(12) United States Patent
Kimura

(10) Patent No.: US 8,395,604 B2
(45) Date of Patent: Mar. 12, 2013

(54) SEMICONDUCTOR DEVICE, DISPLAY DEVICE AND ELECTRONIC APPARATUS

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 222 days.

(21) Appl. No.: 12/639,028

(22) Filed: Dec. 16, 2009

(65) Prior Publication Data

US 2010/0110113 A1    May 6, 2010

Related U.S. Application Data

(63) Continuation of application No. 11/327,545, filed on Jan. 9, 2006, now Pat. No. 7,646,367.

(30) Foreign Application Priority Data

Jan. 21, 2005 (JP) .................................. 2005-014890

(51) Int. Cl.
*G09G 5/00* (2006.01)

(52) U.S. Cl. ............................ 345/204; 345/82; 345/690

(58) Field of Classification Search .................... 345/42, 345/46–52, 76–77, 82–87, 204, 205–206, 345/211, 214, 690; 315/169.1, 169.3, 169.4; 257/296, 369
See application file for complete search history.

(56) References Cited

U.S. PATENT DOCUMENTS

| | | | |
|---|---|---|---|
| 5,461,424 A * | 10/1995 | Shimizu | 348/443 |
| 5,670,792 A | 9/1997 | Utsugi et al. | |
| 6,175,345 B1 | 1/2001 | Kuribayashi et al. | |
| 6,373,455 B1 | 4/2002 | Kuribayashi et al. | |
| 6,410,372 B2 | 6/2002 | Flewitt | |
| 6,475,845 B2 | 11/2002 | Kimura | |
| 6,483,124 B2 | 11/2002 | Flewitt | |
| 6,611,107 B2 | 8/2003 | Mikami et al. | |
| 6,661,180 B2 | 12/2003 | Koyama | |
| 6,753,834 B2 | 6/2004 | Mikami et al. | |
| 6,760,004 B2 | 7/2004 | Koyama | |

(Continued)

FOREIGN PATENT DOCUMENTS

| EP | 0653741 A | 5/1995 |
|---|---|---|
| EP | 0883191 A | 12/1998 |

(Continued)

OTHER PUBLICATIONS

Hiroshi Kageyama et al., "51.1: A 2.5-inch OLED Display with a Three-TFT Pixel Circuit for Clamped Inverter Driving," SID 04 Digest, pp. 1394-1397.

(Continued)

*Primary Examiner* — William Boddie
*Assistant Examiner* — Mansour M Said
(74) *Attorney, Agent, or Firm* — Eric J. Robinson; Robinson Intellectual Property Law Office, P.C.

(57) ABSTRACT

When a resistance load inverter is used to control lighting/non-lighting of a pixel, in accordance with characteristic variations of a transistor forming the resistance load inverter, variations occur in light emission of each pixel. As an inverter in a pixel, an N channel transistor and a P channel transistor are used to apply a CMOS inverter. Even when characteristics of the transistor forming the CMOS inverter vary and inverter transfer characteristics vary, there is little effect on controlling lighting/non-lighting of the pixel, therefore, light emission variations of each pixel can be eliminated. Further, a signal potential of a scan line is used as one power source of a potential of the inverter, therefore, an aperture ratio of the pixel can be increased.

12 Claims, 64 Drawing Sheets

U.S. PATENT DOCUMENTS

| | | | |
|---|---|---|---|
| 6,768,482 B2 | 7/2004 | Asano et al. | |
| 6,781,152 B2 | 8/2004 | Yamazaki | |
| 6,788,003 B2 | 9/2004 | Inukai et al. | |
| 6,858,991 B2 | 2/2005 | Miyazawa | |
| 6,876,345 B2 | 4/2005 | Akimoto et al. | |
| 6,943,501 B2 | 9/2005 | Kobayashi et al. | |
| 6,950,081 B2 | 9/2005 | Akimoto et al. | |
| 6,958,489 B2 | 10/2005 | Kimura | |
| 6,989,805 B2 | 1/2006 | Inukai | |
| 7,012,290 B2 | 3/2006 | Kimura | |
| 7,015,882 B2 | 3/2006 | Yumoto | |
| 7,023,408 B2 | 4/2006 | Chen et al. | |
| 7,119,364 B2 | 10/2006 | Yamazaki | |
| 7,129,914 B2 | 10/2006 | Knapp et al. | |
| 7,133,049 B2 * | 11/2006 | Lee et al. | 345/589 |
| 7,142,180 B2 | 11/2006 | Akimoto et al. | |
| 7,176,857 B2 | 2/2007 | Osame et al. | |
| 7,180,245 B2 | 2/2007 | Yamazaki et al. | |
| 7,205,713 B2 | 4/2007 | Kiguchi | |
| 7,205,965 B2 | 4/2007 | Mikami et al. | |
| 7,221,343 B2 | 5/2007 | Kageyama et al. | |
| 7,230,594 B2 | 6/2007 | Miller et al. | |
| 7,259,735 B2 * | 8/2007 | Kasai | 345/77 |
| 7,277,072 B2 | 10/2007 | Akimoto et al. | |
| 7,286,105 B2 | 10/2007 | Akimoto et al. | |
| 7,324,101 B2 | 1/2008 | Miyazawa | |
| 7,327,168 B2 | 2/2008 | Kimura | |
| 7,379,044 B2 | 5/2008 | Kageyama et al. | |
| 7,423,295 B2 | 9/2008 | Yamazaki et al. | |
| 7,436,376 B2 | 10/2008 | Akimoto et al. | |
| 7,450,093 B2 | 11/2008 | Osame et al. | |
| 7,456,810 B2 | 11/2008 | Kimura | |
| 7,468,715 B2 | 12/2008 | Akimoto et al. | |
| 7,518,407 B2 | 4/2009 | Nonaka | |
| 7,564,433 B2 | 7/2009 | Hector et al. | |
| 7,592,652 B2 | 9/2009 | Kimura | |
| 7,646,367 B2 * | 1/2010 | Kimura | 345/82 |
| 7,733,309 B2 | 6/2010 | Akimoto et al. | |
| 7,965,106 B2 | 6/2011 | Kimura | |
| 8,039,288 B2 | 10/2011 | Yamazaki | |
| 8,102,387 B2 | 1/2012 | Akimoto et al. | |
| 8,120,551 B2 | 2/2012 | Yumoto | |
| 2002/0030647 A1 | 3/2002 | Hack et al. | |
| 2004/0207614 A1 | 10/2004 | Yamashita et al. | |
| 2004/0252088 A1 | 12/2004 | Kawachi et al. | |
| 2005/0007316 A1 | 1/2005 | Akimoto et al. | |
| 2006/0082566 A1 | 4/2006 | Akimoto et al. | |
| 2006/0208977 A1 | 9/2006 | Kimura | |
| 2006/0290617 A1 | 12/2006 | Miyazawa | |
| 2008/0007493 A1 | 1/2008 | Akimoto et al. | |
| 2009/0033600 A1 | 2/2009 | Osame et al. | |
| 2009/0051674 A1 | 2/2009 | Kimura et al. | |
| 2009/0102761 A1 * | 4/2009 | Akimoto et al. | 345/76 |
| 2009/0315066 A1 | 12/2009 | Kimura | |
| 2010/0073267 A1 | 3/2010 | Akimoto et al. | |

FOREIGN PATENT DOCUMENTS

| | | |
|---|---|---|
| EP | 1139454 A | 10/2001 |
| EP | 2151865 | 2/2010 |
| JP | 07-111341 A | 4/1995 |
| JP | 11-003048 A | 1/1999 |
| JP | 2000-268957 A | 9/2000 |
| JP | 2001-202035 A | 7/2001 |
| JP | 2001-343911 A | 12/2001 |
| JP | 2003-005709 A | 1/2003 |
| JP | 2003-150116 | 5/2003 |
| JP | 2003-186438 A | 7/2003 |
| JP | 2003-223136 | 8/2003 |
| JP | 2004-117921 | 4/2004 |
| JP | 2004-170815 A | 6/2004 |
| JP | 2004-325885 A | 11/2004 |
| JP | 2004-341263 A | 12/2004 |
| JP | 2005-003868 A | 1/2005 |
| JP | 2005-354035 A | 12/2005 |
| JP | 2005-354036 A | 12/2005 |
| JP | 2006-013433 A | 1/2006 |
| WO | WO 02/27700 | 4/2002 |

OTHER PUBLICATIONS

Hiroshi Kageyama et al., "9.1: A 3.5-inch OLED Display Using a 4-TFT Pixel Circuit with an Innovative Pixel Driving Scheme," SID 03 Digest, pp. 96-99.

Akimoto et al., "49.4: Two TFT Pixel Circuit with Non-Uniformity Suppress-Function for Voltage Programming Active Matrix OLED Displays," SID Digest '05: SID International Symposium Digest of Technical Papers, 2005, pp. 1550-1553.

Nomura.K et al., "Room-Temperature Fabrication of Transparent Flexible Thin-Film Transistors Using Amorphous Oxide Semiconductors," Nature, Nov. 25, 2004, vol. 432, pp. 488-492.

Goh.J et al., "P-15:A New Pixel Design for Amorphous-Sillicon Backplane of Active-Matrix Organic Light-Emitting Diode Displays," SID Digest '04 : SID International Symposium Digest of Technical Papers, 2004, vol. 35, pp. 276-279.

* cited by examiner

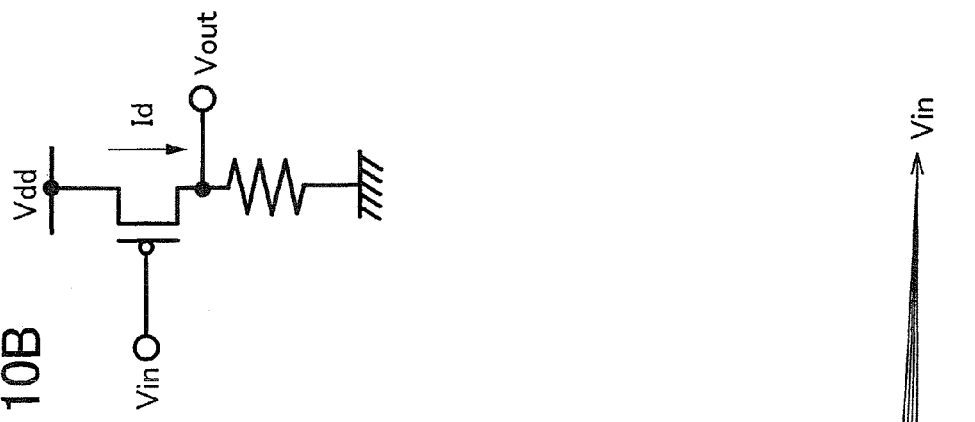
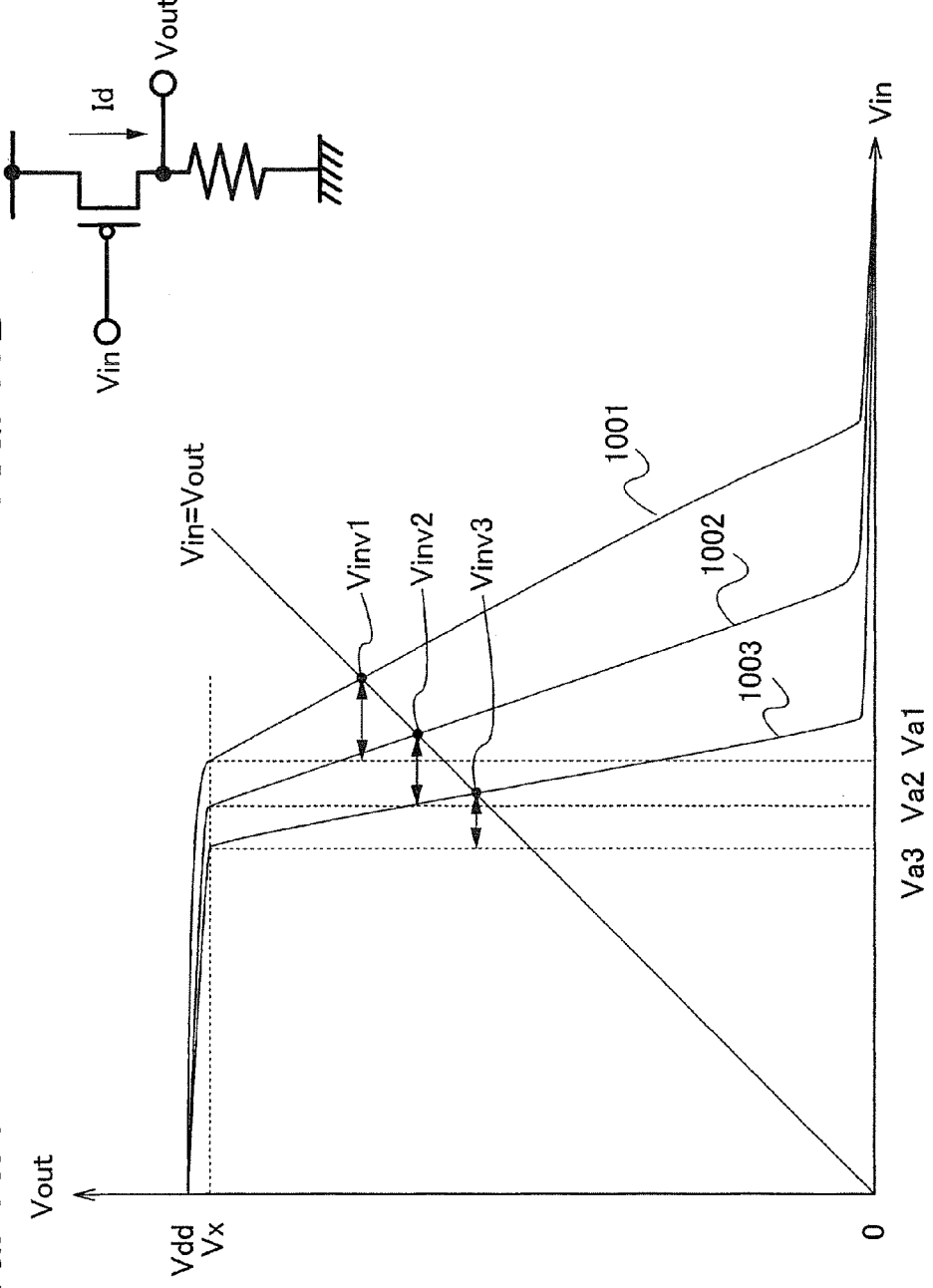
FIG. 10B
FIG. 10A

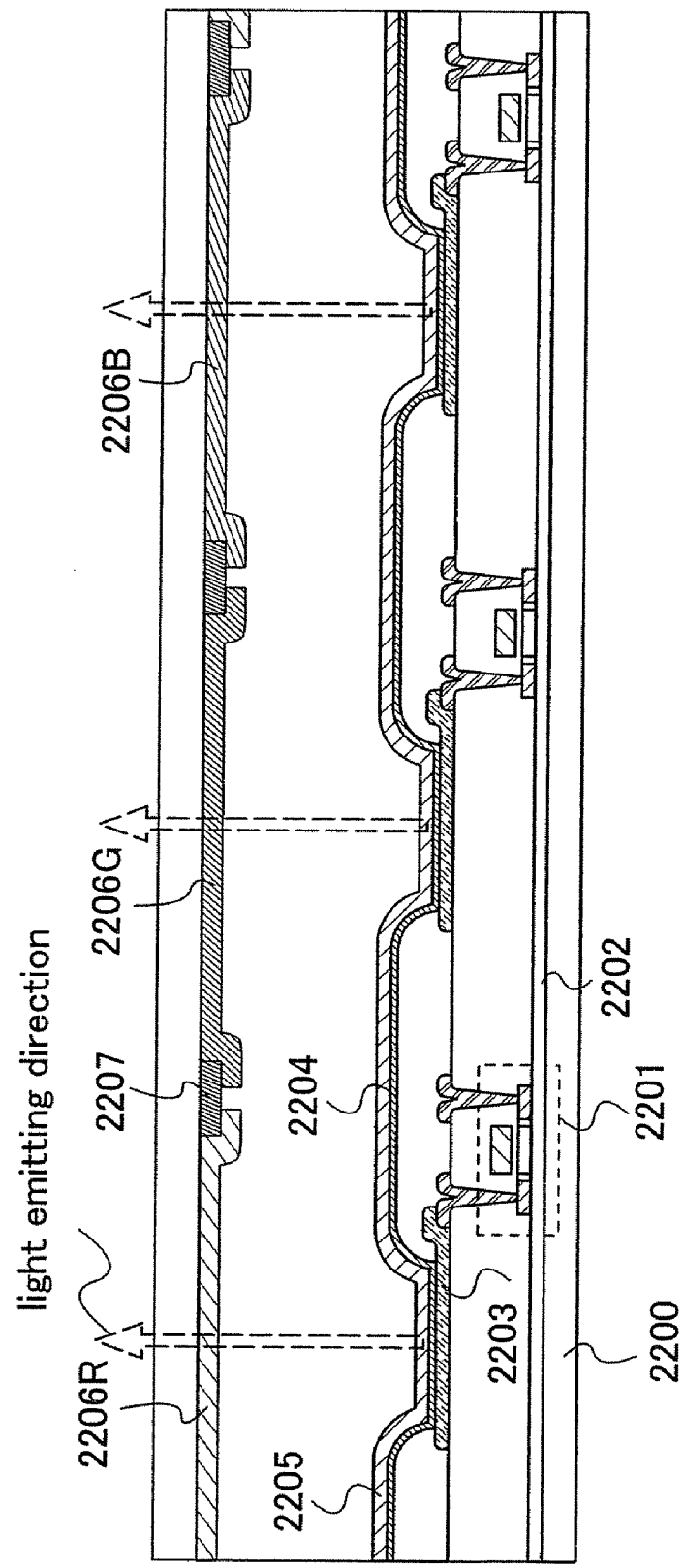

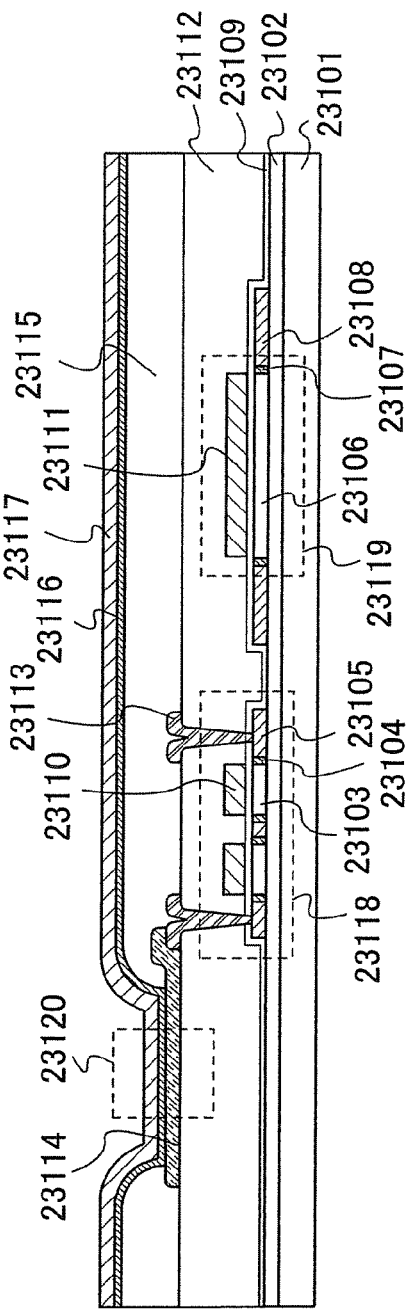
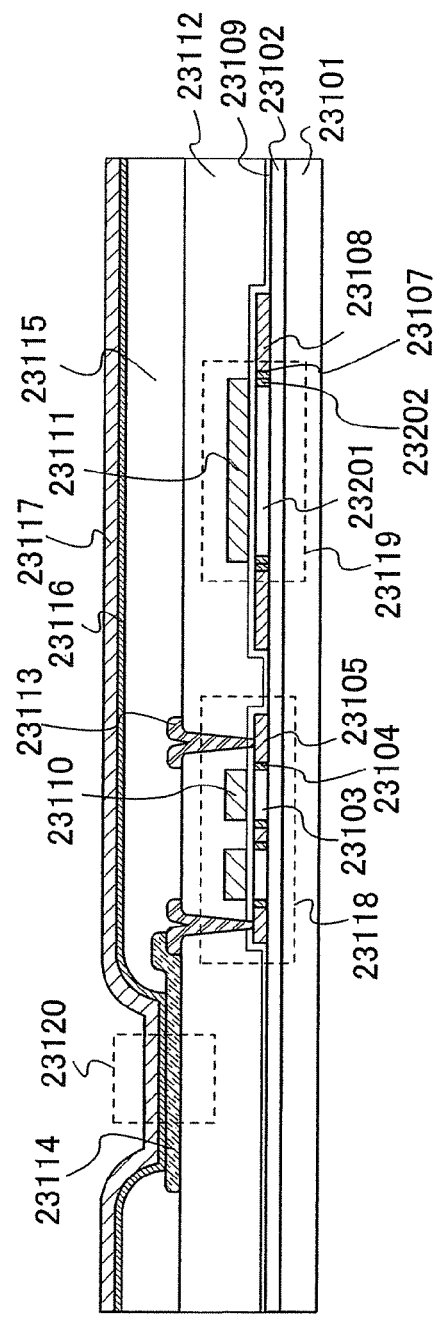
FIG. 23A
FIG. 23B

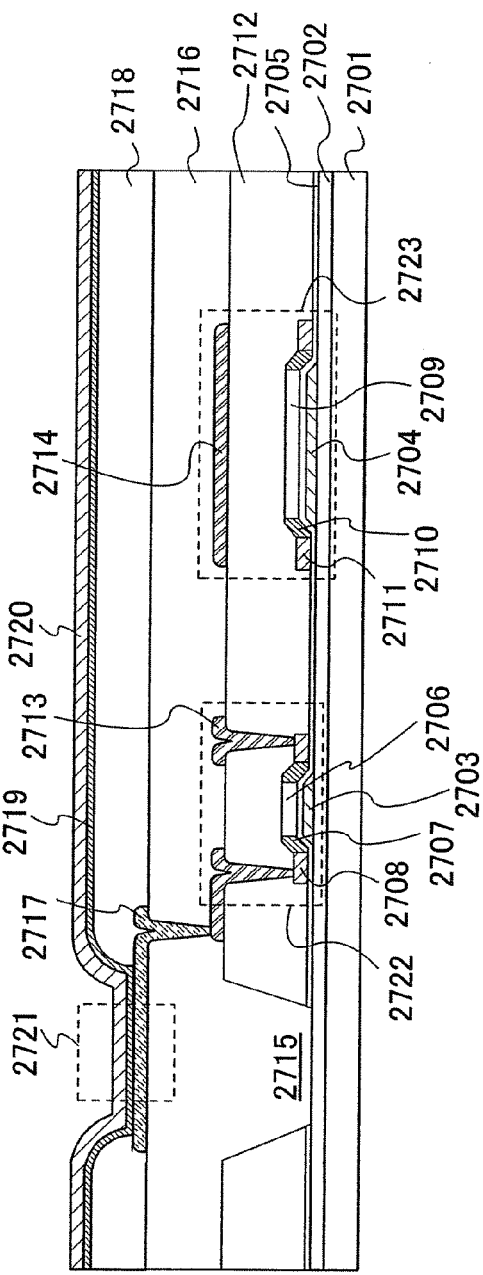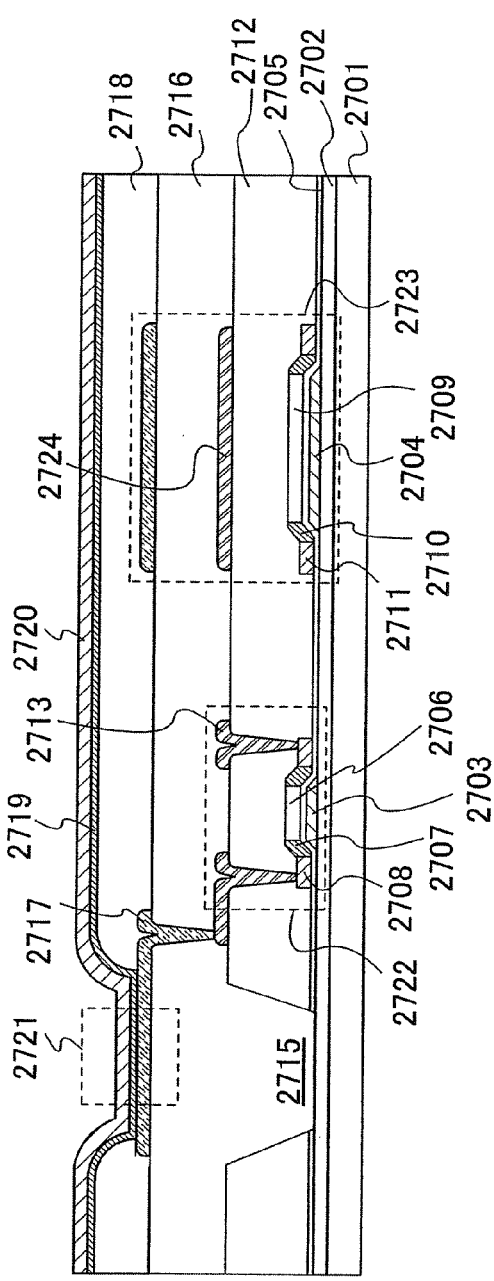
FIG. 27A
FIG. 27B

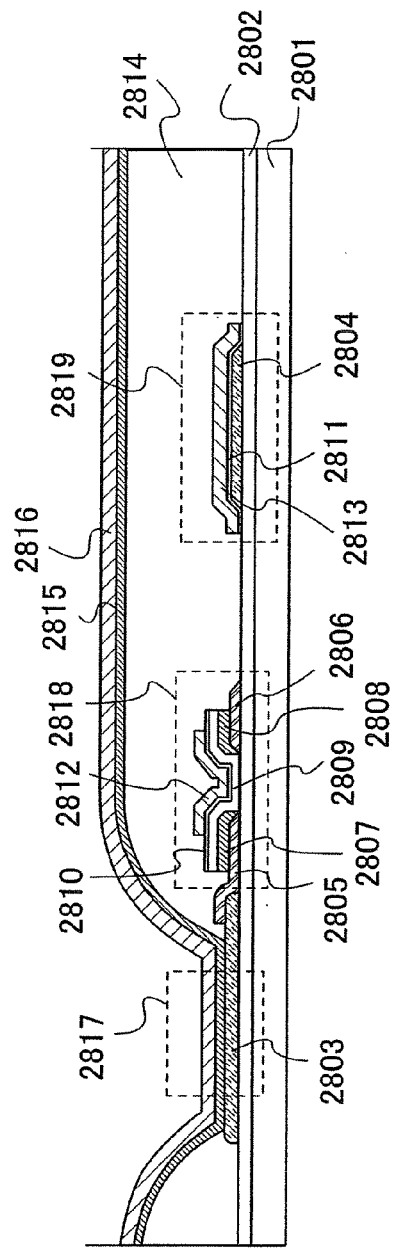
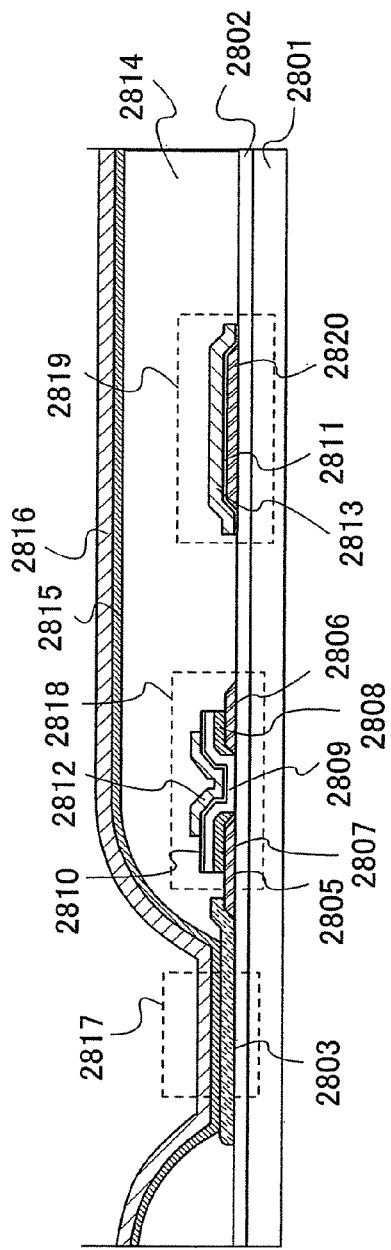
FIG. 28A
FIG. 28B

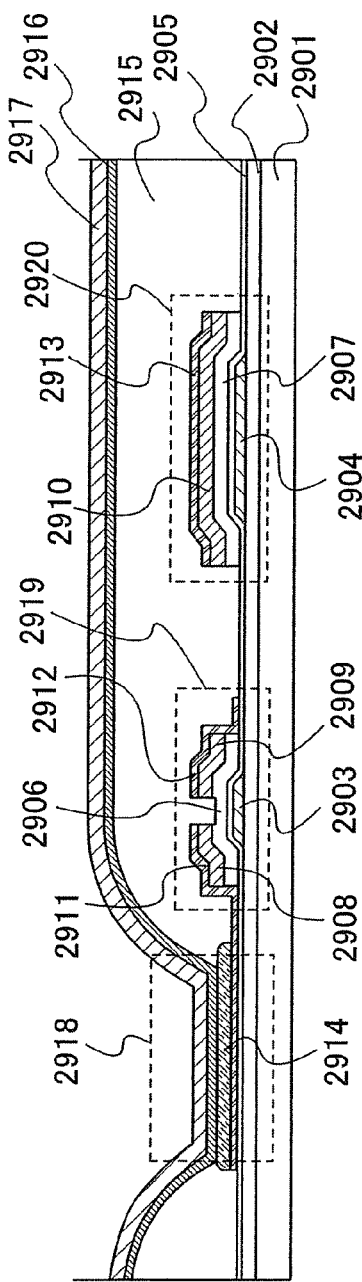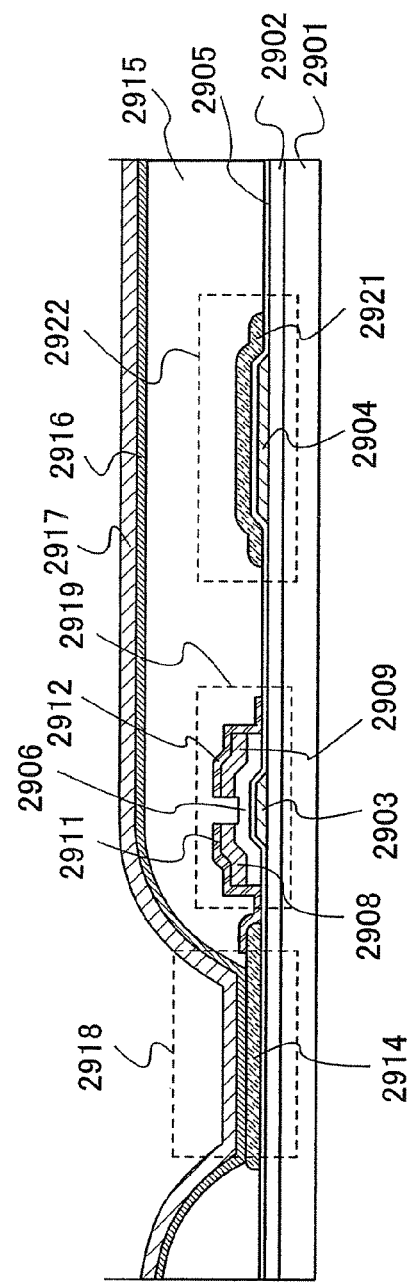

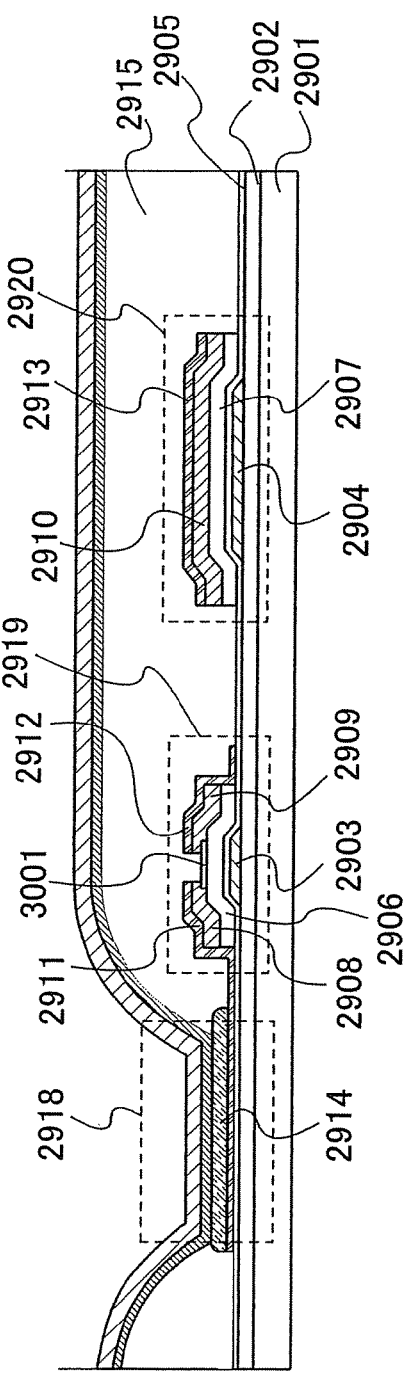
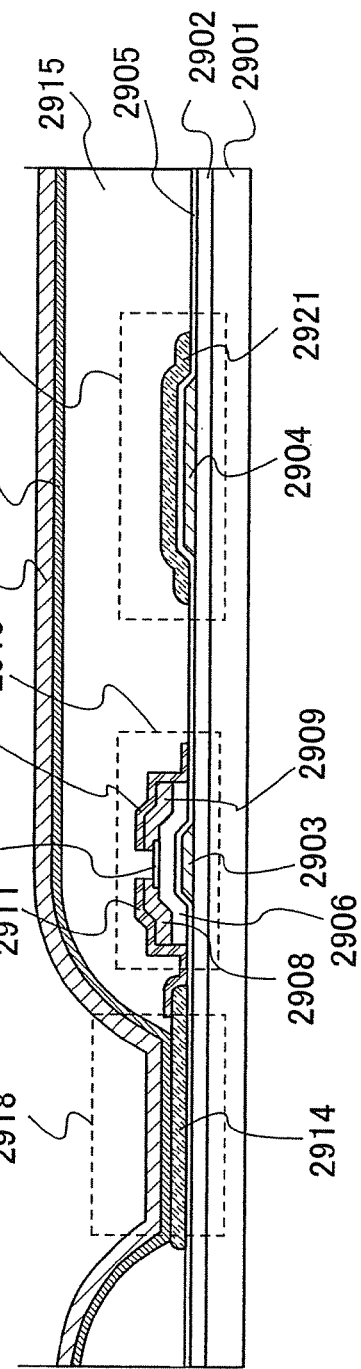
FIG. 30A
FIG. 30B

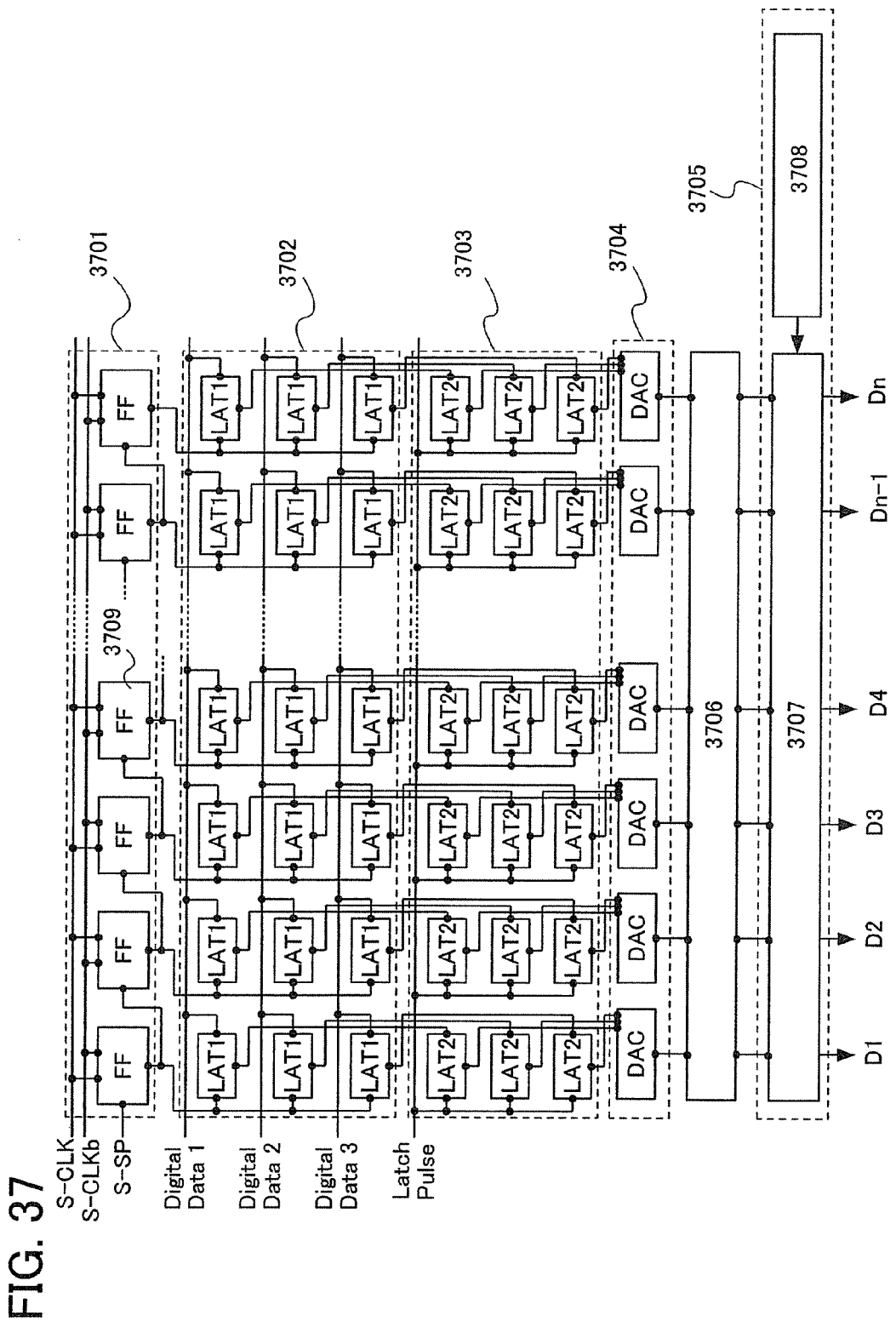

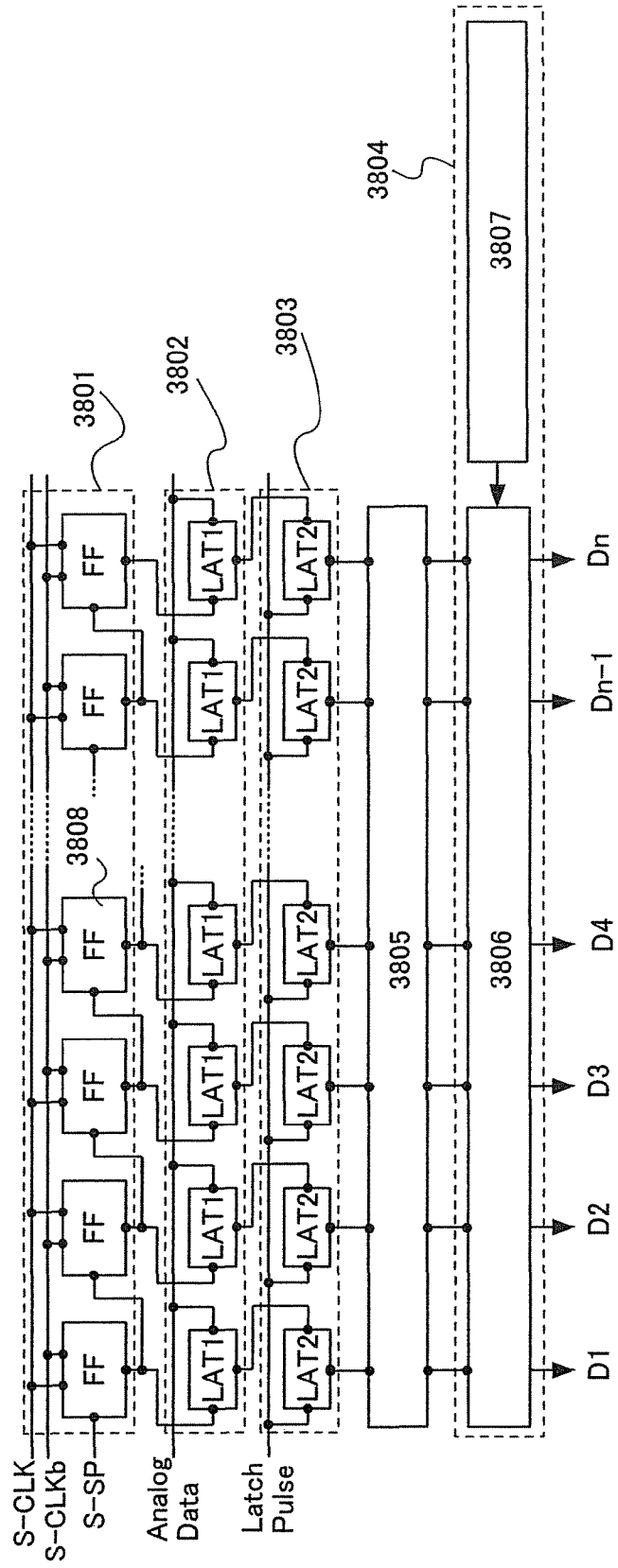

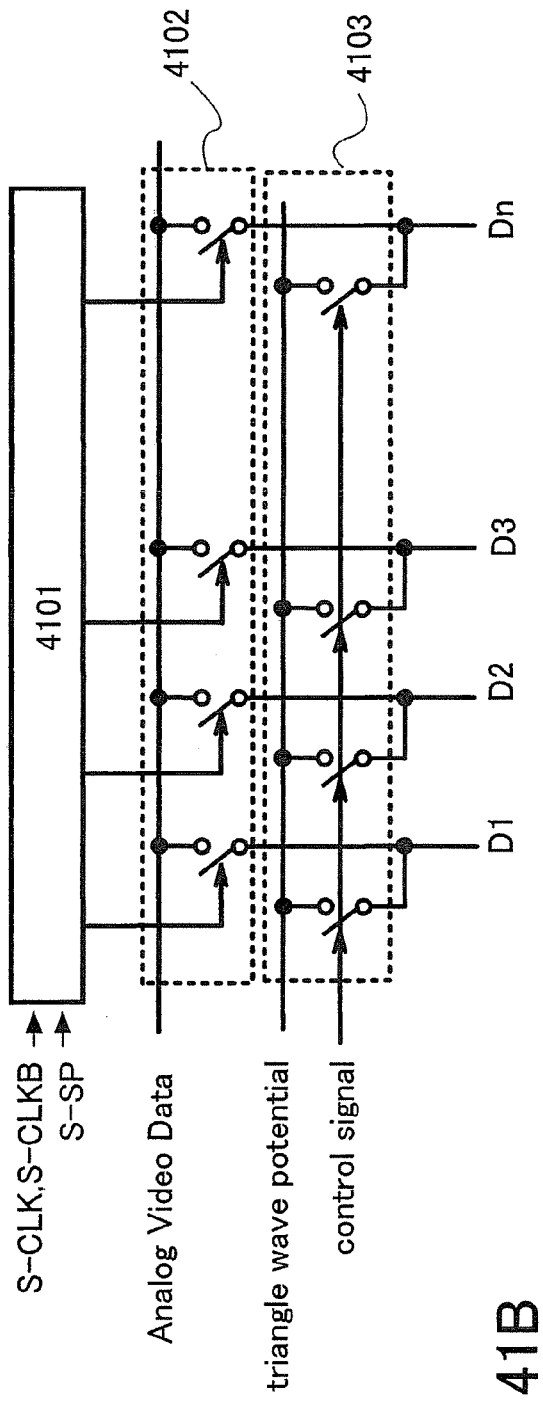
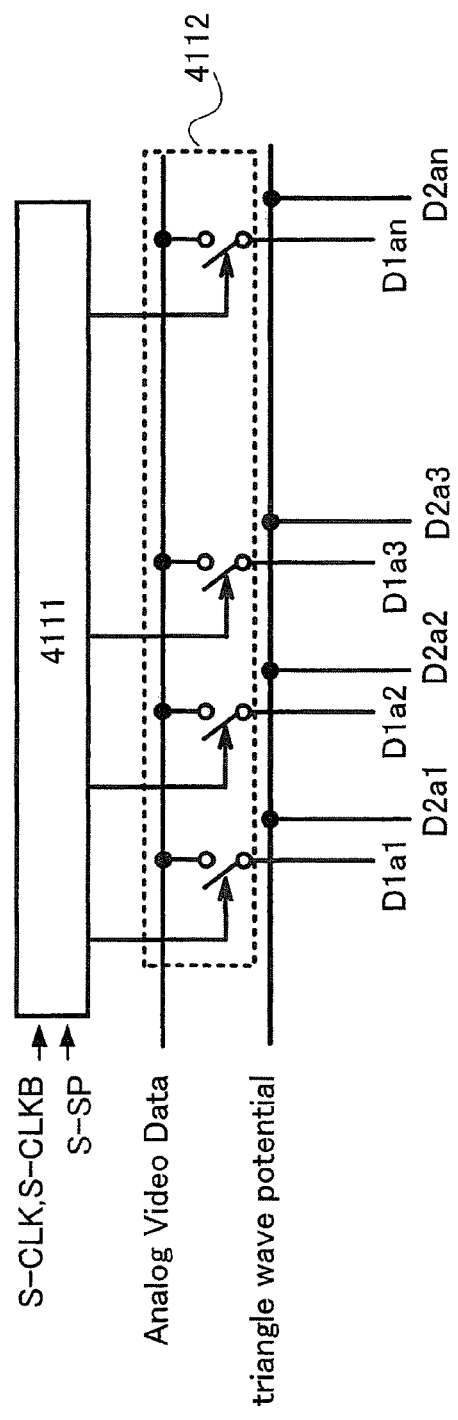
FIG. 41A
FIG. 41B

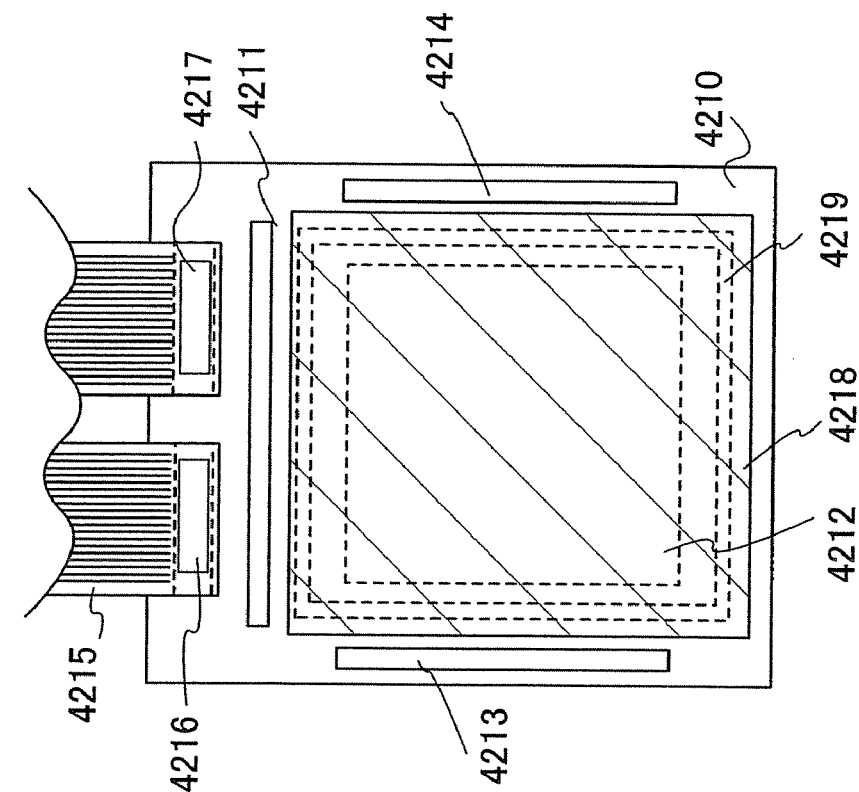
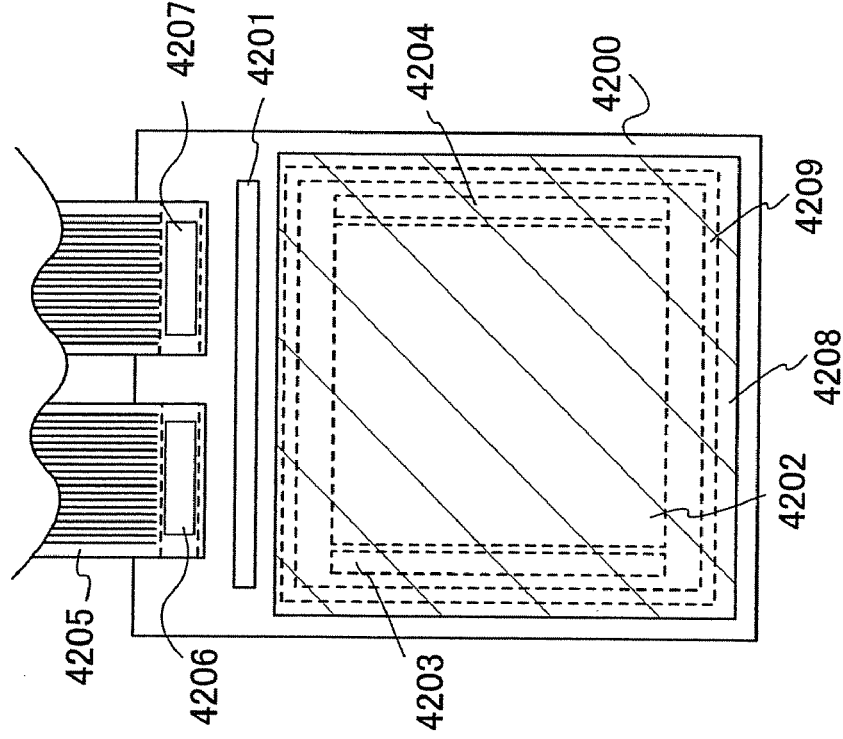
FIG. 42A
FIG. 42B

SEMICONDUCTOR DEVICE, DISPLAY DEVICE AND ELECTRONIC APPARATUS

BACKGROUND OF THE INVENTION

1. Field of the Invention

The present invention relates to a semiconductor device provided with a function to control a current supplied to a load by a transistor, particularly relates to a display device including a pixel formed of a current drive type light emitting element in which luminance varies according to a current, and a signal line driver circuit thereof. In addition, the invention relates to a driving method of the display device, and to an electronic apparatus having the display device in a display portion.

2. Description of the Related Art

In recent years, a so-called self-luminous display device in which a pixel is formed of a light emitting element such as a light emitting diode (LED) has attracted attention. As a light emitting element used for such a self-luminous display device, an organic light emitting diode (an OLED), an organic EL element, an electroluminescence (EL) element, or the like have been attracted attention and have been used for an EL display or the like. A light emitting element such as an OLED is a self-luminous light emitting element, therefore, the light emitting element has an advantage such that the visibility of a pixel is high, a back light is unnecessary, and a response speed is fast compared to a liquid crystal display. Note that the luminance of a light emitting element is controlled by a current value flowing therethrough.

As a driving method to express a gradation of such a display device, there are a digital method and an analog method. The digital method turns on/off a light emitting element by a digital control to express a gradation. In the case of the digital method, there are only two states of light emission and non-light emission, therefore, only two gradations can be expressed. Thus, combining another method, many gradations are performed. As a method of many gradations, a time gradation method is often used. The digital time gradation method is superior to uniformity of a luminance in each pixel while it is required to increase frequency and power consumption increases. On the other hand, in the case of the analog method, the light intensity of a light emitting element is controlled in an analog manner or light emitting time of a light emitting element is controlled in an analog manner. The analog method of controlling light intensity is easy to be affected by characteristic variations of a thin film transistor (hereinafter also referred to as a TFT) in each pixel and variations are also generated in light emission in each pixel. On the other hand, described in a Non-Patent Document 1 is a display device of an analog time gradation method in which light emitting time is controlled in an analog manner and uniformity of light emission in each pixel is superior (See Non-Patent Document 1: SID 04 DIGEST p. 1394 to p. 1397).

A pixel of the display device described in Non-Patent Document 1 comprises an inverter formed of a light emitting element and a transistor for driving the light emitting element. A gate terminal of the driving transistor is an input terminal of the inverter and a drain terminal of the driving transistor is an output terminal of the inverter. Then, an output of the inverter is inputted to an anode of the light emitting element. When a video signal voltage is written to the pixel, the inverter is set in the middle of on and off. Then, a triangle wave voltage is inputted to the pixel to control the output of the inverter in a light emitting period. That is, the output of the inverter which is a potential inputted to the anode of the light emitting element is controlled, thereby controlling light emission/non-light emission of the light emitting element.

Here, a resistance load inverter is shown in FIG. 10B and inverter transfer characteristics of the resistance load inverter are shown in FIG. 10A. The abscissa in FIG. 10A indicates an input potential Vin into an input terminal of the resistance load inverter and the ordinate indicates an output potential Vout from an output terminal of the resistance load inverter. The resistance load inverter includes a transistor and a resistor, and a high power source potential Vdd is inputted to a source terminal of the transistor while a drain terminal thereof is connected to one terminal of the resistor. In addition, a low power source potential Vss is inputted to the other terminal of the resistor. Note that, here, Vss=0 V. A gate terminal of the transistor is the input terminal of the resistance load inverter while the drain terminal of the transistor is the output terminal of the resistance load inverter.

A curve 1002 shown in FIG. 10A shows inverter transfer characteristics of a resistance load inverter, a curve 1001 shows inverter transfer characteristics of a resistance load inverter in the case where a current supply capacity of the transistor in the inverter is high, and a curve 1003 shows inverter transfer characteristics of a resistance load inverter in the case where a current supply capacity of the transistor is low.

That is, when an input potential is sufficiently high and the transistor is in an off-state, a potential of the output terminal of the resistance load inverter becomes a potential of 0 V, while when the transistor is sufficiently in an on-state, the potential of the output terminal of the resistance load inverter becomes Vdd.

Here, the output Vout of the resistance load inverter is expressed below by using the power source potential Vdd, a resistance R of the resistor, and a source-drain current Id of the transistor.

$$V\text{out} = R \times Id$$

Further, the source-drain current Id of the transistor is expressed below when an operation is in a saturation region. Note that $\mu$ is a carrier mobility of the transistor, Cox is a capacitance of a gate insulating film, W/L is a ratio of a channel width W and a channel length L of the transistor, and Vth is a threshold voltage of the transistor.

$$Id = \frac{1}{2} \times \mu \times \text{Cox} \times \frac{W}{L} \times (Vdd - Vin - |Vth|)^2$$

Therefore, the current supply capacity of the transistor varies in accordance with the value of $\mu$, Cox, W/L, Vth, and the like. Accordingly, the inverter transfer characteristics of the resistance load inverter vary in accordance with variations of these values of the transistor.

Such variations of the inverter transfer characteristics of the resistance load inverter also occur in the case of using a light emitting element as a resistor. Then, even in the display device having the pixel described in Non-Patent Document 1, there is a pixel of the transfer characteristics of the resistance load inverter such as the curve 1001, the curve 1002, or the curve 1003. Accordingly, time from the transistor is turned on in the saturation region to the transistor is turned off and an output potential of the resistance load inverter becomes Vx, as well as time from a portion between the input terminal and the output terminal becomes conductive to input potentials Vinv1, Vinv2, and Vinv3 of the resistance load inverter which are offset-cancelled become input potentials Va1, Va2, and Va3 respectively at which the output potential of the resistance load inverter becomes Vx, varies in each pixel different in the transfer characteristics of the resistance load inverters.

Therefore, in a display device of a driving method for expressing a gradation in an analog time, even the same gradation display varies between pixels and clear display cannot be performed.

Further, there are problems in that the number of transistors or wires in a pixel is large, an aperture ratio decreases, and the like in conventional configurations. In the case where similar brightness is obtained in a pixel with a high aperture ratio and a pixel with a low aperture ratio, the pixel with a low aperture ratio is required to increase its luminance of the light emitting element more than the pixel with a high aperture ratio. Therefore, in the pixel with a low aperture ratio, deterioration of the light emitting element proceeds faster. In addition, the power consumption is also increased since the luminance is increased.

Moreover, when the number of transistors or wires in a pixel increases, yield also tends to decrease and cost of a display panel rises.

SUMMARY OF THE INVENTION

In view of the foregoing, the object of the present invention is to provide a display device of an analog time gradation method in which even when the transfer characteristics of the resistance load inverter vary due to characteristic variations of a transistor, these effects are suppressed and a clear gradation can be displayed. Further, the object of the invention is to provide a display device having a pixel with a high aperture ratio and to provide a display device in which the reliability of a light emitting element improves and cost increase of a display panel can be suppressed.

Further, the object of the invention is to provide an electronic apparatus having the above-described display device in a display portion.

According to the invention, a CMOS inverter having an N channel transistor and a P channel transistor to turn on/off complementarily is applied in a pixel and a signal potential for controlling selection of pixels of another row is used as one power source potential of the CMOS inverter.

A semiconductor device of the invention has a first transistor in which a gate terminal thereof is connected to a scan line; a second transistor in which one of a source terminal or a drain terminal thereof is connected to a power source line; a third transistor in which one of a source terminal or a drain terminal thereof is connected to another scan line which is different from the above-described scan line; and a capacitor in which one electrode thereof is connected to a gate terminal of the second transistor and a gate terminal of the third transistor while the other electrode thereof is connected to a signal line, and the other of the source terminal or the drain terminal of the second transistor and the other of the source terminal or the drain terminal of the third transistor are connected to a pixel electrode; one of a source terminal or a drain terminal of the first transistor is connected to the other of the source terminal or the drain terminal of the second transistor and the other of the source terminal or the drain terminal of the third transistor; and the other of the source terminal or the drain terminal of the first transistor is connected to the gate terminal of the second transistor and the gate terminal of the third transistor.

In addition, according to the semiconductor device of the invention, the first transistor and the third transistor are N channel transistors and the second transistor is a P channel transistor in the aforementioned configuration.

The display device of the invention has a plurality of pixels arranged in matrix at least one of which provides a CMOS inverter having a P channel transistor and an N channel transistor; a switch connected between an input terminal and an output terminal of the CMOS inverter; a signal line inputted with an analog potential; a capacitor for holding a potential difference between the input terminal of the CMOS inverter and the signal line; and a light emitting element in which light emission/non-light emission is controlled by an output of the CMOS inverter, and a signal potential for controlling on/off of a switch of at least another one of the pixels is used as one power source potential of the CMOS inverter.

According to another configuration of a display device of the invention, an N channel transistor is used for the switch in the aforementioned configuration.

According to another configuration of a display device of the invention, a P channel transistor is used for the switch in the aforementioned configuration.

A display device of the invention has a first transistor in which a gate terminal thereof is connected to a scan line; a second transistor in which one of a source terminal or a drain terminal thereof is connected to a power source line; a third transistor in which one of a source terminal or a drain terminal thereof is connected to another scan line which is different from the above-described scan line; a capacitor in which one electrode thereof is connected to a gate terminal of the second transistor and a gate terminal of the third transistor while the other electrode thereof is connected to a signal line; and a light emitting element in which a pixel electrode is connected to the other of the source terminal or the drain terminal of the second transistor and the other of the source terminal or the drain terminal of the third transistor, and one of a source terminal or a drain terminal of the first transistor is connected to the other of the source terminal or the drain terminal of the second transistor and the other of the source terminal or the drain terminal of the third transistor; and the other of the source terminal or the drain terminal of the first transistor is connected to a gate terminal of the second transistor and a gate terminal of the third transistor.

In addition, according to the display device of the invention, the first transistor and the third transistor are N channel transistors and the second transistor is a P channel transistor in the aforementioned configuration.

Note that the switch described in this specification may be used either an electrical switch or a mechanical switch. Any switch may be used as long as a current flow can be controlled. A transistor, a diode, or a logic circuit combining with them may be used. Therefore, in the case of using a transistor as a switch, the transistor is operated simply as a switch, therefore, a polarity (conductive type) of the transistor is not limited particularly. However, in the case where an off current is desirably small, a transistor of a polarity with a small off current is desirably used. As the small off current transistor, there are a transistor provided with an LDD region, a transistor having a multi-gate structure, and the like. Further, in the case where a potential of a source terminal of a transistor when operating as a switch is close to a power source potential of a low potential side (Vss, GND, 0 V, or the like), an N channel transistor is desirably used. On the other hand, in the case where the potential of the source terminal when operating is close to a power source potential of a high potential side (Vdd or the like), a P channel transistor is desirably used. This is because an absolute value of a gate-source voltage can be increased, thereby operating easily as a switch. Note that both an N channel transistor and a P channel transistor may be used to be a CMOS switch.

Note that in the invention, a connection is synonymous with an electrical connection. Accordingly, another element, a switch, or the like may be arranged therebetween.

Note that any light emitting element may be used. Any display element may be used such as an EL element (an organic EL element, an inorganic EL element, or an EL element containing an organic substance and an inorganic substance), an element used for a field emission display (FED), an SED (Surface-conduction Electron-emitter Display) which is a kind of FED, a liquid crystal display (LCD), an plasma display (PDP), an electronic paper display, a digital micromirror device (DMD), or a piezoelectric ceramic display.

In the invention, the kinds of applicable transistors are not limited, and a thin film transistor (TFT) using a non-single crystal semiconductor film typified by amorphous silicon and polycrystalline silicon, a MOS transistor formed using a semiconductor substrate or an SOI substrate, a junction transistor, a bipolar transistor, a transistor using an organic semiconductor or a carbon nanotube, and other transistors can be applied. Further, the kinds of substrates over which a transistor is arranged are not limited, and a transistor can be arranged over a single crystalline substrate, an SOI substrate, a glass substrate, a plastic substrate, or the like.

In this specification, one pixel means one pixel element of a color element. Therefore, in the case of a full color display device formed by color elements of R (red), G (green), and B (blue), one pixel means any one of a pixel of a color element of R, a pixel of a color element of G, and a pixel of a color element of B.

Note that in this specification, pixels arranged in matrix includes a case where pixels are arranged in stripe in which a vertical stripe and a lateral stripe are combined to be arranged in a so-called lattice shape, as well as a case where pixels of three color elements expressing a minimum element of one image are arranged in a so-called delta shape in the case of performing a full color display by three color elements (for example, RGB).

Note that in this specification, a semiconductor device means a device having a circuit including a semiconductor element (a transistor, a diode, or the like).

Note that in this specification, an anode and a cathode of the light emitting element mean electrodes when a forward voltage is applied to the light emitting element.

The invention can provide a display device in which even when characteristics of a transistor in an inverter in a pixel vary in each pixel, the effect can be reduced and a clear gradation can be displayed.

Further, an aperture ratio in a pixel increases and progression of the deterioration of the light emitting element is suppressed so that the reliability can be improved. In addition, yield increases so that cost can be suppressed.

BRIEF DESCRIPTION OF THE DRAWINGS

FIGS. 10A and 10B are diagrams each showing a pixel configuration of the invention.

FIG. 22 is a cross section diagram of a display panel using a color filter to perform a full color display.

FIGS. 23A and 23B are fragmentary cross section diagrams each of a display panel.

FIGS. 27A and 27B are fragmentary cross section diagrams each of a display panel.

FIGS. 28A and 28B are fragmentary cross section diagrams each of a display panel.

FIGS. 29A and 29B are fragmentary cross section diagrams each of a display panel.

FIGS. 30A and 30B are fragmentary cross section diagrams each of a display panel.

FIG. 37 is an example of a signal line driver circuit applicable to a display device of the invention.

FIG. 38 is an example of a signal line driver circuit applicable to a display device of the invention.

FIGS. 41A and 41B are examples of a signal line driver circuit applicable to a display device of the invention.

FIGS. 42A and 42B are diagrams each describing a display panel having a pixel configuration of the invention.

DETAILED DESCRIPTION OF THE INVENTION

Although the present invention will be fully described by way of embodiment modes and embodiments with reference to the accompanying drawings, it is to be understood that various changes and modifications will be apparent to those skilled in the art. Therefore, unless such changes and modifications depart from the scope of the present invention, they should be construed as being included therein.

[Embodiment Mode 1]

In this embodiment mode, described are a pixel configuration of a display device of the invention and a principal of operation thereof.

Figure 1:
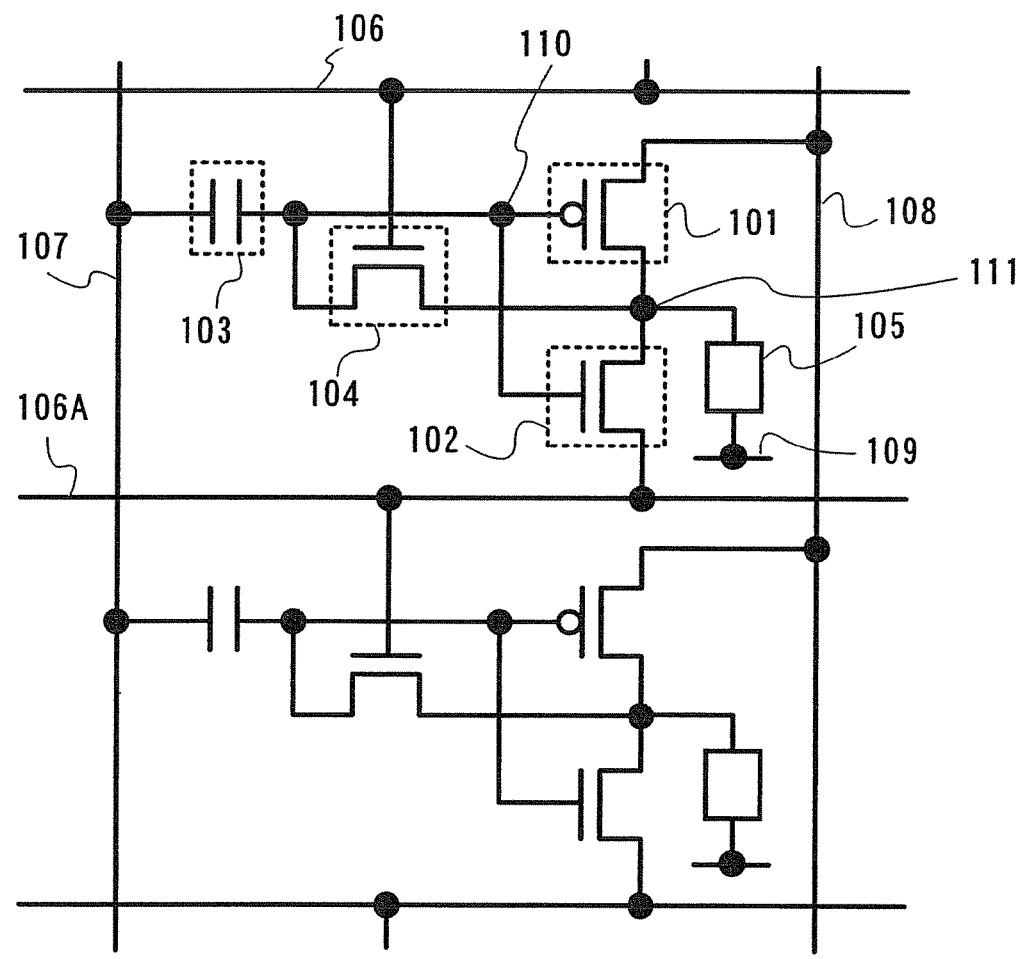
FIG. 1 is a diagram showing a pixel configuration of the invention.

First, description is made in detail on a pixel configuration of a display device of the invention with reference to FIG. 1. Here, although only two pixels arranged in a column direction are shown, a plurality of pixels are arranged in matrix in a row direction and a column direction in a pixel portion of the display device in reality.

A pixel has a driving transistor (a second transistor) 101, a complementary transistor (a third transistor) 102, a capacitor 103, a switching transistor (a first transistor) 104, a light emitting element 105, a scan line (Select line) 106, a signal line (Data line) 107, and a power source line 108. Note that a P channel transistor is used for the driving transistor 101 while N channel transistors are used for the complementary transistor 102 and the switching transistor 104.

A first terminal (one of a source terminal or a drain terminal) of the driving transistor 101 is connected to the power source line 108, a second terminal (the other of the source terminal or the drain terminal) thereof is connected to a second terminal (one of a source terminal or a drain terminal) of the complementary transistor 102, and a gate terminal of the driving transistor 101 is connected to a gate terminal of the complementary transistor 102. Further, the gate terminals of the driving transistor 101 and the complementary transistor 102 are connected to the signal line 107 through the capacitor 103, and connected to the second terminals (each one of the source terminal or the drain terminal) of the driving transistor 101 and the complementary transistor 102 through the switching transistor 104. That is, a first terminal (one of a source terminal or a drain terminal) of the switching transistor 104 is connected to the second terminals (each one of the source terminal or the drain terminal) of the driving transistor 101 and the complementary transistor 102, and a second terminal (the other of the source terminal or the drain terminal) of the switching transistor 104 is connected to the gate terminals of the driving transistor 101 and the complementary transistor 102. Therefore, turning on/off the switching transistor 104 can make a portion between the gate terminal and the second terminal (one of the source terminal or the drain terminal) each of the driving transistor 101 and the complementary transistor 102 conductive/non-conductive. Then, a signal is inputted to the scan line 106 to which a gate terminal of the switching transistor 104 is connected, thereby controlling on/off of the switching transistor 104. Further, the second terminals (each one of the source terminal or the drain terminal) of the driving transistor 101 and the complementary transistor 102 are connected to an anode of the light emitting element 105. In addition, a cathode of the light emitting element 105 is connected to a wire (Cathode) 109 to which a low power source potential Vss is supplied. Note that based on a power source potential Vdd supplied to the power source line 108, Vss is a potential satisfying Vss<Vdd. For example, Vss=GND (ground potential) may be used.

Further, a first terminal of the complementary transistor 102 (the other of the source terminal or the drain terminal) is connected to a scan line 106A in pixels of another row. Here, the driving transistor 101 is a transistor for driving the light emitting element 105 while the complementary transistor 102 is a transistor in which a polarity is inverted with respect to that of the driving transistor 101. That is, when a signal of the scan line 106A is at L level, the driving transistor 101 and the complementary transistor 102 form an inverter to turn on/off complementarily.

Next, description is made in detail on a principal of operation of the pixel configuration in FIG. 1.

In a period where a signal is written to the pixel, an analog signal potential is supplied to the signal line 107. The analog signal potential corresponds to a video signal. Then, when a video signal is written to the pixel, an H level signal is inputted to the scan line 106 to turn on the switching transistor 104. Note that at this time, an L level signal is supplied to the scan line 106A for selecting pixels of another row. Therefore, when a signal is written to the pixel, the driving transistor 101 and the complementary transistor 102 are operated as an inverter. Note that when operating as the inverter, a connecting point between the gate terminals of the driving transistor 101 and the complementary transistor 102 becomes an input terminal 110 of the inverter while a connecting point between the second terminals of the driving transistor 101 and the complementary transistor 102 becomes an output terminal 111 of the inverter. In addition, when operating as the inverter, the first terminals of the driving transistor 101 and the complementary transistor 102 are the source terminals while the second terminals thereof are the drain terminals.

In this manner, when the switching transistor 104 is turned on, a portion between the input terminal 110 of the inverter and the output terminal 111 becomes conductive and a current flows to the driving transistor 101, the complementary transistor 102, and the light emitting element 105 while the capacitor 103 discharges or accumulates charge.

Thus, the inverter is offset-cancelled. Note that the offset cancellation means the portion between the input terminal 110 and the output terminal 111 is made conductive to uniform an input potential and an output potential, and a potential of the input terminal 110 becomes a logic threshold potential Vinv of the inverter. Therefore, the logic threshold potential Vinv is ideally a medium potential of an L level and an H level outputs of the inverter.

Note that the H level potential of an output of the inverter is the power source potential Vdd of the power source line 108 while the L level potential of the inverter is an L level potential supplied to the scan line 106A. In addition, the power source potential Vdd to be the H level output of the inverter and the L level potential of a signal supplied to the scan line 106 and the scan line 106A to be the L level output of the inverter are set based on a potential of the wire 109. Then, when the output of the inverter is at H level, the light emitting element 105 emits light, and when the output of the inverter is at L level, the light emitting element 105 emits no light.

That is, in the case where a voltage is $V_{EL}$ when the light emitting element 105 starts emitting light, the L level potential of the inverter (the L level potential of signal supplied to the scan line 106 or the scan line 106A) is required to be lower than Vss+$V_{EL}$. Further, the H level potential of the inverter is required to be higher than Vss+$V_{EL}$.

Note that when the L level potential of the inverter is lower than the potential of the wire 109, a reverse bias voltage is applied to the light emitting element 105. Therefore, the deterioration of the light emitting element 105 can be desirably suppressed.

Note that discharge or accumulation of charge in the capacitor 103 is determined depending on a relation between an originally accumulated charge in the capacitor 103 and a potential supplied to the signal line 107. After completing discharge or accumulation of charge in the capacitor 103, a charge corresponding to a potential difference (voltage Vp) between the signal line 107 and the logic threshold potential Vinv is accumulated in the capacitor 103. Then, a signal of the scan line 106 is at L level to turn off the switching transistor 104 and the voltage Vp is held in the capacitor 103.

Note that in a writing period, the potential of the wire (Cathode) 109 may be set to Vss2. Vss2 is a potential satisfying Vss<Vss2, when the inverter is offset-cancelled, a voltage applied to the light emitting element 105 is set to be smaller than a forward threshold voltage $V_{EL}$ of the light emitting element 105, that is, to be set Vinv−Vss2<$V_{EL}$. In this manner, in a writing period, a display defect due to that the light emitting element 105 emits light can be prevented from generating. In addition, little current can flow to the light emitting element in a writing period, therefore, power consumption can be reduced.

Moreover, Vss2 may increase to apply a reverse bias voltage to the light emitting element 105. By applying the reverse bias voltage, the reliability of the light emitting element 105 can be improved and a malfunction portion in the light emitting element 105 can be baked and cut.

Note that if a current is not flow to the wire 109, other methods can be used as well. For example, the wire 109 may be a floating state. As a result, a current does not flow to the light emitting element 105. Alternatively, a switch may be provided between the output terminal 111 of the inverter and the wire 109. By controlling the switch, a current cannot flow to the light emitting element 105.

Figure 55:
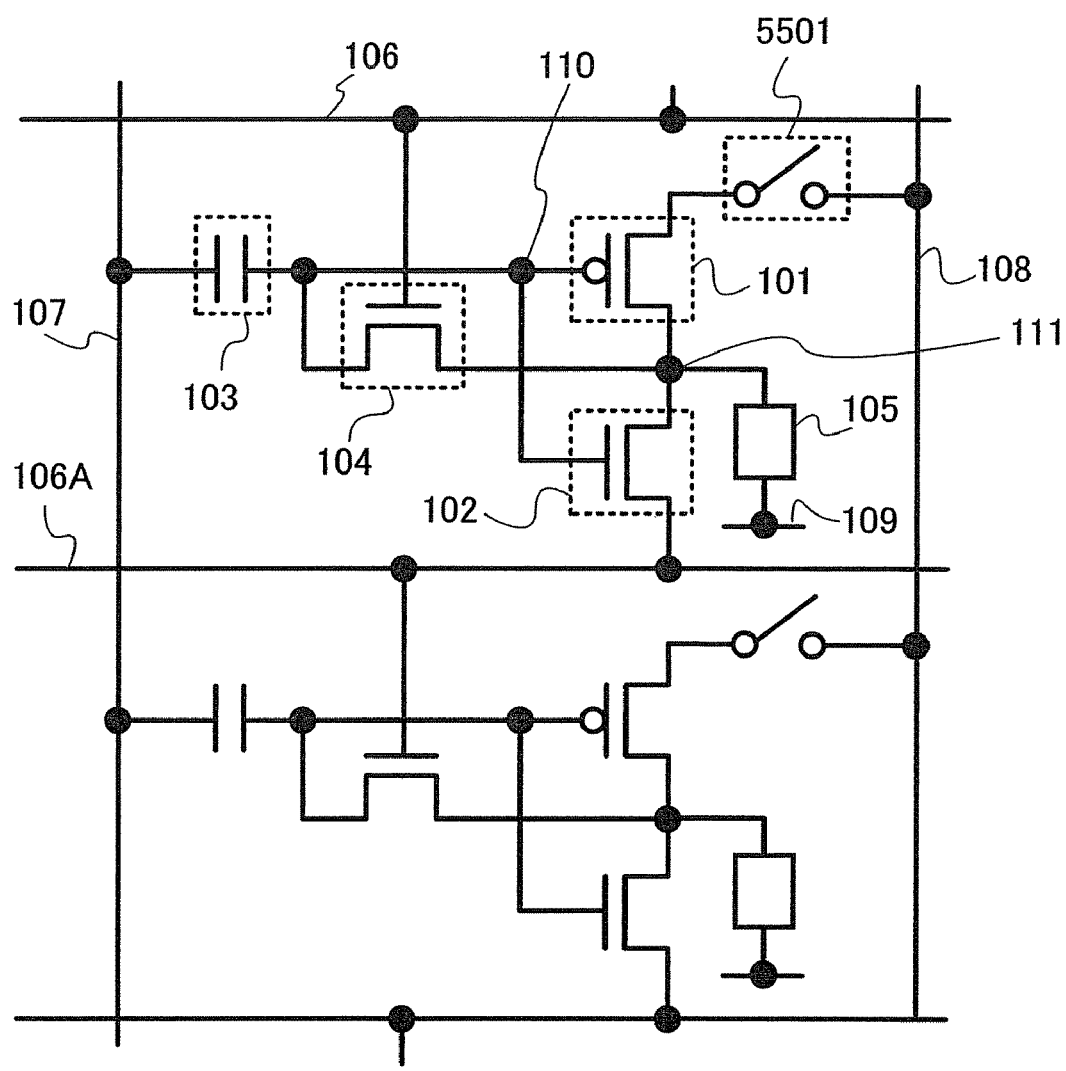
FIG. 55 is a diagram showing a pixel configuration of the invention.

For example, as shown in FIG. 55, the first terminal (one of the source terminal or the drain terminal) of the driving transistor 101 may be connected to the power source line 108 through a switch 5501. Then, in a period where signals are written to pixels, only in a period where a signal is written in pixels of the row, the switch 5501 is turned on. Accordingly, pixels of a row which is not performed writing can emit no light in a period where a signal is written in pixels of another row, thereby preventing a defective image, as well as reducing power consumption. Note that in this configuration, in a light emitting period, the switch 5501 is in an on-state.

In this manner, writing of a video signal into the pixel is completed.

Note that after the video signal is written to the pixel, based on the analog signal potential supplied to the signal line 107 when the video signal is written to the pixel, an output level of the inverter is controlled in accordance with variations of a potential of the signal line 107. That is, if in a period where a signal is written to the pixel, the potential of the signal line 107 is higher than an analog signal potential when a video signal is written to the pixel. the output of the inverter is at L level, while if the potential of the signal line 107 is lower than the analog signal potential when a video signal is written to the pixel, the output of the inverter is at H level.

This is because when a video signal is written to the pixel, the capacitor 103 holds the potential difference (Vp), therefore, the potential of the signal line 107 is higher than an analog signal potential when a video signal is written to the pixel, the potential of the input terminal 110 of the inverter is also higher than the potential of the input terminal 110 when a video signal is written to the pixel, and thus, the driving transistor 101 is turned off, the complementary transistor 102 is turned on, and the output of the inverter is at L level. On the other hand, if the potential of the signal line 107 is lower than the analog signal potential when the video signal is written to the pixel in a period where a signal is written to the pixel, the potential of the input terminal 110 of the inverter is also lower than the potential of the input terminal 110 when the video signal is written to the pixel, therefore, the driving transistor 101 is turned on, the complementary transistor 102 is turned off, and the output of the inverter is at H level.

Accordingly, in a light emitting period of the pixel, while the scan line (the scan line 106, the scan line 106A, or the like) is at L level, the potential supplied to the signal line 107 is changed in an analog manner, thereby controlling the output level of the inverter in the pixel. Thus, time during which a current flows to the light emitting element 105 is controlled in an analog manner to express a gradation.

In addition, the first terminal (one of the source terminal or the drain terminal) of the complementary transistor 102 is connected to the scan line 106A, therefore, the number of wires can be reduced to improve an aperture ratio. Accordingly, the reliability of the light emitting element 105 can be improved. In addition, yield increases so that cost of a display panel can be suppressed.

Subsequently, description is made on a potential supplied to the signal line 107 in a light emitting period of the pixel. The potential supplied to the signal line 107 can be used with an analog potential with a waveform changing periodically.

For example, in a light emitting period, a potential changing in an analog manner from a low potential to a high potential is supplied to the signal line 107. For example, as a waveform 1201 shown in FIG. 12, a potential may increase linearly. Note that such a waveform is also called a sawtooth wave.

Further, a potential changing in an analog manner from a high potential to a low potential may be supplied as well. For example, as a waveform 1202, a potential may decrease linearly.

Moreover, a waveform combined with the aforementioned waveforms may be used as well. That is, for example, as a waveform 1203, a potential increasing from a low potential to a high potential linearly and decreasing from a high potential to a low potential may be supplied. Note that such the waveform 1203 is hereinafter referred to as a triangle wave potential. Further, as a waveform 1204, a triangle wave potential decreasing from a high potential to a low potential linearly and increasing from a low potential to a high potential linearly may be supplied.

In addition, a potential supplied to the signal line 107 may not be changed linearly. As a waveform 1205, a potential of the waveform 1205 corresponding to one cycle of an output waveform of a full-wave rectifier circuit may be supplied or a potential of a waveform 1206 in which the waveform 1205 is flip vertical may be supplied as well. Moreover, a potential of a waveform 1208 or a waveform 1209 may be supplied as well.

With such a waveform, light emitting time to a video signal can be freely set. Therefore, gamma correction and the like can be also performed.

Moreover, in a light emitting period of the pixel, a plurality of pulses of the waveform 1201, the waveform 1202, the waveform 1203, the waveform 1204, the waveform 1205, the waveform 1206, the waveform 1208, or the waveform 1209 may be supplied in succession. For example, as shown in a waveform 1207, the pulse of the waveform 1201 may be supplied twice in succession in the light emitting time of the pixel.

In this manner, the light emitting time can be divided in one frame. As a result, frame frequency seems to be improved so that a screen flicker can be prevented.

Thus, by an analog signal potential supplied to the signal line 107 when an analog signal is written to the pixel, an analog time gradation display of the pixel can be performed. Note that as the number of gradations becomes smaller, the analog signal potential decreases while as the gradation becomes higher, the analog signal potential increases.

This is because a high-low relation between a triangle wave potential supplied in a light emitting period of a pixel and an analog signal potential inputted in a pixel in a period where a signal is written to the pixel determines an output level of the inverter formed of the driving transistor 101 and the complementary transistor 102. When the triangle wave potential supplied in the light emitting period of the pixel is lower than the analog signal potential inputted in the pixel in the period where the signal is written to the pixel, the output of the inverter becomes at H level to emit light. Therefore, as an analog signal potential inputted to a pixel in a period where a signal is written to the pixel becomes higher, a period where the analog signal potential is higher than a triangle wave potential supplied in a light emitting period of the pixel becomes longer. Therefore, a light emitting period also becomes longer. Accordingly, the number of gradations also increases. On the other hand, as an analog signal potential inputted to a pixel in the period where the signal is written to the pixel becomes lower, a period where the analog signal potential is higher than a triangle wave potential supplied in the light emitting period of the pixel becomes shorter. Therefore, a light emitting period also becomes shorter. Accordingly, the number of gradations also decreases.

Figure 60:
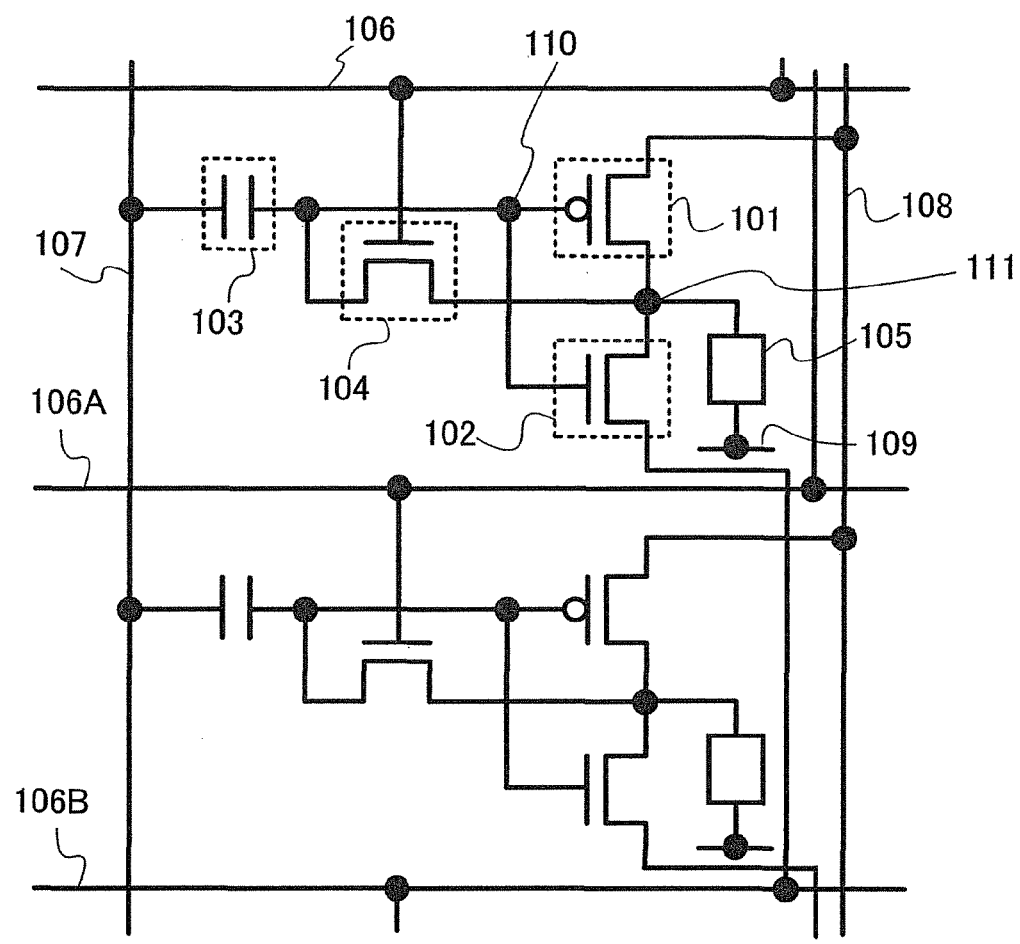
FIG. 60 is a diagram showing a pixel configuration of the invention.

Note that a pixel described in this embodiment mode is not limited to the configuration of FIG. 1, and the first terminal (one of the source terminal or the drain terminal) of the complementary transistor 102 may be connected to a scan line of pixels of an arbitrary another row. For example, as shown in FIG. 60, the first terminal (one of the source terminal or the drain terminal) of the complementary transistor 102 may be connected to a scan line 106B for controlling on/off of a switching transistor in a pixel of the two adjacent row.

Figure 2:
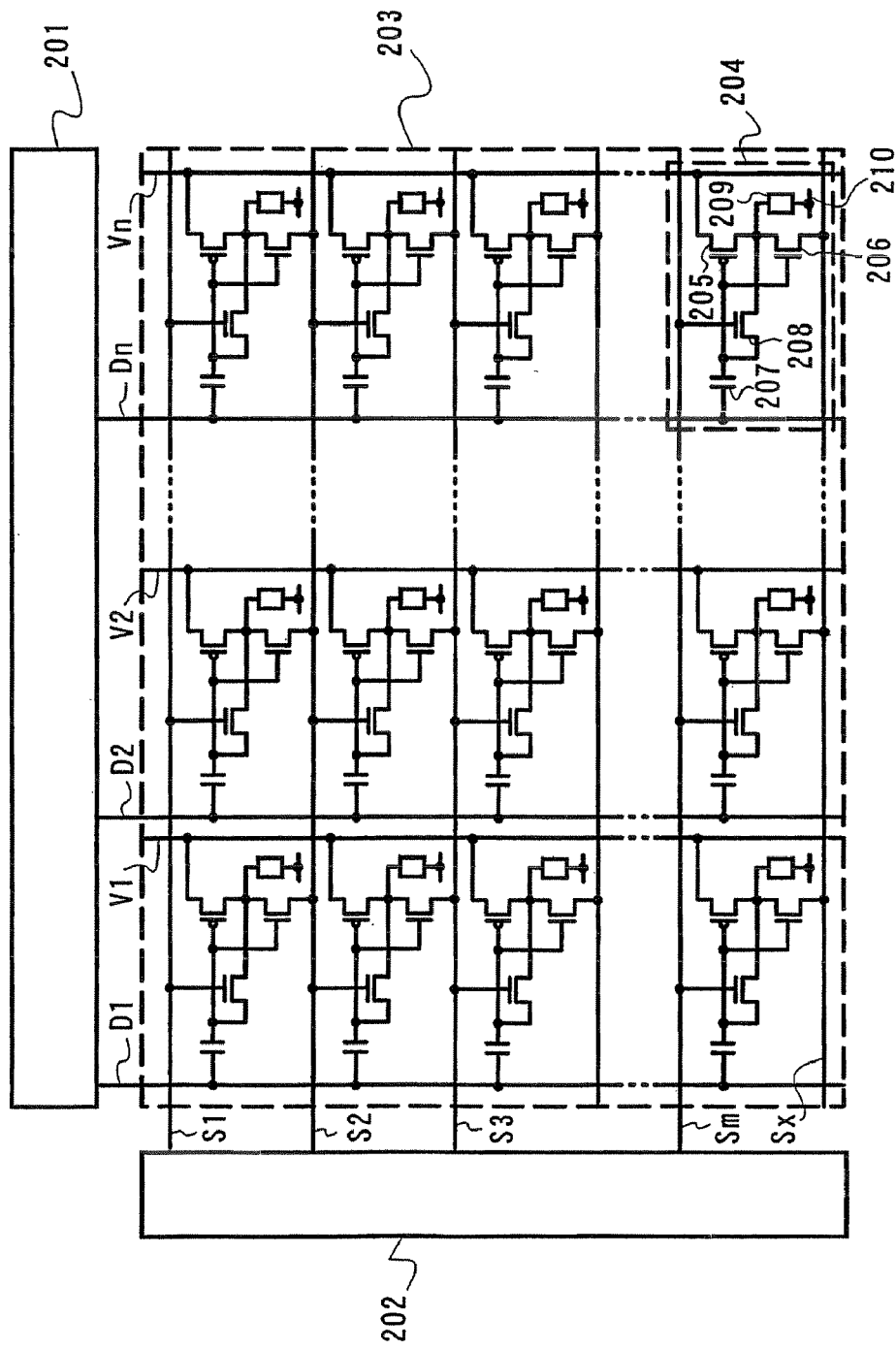
FIG. 2 is a diagram describing a display device having a pixel configuration of the invention.

Description is made on a display device having the pixel configuration in FIG. 1 in a pixel portion with reference to FIG. 2. The display device in FIG. 2 has a signal line driver circuit 201, a scan line driver circuit 202, and a pixel portion 203 having a plurality of pixels 204. The pixels 204 are arranged in matrix corresponding to scan lines (Select lines) S1 to Sm arranged in a row direction and signal lines (Data lines) D1 to Dn arranged in a column direction.

The pixel 204 has a driving transistor (a second transistor) 205, a complementary transistor (a third transistor) 206, a capacitor 207, a switching transistor (a first transistor) 208, a light emitting element 209, a scan line Si (one of S1 to Sm), a signal line Dj (one of D1 to Dn), and a power source line Vj (one of V1 to Vn). Note that a P channel transistor is used for the driving transistor 205 while N channel transistors are used for the complementary transistor 206 and the switching transistor 208. Note that the pixel 204 shows one pixel among the plurality of pixels arranged in the pixel portion 203.

A first terminal (one of a source terminal or a drain terminal) of the driving transistor 205 is connected to the power source line Vj, a second terminal (the other of the source terminal or the drain terminal) thereof is connected to a second terminal (one of a source terminal or a drain terminal) of the complementary transistor 206, and a gate terminal of the driving transistor 205 is connected to a gate terminal of the complementary transistor 206. Further, the gate terminals of the driving transistor 205 and the complementary transistor 206 are connected to the signal line Dj through the capacitor 207, and connected to the second terminals (each one of the source terminal or the drain terminal) of the driving transistor 205 and the complementary transistor 206 through the switching transistor 208. That is, a first terminal (one of a source terminal or a drain terminal) of the switching transistor 208 is connected to the second terminals (each one of the source terminal or the drain terminal) of the driving transistor 205 and the complementary transistor 206, and a second terminal of the switching transistor 208 is connected to the gate terminals of the driving transistor 205 and the complementary transistor 206. Therefore, turning on/off the switching transistor 208 can make a portion between the gate terminals and the second terminals (each one of the source terminal or the drain terminal) of the driving transistor 205 and the complementary transistor 206 conductive/non-conductive. Then, a signal is inputted to the scan line Si to which a gate terminal of the switching transistor 208 is connected, thereby controlling on/off of the switching transistor 208. Further, the second terminals (each one of the source terminal or the drain terminal) of the driving transistor 205 and the complementary transistor 206 are connected to an anode of the light emitting element 209. In addition, a cathode of the light emitting element 209 is connected to a wire (Cathode) 210 to which a low power source potential Vss is supplied. Note that Vss is a potential satisfying Vss<Vdd based on a power source potential Vdd supplied to the power source line Vj. For example, Vss=GND (ground potential) may be used.

In addition, a first terminal of the complementary transistor 206 is connected to a scan line S(i+1) of pixels of another row. Note that in the case where the first terminal of the complementary transistor 206 is connected to a scan line for selecting pixels of the subsequent row as the display device shown in FIG. 2, only a wire Sx for supplying a potential to the first terminals of the complementary transistors of pixels of the last row may be provided in addition to the scan lines S1 to Sm.

In addition, a power source potential supplied to the power source lines V1 to Vn is not limited to Vdd, and for example, in the case of a full color display formed of color elements of RGB, a value of a power source potential supplied to respective pixels for displaying each color element of RGB may be changed as well.

Figure 43:
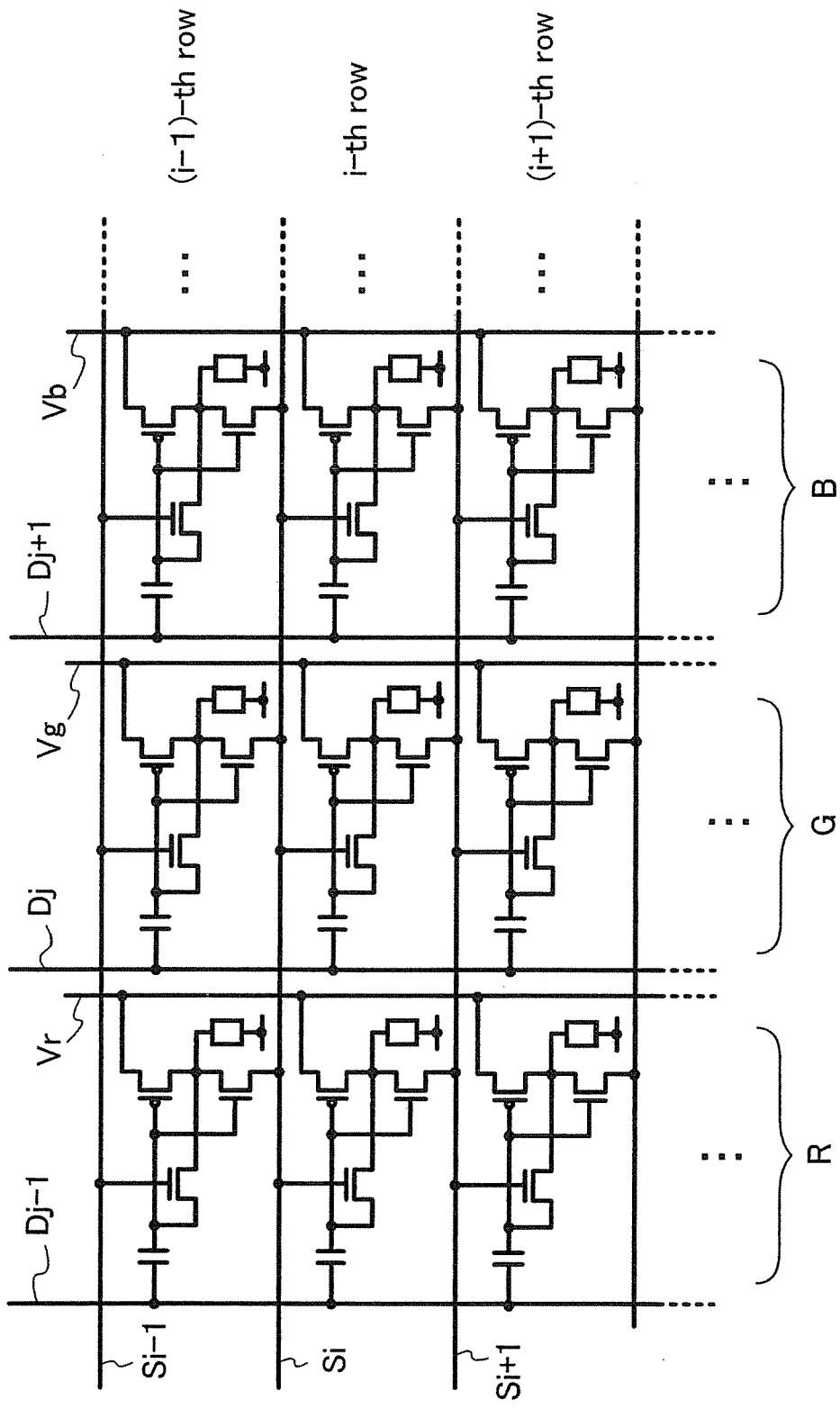
FIG. 43 is a diagram describing a display device having a pixel configuration of the invention.

Here, description is made on a case having a power source line to which supply a power source potential different from each pixel column of the color elements of R, G, and B with reference to FIG. 43.

FIG. 43 is a diagram showing a part of the pixel portion 203 in FIG. 2. A pixel configuration shown in FIG. 43 is the same configuration as the pixel 204 in FIG. 2 other than a power source line, therefore, reference numerals of a driving transistor (a second transistor), a complementary transistor (a third transistor), a capacitor, a switching transistor (a first transistor), and a light emitting element which form each pixel are omitted. Therefore, as for reference numerals of these elements forming a pixel, see FIG. 2 and the description thereof. In FIG. 43, pixels of the i-row (one of 1 to m rows) have power source lines Vr, Vg, and Vb. Then, in pixels of a column of a color element of R, the first terminals of the driving transistors 205 are connected to Vr, in pixels of a column of a color element of G, the first terminals of the driving transistors 205 are connected to Vg, and in pixels of a column of a color element of B, the first terminals of the driving transistors 205 are connected to Vb. A potential Vdd1 for supplying a desired current to the light emitting elements 209 of the pixel column of the color element of R is supplied to the power source line Vr in a light emitting period. A potential Vdd2 for supplying a desired current to the light emitting elements 209 of the pixel column of the color element of G is supplied to the power source line Vg in the light emitting period. A potential Vdd3 for supplying a desired current to the light emitting elements 209 of a pixel column of the color element of B is supplied to the power source line Vb in the light emitting period. Thus, a voltage applied to the light emitting element 209 of a pixel can be set for each color element. As a result, a voltage different from each light emitting color of a light emitting element can be applied. Therefore, luminance of each light emitting color of the light emitting element can be controlled individually. Note that color elements are not limited to RGB, four color elements of R (red), G (green), B (blue), and W (white) may be used to perform a full color display as well. In this case, a voltage applied to a light emitting element can be changed for each color similarly.

Figure 3:
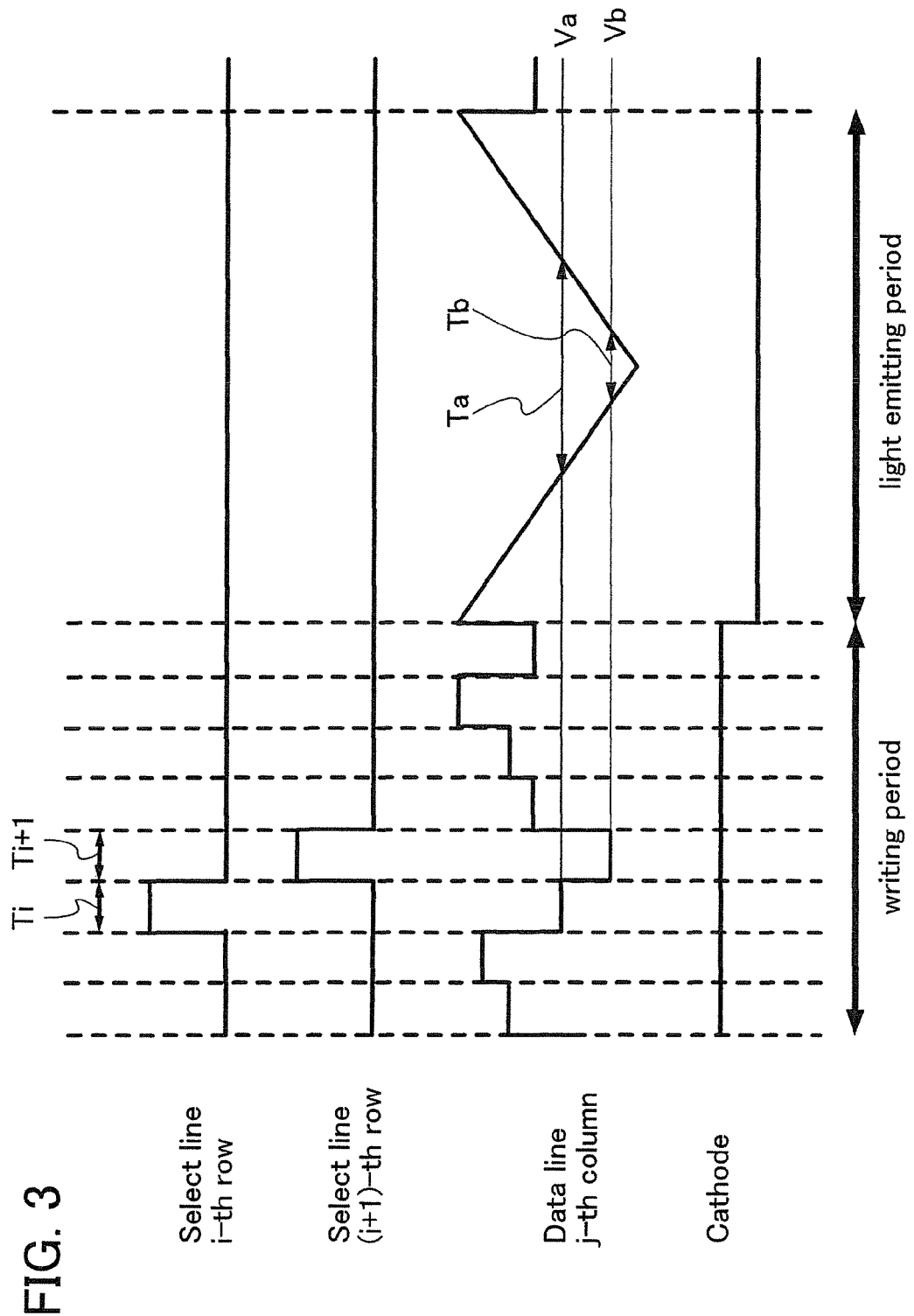
FIG. 3 is a diagram showing a timing chart of a display device having a pixel configuration of the invention.

Next, description is made on a principal of operation of the display device of the invention with reference to FIGS. 2 and 3. FIG. 3 is a diagram showing a timing chart of a pixel column (the j-th column) in the pixel portion 203 of the display device in FIG. 2. Note that a plurality of pixels arranged in the pixel portion 203 have similar configurations to that of the pixel 204, therefore, a driving transistor, a complementary transistor, a capacitor, a switching transistor, and a light emitting element of each pixel are described using the same reference numerals to those of the pixel 204.

As shown in FIG. 3, in a writing period, an analog signal potential is inputted to the Data line (signal line Dj) of pixels of the j-th column. Then, in a period Ti where a signal is written to pixels of the i-th row, when a pulse signal (H level) is inputted to Select line of the i-th row (scan line Si), the switching transistor 208 of pixels of the i-th row is turned on, and a current flows to the driving transistor 205, the complementary transistor 206, and the light emitting element 209. Note that at this time, Select line of the (i+1)-th row (scan line S(i+1)) remains at L level.

Then, accumulation or discharge of charge in the capacitor 207 of a pixel of the i-th row is performed. That is, either of accumulation or discharge of charge is performed depending on a relation between a charge originally accumulated in the capacitor 207 and a potential (Va) supplied to the Data line (signal line Dj).

Then, accumulation or discharge of charge in the capacitor 207 is completed, then, a current flowing to the driving transistor 205, the complementary transistor 206, and the light emitting element 209 becomes constant. At this time, a steady state may not be reached completely. An input potential (gate potentials of the driving transistor 205 and the complementary transistor 206) required to control an output level of the inverter formed of the driving transistor 205 and the complementary transistor 206 (second terminal potentials of the driving transistor 205 and the complementary transistor 206) is required to be obtained. Preferably, at this time, the driving transistor 205 and the complementary transistor 206 may be operated in a saturation region.

After that, the Select line (scan line Si) is at L level to turn off the switching transistor 208. Then, the capacitor 207 holds a potential difference between the input potential of the inverter (the gate potentials of the driving transistor 205 and the complementary transistor 206) required to control the output level of the inverter (the second terminal potentials of the driving transistor 205 and the complementary transistor 206) and an analog signal potential supplied to the Data line (signal line Dj) at the moment of turning off the switching transistor 208.

In this manner, in the period Ti where a signal is written to the pixels of the i-th row, an analog signal potential Va is supplied from the Data line (signal line Dj) to a pixel of the i-th row and the j-the column to write a video signal. Then, in the period Ti where a signal is written to pixels of the i-th row, respective analog signal potentials are supplied from Data lines (signal lines D1 to Dn) to each pixel column to write video signals into each pixel of the i-th row of each column.

Next, in a period (Ti+1) where a signal is written to pixels of the (i+1)-th row, a pulse signal (H level) is supplied to the Select line (scan line S(i+1)), a potential (Vb) is supplied to the Data line (signal line Dj) of a pixel of the (i+1)-th row and the j-th column, and a video signal is written to the pixel of the (i+1)-th row and the j-th column. Note that at this time, respective analog signal potentials are supplied from Data lines (signal lines D1 to Dn) to each pixel column to write video signals into each pixel of the (i+1)-th row of each column. At this time, the Select line of the (i+2)-th pixel row (scan line S(i+2)) is at L level.

In this manner, when pulse signals (H level) are inputted to the Select lines (scan lines S1 to Sm) of respective rows of pixels, and video signals are written to each pixel, a period where signals are written to the pixel portion 203 in one frame period is completed.

Note that in FIG. 3, pulse signals are supplied to the Select lines (scan lines S1 to Sm) sequentially from S1, S2, S3, . . . , to Sm, and pixels are selected from the first row, the second row, the third row, . . . , to the m-th row. However, the invention is not limited thereto. Pulse signals may be supplied to the Select lines (scan lines S1 to Sm) sequentially from Sm, Sm−1, Sm−2, . . . , to S1, so that pixels may be selected from the m-th row, the (m−1)-th row, the (m−2)-th row, . . . , to the first row. If a scan is performed in this manner, a defect of signal writing to a pixel due to dullness of a signal supplied to the Select lines (scan lines S to Sm) can be prevented.

Figure 53:
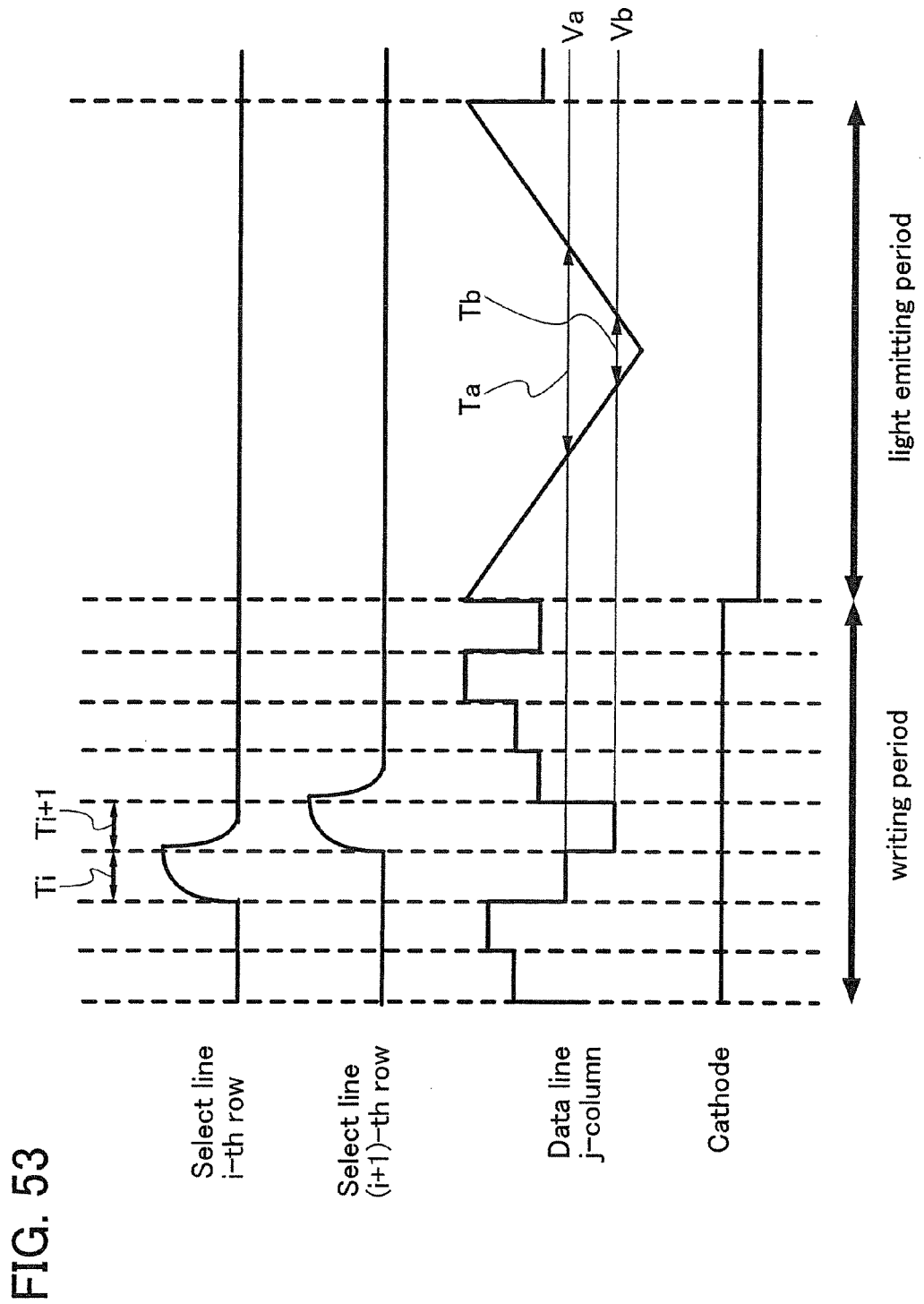
FIG. 53 is a diagram showing a timing chart of a display device having a pixel configuration of the invention.

Here, FIG. 53 shows a timing chart in the case where dullness occurs in pulse signals supplied to the Select line of the i-th row (scan line Si) and the Select line of the (i+1)-th row (scan line S(i+1)) in FIG. 3. When dullness occurs in a pulse signal, rising and falling edges of a signal delay. Therefore, even passing the period Ti where a signal is written to pixels of the i-th row, a Select line (scan line Si) potential does not decrease to an L level potential for turning off the switching transistor 208. Therefore, signal rising of the Select line of the (i+1)-th row (scan line S(i+1)) starts while the switching transistor 208 is still on. Then, a potential to be as a standard for an L level output potential of the inverter is changed so that inverter characteristics are changed. Thus, a signal writing to the pixel is not performed normally.

Figure 54:
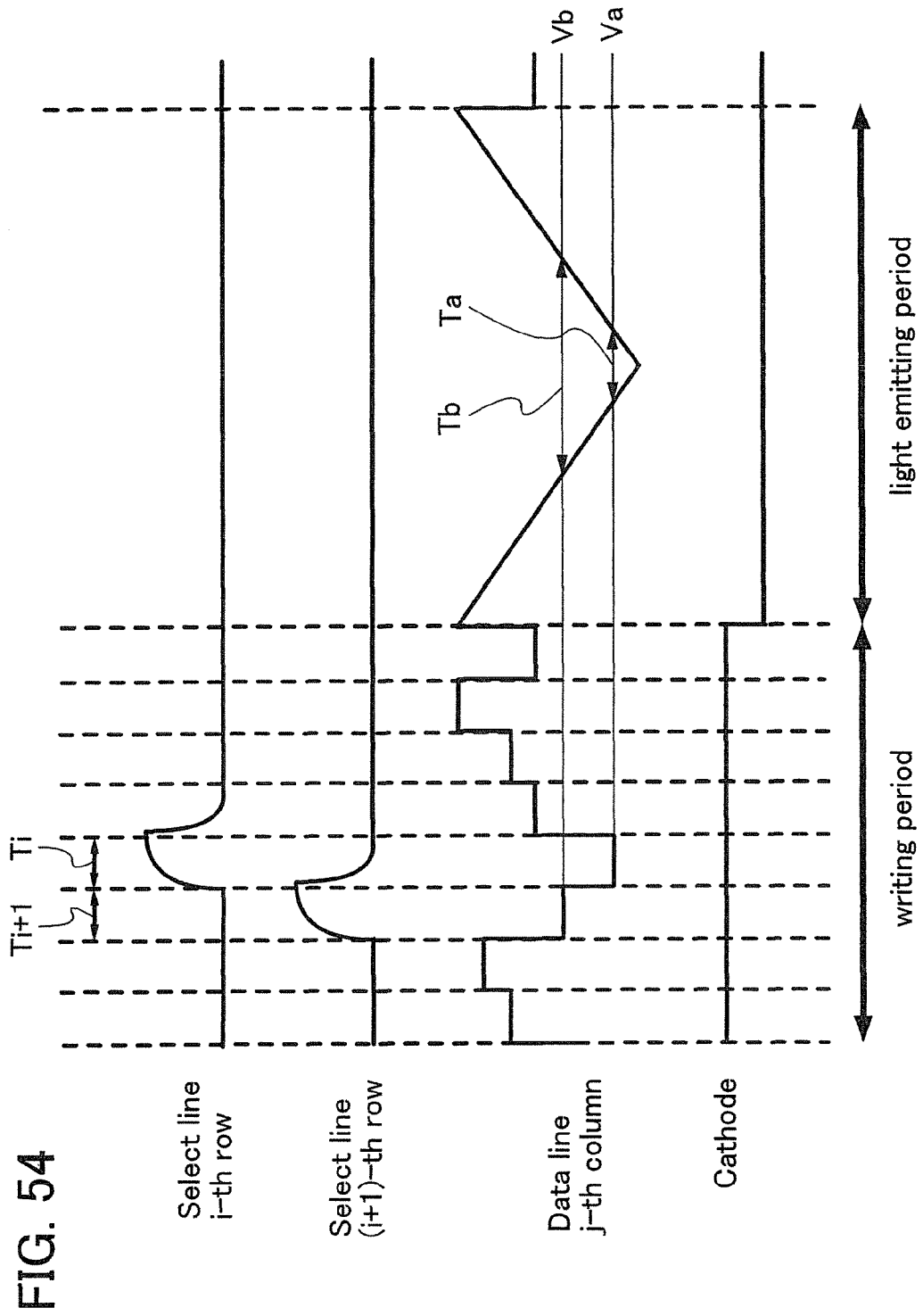
FIG. 54 is a diagram showing a timing chart of a display device having a pixel configuration of the invention.

Next, FIG. 54 shows a timing chart in the case where dullness occurs in pulse signals supplied to the Select line of the i-th row (scan line Si) and the Select line of the (i+1)-th row (scan line S(i+1)) in the case of a scan direction of pixels is inverted. In this case, a signal is written to pixels from the m-th row, therefore, after a signal is written to pixels of the (i+1)-th row, a writing is performed pixels of the i-th row. That is, after a pulse signal is supplied to the Select line of the (i+1)-th row (scan line S(i+1)), a pulse signal is supplied to the Select line of the i-th row (scan line Si). Here, falling of the pulse signal supplied to the Select line of the (i+1)-th row (scan line S(i+1)) delays, in the first half of the period Ti where a signal is written to pixels of the i-th row, the potential to be as a standard for the L level output potential of the inverter is changed so that inverter characteristics are changed. However, the latter half of the period Ti, the L level potential to be as the standard of the output potential of the inverter becomes normal. Thus, a signal writing to pixels can be performed normally.

Subsequently, in a light emitting period, a triangle wave potential is supplied to the Data lines (signal lines D1 to Dn). Then, in the pixel of the i-th row and the j-th column, when the Data line (signal line Dj) is a higher potential than Va, the light emitting element 209 keeps a non-light emission state, and in a period (Ta) where a potential of the Data line (signal line Dj) is a lower potential than Va, the light emitting element 209 emits light. In addition, in the pixel of the (i+1)-th row and the j-th column, the light emitting element 209 similarly emits light in a period (Tb).

Note that after completing a period where signals are written to pixels, during a period where a potential higher than an analog signal potential when an analog signal is written is supplied to the Data line (one of the signal lines D1 to Dn), the light emitting element 209 emits no light, and when the potential becomes lower than the analog signal potential when the signal is written, the light emitting element 209 emits. A detail principal thereof is the same as the description made with reference to the pixel configuration in FIG. 1. Therefore, description is omitted here.

Note that a low power source potential supplied to the Cathode (wire 210) may be different between a period where a signal is written to the pixel and a light emitting period of the pixel. As shown in FIG. 3, a potential of the Cathode (wire 210) in the period where a signal is written to the pixel may be preferably higher than a potential of the Cathode (wire 210) in the light emitting period. That is, the potential of the Cathode (wire 210) in the period where a signal is written to the pixel is Vss2 while the potential of the Cathode (wire 210) in the light emitting period is Vss. Then, at this time, Vss2>Vss. For example, Vss=GND (ground potential) may be used.

In this manner, by setting higher a potential of the Cathode (wire 210) in the period where a signal is written to the pixel, a display defect due to that the light emitting element 209 emits light can be prevented from occurring. In addition, power consumption in the period where a signal is written to the pixel can be reduced.

Further, by setting the potential of the Cathode (wire 210) arbitrary, a current cannot flow to the light emitting element 209 in the period where a signal is written to the pixel. Light emission of the light emitting element 209 in the signal writing period is prevented so that correct gradation of an image can obtained, as well as power consumption can be reduced further. For example, a medium potential between a potential supplied to the power source lines V1 to Vn and a potential supplied to the scan lines S1 to Sm or the redundancy wire Sx is set. That is, this potential is an ideal logic threshold potential of the inverter formed of the driving transistor 205 and the complementary transistor 206. When the potential of the cathode (wire 210) is set to the ideal logic threshold potential of the inverter, even if inverter transfer characteristics vary to some extent per pixel, there is a forward threshold voltage $V_{EL}$ of the light emitting element 209. Accordingly, a current does not flow to the light emitting element 209 and the amplitude of the potential of the Cathode (wire 210) is small, therefore, power consumption is not so large.

Figure 52:
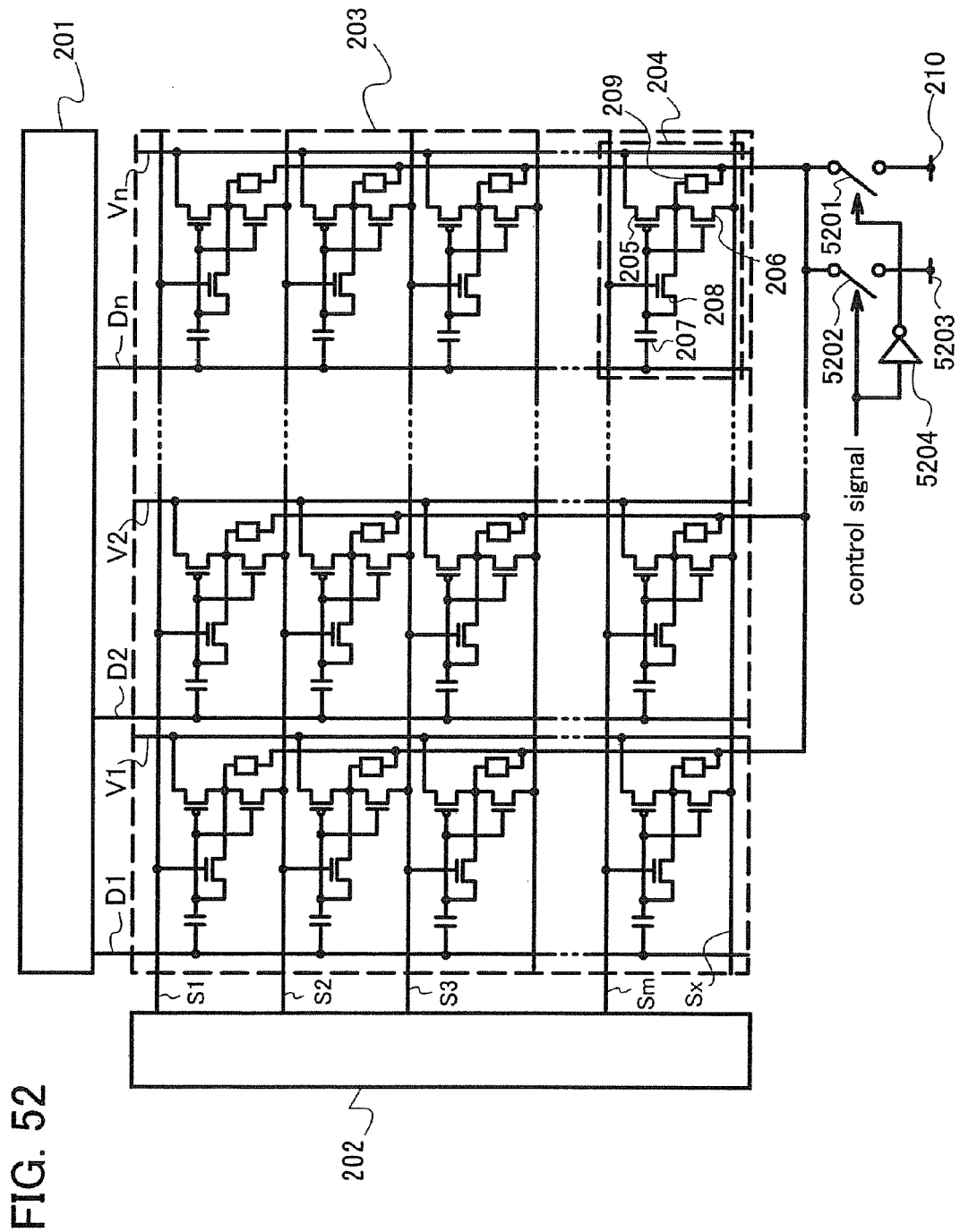
FIG. 52 is a diagram describing a display device having a pixel configuration of the invention.

Moreover, a wire connected to the cathode of the light emitting element 209 may be connected to another wire in a signal writing period. For example, as shown in FIG. 52, the cathode of the light emitting element 209 may be connected to the Cathode (wire 210) through a first switch 5201 and to a second wire 5203 through a second switch 5202. Then, respective control signals for controlling on/off of the first switch 5201 and the second switch 5202 are inverted signals each other. In a configuration in FIG. 52, a control signal is inputted to the second switch 5202 directly while a control signal is inputted to the first switch 5201 through an inverter 5204. That is, a level of the control signal is inverted to be inputted to the first switch 5201. In this manner, the cathode of the light emitting element 209 can be connected either the wire 210 or the second wire 5203. Therefore, in a signal writing period, the cathode of the light emitting element 209 may be connected to the second wire 5203 to which a potential higher than the potential Vss supplied to the wire 210 is supplied, thereby a defective image can be prevented, as well as power consumption can be reduced.

Figure 51:
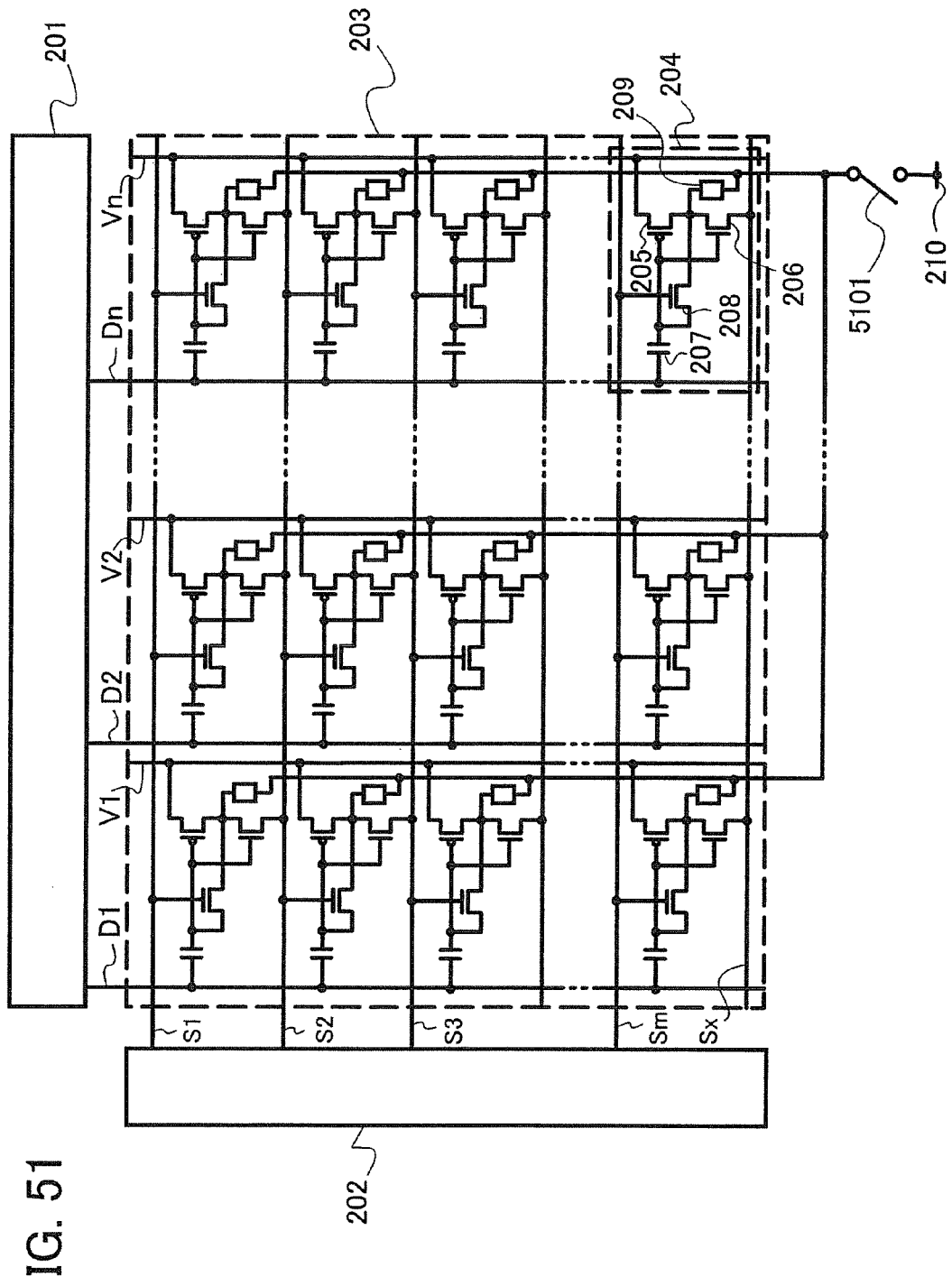
FIG. 51 is a diagram describing a display device having a pixel configuration of the invention.

Further, instead of changing the potential of the Cathode (wire 210), by making the cathode of the light emitting element 209 to be a floating state, a correct gradation of an image can be obtained, as well as power consumption in the signal writing period can be reduced. For example, as shown in FIG. 51, the cathode of the light emitting element 209 is connected to the Cathode (wire 210) through a switch 5101, the switch 5101 is turned on to supply the low power source potential Vss to the cathode of the light emitting element 209, and the switch 5101 is turned off so that the cathode of the light emitting element 209 can be made the floating state. Note that except that the cathode of the light emitting element 209 is connected to the wire 210 through the switch 5101, other configuration of the pixel is the same as that in FIG. 2, therefore, see the description in FIG. 2 for details.

In this manner, in a light emitting period, a triangle wave potential is supplied to the signal lines D1 to Dn of all pixels, and light emitting time of the light emitting element 209 is set in accordance with each analog signal potential when an analog signal is written in a writing period. In this manner, an analog time gradation display can be performed. Since light emitting time is controlled in an analog manner, a pseudo contour does not occur unlike a case of controlling light emitting time in a digital manner. Accordingly, a clear display without image quality defect can be performed.

Note that an output level of the inverter for controlling light emission/non-light emission of the light emitting element 209 is determined whether an analog signal potential supplied to the Data lines (signal lines D1 to Dn) in a writing period is higher or lower than a triangle wave potential inputted to the Data lines (signal lines D1 to Dn) in a light emitting period as described above, thereby controlling in a digital manner. Therefore, the light emission/non-light emission of the light emitting element 209 can be controlled with a small effect of characteristic variations of the driving transistor 205 and the complementary transistor 206. That is, variations of light emission in each pixel can be improved.

Particularly, the inverter in a pixel is formed of the driving transistor 205 which is a P channel transistor and the complementary transistor 206 which is an N channel transistor, therefore, even when transistor characteristics of the driving transistor 205 and the complementary transistor 206 vary and inverter transfer characteristics vary to some extent in each pixel, the pixel configuration described in this embodiment mode can control the light emission/non-light emission of the light emitting element 209 with the small effect of these.

Figures 11A, 11B:
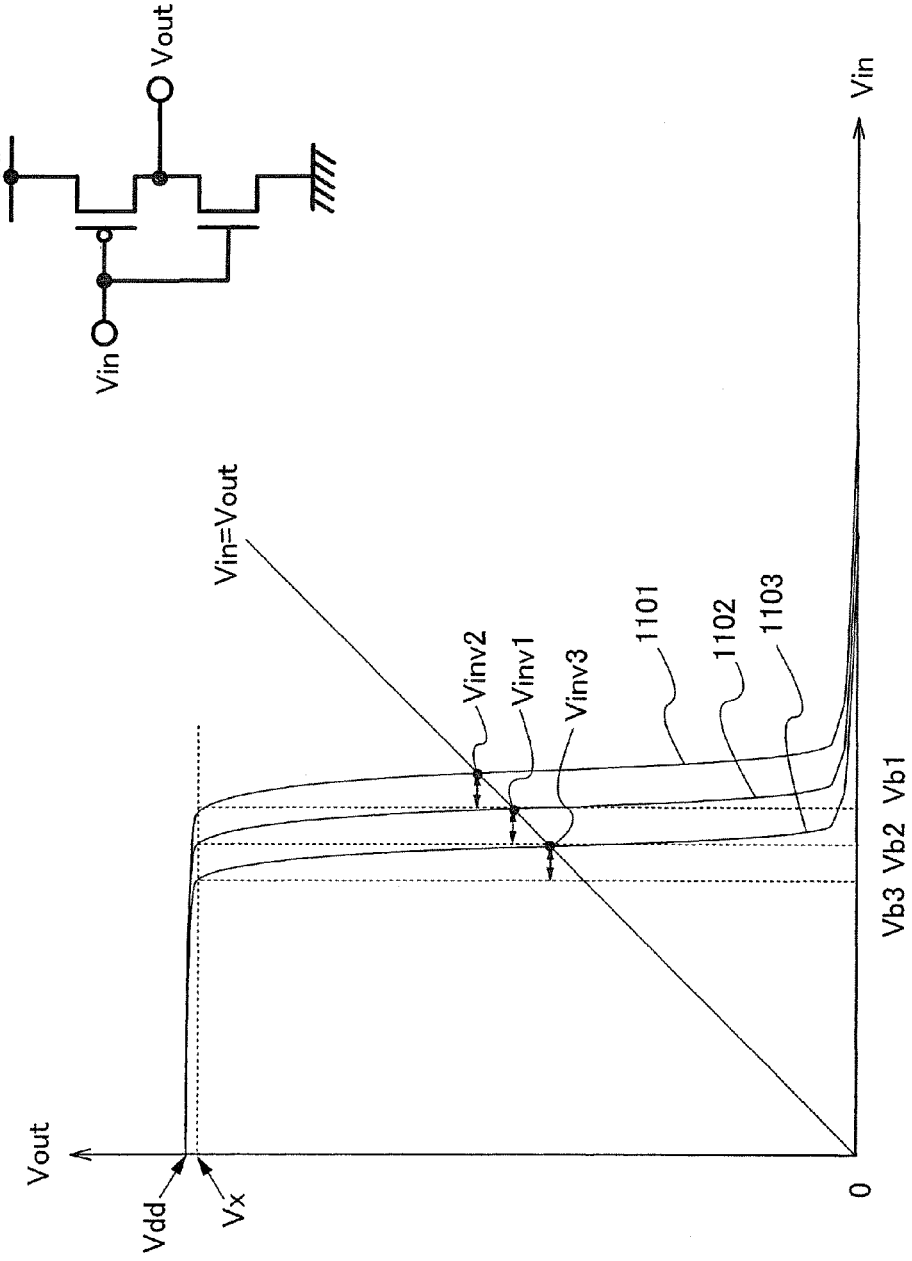
FIGS. 11A and 11B are diagrams each showing a pixel configuration of a display device of the invention.

Here, FIG. 11B shows a CMOS inverter which is a P channel transistor and an N channel transistor while FIG. 11A shows characteristics thereof. The abscissa in FIG. 11A indicates an input potential Vin into an input terminal of the CMOS inverter and the ordinate indicates an output potential Vout from an output terminal of the CMOS inverter. The CMOS inverter includes a P channel transistor and an N channel transistor, and a high power source potential Vdd is supplied to a source terminal of the P channel transistor while a low power source potential Vss is supplied to a source terminal of the N channel transistor. Note that, here, Vss=0 V. Further, gate terminals of the P channel transistor and the N channel transistor are connected to each other and drain terminals thereof are connected to each other, the gate terminals are an input terminal of the CMOS inverter while the drain terminals are an output terminal of the CMOS inverter.

A curve 1101 shown in FIG. 11A shows CMOS inverter transfer characteristics in the case where a current supply capacity of the P channel transistor is higher than that of the N channel transistor, a curve 1103 shows CMOS inverter transfer characteristics in the case where the current supply capacity of the P channel transistor is lower than that of the N channel transistor, and a curve 1102 shows CMOS inverter transfer characteristics in the case where the current supply capacity of the P channel transistor is equivalent to that of the N channel transistor.

That is, when an input potential is sufficiently high and the transistor is in an off-state, a potential of the output terminal of the CMOS inverter becomes a potential of 0 V. At this time, the N channel transistor is turned on in a linear region while the P channel transistor is turned off. Then, as the input potential becomes gradually lower, the P channel transistor is turned on in a saturation region. At this time, when current supply capacities of the P channel transistor and the N channel transistor are equivalent, CMOS inverter transfer characteristics similarly to the curve 1102 is shown, and when the current supply capacity of the P channel transistor is higher than that of the N channel transistor, the CMOS inverter transfer characteristics shift to the curve 1101 side. On the other hand, when the current supply capacity of the P channel transistor is lower than that of the N channel transistor, the CMOS inverter transfer characteristics shift to the curve 1103 side.

In this manner, even if the inverter transfer characteristics vary, in the case of the CMOS inverter, a ratio of an output potential variation is high. Therefore, as well as a period where from a time when the P channel transistor is turned on in a saturation region to a time when the P channel transistor is turned off and the output potential of the CMOS inverter becomes Vx, a period from respective input potentials Vinv1, Vinv2, and Vinv3 of the CMOS inverters that portions between input terminals and output terminals become conductive and are offset-cancelled to respective input potentials Vb1, Vb2, and Vb3 when output potentials of the CMOS inverters become Vx varies little in each pixel different in the CMOS inverter transfer characteristics.

Accordingly, when the pixel configuration shown in this embodiment mode is applied, effects of characteristic variations of a transistor between pixels can be reduced and a clear display can be performed. In addition, an aperture ratio of a pixel can be increased, thereby suitably applying to a high definition display.

Figure 12:
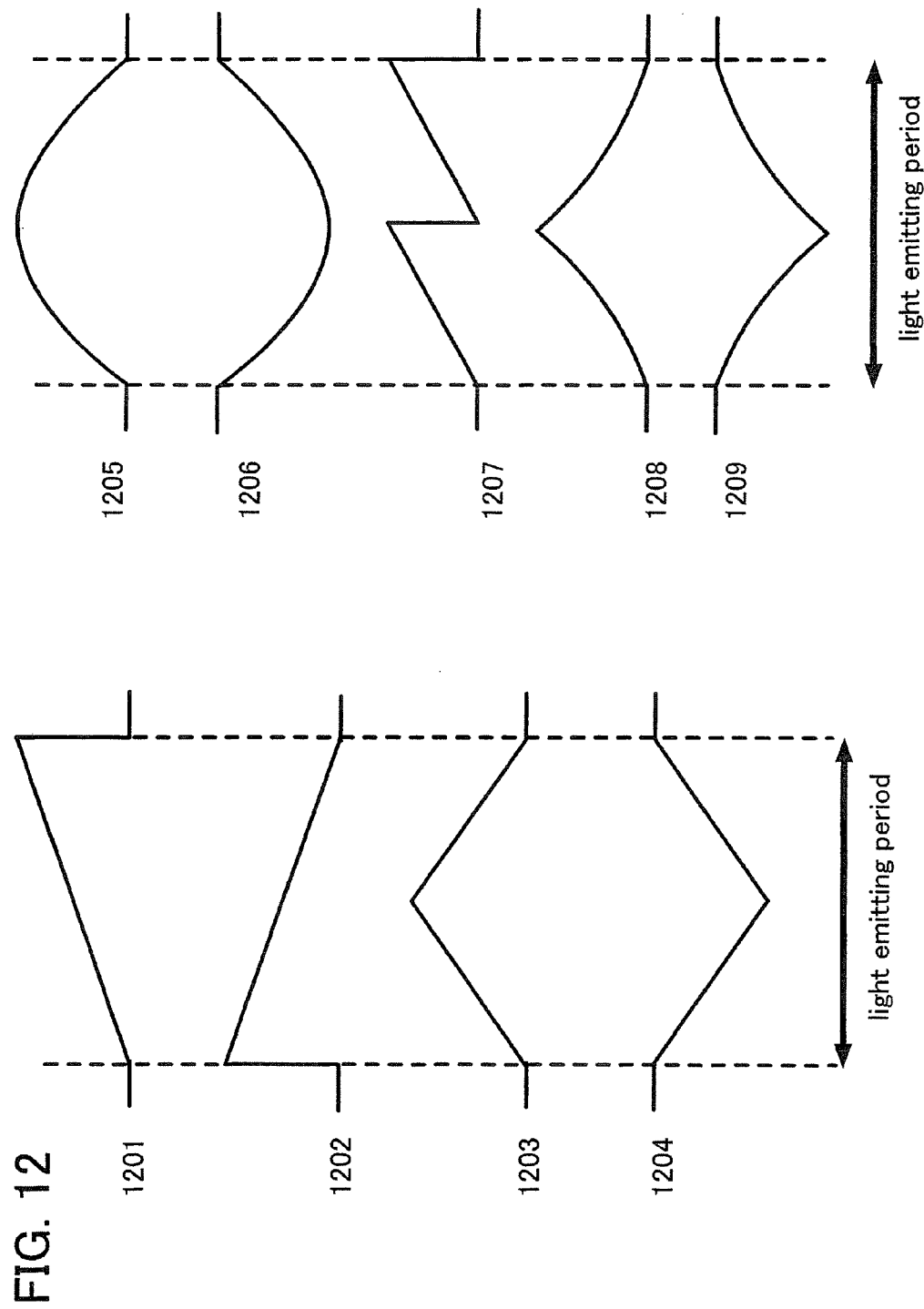
FIG. 12 is a diagram describing waveforms changing periodically.

Note that in a light emitting period, as shown in FIG. 12, a potential may be supplied to the Data lines (signal lines D1 to Dn) such as the waveform 1201, the waveform 1202, the waveform 1203, the waveform 1204, the waveform 1205, the waveform 1206, the waveform 1208, the waveform 1209, or a plurality of these in succession.

By supplying in succession, the light emitting time can be divided in one frame. As a result, frame frequency seems to be improved so that a screen flicker can be prevented.

Figures 62A, 62B:
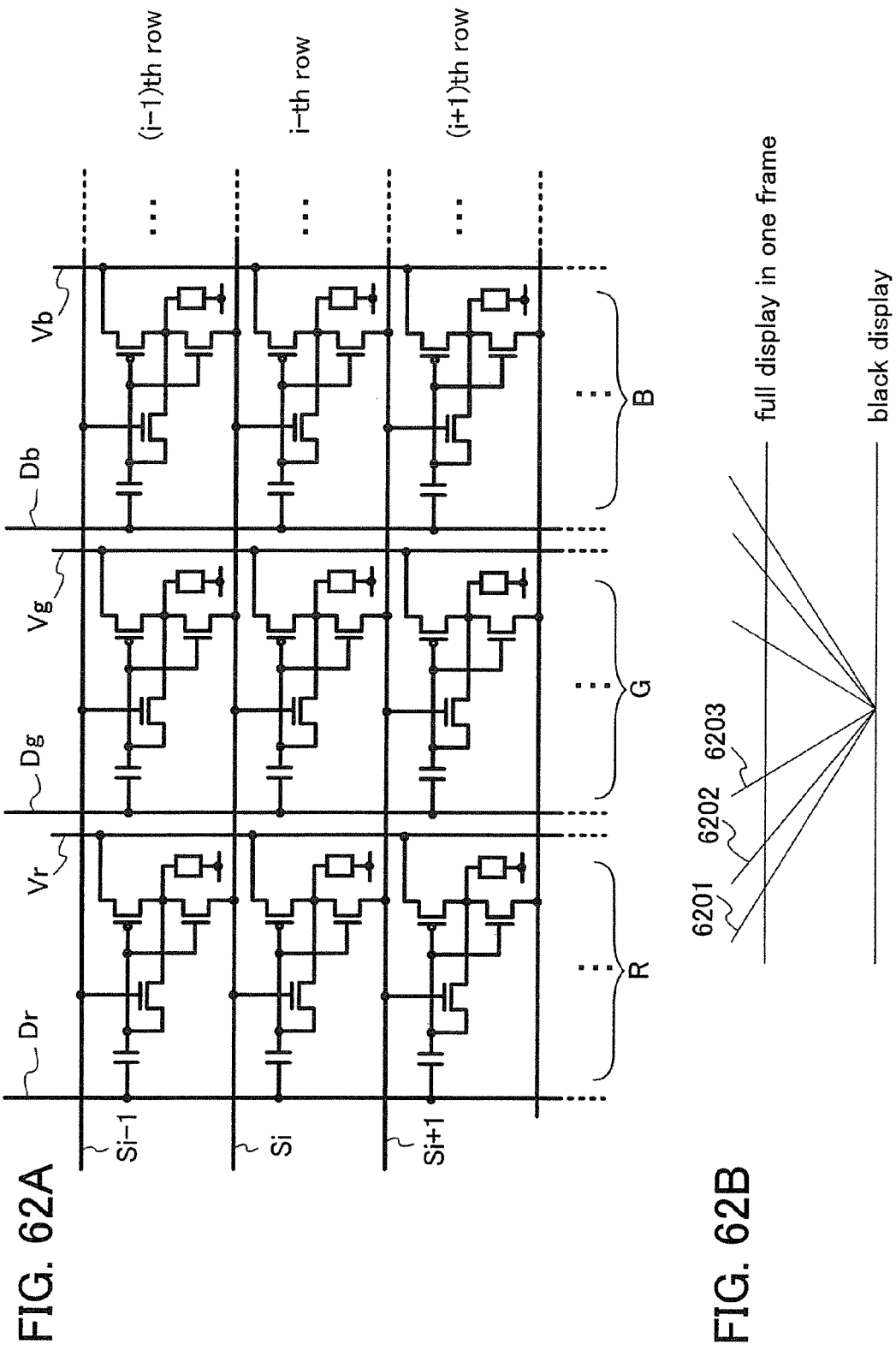
FIG. 62A is a diagram showing a pixel configuration of the invention and FIG. 62B is a diagram showing a triangle wave potential.

Moreover, in a light emitting period, a waveform of a potential supplied to the Data lines (signal lines D1 to Dn) may be changed in each pixel of color elements. For example, in a display device having pixels of different color elements, in the case where luminance obtained from a light emitting element is different in each color even when the same voltage is applied, a potential change of a triangle wave potential may be set differently. Here, for example, description is made on a display device having pixels of color elements of RGB shown in FIG. 62A. A triangle wave potential is supplied from a signal line Dr to pixels of a color element of R, a triangle wave potential is supplied from a signal line Dg to pixels of a color element of G, and a triangle wave potential is supplied from a signal line Db to pixels of a color element of B in a light emitting period. At this time, any one of a triangle wave potential 6201, a triangle wave potential 6202, or a triangle wave potential 6203 shown in FIG. 62B is appropriately set in each color of a pixel. That is, the triangle wave potential 6201 can be set a long full-display period in one frame, therefore, such a triangle wave potential may be supplied to a signal line of a pixel in which luminance obtained from a light emitting element is low. On the other hand, the triangle wave potential 6203 is set a short full-display period in one frame, therefore, such a triangle wave potential may be supplied to a signal line of a pixel in which luminance obtained from a light emitting element is high.

In this manner, different triangle waves are supplied depending on pixels of each color, therefore, in accordance with luminance characteristics of a light emitting element of each color, light emitting time can be controlled. Therefore, a clear full color display can be performed.

Figure 63:
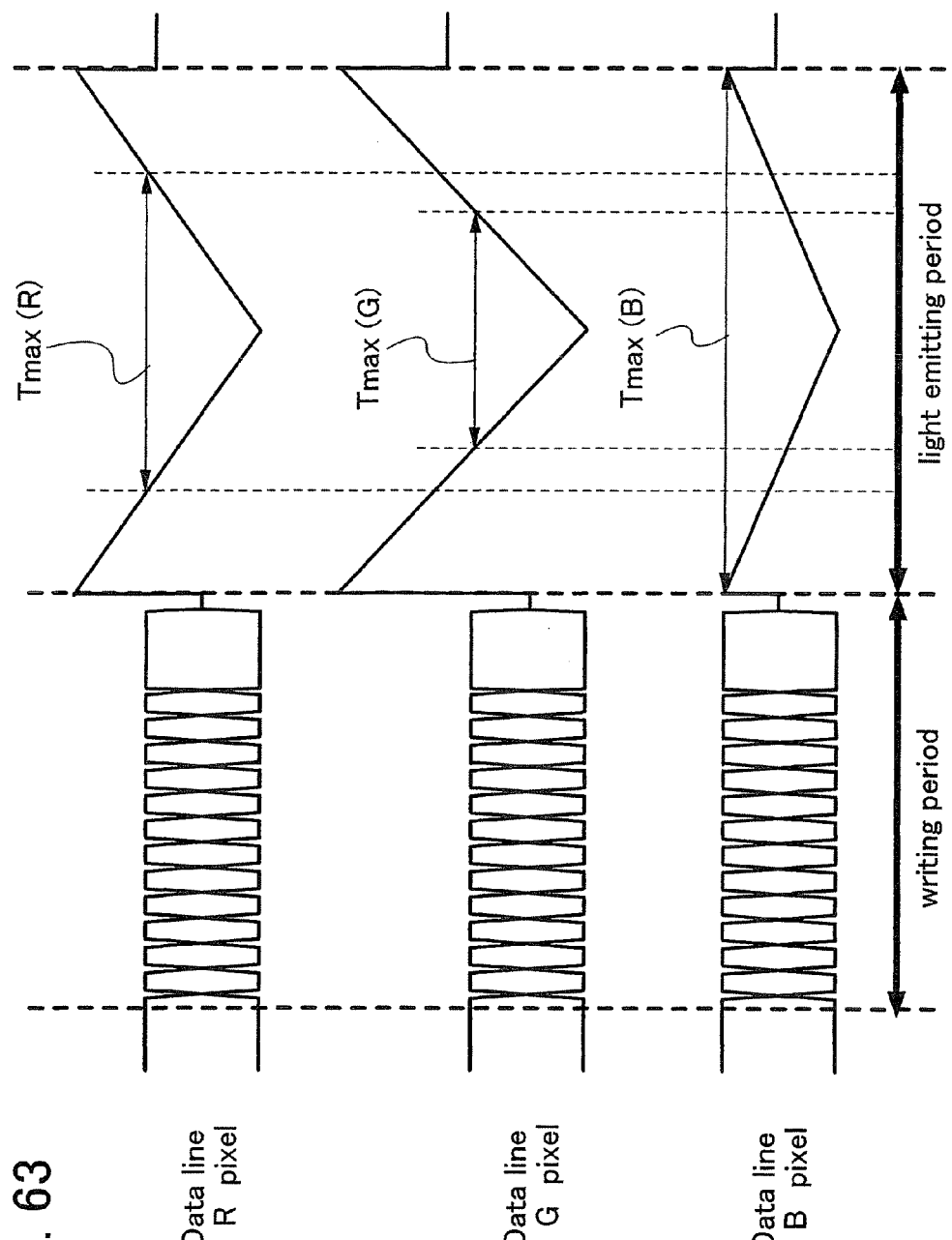
FIG. 63 is a diagram describing a relation between a signal supplied to a signal line in a writing period and a potential supplied to the signal line in a light emitting period.

Description is made on a relation between luminance characteristics of a light emitting element and a triangle wave inputted to a signal line with reference to FIG. 63. For example, based on luminance characteristics of a light emitting element of a pixel to be a color element of R, description is made on a case where luminance obtained from a light emitting element of a pixel of a color element of G is low and luminance obtained from a light emitting element of a pixel of a color element of B is high.

In this case, based on a triangle wave potential inputted to a signal line Dr (Data line R pixel), a triangle wave potential with steep gradient is inputted to a signal line Dg (Data line G pixel). That is, the amplitude of the triangle wave potential is increased. On the other hand, a triangle wave potential with slight gradient is inputted to a signal line Db (Data line B pixel). That is, the amplitude of the triangle wave potential is decreased.

In this manner, even in the case of the same gradation, light emission time can be changed depending on each color element of a pixel. For example, a display period of the maximum gradation in one frame period in a pixel of R is Tmax (R), a display period of the maximum gradation in one frame period in a pixel of G is Tmax (G), and a display period of the maximum gradation in one frame period in a pixel of B is Tmax (B).

Figure 64:
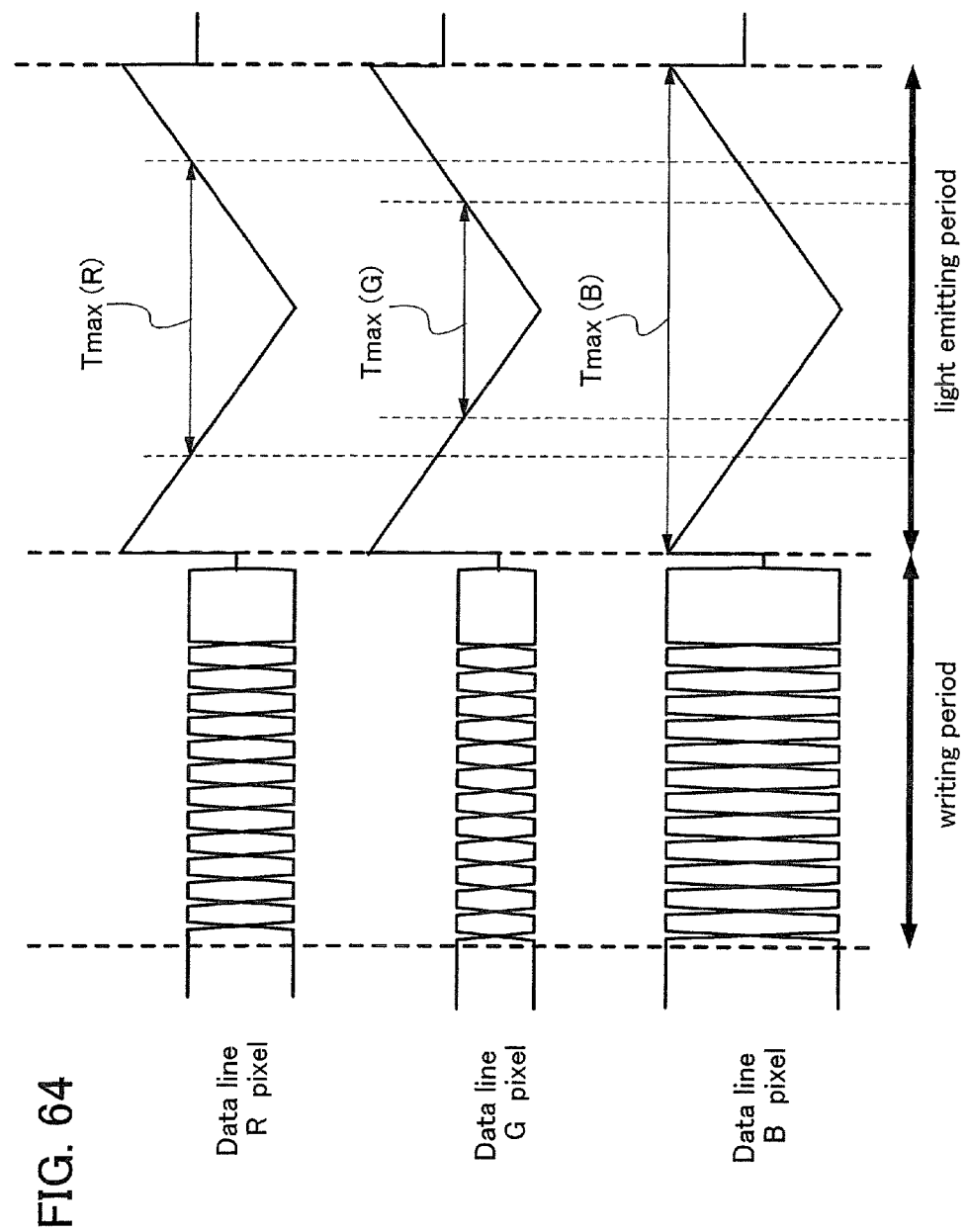
FIG. 64 is a diagram describing a relation between a signal supplied to a signal line in a writing period and a potential supplied to the signal line in a light emitting period.

Further, as other configuration, a potential width of a video signal may be changed in each color pixel. That is, as shown in FIG. 64, based on a pixel of a color element of R, in the case where luminance obtained from a light emitting element of a pixel of a color element of G is high, a potential width of a video signal of G is decreased. In addition, in the case where luminance obtained from a light emitting element of a pixel of a color element of B is low, a potential width of a video signal of B is increased. Thus, even in the case of the same gradation, light emission time can be changed depending on each color element of a pixel. For example, a display period of the maximum gradation in one frame period in a pixel of R is Tmax (R), a display period of the maximum gradation in one frame period in a pixel of G is Tmax (G), and a display period of the maximum gradation in one frame period in a pixel of B is Tmax (B).

Further, as other configuration, a configuration in which potentials corresponding to each gradation of video signals are shifted per color element and a configuration in which the amplitudes of triangle wave potentials are changed per color element may be combined. In this manner, the amplitude can be small, and power consumption can be reduced.

Moreover, in the case of a full color display, a power source line (Supply line) is provided per pixels of each color element and each power source line potential is set per color element, therefore, luminance of a light emitting element can be adjusted per color. Accordingly, even when luminance characteristics of a light emitting element are different from each color, color can be adjusted. For example, in the case of having a pixel as shown in FIG. 2, among the power source lines V1 to Vn, a potential in accordance with luminance characteristics of each color can be set to a power source line to which a potential inputted to an anode of a light emitting element of a pixel of a color element of R (red) is supplied, a power source line to which a potential inputted to an anode of a light emitting element of a pixel of a color element of G (green) is supplied, a power source line to which a potential inputted to an anode of a light emitting element of a pixel of a color element of B (blue) is supplied, and a power source line to which a potential inputted to an anode of a light emitting element of a pixel of a color element of W (white) is supplied.

In addition, as other configuration, for example, a light emitting element of white (W) is applied to a light emitting element of a pixel and a color filter is used to perform a full color display, thereby luminance obtained from each color element can be approximately equivalent.

Moreover, the pixel configuration of the invention is not limited to the configuration in FIG. 1. That is, in the configuration in FIG. 1, as for the P channel transistor and the N channel transistor which form the inverter, a scan line of another row is used instead of a wire for supplying a potential to the source terminal of the N channel transistor. However, as shown in FIG. 4, a scan line of another row may be used instead of a wire for supplying a potential to the source terminal of the P channel transistor.

Figure 4:
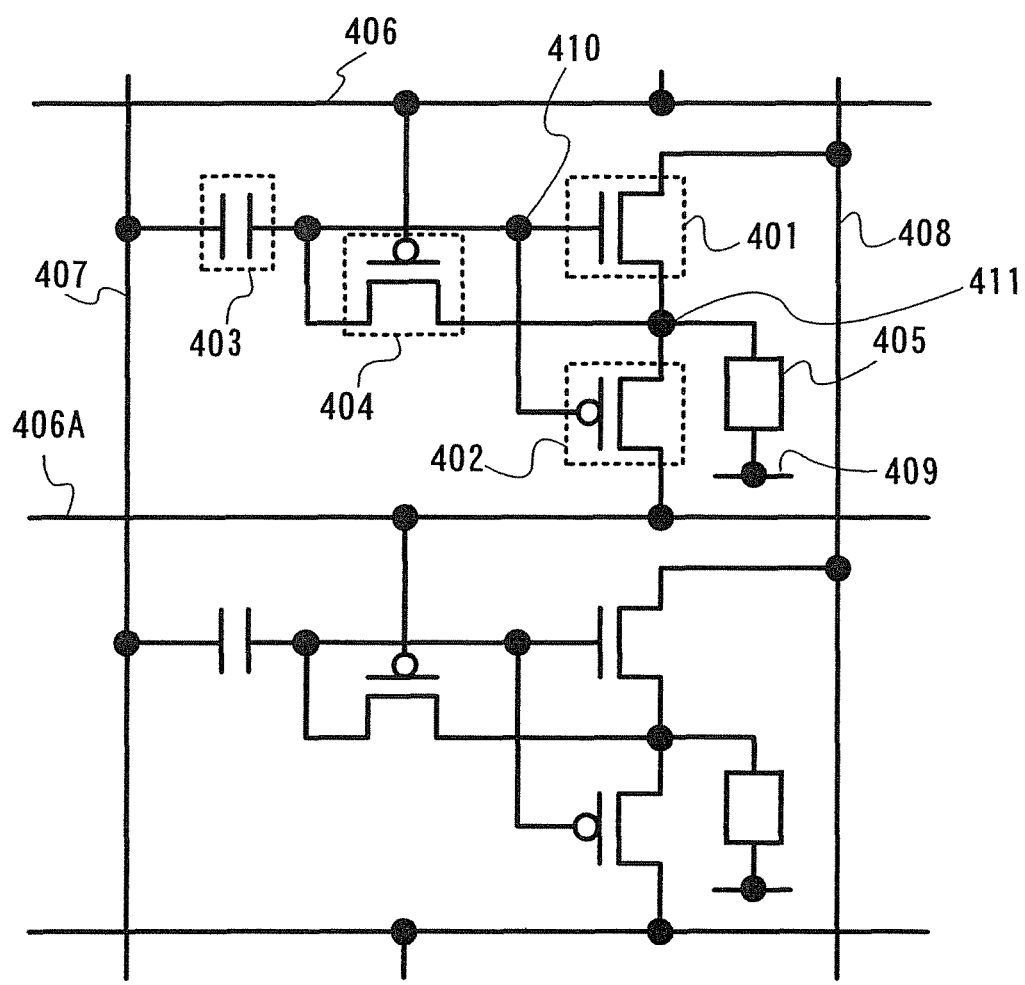
FIG. 4 is a diagram showing a pixel configuration of the invention.

A pixel shown in FIG. 4 has a complementary transistor (a third transistor) 401, a driving transistor (a second transistor) 402, a capacitor 403, a switching transistor (a first transistor) 404, a light emitting element 405, a scan line (Select line) 406, a signal line (Data line) 407, and a power source line 408. Note that an N channel transistor is used for the complementary transistor 401 while P channel transistors are used for the driving transistor 402 and the switching transistor 404.

A first terminal (one of a source terminal or a drain terminal) of the complementary transistor 401 is connected to the power source line 408, a second terminal (the other of the source terminal or the drain terminal) thereof is connected to a second terminal (one of a source terminal or a drain terminal) of the driving transistor 402, and a gate terminal of the complementary transistor 401 is connected to a gate terminal of the driving transistor 402. Further, the gate terminals of the complementary transistor 401 and the driving transistor 402 are connected to the signal line 407 through the capacitor 403, and connected to the second terminals (each one of the source terminal or the drain terminal) of the complementary transistor 401 and the driving transistor 402 through the switching transistor 404. That is, a first terminal (one of a source terminal or a drain terminal) of the switching transistor 404 is connected to the second terminals (each one of the source terminal or the drain terminal) of the complementary transistor 401 and the driving transistor 402, and a second terminal (the other of the source terminal or the drain terminal) of the switching transistor 404 is connected to the gate terminals of the complementary transistor 401 and the driving transistor 402. Therefore, turning on/off the switching transistor 404 can make a portion between the gate terminals and the second terminals (each one of the source terminal or the drain terminal) of the complementary transistor 401 and the driving transistor 402 conductive/non-conductive. Then, a signal is inputted to the scan line 406 to which a gate terminal of the switching transistor 404 is connected, thereby controlling on/off of the switching transistor 404. Further, the second terminals (each one of the source terminal or the drain terminal) of the complementary transistor 401 and the driving transistor 402 are connected to an anode of the light emitting element 405. In addition, a cathode of the light emitting element 405 is connected to a wire (Cathode) 409 to which a low power source potential Vss is supplied. Note that based on a power source potential Vdd which is an H level potential of a scan line 406A, Vss is a potential satisfying Vss<Vdd. For example, Vss=GND (ground potential) may be used.

Further, a first terminal of the driving transistor 402 is connected to the scan line 406A in pixels of another row. Here, the driving transistor 402 is a transistor for driving the light emitting element 405 while the complementary transistor 401 is a transistor in which a polarity thereof is inverted with respect to that of the driving transistor 402. That is, the complementary transistor 401 and the driving transistor 402 form an inverter to turn on/off complementarily when a signal of the scan line 406A is at H level.

Figure 5:
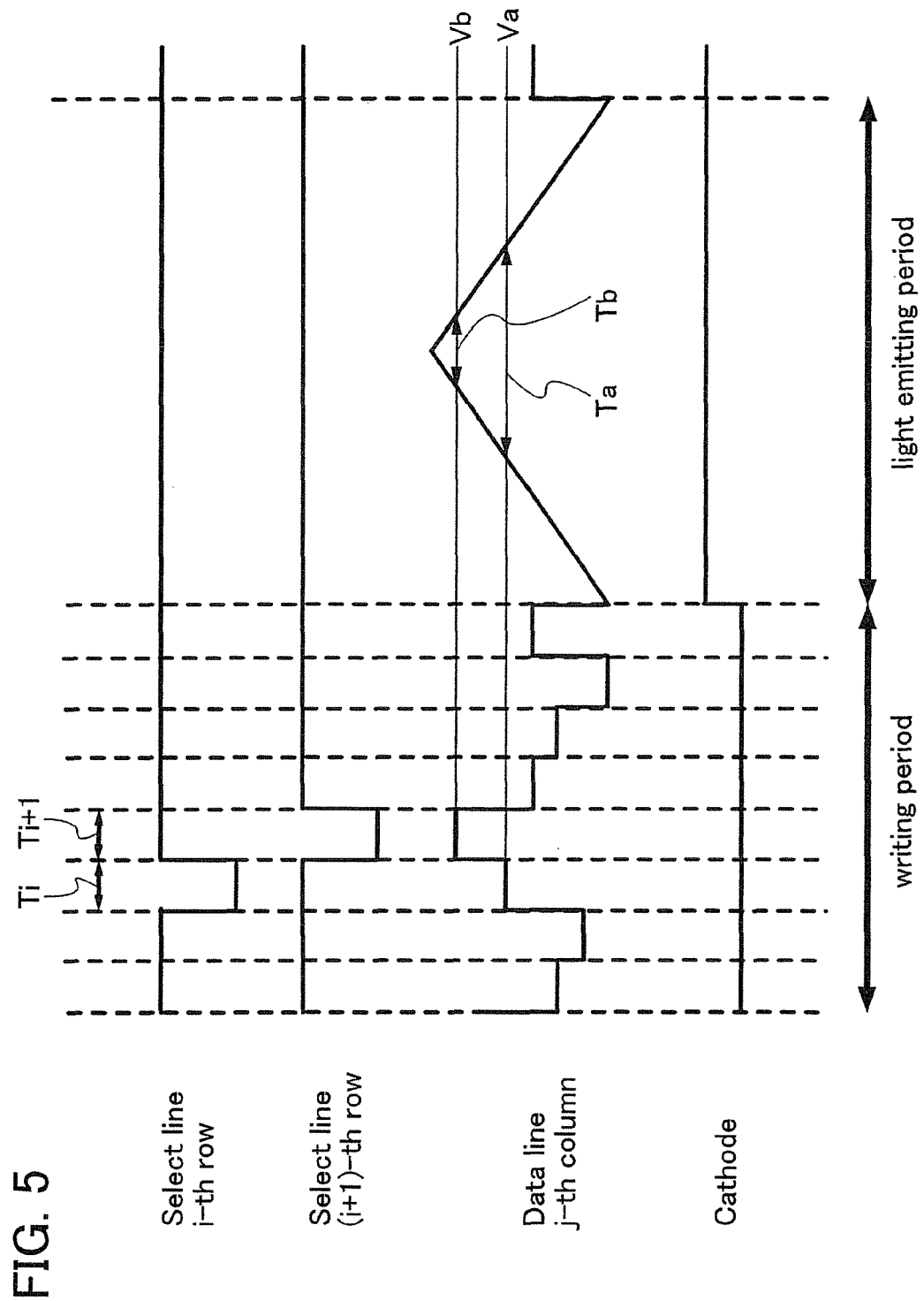
FIG. 5 is a diagram showing a timing chart of a display device having a pixel configuration of the invention.

Next, description is made in detail on a principal of operation of the pixel configuration in FIG. 4. Here, a pixel selected by the scan line 406 is pixels of the i-th row, and a pixel selected by the scan line 406A is pixels of the (i+1)-th row, then, description is made with reference to a timing chart in FIG. 5.

In a period where a signal is written to the pixel, an analog signal potential is supplied to the signal line 407. The analog signal potential corresponds to a video signal. Then, when a video signal is written to a pixel, an L level signal is inputted to the scan line 406 (Select line of the i-th row) to turn on the switching transistor 404. Note that at this time, an H level signal is supplied to the scan line 406A (Select line of the (i+1)-th row) for selecting pixels of another row. Therefore, when a signal is written to the pixel, the complementary transistor 401 and the driving transistor 402 are operated as an inverter. Note that when operating as the inverter, a connecting point between the gate terminals of the complementary transistor 401 and the driving transistor 402 is an input terminal 410 of the inverter while a connecting point between the second terminals of the complementary transistor 401 and the driving transistor 402 is an output terminal 411 of the inverter. In addition, when operating as the inverter, the first terminals of the complementary transistor 401 and the driving transistor 402 are source terminals while the second terminals thereof are drain terminals.

In this manner, when the switching transistor 404 is turned on, a portion between the input terminal 410 and the output terminal 411 of the inverter becomes conductive and a current flows to the complementary transistor 401, the driving transistor 402, and the light emitting element 405 while the capacitor 403 discharges or accumulates charge.

Thus, the inverter is offset-cancelled. Note that the offset cancellation means the portion between the input terminal 410 and the output terminal 411 is made conductive to uniform an input potential and an output potential, and, a potential of the input terminal 410 becomes a logic threshold potential Vinv of the inverter. Therefore, the logic threshold potential Vinv is ideally a medium potential of an L level and an H level outputs of the inverter.

Note that discharge or accumulation of charge in the capacitor 403 is determined depending on a relation between an originally accumulated charge in the capacitor 403 and a potential supplied to the signal line 407. After completing discharge or accumulation of charge in the capacitor 403, a charge corresponding to a potential difference (voltage Vp) between the signal line 407 and the logic threshold potential Vinv is accumulated in the capacitor 403. Then, a signal of the scan line 406 is at H level to turn off the switching transistor 404 and the voltage Vp is held in the capacitor 403.

Note that in a writing period, the potential applied to the wire (Cathode) 409 may be set to Vss2. Vss2 is a potential satisfying Vss<Vss2, when the inverter is offset-cancelled, a voltage applied to the light emitting element 405 is set to be smaller than a forward threshold voltage $V_{EL}$ of the light emitting element 405, that is, to be set Vinv−Vss2<$V_{EL}$. In this manner, little current can flow to the light emitting element 405 in a writing period, therefore, power consumption can be reduced.

Moreover, Vss2 may increase to apply a reverse bias voltage to the light emitting element 405. By applying the reverse bias voltage, the reliability of the light emitting element 405 can be improved and a malfunction portion in the light emitting element 405 can be baked and cut.

Note that if a current is not flow to the wire 409, other methods can be used as well. For example, the wire 409 may be a floating state. As a result, a current does not flow to the light emitting element 405. Alternatively, a switch may be provided between the output terminal 411 of the inverter and the wire 409. By controlling the switch, a current cannot flow to the light emitting element 405.

In this manner, writing of a video signal into the pixel is completed.

Note that after the video signal is written to the pixel, based on the analog signal potential supplied to the signal line 407 when the video signal is written to the pixel, an output level of the inverter is controlled in accordance with variations of a potential of the signal line 407. That is, if in a period where a signal is written to the pixel, the potential of the signal line 407 is lower than an analog signal potential when a video signal is written to the pixel, the output of the inverter is at H level, while if the potential of the signal line 407 is higher than the analog signal potential when a video signal is written to the pixel, the output of the inverter is at L level.

This is because when a video signal is written to the pixel, the capacitor 403 holds the potential difference (Vp), therefore, the potential of the signal line 407 is lower than an analog signal potential when a video signal is written to the pixel, the potential of the input terminal 410 of the inverter is also lower than the potential of the input terminal 410 when a video signal is written to the pixel, and thus, the complementary transistor 401 is turned off, the driving transistor 402 is turned on, and the output of the inverter is at H level. On the other hand, if the potential of the signal line 407 is higher than the analog signal potential when the video signal is written to the pixel in a period where a signal is written to the pixel, the potential of the input terminal 410 of the inverter is also higher than the potential of the input terminal 410 when the analog signal is written to the pixel, therefore, the complementary transistor 401 is turned on, the driving transistor 402 is turned off, and the output of the inverter is at L level.

Accordingly, in a light emitting period of the pixel, while the scan line (the scan line 406, the scan line 406A, or the like) is at L level, the potential supplied to the signal line 407 is changed in an analog manner, thereby controlling the output level of the inverter in the pixel. Thus, time during which a current flows to the light emitting element 405 is controlled in an analog manner to express a gradation.

In addition, the first terminal (one of the source terminal or the drain terminal) of the complementary transistor 401 is connected to the scan line 406A, therefore, the number of wires can be reduced to improve an aperture ratio. Accordingly, the reliability of the light emitting element 405 can be improved. In addition, yield increases so that cost of a display panel can be suppressed.

Subsequently, in a light emitting period of the pixel, description is made on a potential supplied to the signal line 407. As the potential supplied to the signal line 407, an analog potential with a waveform changing periodically can be used. Therefore, as shown in FIG. 12, the waveform 1201, the waveform 1202, the waveform 1203, the waveform 1204, the waveform 1205, the waveform 1206, the waveform 1208, the waveform 1209 or a plurality of these in succession may be supplied.

By supplying in succession, the light emitting time can be divided in one frame. As a result, frame frequency seems to be improved so that a screen flicker can be prevented.

Thus, by an analog signal potential supplied to the signal line 407 when an analog signal is written to the pixel, an analog time gradation display of the pixel can be performed. Note that as the number of gradations becomes smaller, the analog signal potential increases.

This is because a high-low relation between a triangle wave potential supplied in light emitting period of the pixel and an analog signal potential inputted in the pixel in the period where a signal is written to the pixel can determine an output level of the inverter formed of the complementary transistor 401 and the driving transistor 402. When the analog signal potential inputted in the pixel in the period where a signal is written to the pixel is lower than the triangle wave potential supplied in the light emitting period of the pixel, the output of the inverter becomes at H level and the pixel emits light. Therefore, as the analog signal potential inputted to the pixel in the period where a signal is written to the pixel becomes lower, a period where the analog signal potential is lower than the triangle wave potential supplied in the light emitting period of the pixel becomes longer. Therefore, a light emitting period also becomes longer. Accordingly, the number of gradations also increases. On the other hand, as the analog signal potential inputted to the pixel in the period where a signal is written to the pixel becomes higher, a period where the analog signal potential is lower than the triangle wave potential supplied in the light emitting of the pixel becomes shorter. Therefore, a light emitting period also becomes shorter. Accordingly, the number of gradations also decreases.

[Embodiment Mode 2]

In this embodiment mode, described is another pixel configuration different from the pixel configuration in Embodiment Mode 1. The pixel configuration shown in this embodiment mode is a configuration in which an analog signal potential supplied when an analog signal is written to a pixel and an analog potential for controlling lighting/non-lighting of a pixel are supplied to a pixel by different wires.

Figure 6:
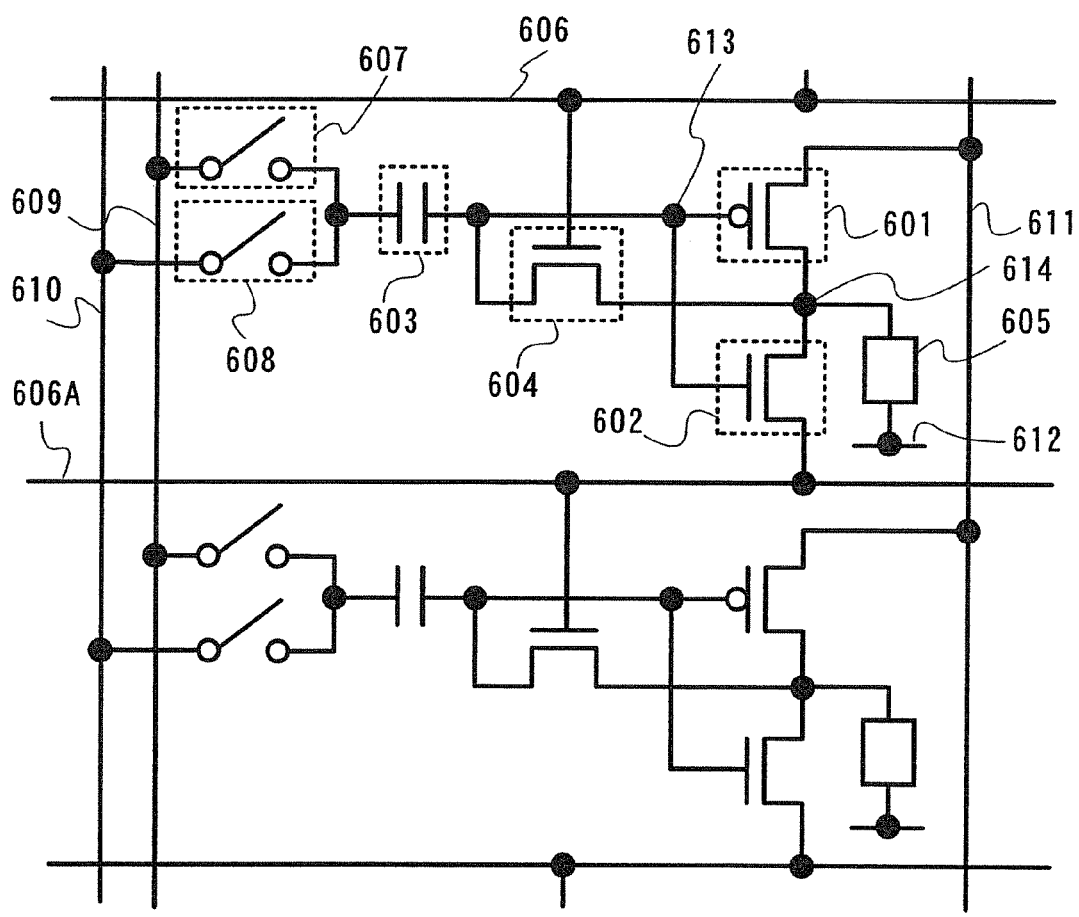
FIG. 6 is a diagram showing a pixel configuration of the invention.

A pixel has a driving transistor (a second transistor) 601, a complementary transistor (a third transistor) 602, a capacitor 603, a switching transistor (a first transistor) 604, a light emitting element 605, a scan line (Select line) 606, a first switch 607, a second switch 608, a first signal line (Data line 1) 609, a second signal line (Data line 2) 610, and a power source line 611 as shown in FIG. 6. Note that a P channel transistor is used for the driving transistor 601 while N channel transistors are used for the complementary transistor 602 and the switching transistor 604.

A first terminal (one of a source terminal or a drain terminal) of the driving transistor 601 is connected to the power source line 611, a second terminal (the other of the source terminal or the drain terminal) thereof is connected to a second terminal (one of a source terminal or a drain terminal) of the complementary transistor 602, and a gate terminal of the driving transistor 601 is connected to a gate terminal of the complementary transistor 602. Further, the gate terminals of the driving transistor 601 and the complementary transistor 602 are connected to one electrode of the capacitor 603, and connected to the second terminals (each one of the source terminal or the drain terminal) of the driving transistor 601 and the complementary transistor 602 through the switching transistor 604. That is, a first terminal (one of a source terminal or a drain terminal) of the switching transistor 604 is connected to the second terminals (each one of the source terminal or the drain terminal) of the driving transistor 601 and the complementary transistor 602, and a second terminal (the other of the source terminal or the drain terminal) of the switching transistor 604 is connected to the gate terminals of the driving transistor 601 and the complementary transistor 602. Therefore, turning on/off the switching transistor 604 can make a portion between the gate terminals and the second terminals (each one of the source terminal or the drain terminal) of the driving transistor 601 and the complementary transistor 602 conductive/non-conductive. Then, a signal is inputted to the scan line 606 to which a gate terminal of the switching transistor 604 is connected, thereby controlling on/off of the switching transistor 604. Note that the other electrode of the capacitor 603 is connected to the first signal line 609 through the first switch 607 and to the second signal line 610 through the second switch 608. Further, the second terminals (each one of the source terminal or the drain terminal) of the driving transistor 601 and the complementary transistor 602 are connected to an anode of the light emitting element 605. In addition, a cathode of the light emitting element 605 is connected to a wire (Cathode) 612 to which a low power source potential Vss is supplied. Note that based on a power source potential Vdd supplied to the power source line 611, Vss is a potential satisfying Vss<Vdd. For example, Vss=GND (ground potential) may be used. Note that the potential of the power source line 611 is not limited thereto. A power source potential value may be changed per pixels of each color element. That is, in the case of a full color display device formed of pixels of color elements of RGB, a power source line potential may be supplied to respective pixels of color elements of RGB, while in the case of a full color display device formed of pixels of color elements of RGBW, a power source line potential may be supplied to respective pixels of color elements of RGBW.

Further, a first terminal of the complementary transistor 602 is connected to a scan line 606A in pixels of another row. Here, the driving transistor 601 is a transistor for driving the light emitting element 605 while the complementary transistor 602 is a transistor in which a polarity thereof is inverted with respect to that of the driving transistor 601. That is, when a signal of the scan line 606A is at L level, the driving transistor 601 and the complementary transistor 602 form an inverter to turn on/off complementarily.

Next, description is made in detail on a principal of operation of the pixel configuration in FIG. 6. Here, a pixel selected by the scan line 606 is a pixel of the i-th row, and a pixel selected by the scan line 606A is a pixel of the (i+1)-th row, therefore, description is made with reference to a timing chart in FIG. 7.

In the pixel in FIG. 6, an analog signal potential for determining light emitting time of each pixel is supplied to the first signal line (Data line 1) 609 while an analog potential for controlling light emitting time of each pixel is supplied to the second signal line (Data line 2) 610.

Note that as shown in FIG. 12 described in Embodiment Mode 1, the potential may be supplied to the second signal line (Data line 2) 610 such as the waveform 1201, the waveform 1202, the waveform 1203, the waveform 1204, the waveform 1205, the waveform 1206, the waveform 1208, the waveform 1209, or a plurality of these in succession.

By supplying in succession, the light emitting time can be divided in one frame. As a result, frame frequency seems to be improved so that a screen flicker can be prevented.

Note that in a display device having the pixel configuration of this embodiment mode, a signal writing period and a light emitting period are set per row in the pixel portion.

Here, description is made on a period where a signal is written to pixels of the i-th row. A period Ti shown in FIG. 7 means a period where a signal is written to the pixels of the i-th row. Then, a period other than the period Ti is light emitting time of the pixels of the i-th row.

First, in the period Ti where a signal is written to the pixels of the i-th row, the first switch 607 is turned on while the second switch 608 is turned off. At this time, an L level potential is supplied to the scan line (the Select line of the (i+1)-th row) 606A. Therefore, the driving transistor 601 and the complementary transistor 602 function as an inverter. Accordingly, a connecting point between the gate terminals of the driving transistor 601 and the complementary transistor 602 is an input terminal 613 of the inverter while a connecting point between the second terminals of the driving transistor 601 and the complementary transistor 602 is an output terminal 614 of the inverter.

In addition, an H level signal is inputted to the scan line (the Select line of the i-th row) 606 to turn on the switching transistor 604. Therefore, a portion between the input terminal 613 and the output terminal 614 of the inverter becomes conductive to perform an offset cancellation. That is, a potential of the input terminal 613 of the inverter becomes a logic threshold potential Vinv of the inverter. Therefore, at this time, the potential of the input terminal 613 of the inverter becomes a required potential for controlling an output level of the inverter.

Then, a charge corresponding to a potential difference (voltage Vp) between the logic threshold potential Vinv of the inverter and the potential Va supplied to the first signal line 609 in the writing period Ti is accumulated in the capacitor 603.

Subsequently, the first switch 607 is turned off while the second switch 608 is turned on. Then, a L level signal is inputted to the scan line (the Select line of the i-th row) 606. Then, the switching transistor 604 is turned off so that the voltage Vp is held in the capacitor 603. In this manner, the period Ti is completed, then, an analog signal is written from the Data line 1 (the first signal line 609) to a pixel of the i-th row and the j-th column. Note that at this time, respective analog signal potentials are supplied from the respective Data lines 1 (the first signal lines 609) of pixel columns to write analog signals into the pixel of the i-th row of each column.

In this manner, when the period Ti where a signal is written to the pixels of the i-th row is completed, a period $T_{i+1}$ where a signal is written to pixels of the (i+1)-th row starts, then, a light emitting period of the pixels of the i-th row starts. In the period $T_{i+1}$ where a signal is written to the pixels of the (i+1)-th row, an H level signal is inputted to the scan line 606A and a signal is written similarly to the signal writing operation of the pixels of the i-th row.

Figure 7:
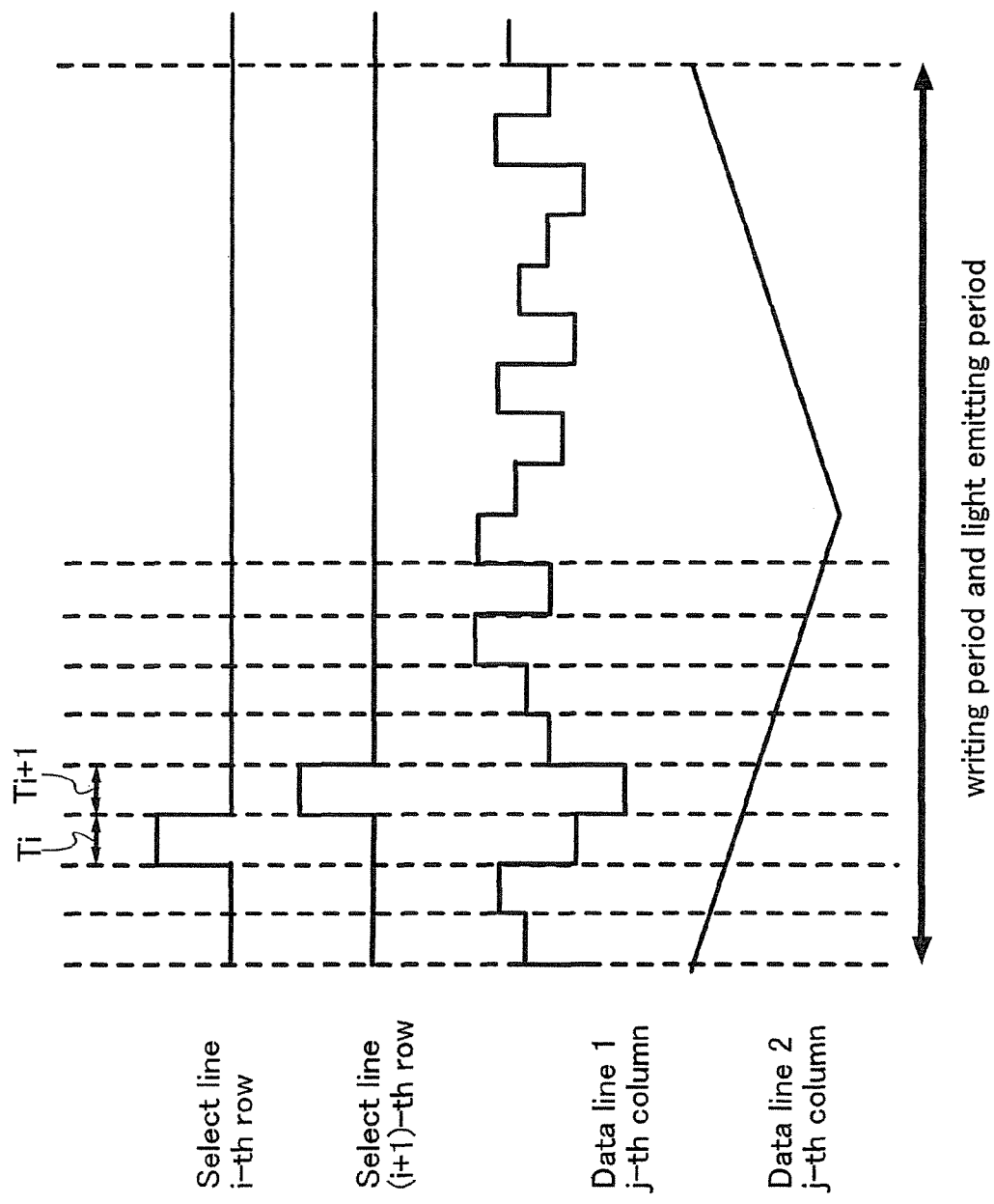
FIG. 7 is a diagram showing a timing chart of a display device having a pixel configuration of the invention.

Note that as shown in FIG. 7, a triangle wave potential is supplied to the Data line 2 (the second signal line 610). Then, in the pixel of the i-th row and j-th column, when a potential of the Data line 2 (the second signal line 610) is a higher potential than the analog signal potential supplied to the Data line 1 (the first signal line 609) in the period Ti where a signal is written to the pixels of the i-th row, the light emitting element 605 keeps a non-light emission state, and in a period where a potential of the Data line 2 (the second signal line 610) is a lower potential than the analog signal potential supplied to the Data line 1 (the first signal line 609) in the period Ti where a signal is written to the pixels of the i-th row, the light emitting element 605 emits light. Therefore, in accordance with an analog signal potential when an analog signal is written in the period where a signal is written to each pixel, light emitting time of the light emitting element 605 is controlled. In this manner, an analog time gradation display can be performed.

Note that when the signal writing time to the pixels of the i-th row is completed and the signal writing period to the pixels of the (i+1)-th row starts, an H level signal is inputted to the scan line 606A to which the first terminal (one of the source terminal or the drain terminal) of the complementary transistor 602 of each pixel of the i-th row is connected. Here, in the case where a triangle wave potential supplied to the second signal line 610 becomes higher than an analog signal potential written by the first signal line 609 in the period where a signal is written to the pixels of the i-th row, the complementary transistor 602 is turned on. Therefore, an output of the inverter may output the H level potential of the scan line 606A.

Figure 50:
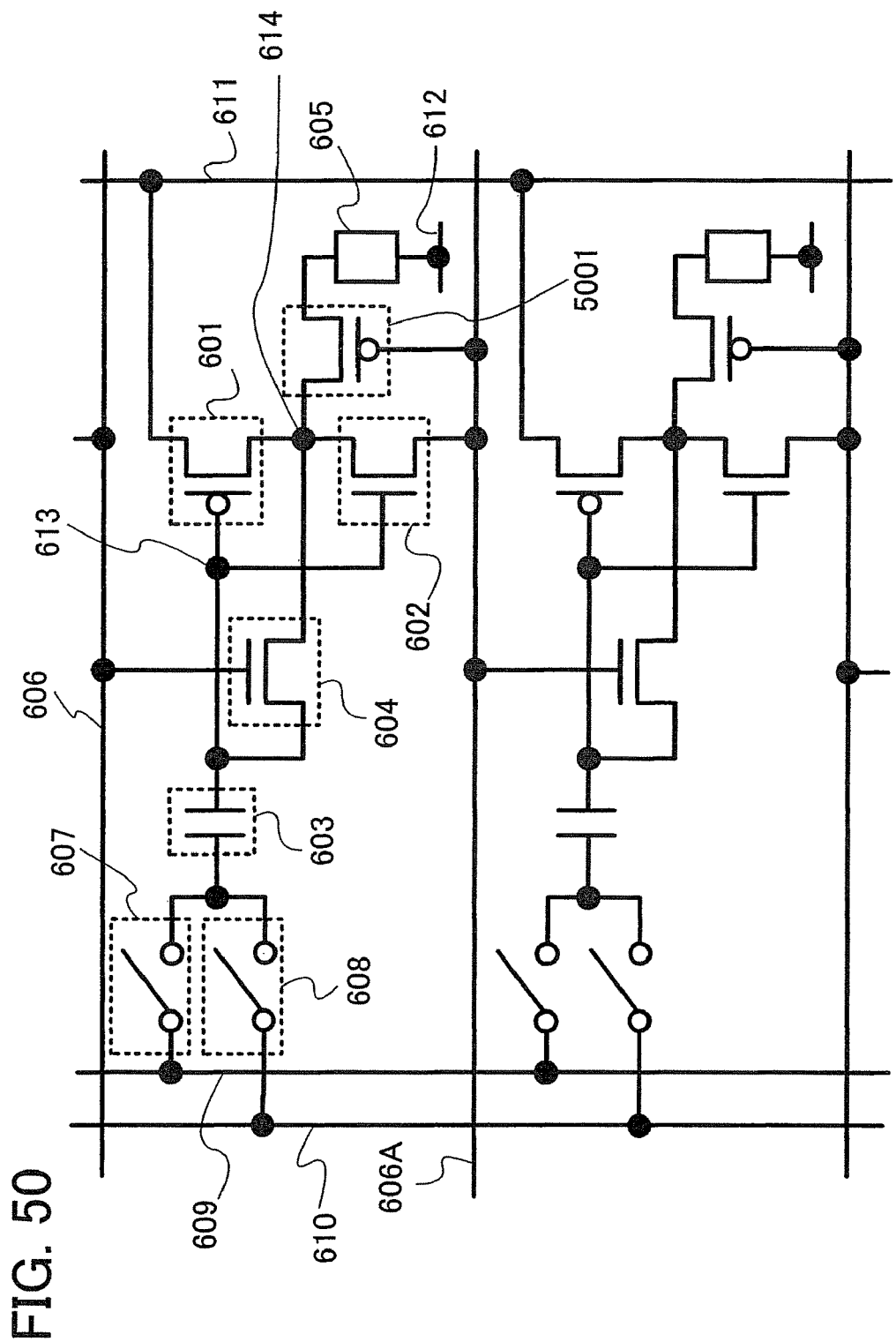
FIG. 50 is a diagram showing a pixel configuration of the invention.

Therefore, a pixel required to be a non-light emission state emits light. If the pixel required to be a non-light emission state emits light, there is a problem to be visible to human eyes. Therefore, as shown in FIG. 50, a P channel transistor 5001 may be provided between the output terminal 614 of the inverter and the anode of the light emitting element 605. That is, a first terminal (one of a source terminal or a drain terminal) of the P channel transistor 5001 is connected to the output terminal 614 of the inverter, a second terminal (the other of the source terminal or the drain terminal) thereof is connected to the anode of the light emitting element 605, and a gate terminal thereof is connected to the scan line 606A. In this manner, when an H level signal is inputted to the scan line 606A and the pixels of the (i+1)-th row are selected, the P channel transistor 5001 of each pixel of the i-th row is turned off. Therefore, the pixel required to be a non-light emission state does not emit light.

In this manner, in a display device having the pixel configuration of this embodiment mode, a signal writing period sequentially per pixel row starts and a light emitting period per pixel row starts after completing the signal writing period. Therefore, as this embodiment mode, in the case where a signal is written to a pixel in a line sequential manner, the writing period may be time of one pixel, therefore, a light emitting period can be extended. That is, a duty ratio (a ratio of a light emitting period in one frame period) is high, therefore, instantaneous luminance of the light emitting element can be reduced. Therefore, the reliability of the light emitting element can be improved.

In addition, the signal writing period to pixels of each row can be extended, therefore, frequency of a signal line driver circuit for inputting an analog signal potential to the Data line 1 (the first signal line 609) can be reduced. Therefore, power consumption can be reduced.

In this manner, a triangle wave potential is supplied to the signal line 610 to set light emitting time of the light emitting element 605 in accordance with an analog signal potential when an analog signal is written in each writing period. Thus, an analog time gradation display can be performed. Since the light emitting time is controlled in an analog manner, a pseudo contour does not occur unlike a case of controlling light emitting time in a digital manner. Accordingly, a clear display without image quality defect can be performed.

Note that an output level of the inverter for controlling light emission/non-light emission of the light emitting element 605 is determined whether an analog signal potential supplied to the Data lines 1 (the signal lines 609) in a writing period is higher or lower than a triangle wave potential inputted to the Data lines 2 (the signal lines 610) in a light emitting period as described above, thereby controlling in a digital manner. Therefore, the light emission/non-light emission of the light emitting element 605 can be controlled with a small effect of characteristic variations of the driving transistor 601 and the complementary transistor 602. That is, variations of light emission in each pixel can be improved.

Particularly, the inverter in a pixel is formed of the driving transistor 601 which is a P channel transistor and the complementary transistor 602 which is an N channel transistor, therefore, even when transistor characteristics of the driving transistor 601 and the complementary transistor 602 vary and inverter transfer characteristics vary to some extent in each pixel, the pixel configuration described in this embodiment mode can control the light emission/non-light emission of the light emitting element 605 with the small effect of these.

Moreover, the pixel configuration of this embodiment mode is not limited to the configuration in FIG. 6. That is, in the configuration in FIG. 6, as for the P channel transistor and the N channel transistor which form the inverter, a scan line of another row is used instead of a wire for supplying a potential to the source terminal of the N channel transistor. However, as shown in FIG. 8, a scan line of another row may be used instead of a wire for supplying a potential to the source terminal of the P channel transistor.

Figure 8:
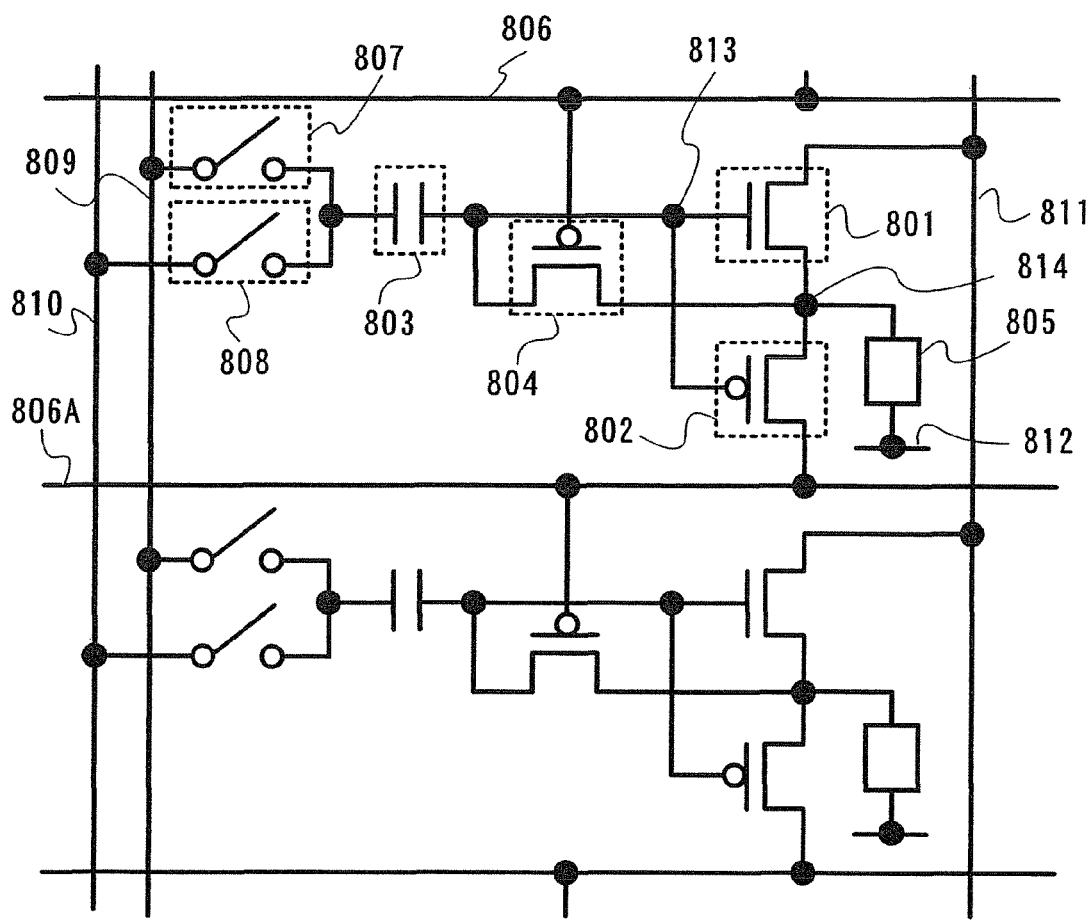
FIG. 8 is a diagram showing a pixel configuration of the invention.

A pixel shown in FIG. 8 has a complementary transistor (a third transistor) 801, a driving transistor (a second transistor) 802, a capacitor 803, a switching transistor (a first transistor) 804, a light emitting element 805, a scan line (Select line) 806, a first switch 807, a second switch 808, a first signal line (Data line 1) 809, a second signal line (Data line 2) 810, and a power source line 811. Note that an N channel transistor is used for the complementary transistor 801 while P channel transistors are used for the driving transistor 802 and the switching transistor 804.

A first terminal (one of a source terminal or a drain terminal) of the complementary transistor 801 is connected to the power source line 811, a second terminal (the other of the source terminal or the drain terminal) thereof is connected to a second terminal (one of a source terminal or a drain terminal) of the driving transistor 802, and a gate terminal of the complementary transistor 801 is connected to a gate terminal of the driving transistor 802. Further, the gate terminals of the complementary transistor 801 and the driving transistor 802 are connected to one electrode of the capacitor 803, and connected to the second terminals (each one of the source terminal or the drain terminal) of the complementary transistor 801 and the driving transistor 802 through the switching transistor 804. That is, a first terminal (one of a source terminal or a drain terminal) of the switching transistor 804 is connected to the second terminals (each one of the source terminal or the drain terminal) of the complementary transistor 801 and the driving transistor 802, and a second terminal of the switching transistor 804 (the other of the source terminal or the drain terminal) is connected to the gate terminals of the complementary transistor 801 and the driving transistor 802. Therefore, turning on/off the switching transistor 804 can make a portion between the gate terminals and the second terminals (each one of the source terminal or the drain terminal) of the complementary transistor 801 and the driving transistor 802 conductive/non-conductive. Then, a signal is inputted to the scan line 806 to which a gate terminal of the switching transistor 804 is connected, thereby controlling on/off of the switching transistor 804. Note that the other electrode of the capacitor 803 is connected to the first signal line 809 through the first switch 807 and to the second signal line 810 through the second switch 808. Further, the second terminals (each one of the source terminal or the drain terminal) of the complementary transistor 801 and the driving transistor 802 are connected to an anode of the light emitting element 805. In addition, a cathode of the light emitting element 805 is connected to a wire (Cathode) 812 to which a low power source potential Vss is supplied. Note that based on a power source potential Vdd of an H level potential supplied to a scan line 806A, Vss is a potential satisfying Vss<Vdd. For example, Vss=GND (ground potential) may be used. In addition, the potential supplied to the power source line 811 is set that a potential difference between it and the wire (Cathode) 812 is a forward threshold voltage or less of the light emitting element 805. That is, when a potential supplied to the power source line 811 is supplied to a first electrode of the light emitting element 805 and the low power source potential Vss is supplied to a second electrode of the light emitting element 805, a voltage applied to the light emitting element 805 may be a forward threshold voltage $V_{EL}$ or less. Note that at this time, the first electrode of the light emitting element 805 is the anode while the second electrode thereof is the cathode. On the other hand, a potential supplied to the power source line 811 may be a further lower potential, that is, a potential lower than the low power source potential Vss, and a voltage applied to the light emitting element 805 may be a reverse bias voltage. By applying the reverse bias voltage, the reliability of the light emitting element 805 can be improved and a malfunction portion in the light emitting element 805 can be baked and cut.

Furthermore, a first terminal of the driving transistor 802 is connected to the scan line 806A in pixels of another row. Here, the driving transistor 802 is a transistor for driving the light emitting element 805 while the complementary transistor 801 is a transistor in which a polarity thereof is inverted with respect to that of the driving transistor 802. That is, the complementary transistor 801 and the driving transistor 802 form an inverter to turn on/off complementarily when a signal of the scan line 806A is at H level.

Figure 9:
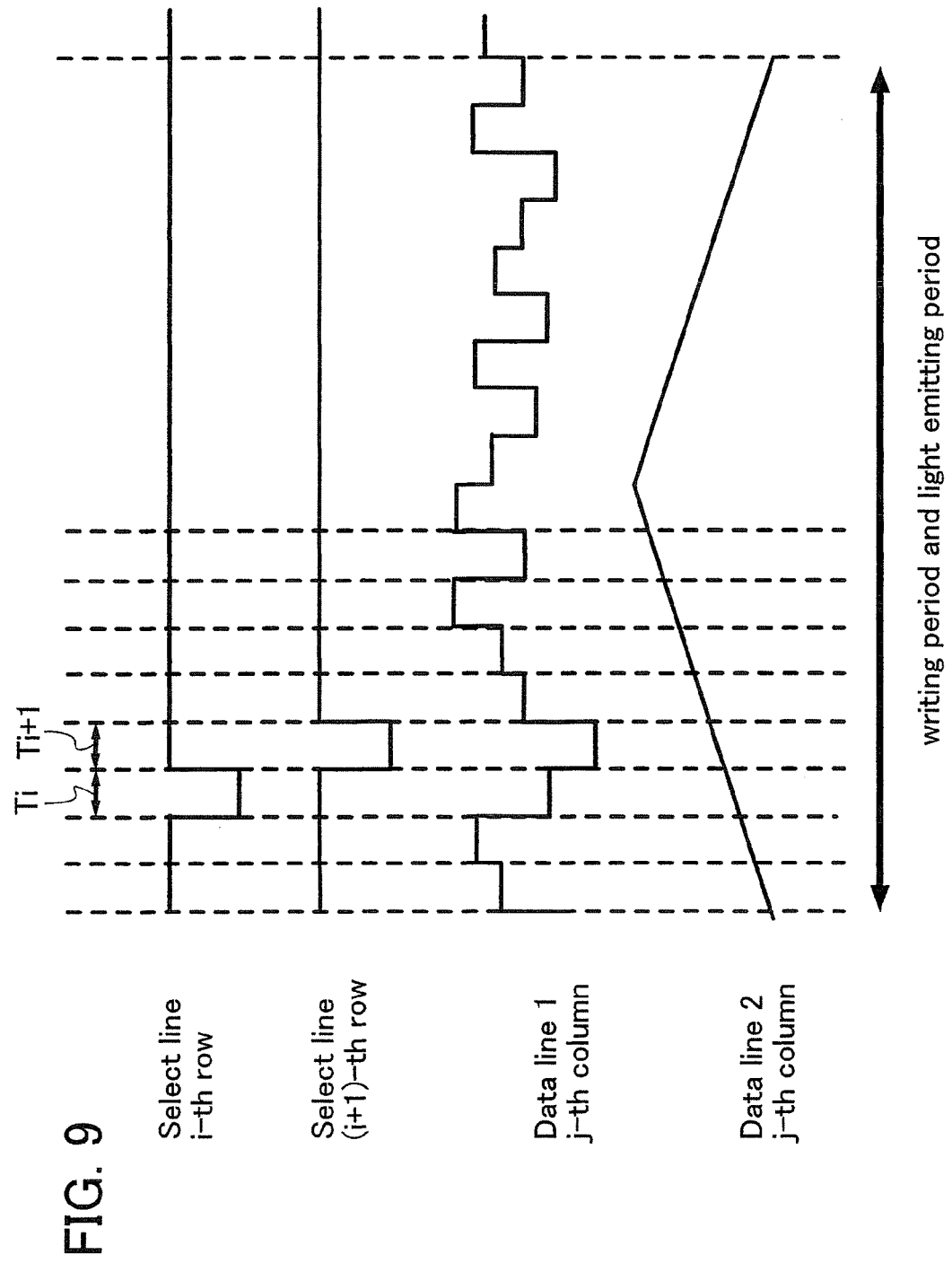
FIG. 9 is a diagram showing a timing chart of a display device having a pixel configuration of the invention.

Next, description is made in detail on a principal of operation of the pixel configuration in FIG. 8. Here, a pixel selected by the scan line 806 is a pixel of the i-th row, and a pixel selected by the scan line 806A is a pixel of the (i+1)-th row, then, description is made with reference to a timing chart in FIG. 9.

In the pixel in FIG. 8, an analog signal potential for determining light emitting time of each pixel is supplied to the first signal line (Data line 1) 809 while an analog potential for controlling light emitting time of each pixel is supplied to the second signal line (Data line 2) 810.

Note that as shown in FIG. 12 described in Embodiment Mode 1, the potential may be supplied to the second signal line (Data line 2) 810 such as the waveform 1201, the waveform 1202, the waveform 1203, the waveform 1204, the waveform 1205, the waveform 1206, the waveform 1208, the waveform 1209 or a plurality of these in succession.

By supplying in succession, the light emitting time can be divided in one frame. As a result, frame frequency seems to be improved so that a screen flicker can be prevented.

Note that in a display device having the pixel configuration of this embodiment mode, a signal writing period and a light emitting period are set per row in the pixel portion.

Here, description is made on a period where a signal is written to the pixels of the i-th row. A period Ti shown in FIG. 9 means a period where a signal is written to the pixels of the i-th row. Then, a period other than the period Ti is light emitting time of the pixels of the i-th row.

First, in the period Ti where a signal is written to the pixels of the i-th row, the first switch 807 is turned on while the second switch 808 is turned off. At this time, an H level potential is supplied to the scan line (the Select line of the (i+1)-th row) 806A. Therefore, the complementary transistor 801 and the driving transistor 802 function as an inverter. Accordingly, a connecting point between the gate terminals of the complementary transistor 801 and the driving transistor 802 is an input terminal 813 of the inverter while a connecting point between the second terminals of the complementary transistor 801 and the driving transistor 802 is an output terminal 814 of the inverter.

In addition, an L level signal is inputted to the scan line (the Select line of the i-th row) 806 to turn on the switching transistor 804. Therefore, a portion between the input terminal 813 and the output terminal 814 of the inverter becomes conductive to perform an offset cancellation. That is, a potential of the input terminal 813 of the inverter becomes a logic threshold potential Vinv of the inverter. Therefore, at this time, the potential of the input terminal 813 of the inverter becomes a required potential for controlling an output level of the inverter.

Then, a charge corresponding to a potential difference (voltage Vp) between the logic threshold potential Vinv of the inverter and the potential Va supplied to the first signal line 809 in the writing period Ti is accumulated in the capacitor 803.

Subsequently, the first switch 807 is turned off while the second switch 808 is turned on. Then, a H level signal is inputted to the scan line (the Select line of the i-th row) 806. Then, the switching transistor 804 is turned off so that the voltage Vp is held in the capacitor 803. In this manner, the period Ti is completed, then, an analog signal is written from the Data line 1 (the first signal line 809) to a pixel of the i-th row and the j-th column. Note that at this time, respective analog signal potentials are supplied from the respective Data lines 1 (the first signal lines 809) of pixel columns to write analog signals into the pixel of the i-th row of each column.

In this manner, when the period Ti where a signal is written to the pixels of the i-th row is completed, a period $T_{i+1}$ where a signal is written to pixels of the (i+1)-th row starts, then, a light emitting period of the pixel of the i-th row starts. In the period $T_{i+1}$ where a signal is written to the pixel of the (i+1)-th row, an L level signal is inputted to the scan line 806A and a signal is written similarly to the signal writing operation of the pixel of the i-th row.

Note that as shown in FIG. 7, a triangle wave potential is supplied to the Data line 2 (the second signal line 810). Then, in the pixel of the i-th row and j-th column, when a potential of the Data line 2 (the second signal line 810) is a higher potential than the analog signal potential supplied to the Data line 1 (the first signal line 809) in the period Ti where a signal is written to the pixels of the i-th row, the light emitting element 805 keeps a non-light emission state, and in the period where the a potential of Data line 2 (the second signal line 810) is a lower potential than the analog signal potential supplied to the Data line 1 (the first signal line 809) in the period Ti where a signal is written to the pixel of the i-th row, the light emitting element 805 emits light. Therefore, in accordance with an analog signal potential when an analog signal is written in the period where a signal is written to each pixel, light emitting time of the light emitting element 805 is controlled. In this manner, an analog time gradation display can be performed.

In this manner, in a display device having the pixel configuration of this embodiment mode a signal writing period sequentially per pixel row starts and then transferred to a light emitting period per pixel row starts after completing the signal writing period. Therefore, as this embodiment mode, in the case where a signal is written to a pixel in a line sequential manner, the writing period may be time of one pixel, therefore, a light emitting period can be extended. That is, a duty ratio (a ratio of a light emitting period in one frame period) is high, therefore, instantaneous luminance of the light emitting element can be reduced. Therefore, the reliability of the light emitting element can be improved.

In addition, the signal writing period to pixels of each row can be extended, therefore, frequency of a signal line driver circuit for inputting an analog signal potential to the Data line 1 (the first signal line 809) can be reduced. Therefore, power consumption can be reduced.

In this manner, a triangle wave potential is supplied to the signal line 810 to set light emitting time of the light emitting element 805 in accordance with an analog signal potential when an analog signal is written in each writing period. Thus, an analog time gradation display can be performed. Since the light emitting time is controlled in an analog manner, a pseudo contour does not occur unlike a case of controlling the light emitting time in a digital manner. Accordingly, a clear display without image quality defect can be performed.

Note that an output level of the inverter for controlling light emission/non-light emission of the light emitting element 805 is determined whether an analog signal potential supplied to the Data lines 1 (the signal lines 809) in a writing period is higher or lower than a triangle wave potential inputted to the Data lines 2 (the signal lines 810) in a light emitting period as described above, thereby controlling in a digital manner. Therefore, the light emission/non-light emission of the light emitting element 805 can be controlled with a small effect of characteristic variations of the complementary transistor 801 and the driving transistor 802. That is, variations of light emission in each pixel can be improved.

Particularly, the inverter in a pixel is formed of the driving transistor 802 which is a P channel transistor and the complementary transistor 801 which is an N channel transistor, therefore, even when transistor characteristics of the complementary transistor 801 and the driving transistor 802 vary and inverter transfer characteristics vary to some extent in each pixel, the pixel configuration described in this embodiment mode can control the light emission/non-light emission of the light emitting element 805 with the small effect of these.

Note that transistors can be used as the first switch 607 and the second switch 608 in the configuration shown in FIG. 6, and the first switch 807 and the second switch 808 in FIG. 8.

Figure 57:
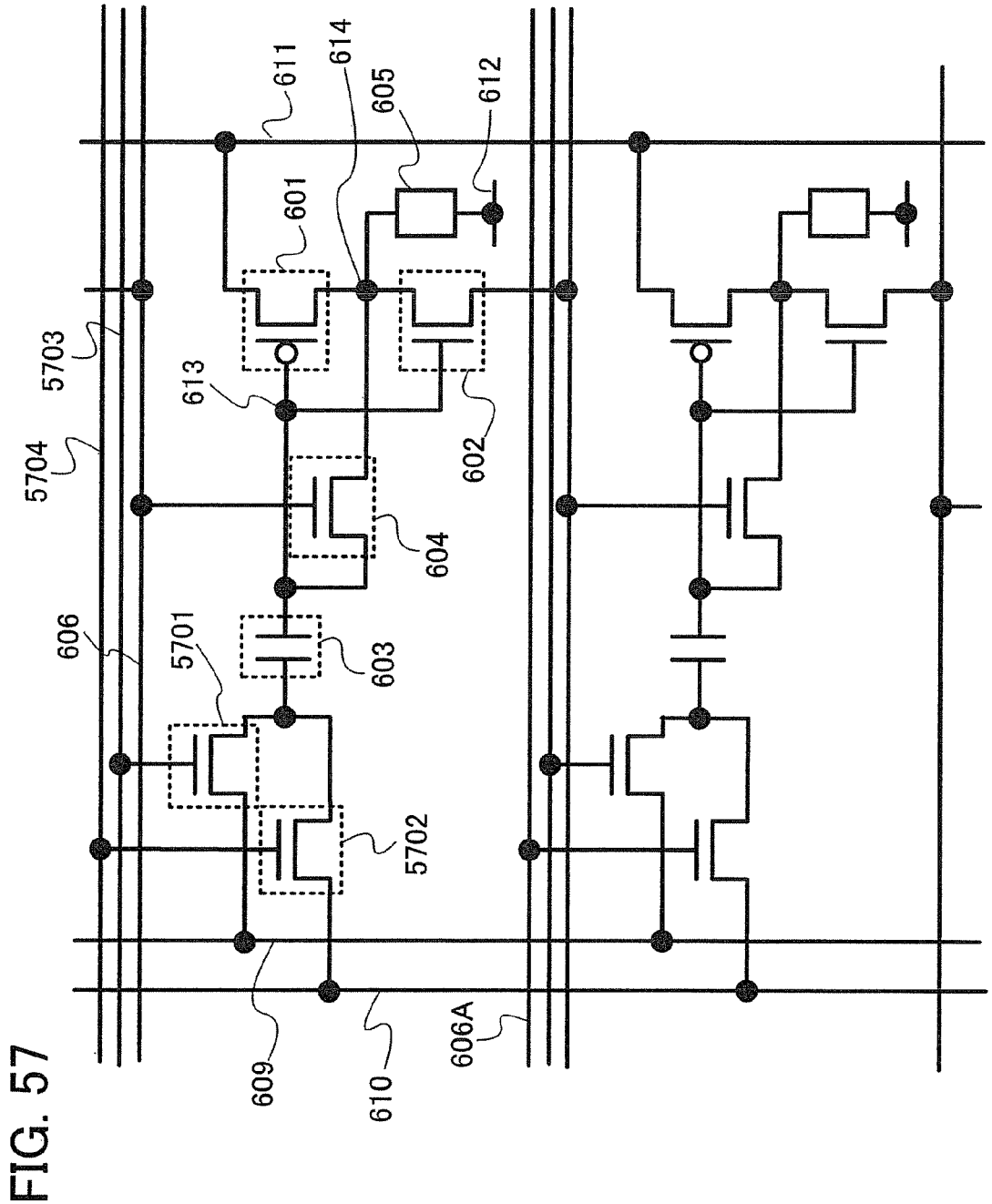
FIG. 57 is a diagram showing a pixel configuration of the invention.

For example, FIG. 57 shows a configuration in which N channel transistors are applied to the first switch 607 and the second switch 608 in the configuration in FIG. 6. A writing selection transistor 5701 is used instead of the first switch 607 and a light-emission selection transistor 5702 is used instead of the second switch 608. The writing selection transistor 5701 inputs a signal to a second scan line 5703 to control on/off while the light-emission selection transistor 5702 inputs a signal to a third scan line 5704 to control on/off.

Here, the transistor used instead of a switch has desirably a configuration in which a little leakage current (an off current and a gate leakage current). Note that the off current is a current flowing between a source and a drain when a transistor is in an off-state while the gate leakage current is a current flowing between a gate and a source/drain through a gate insulating film.

Therefore, N channel transistors used for the writing selection transistor 5701, the light-emission selection transistor 5702, and the switching transistor 604 have preferably configurations provided with a low concentration impurity region (Lightly Doped Drains: also called an LDD region). This is because a transistor with a configuration provided with an LDD region can reduce an off current. When an off current flows to the writing selection transistor 5701, the light-emission selection transistor 5702, and the switching transistor 604, the capacitor 603 cannot hold a voltage.

Further, by thinning a thickness of the gate insulating film, therefore, an off current can be reduced as well. Accordingly, thicknesses of the writing selection transistor 5701, light-emission selection transistor 5702, and the switching transistor 604 may be thinner than a thickness of the driving transistor 601.

Moreover, multi-gate transistors are used for the writing selection transistor 5701, the light-emission selection transistor 5702, and the switching transistor 604, therefore, the gate leakage current can be reduced.

In addition, on/off of the writing selection transistor 5701 and the switching transistor 604 can be controlled at the same timing. Therefore, in the configuration in FIG. 57, a configuration in which the second scan line 5703 is omitted and a gate terminal of the writing selection transistor 5701 is connected to the scan line 606 may be applied.

Here, in the N channel transistor, an LDD region can be easily formed. Accordingly, if an N channel transistor is used as a switch, an off current can be reduced. Further, if the transistor has a multi-gate structure, a gate leakage current may be reduced further. Accordingly, the function of the transistor as a switch can be improved.

Figure 58:
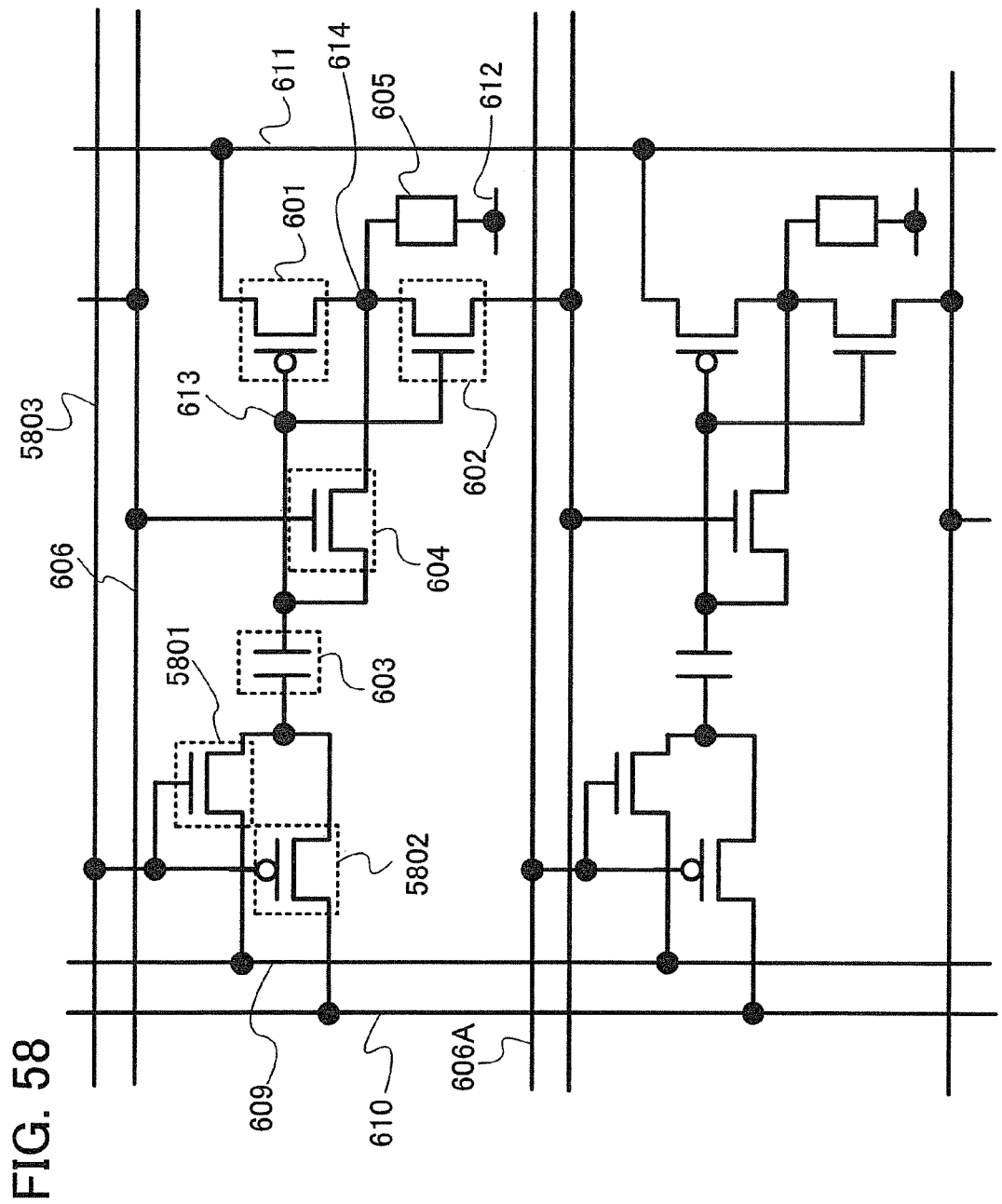
FIG. 58 is a diagram showing a pixel configuration of the invention.

In addition, FIG. 58 shows a case where a configuration in which an N channel transistor is used instead of the first switch 607 and a P channel transistor is used instead of the second switch 608 is applied in the configuration shown in FIG. 6.

Figure 59:
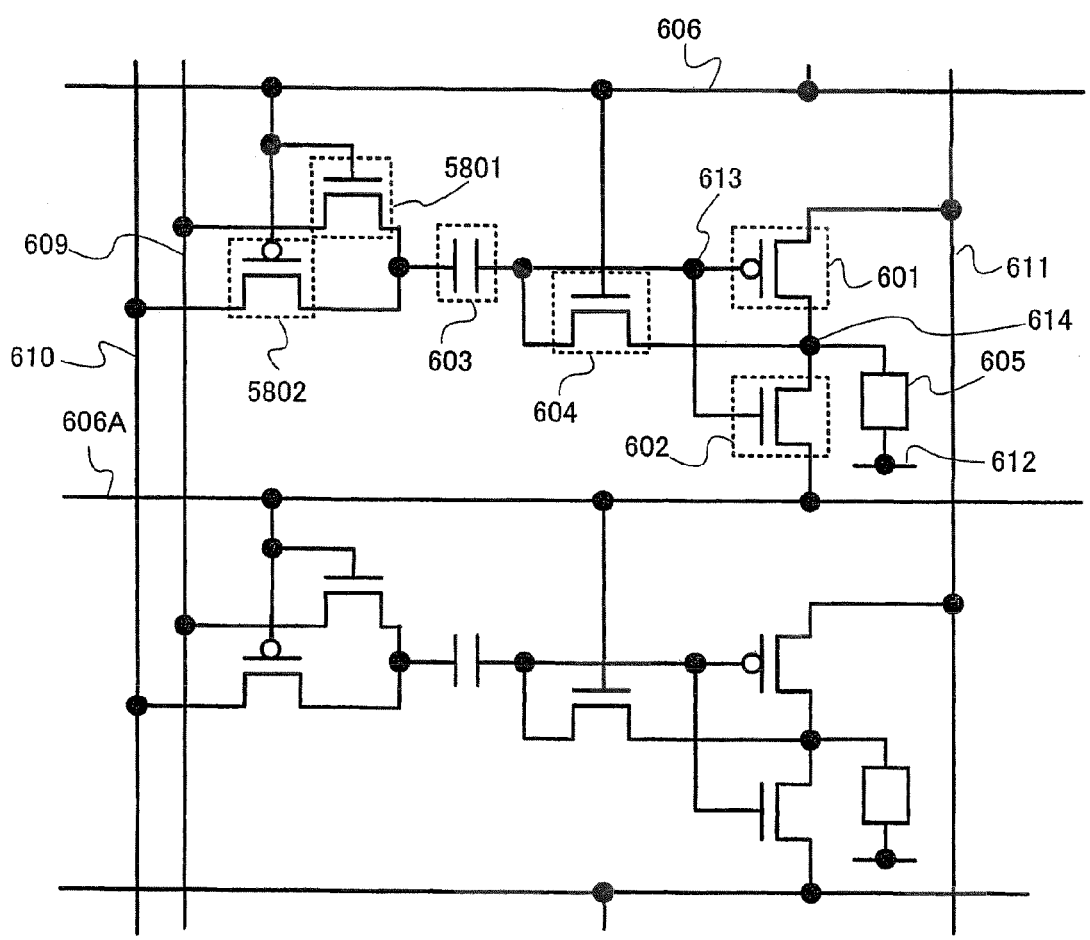
FIG. 59 is a diagram showing a pixel configuration of the invention.

A writing selection transistor 5801 is used instead of the first switch 607 and a light-emission selection transistor 5802 is used instead of the second switch 608. When either one of the writing selection transistor 5801 or the light-emission selection transistor 5702 is turned on, the other thereof is turned off, therefore, gate terminals of the writing selection transistor 5801 and the light-emission selection transistor 5802 are connected to a second scan line 5803 and a signal is inputted to the second scan line 5803 to control on/off of the writing selection transistor 5801 and the light-emission selection transistor 5802. Note that as shown in FIG. 59, the gate terminals of the writing selection transistor 5801 and the light-emission selection transistor 5802 may be connected to the scan line 606 to control on/off thereof.

In this manner, if an N channel transistor is applied instead of the first switch 607 and a P channel transistor is applied instead of the second switch 608, the number of wires for controlling them can be reduced. That is, an aperture ratio of a pixel can be improved. Accordingly, the reliability of a light emitting element can be improved.

[Embodiment Mode 3]

In this embodiment mode, description is made on a pixel configuration and a display device of the invention in the case of using a potential control line capable of controlling a potential level by a signal instead of a power source line with a fixed potential, and a driving method thereof.

Figure 48:
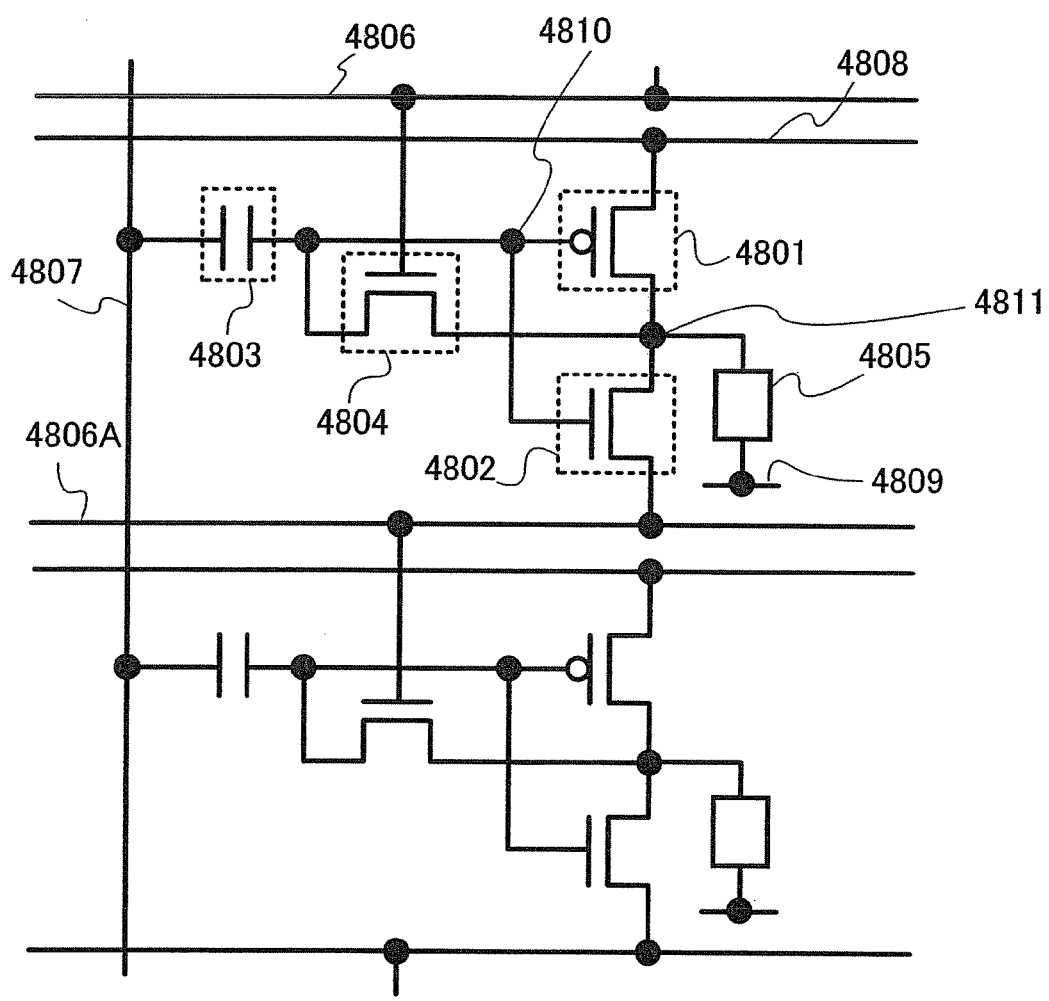
FIG. 48 is a diagram showing a pixel configuration of the invention.

FIG. 48 shows a pixel configuration in the case of applying a potential supply line 4808 instead of the power source line 108 in the pixel configuration shown in FIG. 1.

A pixel has a driving transistor (a second transistor) 4801, a complementary transistor (a third transistor) 4802, a capacitor 4803, a switching transistor (a first transistor) 4804, a light emitting element 4805, a scan line (Select line) 4806, a signal line (Data line) 4807, and a potential supply line (Illumination line) 4808. Note that a P channel transistor is used for the driving transistor 4801 while N channel transistors are used for the complementary transistor 4802 and the switching transistor 4804.

A first terminal (one of a source terminal or a drain terminal) of the driving transistor 4801 is connected to the potential supply line 4808, a second terminal (the other of the source terminal or the drain terminal) thereof is connected to a second terminal (one of a source terminal or a drain terminal) of the complementary transistor 4802, and a gate terminal of the driving transistor 4801 is connected to a gate terminal of the complementary transistor 4802. Further, the gate terminals of the driving transistor 4801 and the complementary transistor 4802 are connected to the signal line 4807 through the capacitor 4803, and connected to the second terminals (each one of the source terminal or the drain terminal) of the driving transistor 4801 and the complementary transistor 4802 through the switching transistor 4804. That is, a first terminal (one of a source terminal or a drain terminal) of the switching transistor 4804 is connected to the second terminals (each one of the source terminal or the drain terminal) of the driving transistor 4801 and the complementary transistor 4802, and a second terminal (the other of the source terminal or the drain terminal) of the switching transistor 4804 is connected to the gate terminals of the driving transistor 4801 and the complementary transistor 4802. Therefore, turning on/off the switching transistor 4804 can make a portion between the gate terminals and the second terminals (each one of the source terminal or the drain terminal) of the driving transistor 4801 and the complementary transistor 4802 conductive/non-conductive. Then, a signal is inputted to the scan line 4806 to which a gate terminal of the switching transistor 4804 is connected, thereby controlling on/off of the switching transistor 4804. Further, the second terminals (each one of the source terminal or the drain terminal) of the driving transistor 4801 and the complementary transistor 4802 are connected to an anode of the light emitting element 4805. In addition, a cathode of the light emitting element 4805 is connected to a wire (Cathode) 4809 to which a low power source potential Vss is supplied. Note that based on an H level potential Vdd supplied to the potential supply line 4808, Vss is a potential satisfying Vss<Vdd. For example, Vss=GND (ground potential) may be used.

Further, a first terminal of the complementary transistor 4802 is connected to a scan line 4806A in pixels of another row. Here, the driving transistor 4801 is a transistor for driving the light emitting element 4805 while the complementary transistor 4802 is a transistor in which a polarity thereof is inverted with respect to that of the driving transistor 4801. That is, when a signal of the potential supply line 4808 is at H level while a signal of the scan line 4806A is at L level, the driving transistor 4801 and the complementary transistor 4802 form an inverter to turn on/off complementarily.

In a period where a signal is written to the pixel, an analog signal potential is supplied to the signal line 4807. The analog signal potential corresponds to a video signal. Then, when a video signal is written to a pixel, a signal inputted to the potential supply line 4808 is at H level to supply Vdd to the first terminal (one of the source terminal or the drain terminal) of the driving transistor 4801. In addition, an H level signal is inputted to the scan line 4806 to turn on the switching transistor 4804. Note that at this time, an L level signal is inputted to the scan line 4806A for selecting pixels of another row. Therefore, when a signal is written to the pixel, the driving transistor 4801 and the complementary transistor 4802 are operated as an inverter. Note that when operating as the inverter, a connecting point between the gate terminals of the driving transistor 4801 and the complementary transistor 4802 is an input terminal 4810 of the inverter while a connecting point between the second terminals of the driving transistor 4801 and the complementary transistor 4802 is an output terminal 4811 of the inverter. In addition, when operating as the inverter, the first terminals of the driving transistor 4801 and the complementary transistor 4802 are source terminals while the second terminals thereof are drain terminals.

Note that an H level output of the inverter is the power source potential Vdd to be an H level output of the potential supply line 4808 while an L level output of the inverter is an L level potential of the scan line 4806A. In addition, the power source potential Vdd to be an H level output of the inverter, and L level potentials of the scan line 4806 and the scan line 4806A to be L level outputs of the inverter are set based on a potential of the wire 4809. Then, when the output of the inverter is at H level, the light emitting element 4805 emits light, and when the output of the inverter is at L level, the light emitting element 4805 emits no light.

That is, in the case where a voltage is $V_{EL}$ when the light emitting element 4805 starts emitting light, the L level potential is required to be lower than a potential of the wire 4809 of Vss+$V_{EL}$. Further, the H level potential is required to be higher than the potential of the wire 4809 of Vss+$V_{EL}$.

Note that when the L level potential is lower than the potential of the wire 4809, a reverse state voltage is applied to the light emitting element 4805. Therefore, the deterioration of the light emitting element 4805 is desirably suppressed.

Figure 49:
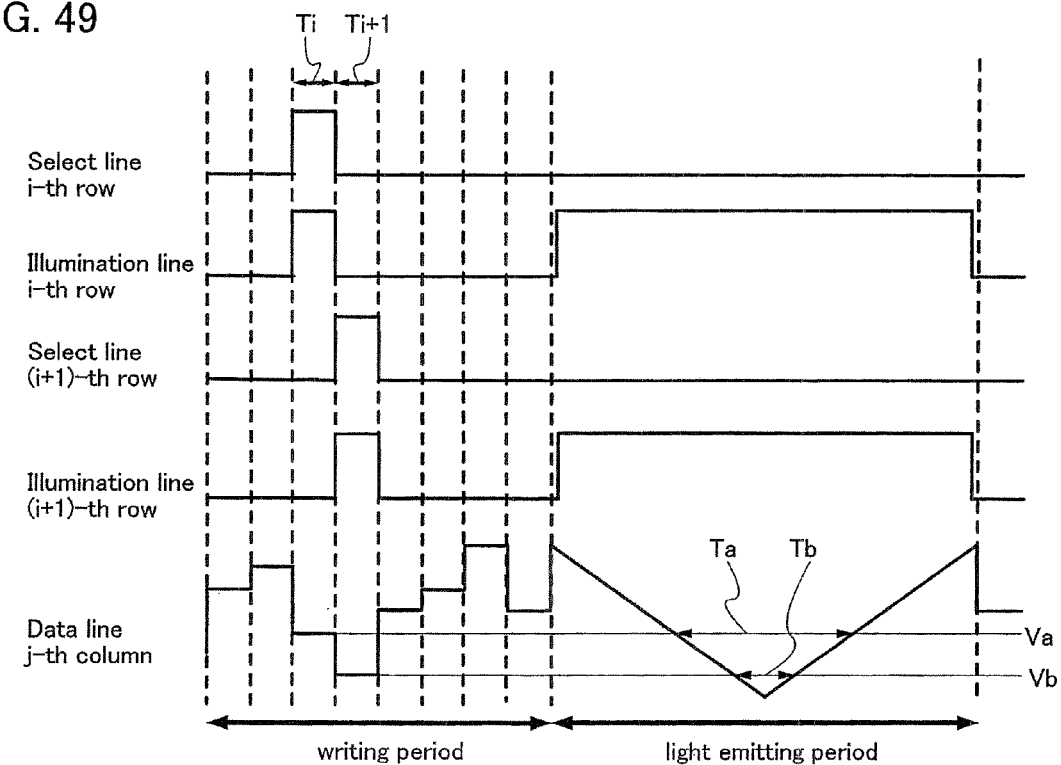
FIG. 49 is a diagram showing a timing chart of a display device having a pixel configuration of the invention.

Next, description is made in detail on a principal of operation of the pixel configuration in FIG. 48. A pixel selected by the scan line 4806 is a pixel of the i-th row, and a pixel selected by the scan line 4806A is a pixel of the (i+1)-th row, then, description is made with reference to a timing chart in FIG. 49.

Here, description is made on a period where a signal is written to the pixel of the i-th row. A period Ti shown in FIG. 49 means a signal writing time of the pixel of the i-th TOW.

First, in the period Ti where a signal is written to the pixel, an H level signal is supplied to the scan line (the Select line of the i-th row) 4806 to turn on the switching transistor 4804. Note that an L level potential is supplied to the scan line (the Select line of the (i+1)-th row) 4806A. Then, an H level signal is inputted to the potential supply line 4808 while a potential Vdd is supplied to the first terminal (one of the source terminal or the drain terminal) of the driving transistor 4801. Therefore, the driving transistor 4801 and the complementary transistor 4802 function as an inverter. Accordingly, a connecting point between the gate terminals of the driving transistor 4801 and the complementary transistor 4802 becomes the input terminal 4810 of the inverter while a connecting point between the second terminals of the driving transistor 4801 and the complementary transistor 4802 becomes the output terminal 4811 of the inverter.

Therefore, a portion between the input terminal 4810 and the output terminal 4811 of the inverter is made conductive to perform an offset cancellation. That is, a potential of the input terminal 4810 of the inverter becomes a logic threshold potential Vinv of the inverter. Therefore, at this time, a potential of the input terminal 4810 of the inverter becomes a required potential for controlling an output level of the inverter.

Then, a charge corresponding to a potential difference (voltage Vp) between the logic threshold potential Vinv of the inverter and the potential Va supplied to the signal line 4807 in the writing period Ti is accumulated in the capacitor 4803.

Subsequently, the scan line (the Select line of the i-th row) 4806 becomes at L level. Then, the switching transistor 4804 is turned off so that the voltage Vp is held in the capacitor 4803. Further, the potential supply line 4808 is at L level. In this manner, the period Ti is completed, then, an analog signal is written from the Data line (the signal line 4807) to a pixel of the i-th row and the j-th column. Note that at this time, analog signal potentials are supplied from the Data lines (the signal lines 4087) to pixel columns respectively to write analog signals into the pixels of the i-th row of each column.

Figure 56:
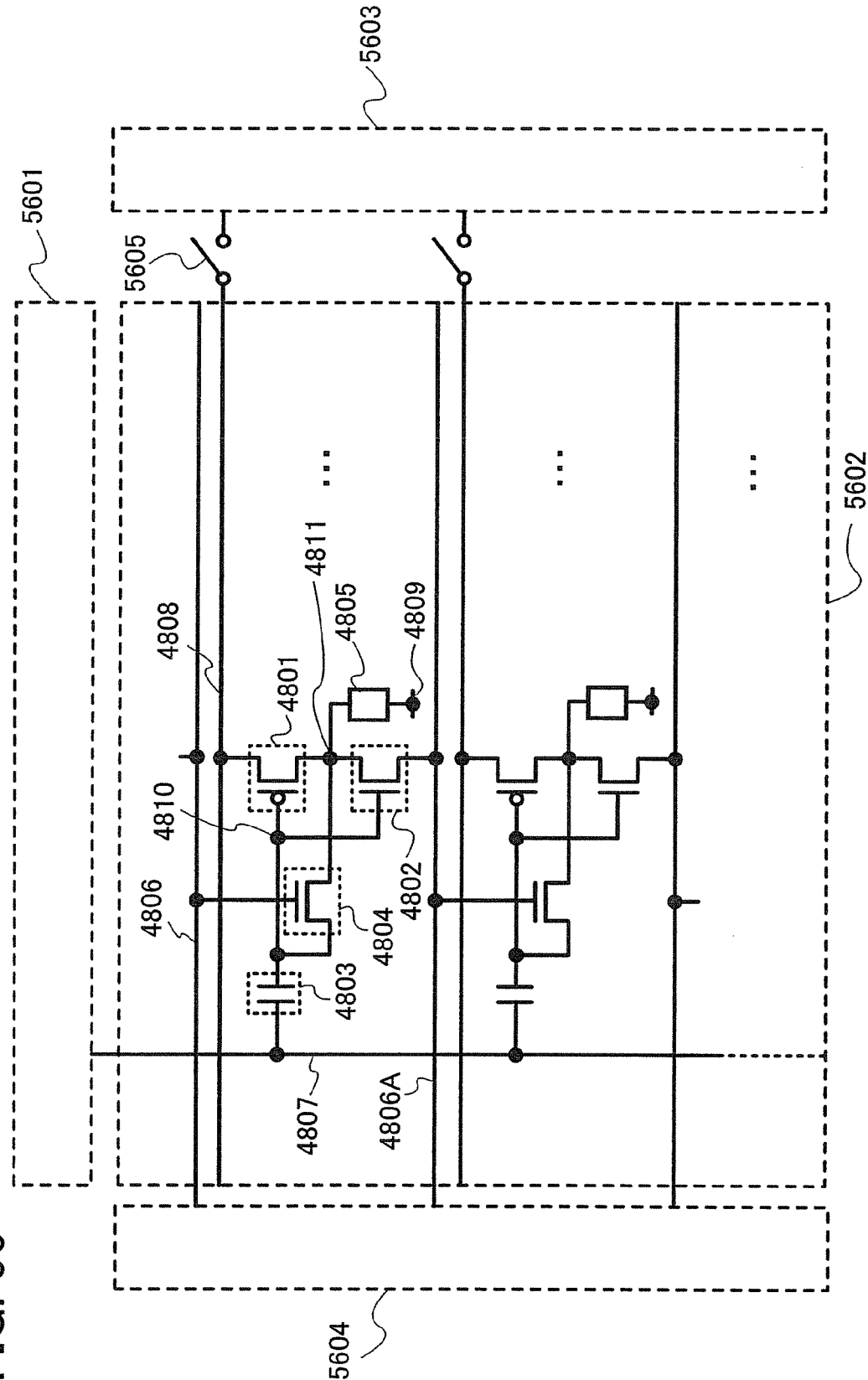
FIG. 56 is a diagram describing a display device having a pixel configuration of the invention.

Note that at this time, the potential supply line 4808 may not be an L level potential. For example, the potential supply line 4808 may be a floating state. FIG. 56 shows a pattern diagram of a display device having the pixel shown in FIG. 48. The display device has a signal line driver circuit 5601, a pixel portion 5602, a potential supply line driver circuit 5603, a scan line driver circuit 5604, and a floating switch 5605. Therefore, in the period where a signal is written to the pixel or a light emitting period, the floating switch 5605 is turned on and in the period where a signal is written to another row and the like, the floating switch 5605 may be turned off. That is, in the timing chart in FIG. 49, in the case of an L level Illumination line, floating may be used.

In this manner, when the period Ti where a signal is written to the pixel of the i-th row is completed, a period $T_{i+1}$ where a signal is written to a pixel of the (i+1)-th row starts, then, an H level signal is inputted to the scan line 4806A and a signal is written to the pixel of the (i+1)-th row, similarly to the signal writing operation the pixel of the i-th row.

In this manner, when signals are written to pixels of all rows and the writing period is completed, a triangle wave potential is supplied to the signal line 4807. That is, when a triangle wave potential of the pixel of the i-th row and j-th column is a higher potential than an analog signal potential supplied to the Data line (the signal line 4807) in the period Ti where a signal is written to the pixels of the i-th row, the light emitting element 4805 keeps a non-light emission state, and when a potential of the Data line (the signal line 4807) is a lower potential than the analog signal potential supplied to the Data line (the signal line 4807) in the period Ti where a signal is written to the pixels of the i-th row, the light emitting element 4805 emits light. Therefore, in accordance with an analog signal potential when an analog signal is written in the period where a signal is written to each pixel, light emitting time of the light emitting element 4805 is controlled. In this manner, an analog time gradation display can be performed. Since the light emitting time is controlled in an analog manner, a pseudo contour does not occur unlike a case of controlling the light emitting time in a digital manner. Accordingly, a clear display without image quality defect can be performed.

Note that an output level of the inverter for controlling light emission/non-light emission of the light emitting element 4805 is determined whether an analog signal potential supplied to the Data lines (the signal lines 4807) in a writing period is higher or lower than a triangle wave potential inputted to the Data lines (the signal lines 4807) in a light emitting period as described above, thereby controlling in a digital manner. Therefore, the light emission/non-light emission of the light emitting element 4805 can be controlled with a small effect of characteristic variations of the driving transistor 4801 and the complementary transistor 4802. That is, variations of light emission in each pixel can be improved.

Particularly, the inverter in a pixel is formed of the driving transistor 4801 which is a P channel transistor and the complementary transistor 4802 which is an N channel transistor, therefore, even when transistor characteristics of the driving transistor 4801 and the complementary transistor 4802 vary and inverter transfer characteristics vary to some extent in each pixel, the pixel configuration described in this embodiment mode can control the light emission/non-light emission of the light emitting element 4805 with the small effect of these.

Note that as shown in FIG. 12 described in Embodiment Mode 1, the potential may be supplied to the signal line (Data line) 4807 such as the waveform 1201, the waveform 1202, the waveform 1203, the waveform 1204, the waveform 1205, the waveform 1206, the waveform 1208, the waveform 1208Y9 or a plurality of these in succession.

By supplying in succession, the light emitting time can be divided in one frame. As a result, frame frequency seems to be improved so that a screen flicker can be prevented.

In addition, the first terminal (one of the source terminal or the drain terminal) of the complementary transistor 4802 is connected to the scan line 4806A, therefore, the number of wires can be reduced to improve an aperture ratio. Accordingly, the reliability of the light emitting element 4805 can be improved. In addition, yield increases so that cost can be suppressed.

Note that an L level potential of the potential supply line (Illumination line) 4808 is set such that a potential difference between the L level potential and a low power source potential Vss supplied to the wire (Cathode) 4809 is a forward threshold voltage or less of the light emitting element 4805. That is, when the L level potential of the potential supply line 4808 is supplied to a first electrode of the light emitting element 4805 and the low power source potential Vss is supplied to a second electrode of the light emitting element 4805, a voltage applied to the light emitting element 4805 may be a forward threshold voltage $V_{EL}$ or less. Note that at this time, the first electrode of the light emitting element 4805 is the anode while the second electrode thereof is the cathode. On the other hand, the L level potential of the potential supply line 4808 may be a further lower potential, that is, a potential lower than the low power source potential, and a voltage applied to the light emitting element 4805 may be reverse biased. By applying the reverse bias voltage, the reliability of the light emitting element 4805 can be improved and a malfunction portion in the light emitting element 4805 can be baked and cut. Therefore, according to the pixel configuration of this embodiment mode, a potential of the cathode of the light emitting element 4805 can be a fixed potential.

Moreover, when a signal is written to a pixel, the potential supply line 4808 is to be at L level or a floating state, therefore, a current can be prevented from flowing to the light emitting element 4805 and defective image can be prevented.

Figure 61:
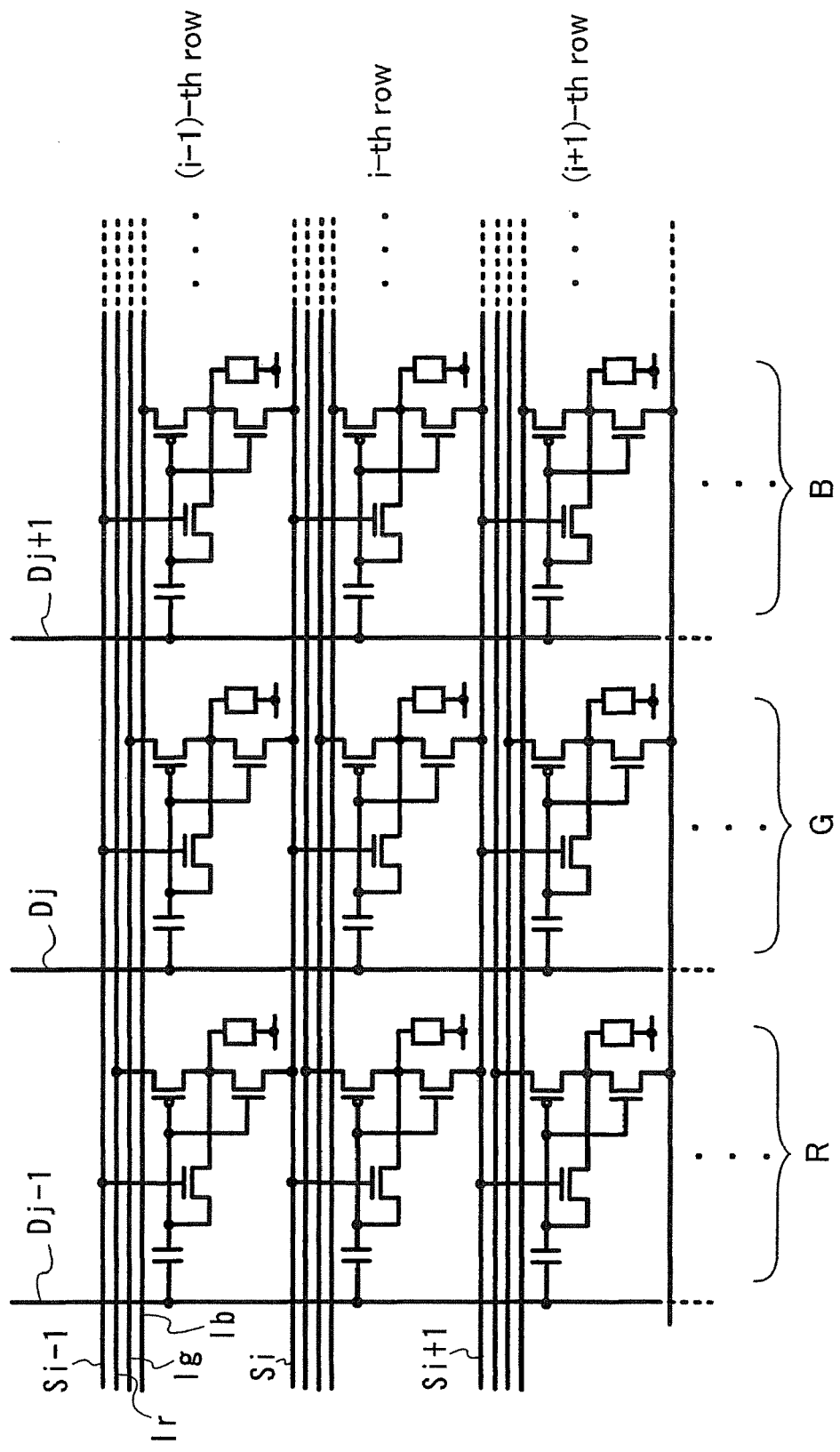
FIG. 61 is a diagram showing a pixel configuration of the invention.

Note that in the configuration of this embodiment mode, a voltage applied to a light emitting element may be changed in each pixel of color elements. FIG. 61 shows a configuration in which the potential supply line 4808 in a pixel shown in the pixel configuration illustrated in FIG. 48 is provided in each pixel of color elements. Here, although description is made on color elements of RGB as color elements, for example, a case of color elements of RGBW may be applicable.

As shown in FIG. 61, in a pixel column of a color element of R, the first terminal (one of the source terminal or the drain terminal) of the driving transistor is connected to a potential supply line Ir, in a pixel column of a color element of G, the first terminal (one of the source terminal or the drain terminal) of the driving transistor is connected to a potential supply line Ig, and in a pixel column of a color element of B, the first terminal (one of the source terminal or the drain terminal) of the driving transistor is connected to a potential supply line Ib. Therefore, a voltage applied to each color of the light emitting element can be controlled appropriately.

[Embodiment Mode 4]

In this embodiment mode, description is made on a configuration of a preferable display device in a display device having the pixel configurations described in Embodiment Mode 1, Embodiment Mode 2, and Embodiment Mode 3.

A display device of this embodiment mode is provided with a buffer in a scan line, a signal line, and a potential supply line. That is, a signal from a scan line driver circuit is inputted to a buffer, and a signal is outputted from the buffer to a scan line. A signal from a signal line driver circuit is inputted to a buffer, and a signal is outputted from the buffer to the signal line. A signal from a potential supply line driver circuit is inputted to a buffer and a signal is outputted from the buffer to the potential supply line. Thus, impedance transformation of output signals from the scan line driver circuit, the signal line driver circuit, and the potential supply line driver circuit is performed to increase a current supply capacity.

Note that without providing a buffer in a scan line, a signal line, and a potential supply line, buffers may be provided in a scan line driver circuit, a signal line driver circuit, and a potential supply line driver circuit, then, a current supply capacity of outputs of these driver circuits may be increased as well.

Figure 13:
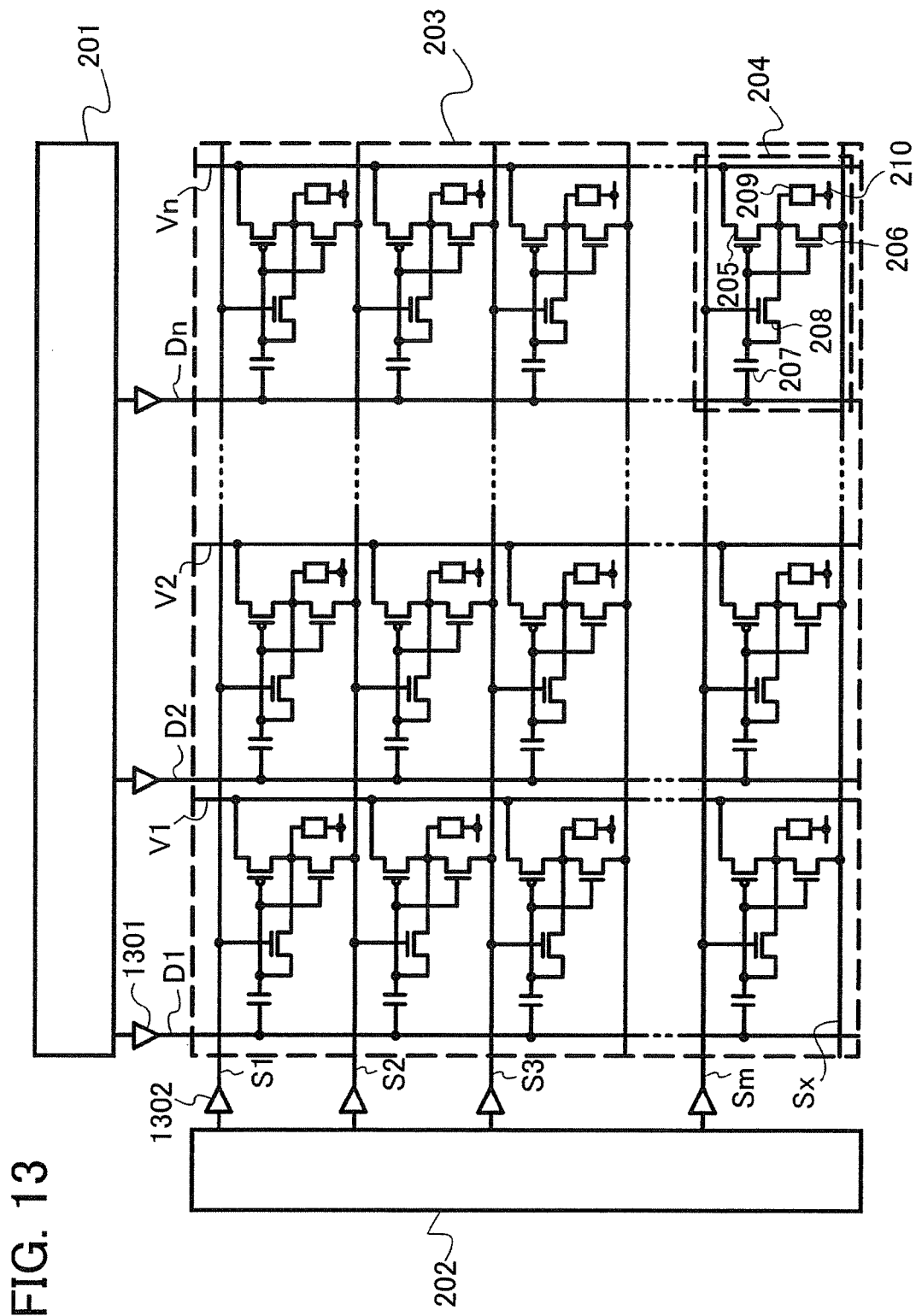
FIG. 13 is a diagram describing a display device having a pixel configuration of the invention.

Description is made on a basic configuration of the display device described in this embodiment mode with reference to FIG. 13. Note that in Embodiment Mode 1, common reference numerals are used for the common portions to the display device described with reference to FIG. 2.

Each of scan lines S1 to Sm controls switches of pixels of one row. For example, in the case of using a transistor for a switch, gate terminals of the switching transistors of the pixels of one row are connected to the scan lines Si to Sm respectively. Then, the switching transistors of one row are required to be turned on all at once. Particularly, as resolution increases, the number of transistors required to be turned on all at once also increases. Therefore, a buffer with high current supply capacity is preferably used for the buffer in this embodiment mode.

Figure 14:
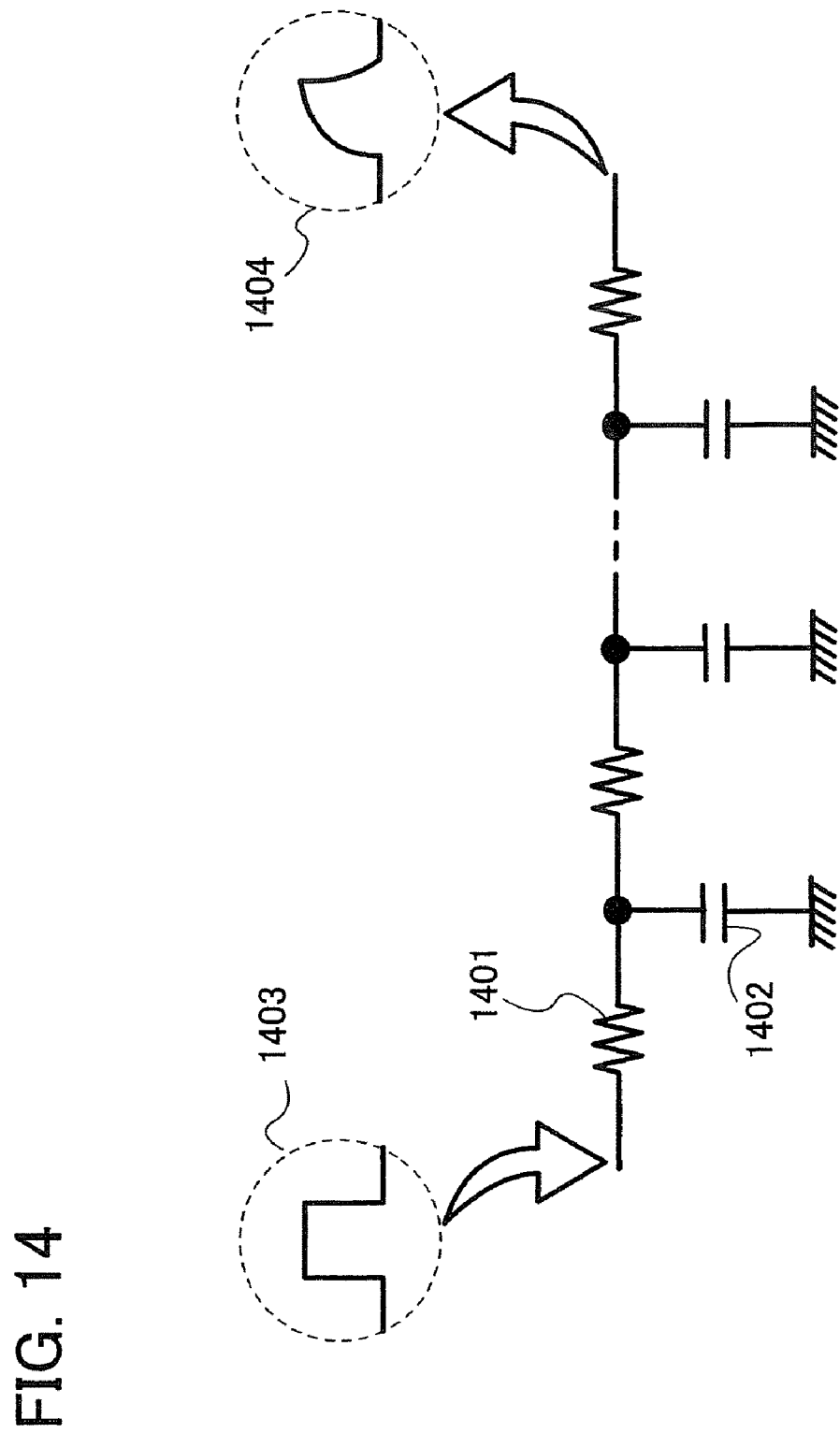
FIG. 14 is a diagram describing delay of the rising and falling edges of a signal.

Further, each of the scan lines Si to Sm of the display device shown in FIG. 13 has a wiring resistance, and at intersections with signal lines D1 to Dn, parasitic capacitance (intersection capacitance) is formed. Therefore, each of the scan lines Si to Sm can be described by an equivalent circuit as shown in FIG. 14 using a resistor 1401 and a capacitor 1402.

When a rectangular input pulse 1403 is inputted to the equivalent circuit, a response wave becomes a wave with dullness like an output pulse 1404. That is, rising and falling edge of the pulse delay. Then, the switching transistor 208 is not turned on at normal timing so that a video signal cannot be written to a pixel precisely. Therefore, in the display device of this embodiment mode, a current supply capacity of a signal outputted from a scan line is increased through a buffer, therefore, dullness occurrence of the signal outputted from the scan line can be reduced.

In addition, in the case of signal lines D1 to Dn, when parasitic capacitance is formed, supplying an analog signal potential corresponding to a video signal delays so that a signal cannot be written to a pixel precisely. Therefore, in the display device of this embodiment mode, a current supply capacity of a signal outputted from a signal line may also be increased through a buffer.

In the display device shown FIG. 13, signals outputted from the scan line driver circuit 202 are inputted to the scan lines S1 to Sm through respective buffers 1302 provided in the scan lines S1 to Sm. That is, current supply capacity of the signal outputted from the scan line driver circuit 202 is increased by interposing the buffer 1302. Similarly, a buffer 1301 is also provided in each of the signal lines D1 to Dn. Note that an analog buffer is used for the buffer 1301.

Accordingly, signals outputted from each driver circuit has high current supply capacity, therefore, the aforementioned dullness in a pulse signal can be reduced. Therefore, switching transistors of pixels of one row are turned on quickly so that a video signal can be written quickly. Accordingly, a period where a signal is written to a pixel can be shorter.

Here, described is an example of a buffer which can be used in this embodiment mode. Hereinafter, for a buffer, a terminal to which an input potential Vin is inputted is referred to as an input terminal while a terminal from which an output potential Vout is outputted is referred to as an output terminal.

Figure 15D:
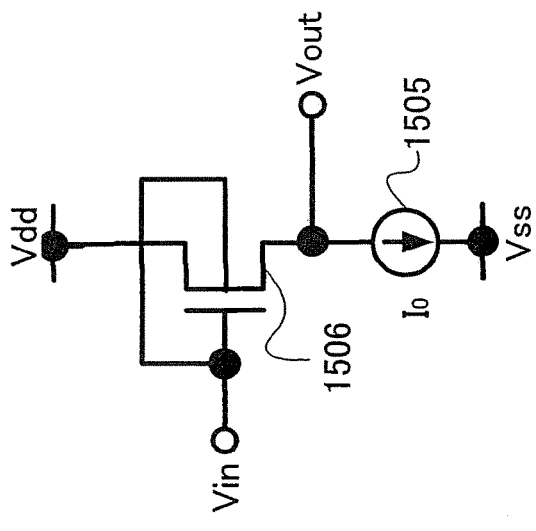
FIGS. 15A to 15D are diagrams each showing a buffer applicable to a display device having a pixel configuration of the invention.
Figure 15C:
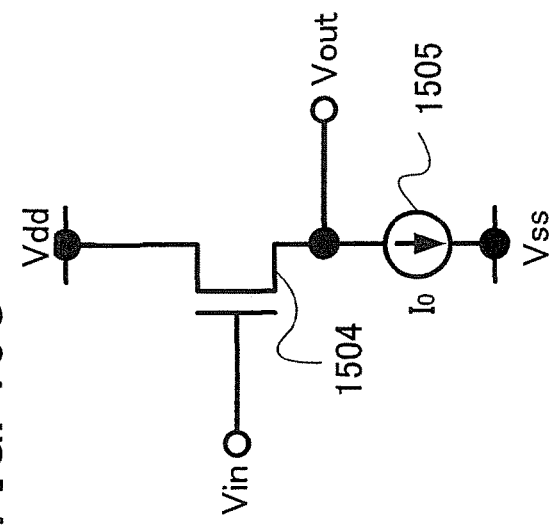
Figure 15A:
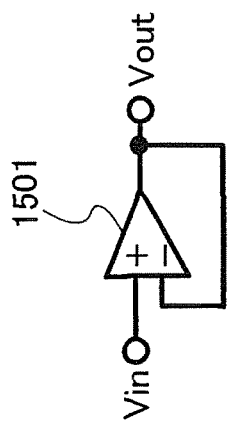

For example, as shown in FIG. 15A, an input terminal of a voltage follower circuit 1501 is connected to an output terminal of a signal line driver circuit while an output terminal of the voltage follower circuit 1501 is connected to a signal line. In the case of using a voltage follower circuit for a buffer, the voltage follower circuit may be formed over an IC chip which can form a transistor with small characteristic variations. Note that in this specification, an IC chip is a chip in which an integrated circuit is formed over a substrate and then separated. Particularly, an IC chip in which a circuit is formed by element isolation and the like using a single crystal silicon wafer as a substrate and the single crystal silicon wafer is separated in an arbitrary shape is suitably used.

Accordingly, in the case of adopting the voltage follower circuit 1501 as a buffer, an IC chip over which a scan line driver circuit, a signal line driver circuit, as well as a buffer may be mounted on a display panel by COG (Chip On Glass) or the like. Note that in the display device in FIG. 13, although a voltage follower circuit can be applied to the buffer 1301 and the buffer 1302, the voltage follower circuit functions as an analog buffer, therefore, the voltage follower circuit is particularly suitable for the buffer 1301.

Figure 15B:
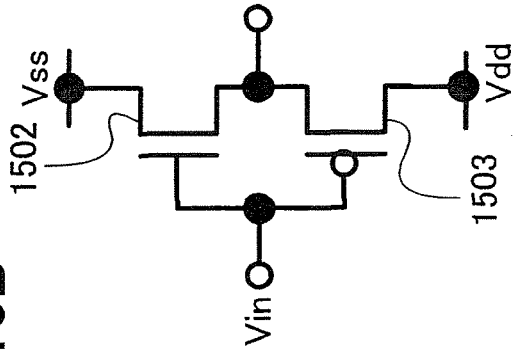

Moreover, as shown in FIG. 15B, an inverter which is an N channel transistor 1502 and a P channel transistor 1503 may be used for a buffer. A gate terminal of the N channel transistor 1502 and a gate terminal of the P channel transistor 1503 are connected to an input terminal to input an input potential Vin. In addition, a source terminal of the N channel transistor 1502 is connected to a low power source potential Vss while a drain terminal of the N channel transistor 1502 and a drain terminal of the P channel transistor 1503 are connected to an output terminal from which an output potential Vout is outputted. A plurality of inverters connecting in series can be used for a buffer. At this time, an inverter of the next stage of which input terminal is inputted with the output potential Vout outputted from the inverter can efficiently increase a current supply capacity by having current supply capacity three times as large. That is, when a potential outputted from the inverter to which a potential is inputted first is inputted to the inverter of the next stage, inverters with current supply capacity about three times as large are connected in series. In this manner, even number of connected inverters can be used for a buffer. Note that in a design of the N channel transistor 1502 and the P channel transistor 1503, a ratio of a channel width W and a channel length L:W/L is adjusted, thereby adjusting a current supply capacity. Note that a buffer using the inverter as shown in FIG. 15B can be applied to the buffer 1302 in the display device shown in FIG. 13. Note that a configuration of a buffer using such an inverter is simple, therefore, in the case of forming a display panel having a thin film transistor in which a scan line driver circuit and a signal line driver circuit as well as a pixel are integrally formed over a substrate, a buffer can be integrally formed. A buffer is integrally formed, therefore, cost can be reduced. Further, as in FIG. 15B, for a CMOS inverter including the N channel transistor 1502 and the P channel transistor 1503, when a potential close to a logic threshold potential Vinv of the inverter is inputted to the input terminal, a current flows to the N channel transistor 1502 and the P channel transistor 1503. However, when an H level potential or an L level potential is inputted to the input terminal, either one of the transistors is turned off, therefore, power is not be wasted. Accordingly, by using a CMOS inverter described in FIG. 15B, low power consumption can be achieved.

In addition, as shown in FIG. 15C, a source follower circuit can be used to form a buffer as well. The source follower circuit is formed of a source follower transistor 1504 and a current source 1505, a gate terminal of the source follower transistor 1504 is connected to an input terminal, a drain terminal thereof is connected to a wire to which a power source potential Vdd is supplied, and a source terminal thereof is connected to one terminal of the current source 1505 and an output terminal. The other terminal of the current source 1505 is connected to the wire to which the power source potential Vdd is supplied. Here, using a gate-source voltage Vgs of the source follower transistor 1504, an output potential Vout can be expressed by the following formula, Vout=Vin−Vgs . . . (1).

Here, Vgs is a voltage that the source follower transistor 1504 requires to flow a current $I_0$.

Accordingly, an output potential Vout is a potential lower than an input potential Vin by Vgs. However, in the case where a signal inputted to an input potential Vin is a digital signal, even when the gate-source voltage Vgs of the source follower transistor 1504 vary to some extent, a source follower circuit can be used for a buffer. Therefore, in the display device in FIG. 13, the source follower circuit can be used for the buffer 1302.

Moreover, a configuration of the source follower circuit shown in FIG. 15C is simple, therefore, the configuration can be easily formed using a thin film transistor. Accordingly, in the case of forming a display panel having a thin film transistor in which a scan line driver circuit and a signal line driver circuit as well as a pixel are integrally formed over a substrate, a buffer can be integrally formed as well.

In addition, as shown in FIG. 15C, an N channel transistor is used for the source follower transistor 1504, therefore, in a display panel in which a pixel, a scan line driver circuit, a signal line driver circuit, and a buffer are integrally formed, a unipolar display panel formed only of an N channel transistor can be formed.

Moreover, in the case of using a source follower circuit for a buffer, by forming a source follower transistor 1506 to have a dual gate as shown in FIG. 15D, a transistor with a low threshold voltage can be made. Note that configurations other than the source follower transistor 1506 are common to those of FIG. 15C, thereby using the common reference numerals and description thereof is omitted.

A source follower transistor as shown in FIG. 15D reduces a threshold voltage Vth, therefore, when variations of a threshold voltage Vth decreases in each source follower transistors forming a source follower circuit, the source follower circuit can also be used for an analog buffer. Accordingly, a source follower circuit as shown in FIG. 15D can be applied not only to the buffer 1302 but also to the buffer 1301 in the display device in FIG. 13.

Figure 16B:
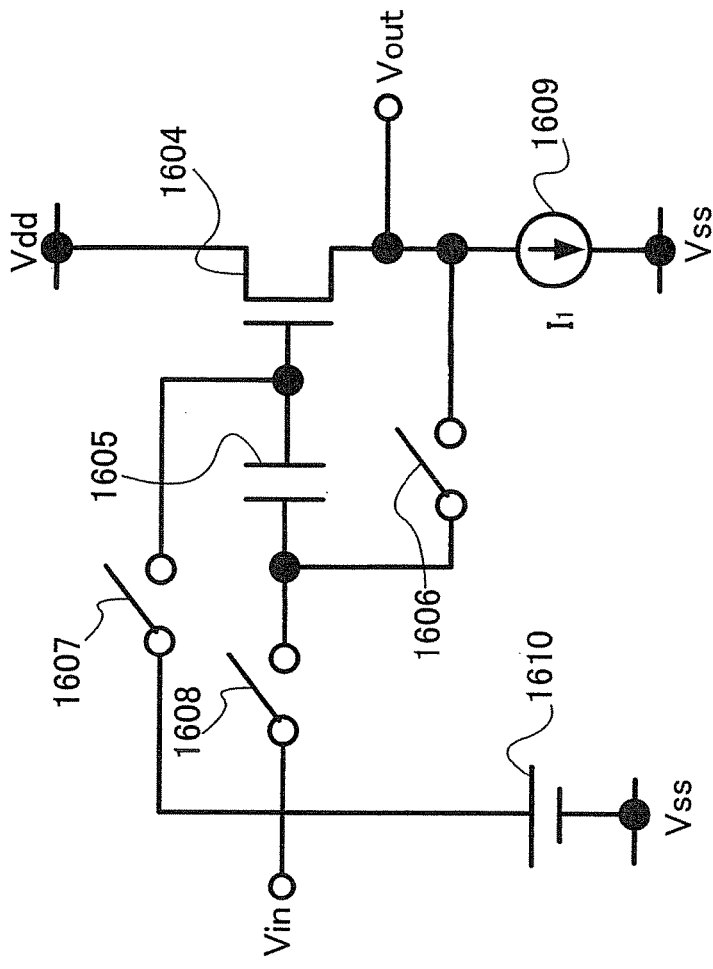
FIGS. 16A and 16B are diagrams each showing a buffer applicable to a display device having a pixel configuration of the invention.

Moreover, a configuration as shown in FIG. 16B can be used for a buffer. A source follower circuit includes a source follower transistor 1604, a capacitor 1605, a first switch 1606, a second switch 1607, a third switch 1608, a current source 1609, and a voltage source 1610. Then, a drain terminal of the source follower transistor 1604 is connected to a wire to which a power source potential Vdd is supplied, a source terminal thereof is connected to an output terminal, a wire to which a low power source potential Vss is supplied through the current source 1609, and one terminal of the first switch 1606. Then, the other terminal of the first switch 1606 is connected to one terminal of the capacitor 1605 and an input terminal through the third switch 1608. Further, the other terminal of the capacitor 1605 is connected to a gate terminal of the source follower transistor 1604 and a wire to which a low power source potential Vss is supplied through the second switch 1607 and the voltage source 1610.

Description is briefly made on an operation of the source follower circuit in FIG. 16B. In a precharge period, the first switch 1606 and the second switch 1607 are turned on. Then, a charge to be a voltage Vgs corresponding to a gate-source voltage of the source follower transistor 1604 required to flow a current $I_1$ is accumulated in the capacitor 1605. Then, the first switch 1606 and the second switch 1607 are turned off. Accordingly, the capacitor 1605 holds the gate-source voltage Vgs of the source follower transistor 1604. When the third switch 1608 is turned on, while the capacitor 1605 holds the gate-source voltage Vgs, an input potential Vin is inputted to the input terminal. Accordingly, a potential in which the gate-source voltage Vgs is added to the input potential Vin is supplied to the gate terminal of the source follower transistor 1604 to which the other terminal of the capacitor 1605 is connected. On the other hand, an output potential Vout outputted from the output terminal is a potential in which the gate-source voltage Vgs is subtracted from the gate terminal potential of the source follower transistor 1604. Accordingly, a potential outputted from the output terminal is the same potential as the potential inputted to the input terminal to be Vin=Vout.

Accordingly, the source follower circuit shown in FIG. 16B can be applied not only to the buffer 1302 in the display device in FIG. 13 but also to the buffer 1301 for increasing a current supply capacity of an analog signal.

In addition, the circuit is simple compared to a voltage follower circuit, therefore, in the case of forming a display panel having a thin film transistor in which a scan line driver circuit and a signal line driver circuit as well as a pixel are integrally formed, the source follower circuit shown in FIG. 16B can also be integrally formed as a buffer. Moreover, the source follower circuit shown in FIG. 16B can be formed of a unipolar transistor, therefore, a unipolar display panel can be formed.

Note that a transistor, a resistor, or a rectifier element operating in a saturation region can be used for the current source 1505 as shown in FIGS. 15C and 15D and the current source 1609 as shown in FIG. 16B. Furthermore, as the rectifier element, a PN junction diode or a diode connected transistor can be used as well.

Figure 16A:
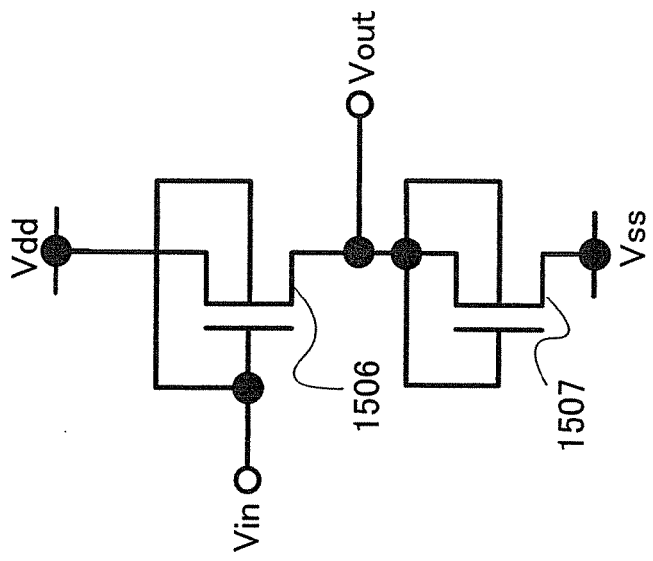

Here, description is made on a case where a diode connected transistor is applied to the current source 1505 in FIG. 15D with reference to FIG. 16A. A source follower circuit includes the source follower transistor 1506 and a diode connected transistor 1507, a drain terminal of the source follower transistor 1506 is connected to a wire to which a power source potential Vdd is supplied while a source terminal thereof is connected to a drain terminal of the diode connected transistor 1507 and an output terminal. In addition, the drain terminal of the diode connected transistor 1507 is connected to a gate terminal thereof while a source terminal thereof is connected to a wire to which a low power source potential Vss is supplied.

Note that a pixel configuration applicable to the display device of this embodiment mode is not limited to the configuration shown in FIG. 13, various pixel configurations shown in Embodiment Mode 1, Embodiment Mode 2, Embodiment Mode 3, and Embodiment Mode 4 can be applied. In addition, a buffer is not required to be provided in a scan line, a signal line, a potential supply line to which all outputs of a scan line driver circuit, a signal line driver circuit and a potential supply line driver circuit are inputted, and a buffer can be provided appropriately. Particularly, in the case of the display device having the pixel configuration in FIG. 48 described in Embodiment Mode 3, a signal inputted to the potential supply line 4808 is required to be a current for flowing a current to light emitting elements of one pixel row, therefore, a buffer may be provided to a potential supply line driver circuit for inputting a signal to the potential supply line 4808.

[Embodiment Mode 5]

In this embodiment mode, description is made on a scan line driver circuit, a signal line driver circuit, and a potential supply line driver circuit of a display device having the pixel configuration of the invention. That is, a scan line driver circuit, a signal line driver circuit, and a potential supply line driver circuit described in this embodiment mode can be appropriately applied to display devices having the pixel configurations described in Embodiment Mode 1, Embodiment Mode 2, and Embodiment Mode 3, and the display device described in Embodiment Mode 4.

Figure 25A:
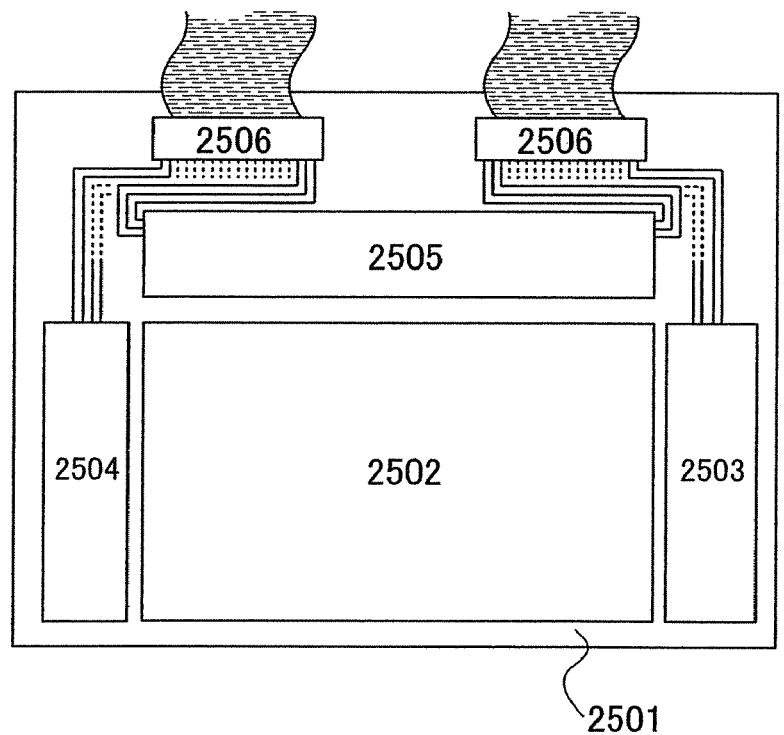
FIGS. 25A and 25B are pattern diagrams each of a display device of the invention.

A display device shown in FIG. 25A includes a pixel portion 2502 in which a plurality of pixels are arranged, and at the peripheral of the pixel portion 2502, there are a potential supply line driver circuit 2503, a scan line driver circuit 2504, and a signal line driver circuit 2505 over a substrate 2501. Note that in the case of a display device having the pixel configuration described in Embodiment Mode 1 or Embodiment Mode 2, the potential supply line driver circuit 2503 may not be provided. In this case, the scan line driver circuit 2504 corresponds to the scan line driver circuit 202 in FIG. 2 while the signal line driver circuit 2505 corresponds to the signal line driver circuit 201 in FIG. 2.

Signals inputted to the potential supply line driver circuit 2503, the scan line driver circuit 2504, and the signal line driver circuit 2505 are supplied from outside through a flexible print circuit (Flexible Print Circuit: FPC) 2506.

Note that although not shown, an IC chip may be mounted over the FPC 2506 by COG (Chip On Glass), TAB (Tape Automated Bonding) or the like. That is, a memory, a buffer or the like included in a part of the potential supply line driver circuit 2503, the scan line driver circuit 2504, and the signal line driver circuit 2505 which are difficult to be formed integrally with the pixel portion 2502 may be formed over an IC chip to be mounted on a display device.

Figure 25B:
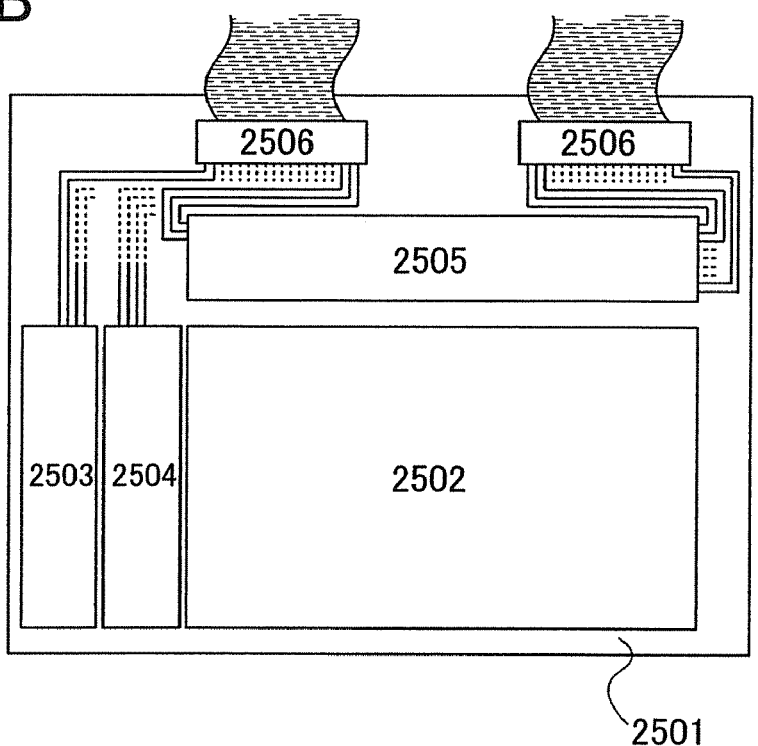

Further, as shown in FIG. 25B, the potential supply line driver circuit 2503 and the scan line driver circuit 2504 may be arranged in one side of the pixel portion 2502. Note that the display device shown in FIG. 25B is different only in an arrangement of the potential supply line driver circuit 2503 as the display device shown in FIG. 25A, therefore, the same reference numerals are used. In addition, one driver circuit may function as a similar function by one driver circuit of the potential supply line driver circuit 2503 and the scan line driver circuit 2504

Subsequently, description is made on a structure example of the signal line driver circuit 2505 of the display devices shown in FIGS. 25A and 25B. This is a driver circuit for supplying signals to signal lines (D1 to Dn) of the display device shown in FIG. 2. A signal line driver circuit shown in FIG. 31A has a pulse output circuit 3101, a first latch circuit

3102, a second latch circuit 3103, a D/A converter circuit (digital/analog converter circuit) 3104, a writing period/light emitting period selection circuit 3105, and an analog buffer circuit 3106.

Figure 31A:
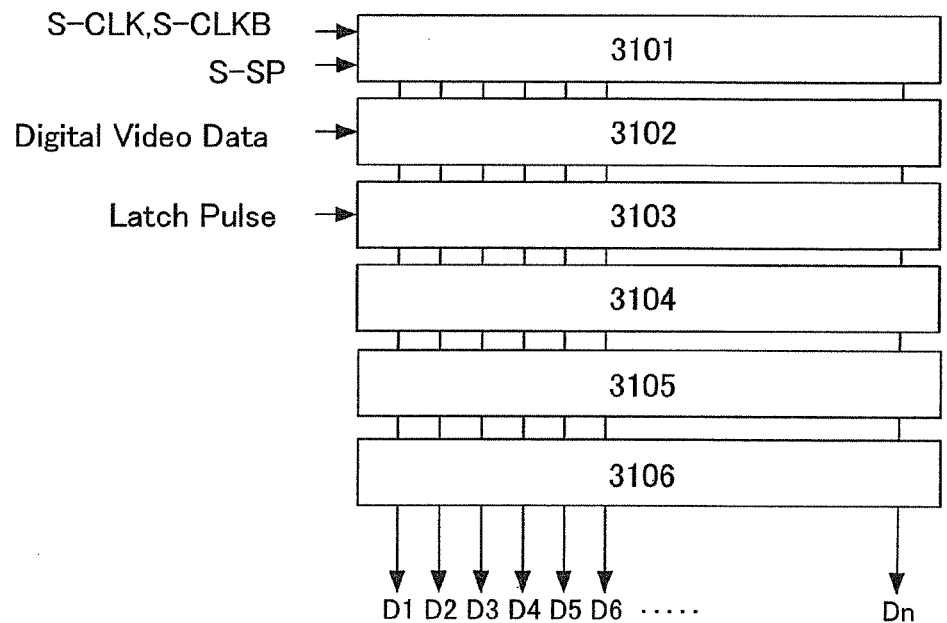
FIGS. 31A and 31B are examples of a signal line driver circuit applicable to a display device of the invention.
Figure 33:
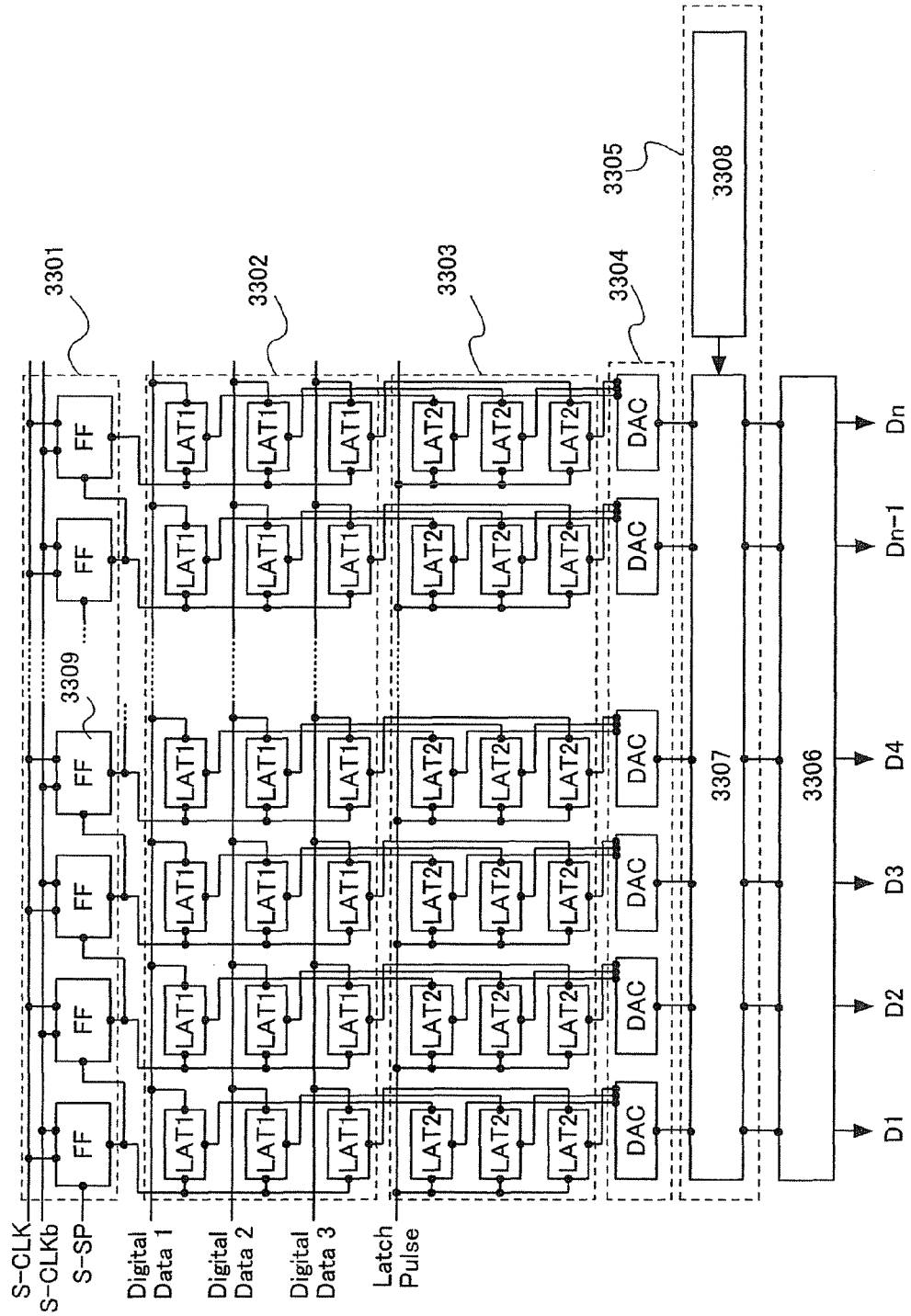
FIG. 33 is an example of a signal line driver circuit applicable to a display device of the invention.

Description is made on an operation of the signal line driver circuit shown in FIG. 31A with reference to a detailed structure shown in FIG. 33.

A pulse output circuit 3301 is made of a plurality of stages of flip-flop circuits (FFs) 3309 or the like, and a clock signal (S-CLK), a clock inverted signal (S-CLKB), a start pulse signal (S-SP) are inputted to the pulse output circuit 3301. In accordance with the timing of these signals, sampling pulses are outputted sequentially.

The sampling pulses outputted by the pulse output circuit 3301 are inputted to a first latch circuit 3302. Digital video signals are inputted to the first latch circuit 3302 and, in accordance with the timing of inputting the sampling pulses, digital video signals are held in each stage. Here, digital video signals are inputted by three bits in every stage, and a video signal of each bit is held in each first latch circuit 3302. One sampling pulse operates three latch circuits of each stage of the first latch circuit 3302 in parallel.

In the first latch circuit 3302, holding digital video signals are completed in the last stage, in a horizontal flyback period, latch pulses (Latch Pulses) are inputted to a second latch circuit 3303 and the digital video signals held in the first latch circuit 3302 are transferred to the second latch circuit 3303 all at once. After that, the digital video signals held in the second latch circuit 3303 are inputted to a DAC (D/A converter circuit) 3304 by one row at the same time.

In the DAC 3304, the inputted digital video signals are digital-to-analog converted, and video signals having an analog potential are inputted to a switching circuit 3307 in a writing period/light emitting period selection circuit 3305.

While the digital video signals held in the second latch circuit 3303 are inputted to the DAC 3304, sampling pulses are outputted again from the pulse output circuit 3301. Then, in a writing period, the aforementioned operations are repeated to perform treatment of video signals of one frame.

In addition, the writing period/light emitting period selection circuit 3305 has a triangle wave potential generating circuit 3308. During a light emitting period, the triangle wave potential generated by the triangle wave potential generating circuit 3308 is inputted to the switching circuit 3307.

In this manner, to the switching circuit 3307, the video signals from the DAC 3304 are inputted in a writing period while the triangle wave potential from the triangle wave potential generating circuit 3308 is inputted in a light emitting period. Then, the switching circuit 3307 inputs video signals to an analog buffer circuit 3306 in the writing period while inputs a triangle wave potential to the analog buffer circuit 3306 in the light emitting period.

The analog buffer circuit 3306 converts impedance and supplies a potential equivalent to the inputted potential to signal lines D1 to Dn. That is, current supply capacity of the video signals is increased by the analog buffer circuit 3306 to be supplied to the signal lines D1 to Dn as an analog signal potential. Note that, for example, these signal lines D1 to Dn correspond to the signal lines D1 to Dn in the display devices in FIGS. 2 and 13.

Figure 31B:
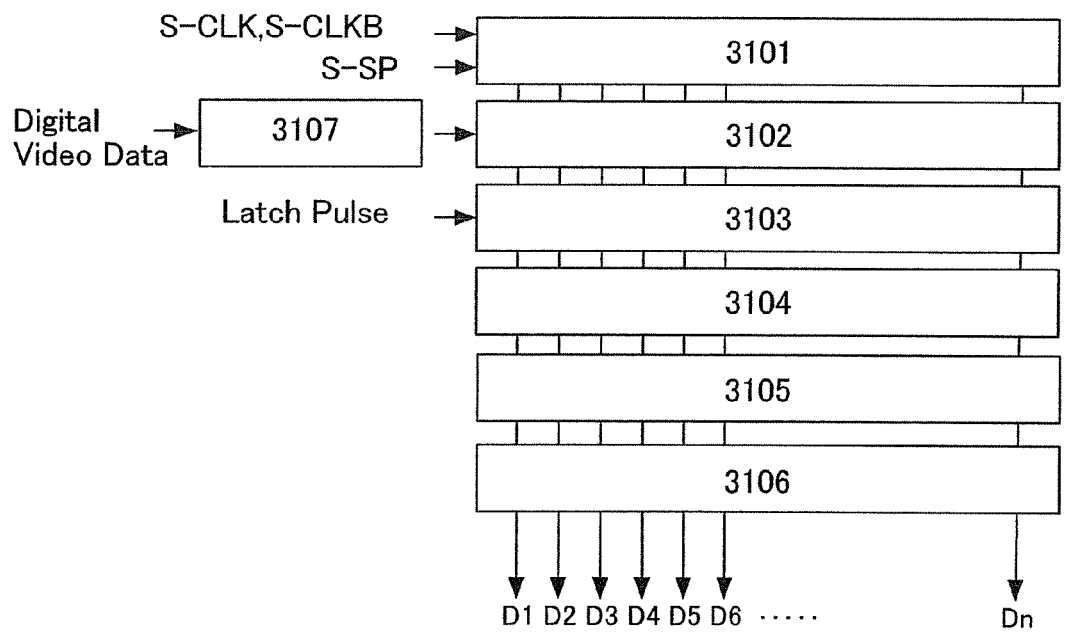

In FIG. 31A, there is a case where the inputted Digital Video Data is desirably corrected before converting to an analog signal. Therefore, as shown in FIG. 31B, before inputting the Digital Video Data to the first latch circuit 3102, the Digital Video Data is preferably corrected by a correction circuit 3107 to input to the first latch circuit 3102. The correction circuit 3107 can perform gamma correction and the like, for example.

Figure 35A:
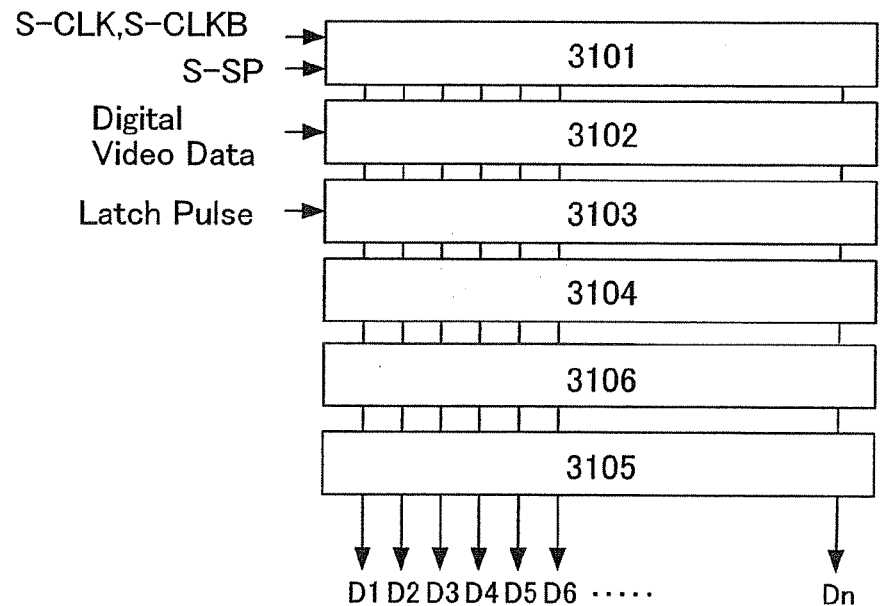
FIGS. 35A and 35B are examples of a signal line driver circuit applicable to a display device of the invention.
Figure 35B:
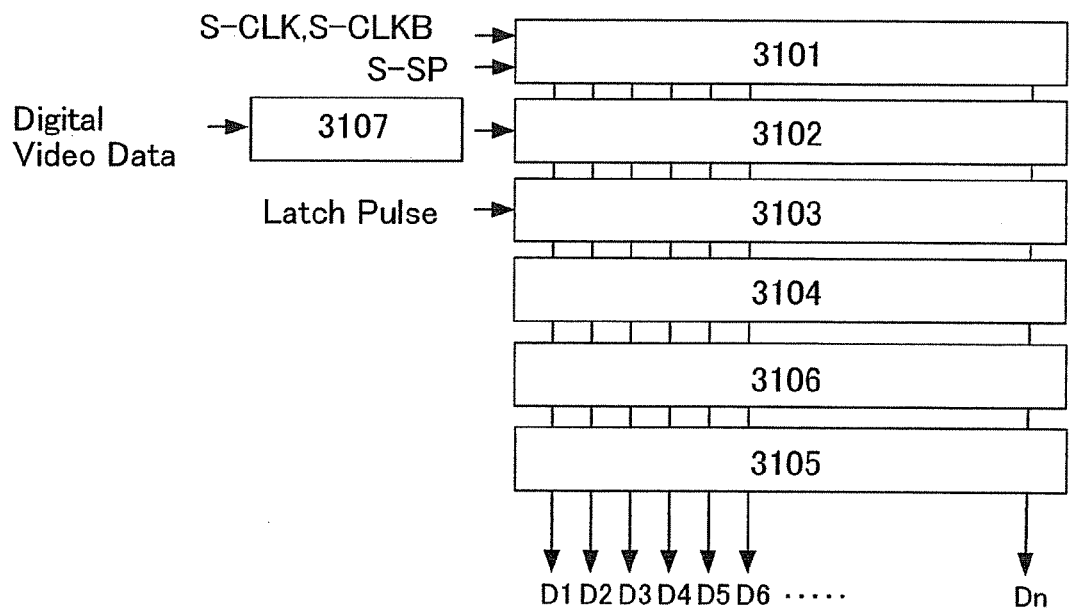

Further, the impedance conversion may be performed before an output of the D/A converter circuit is inputted to the writing period/light emitting period selection circuit. That is, in the configuration in FIG. 31A, as a configuration in which an output of the D/A converter circuit 3104 is impedance-converted to be inputted to the writing period/light emitting period selection circuit 3105, a configuration as shown in FIG. 35A may be made. At this time, the configuration shown in FIG. 33 in which the configuration in FIG. 31A is described in detail is a configuration as shown in FIG. 37. In FIG. 37, reference numeral 3701 denotes a pulse output circuit, 3702; a first latch circuit, 3703; a second latch circuit, 3704; a D/A converter circuit, 3705; a writing period/light emitting period selection circuit, 3706; an analog buffer circuit, 3707; a switching circuit, and 3708; a triangle wave potential generating circuit. In addition, in the configuration in FIG. 31B, as a configuration in which an output of the D/A converter circuit 3104 is impedance-converted to be inputted to the writing period/light emitting period selection circuit 3105, a configuration as shown in FIG. 35B may be made.

Figure 32A:
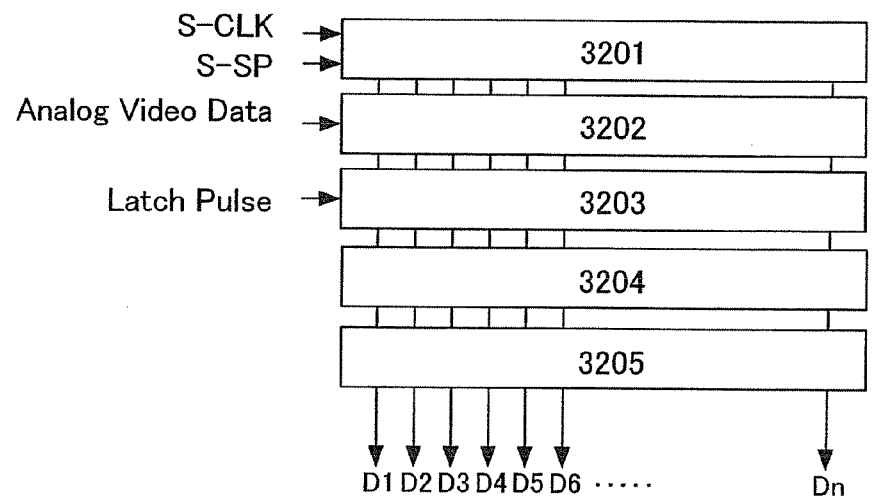
FIGS. 32A and 32B are examples of a signal line driver circuit applicable to a display device of the invention.
Figure 34:
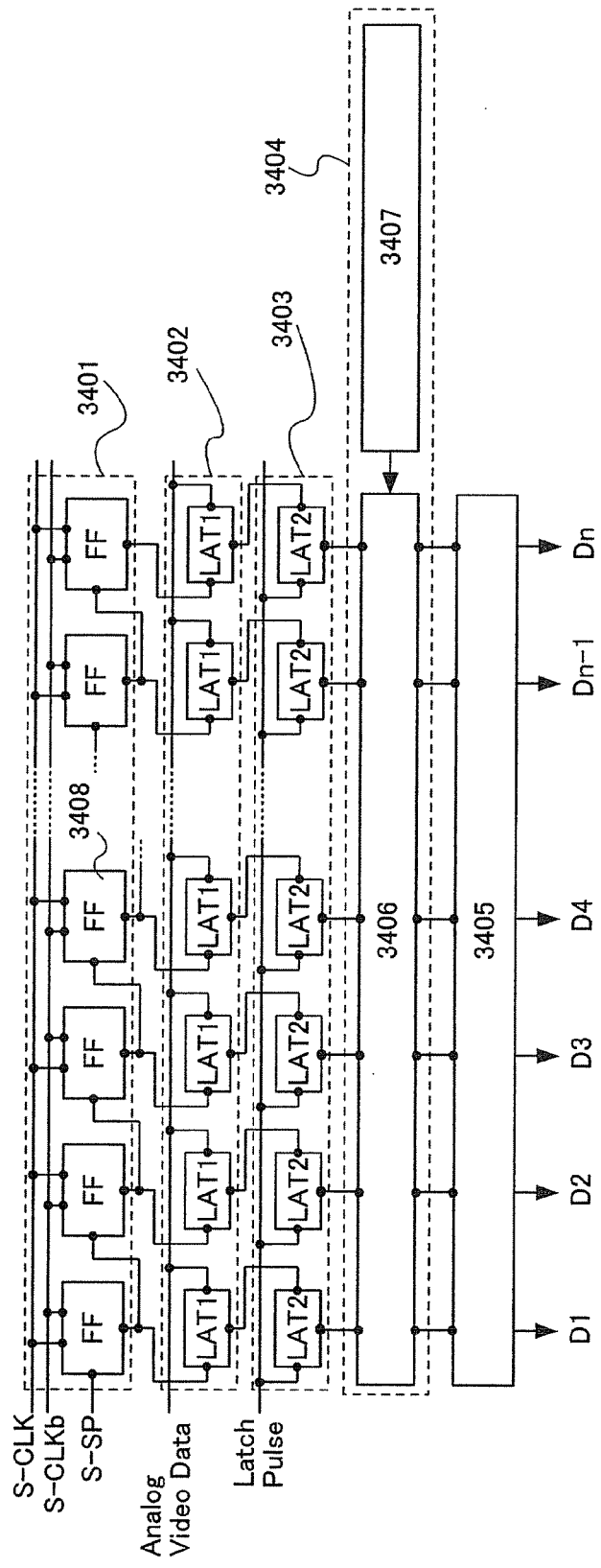
FIG. 34 is an example of a signal line driver circuit applicable to a display device of the invention.

In addition, description is made on the configuration in which video signals inputted to the signal line driver circuit are digital in FIGS. 31 and 33, and description is made next on a case where video signals are analog in FIGS. 32 and 34. In this case, as shown in FIGS. 31A and 31B, a D/A converter circuit may not be provided. In addition, an analog latch circuit and an analog latch circuit which can hold analog video signals may be provided by one bit in each stage. As shown in FIG. 32A, there are a pulse output circuit 3201, a first analog latch circuit 3202, a second analog latch circuit 3203, a writing period/light emitting period selection circuit 3204, and an analog buffer circuit 3205.

An operation of the signal line driver circuit shown in FIG. 32A is described with a detailed configuration shown in FIG. 34.

A pulse output circuit 3401 is made of a plurality of stages of flip-flop circuits (FFs) 3408 or the like, and a clock signal (S-CLK), a clock inverted signal (S-CLKB), a start pulse signal (S-SP) are inputted to the pulse output circuit 3301. In accordance with a timing of these signals, sampling pulses are outputted sequentially.

The sampling pulse outputted by the pulse output circuit 3401 are inputted to a first analog latch circuit 3402. Analog video signals are inputted to the first analog latch circuit 3402, in accordance with a timing of inputting the sampling pulses, analog video signals are held in each stage. Here, the analog video signals are inputted by one bit in each stage and held in the first analog latch circuit 3402 of each stage.

In the first analog latch circuit 3402, holding analog video signals are completed in the last stage, in a horizontal flyback period, latch pulses (Latch Pulses) are inputted to a second analog latch circuit 3403 and the analog video signals held in the first analog latch circuit 3402 are transferred to the second analog latch circuit 3403 all at once. After that, the analog video signals held in the second analog latch circuit 3403 are inputted to a switching circuit 3406 in a writing period/light emitting period selection circuit 3404 by one row at the same time.

Then, in a writing period, the switching circuit 3406 inputs video signals inputted from the second analog latch circuit 3403 to an analog buffer circuit 3405, and the analog buffer circuit 3405 converts impedance and supplies respective analog signal potentials to signal lines D1 to Dn. Note that, for example, these signal lines D1 to Dn correspond to the signal lines D1 to Dn in the display devices in FIGS. 2 and 13.

In this manner, while an analog signal potential of one pixel row is supplied to these signal lines D1 to Dn, sampling pulses are outputted again from the pulse output circuit 3401. Then, in a writing period, the aforementioned operations are repeated to perform treatment of video signals of one frame.

In addition, the writing period/light emitting period selection circuit 3404 has a triangle wave potential generating circuit, and in a light emitting period, a triangle wave potential generated by a triangle wave potential generating circuit 3407 is inputted to the switching circuit 3406. Then, in the light emitting period, the analog buffer circuit 3405 converts impedance and supplies a potential equivalent to the inputted triangle wave potential to signal lines D1 to Dn. That is, output current capacity increases by the analog buffer circuit.

In this manner, to the switching circuit 3406, video signals from the second analog latch circuit 3403 are inputted in a writing period while the triangle wave potential from the triangle wave potential generating circuit 3407 is inputted in a light emitting period. Then, the switching circuit 3406 inputs video signals to the analog buffer circuit 3405 in a writing period while inputs a triangle wave potential to the analog buffer circuit 3405 in the light emitting period.

Figure 32B:
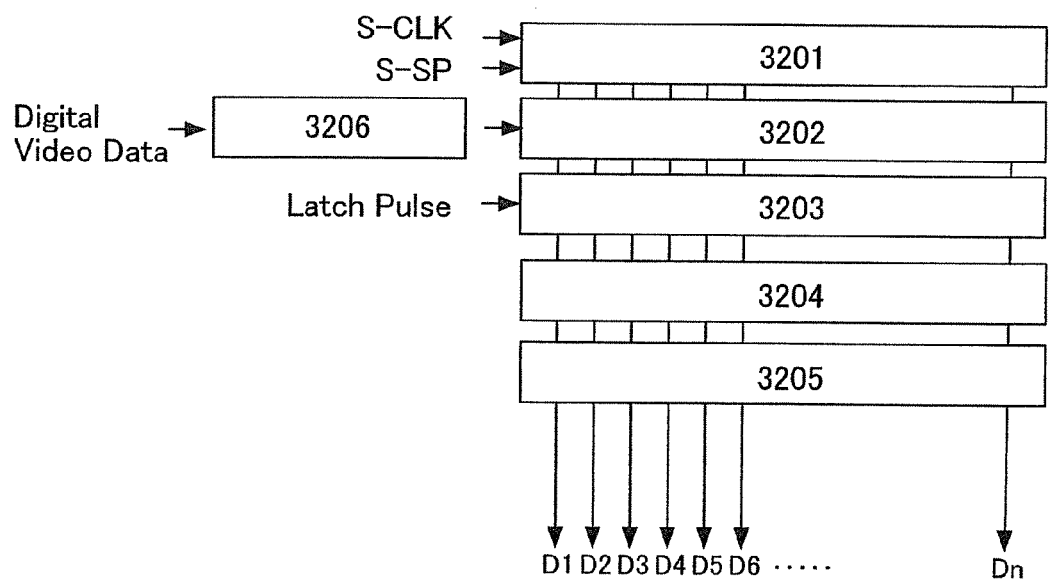

Moreover, in the case where a video signal from outside is a digital video signal, a D/A converter circuit 3206 may convert the digital video signal to an analog video signal to input to a first analog latch circuit 3202 as shown in FIG. 32B.

Figure 36A:
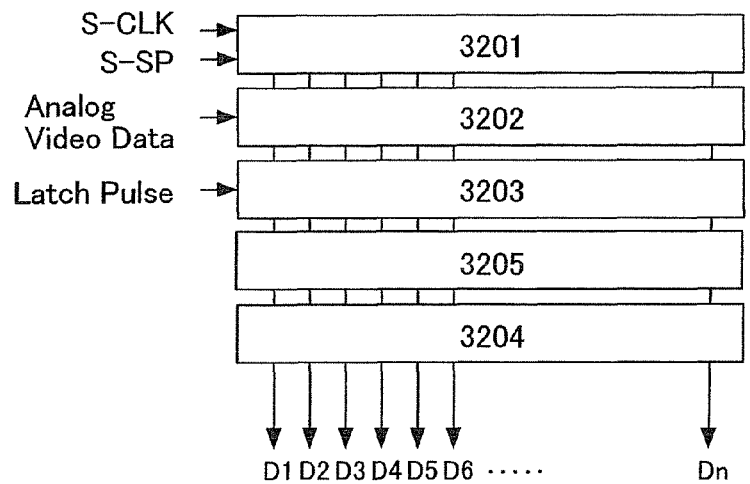
FIGS. 36A and 36B are examples of a signal line driver circuit applicable to a display device of the invention.
Figure 36B:
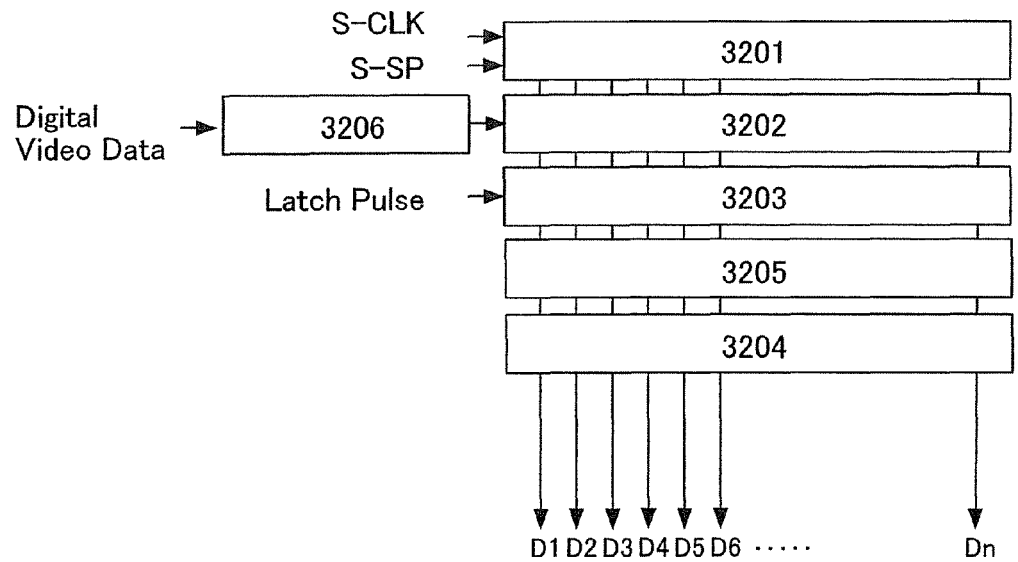

Further, the impedance conversion may be performed before an output of the second latch circuit is inputted to the writing period/light emitting period selection circuit. That is, in the configuration in FIG. 32A, as a configuration in which an output of the second analog latch circuit 3203 is impedance-converted to be inputted to the writing period/light emitting period selection circuit 3204, a configuration as shown in FIG. 36A may be used. At this time, the configuration shown in FIG. 34 in which the configuration in FIG. 32A is described in detail is a configuration as shown in FIG. 38. In FIG. 38, reference numeral 3801 denotes a pulse output circuit, 3802; a first latch circuit, 3803; a second latch circuit, 3804; a writing period/light emitting period selection circuit, 3805; an analog buffer circuit, 3806; a switching circuit, 3807; a triangle wave potential generating circuit. In addition, in the configuration in FIG. 32B, as a configuration in which an output of the second analog latch circuit 3203 is impedance-converted to be inputted to the writing period/light emitting period selection circuit 3204, a configuration as shown in FIG. 36B may be used.

Figure 39:
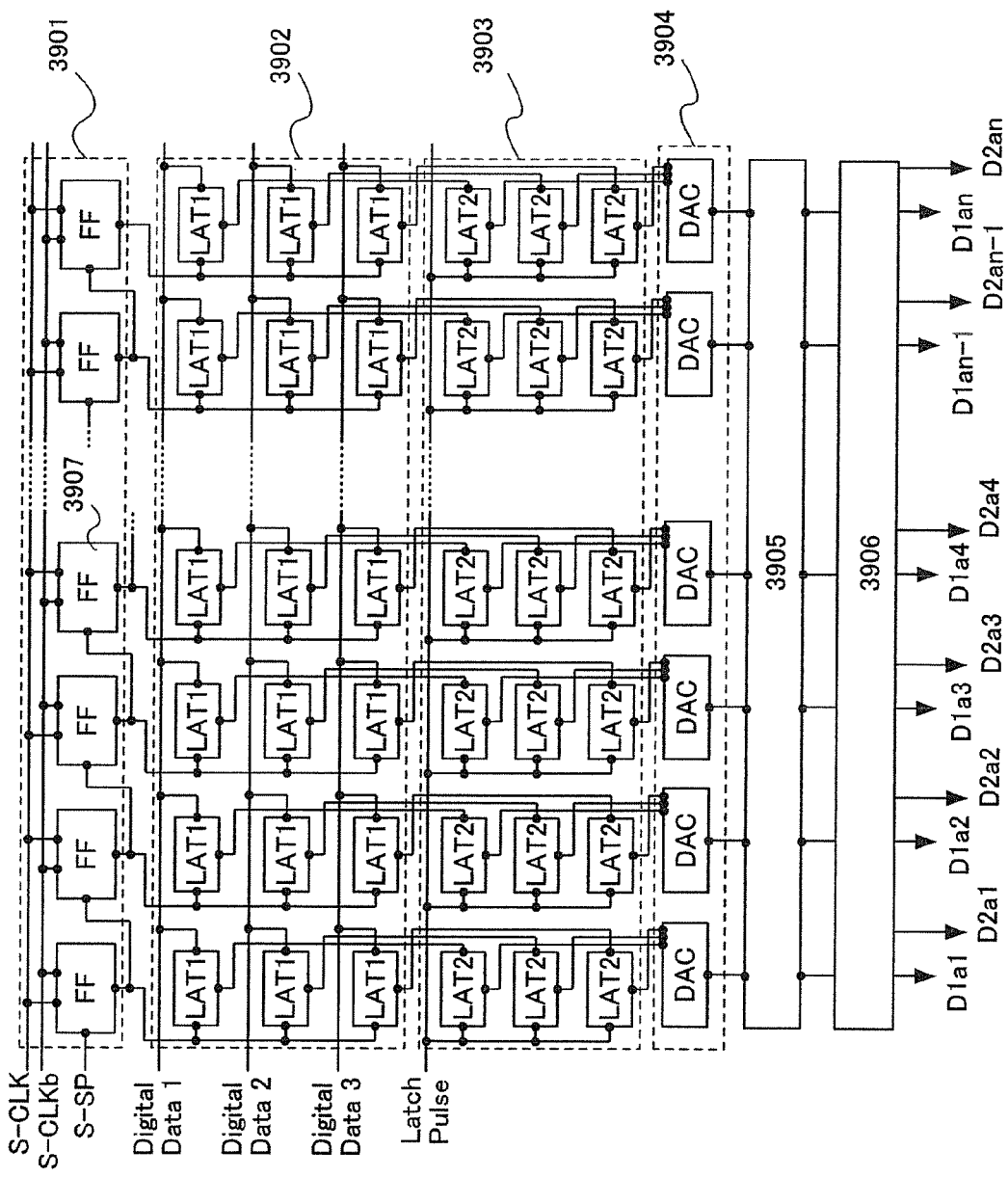
FIG. 39 is an example of a signal line driver circuit applicable to a display device of the invention.
Figure 40:
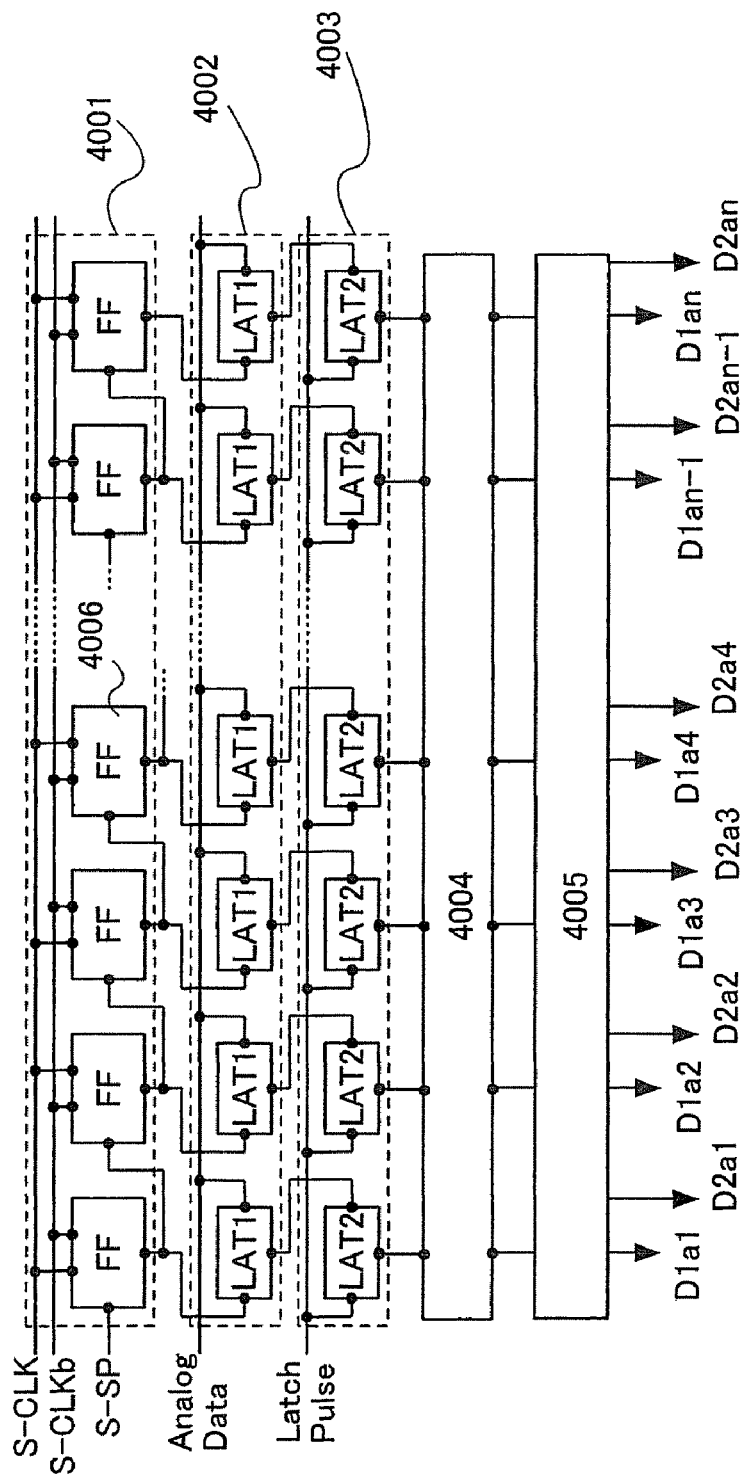
FIG. 40 is an example of a signal line driver circuit applicable to a display device of the invention.

Moreover, description is made on a signal line driver circuit applicable to a display device having a pixel configuration (for example, a pixel configuration such as FIGS. 6 and 8) in which an analog signal potential corresponding to a video signal and a potential which changes in an analog manner for controlling on/off of a driving transistor are inputted to a pixel by another signal lines with reference to FIGS. 39 and 40.

First, description is made on a configuration shown in FIG. 39.

A pulse output circuit 3901 is made of a plurality of stages of flip-flop circuits (FFs) 3907 or the like, and a clock signal (S-CLK), a clock inverted signal (S-CLKB), a start pulse signal (S-SP) are inputted to the pulse output circuit 3301. In accordance with a timing of these signals, sampling pulses are outputted sequentially.

The sampling pulses outputted by the pulse output circuit 3901 are inputted to a first latch circuit 3902. Digital video signals are inputted to the first latch circuit 3902 and, in accordance with the timing of inputting the sampling pulses, digital video signals are held in each stage. Here, digital video signals are inputted by three bits in each stage, and a video signal of each bit is held in the first latch circuit 3902. One sampling pulse operates three latch circuits of each stage of the first latch circuit 3902 in parallel.

In the first latch circuit 3902, holding digital video signals are completed in the last stage, in a horizontal flyback period, latch pulses (Latch Pulses) are inputted to a second latch circuit 3903 and the digital video signals held in the first latch circuit 3902 are transferred to the second analog latch circuit 3903 all at once. After that, the digital video signals held in the second latch circuit 3903 are inputted to a DAC (D/A converter circuit) 3904 by one row at the same time.

In the DAC 3904, inputted digital video signals are digital-to-analog converted and inputted to an analog buffer circuit 3905 as video signals having an analog potential.

An analog signal potential is supplied from the analog buffer circuit 3905 to each of signal lines D1a1 to D1an. At the same time, a triangle wave potential is also supplied from a triangle wave potential generating circuit 3906 to each of signal lines D2a1 to D2an. Note that the signal lines D1a1 to D1an correspond to the first signal line 609 or the first signal line 809 of the display device having a pixel such as FIGS. 6 and 8. Further, the signal lines D2a1 to D2an correspond to the second signal line 610 or the second signal line 810 of the display device having a pixel such as FIGS. 6 and 8.

In addition, description is made on a configuration shown in FIG. 40.

A pulse output circuit 4001 is made of a plurality of stages of flip-flop circuits (FFs) 4006 or the like, and a clock signal (S-CLK), a clock inverted signal (S-CLKB), a start pulse signal (S-SP) are inputted to the pulse output circuit 4001. In accordance with a timing of these signals, sampling pulses are outputted sequentially.

The sampling pulse outputted by the pulse output circuit 4001 are inputted to a first analog latch circuit 4002. Analog video signals (Analog Data) are inputted to the first analog latch circuit 4002, in accordance with a timing of inputting the sampling pulses, analog video signals are held in each stage. Here, the analog video signals are inputted by one bit in each stage and held in the first analog latch circuit 4002 of each stage.

In the first analog latch circuit 4002, holding analog video signals are completed in the last stage, in a horizontal flyback period, latch pulses (Latch Pulses) are inputted to a second analog latch circuit 4003 and the analog video signals held in the first analog latch circuit 4002 are transferred to the second analog latch circuit 4003 all at once. After that, the analog video signals held in the second analog latch circuit 4003 are inputted to an analog buffer circuit 4004 by one row at the same time.

An analog signal potential is supplied from the analog buffer circuit 4004 to each of signal lines D1a1 to D1an. At the same time, a triangle wave potential is also supplied from a triangle wave potential generating circuit 4005 to each of signal lines D2a1 to D2an.

Note that description is made on a signal line driver circuit in the case where signals are written to pixels selected in a row direction all at once (also called a line sequential method). However, in accordance with a signal outputted from a pulse output circuit, a video signal inputted to a signal line driver circuit may be written to a pixel directly (also called a dot sequential method).

Description is made on a signal line driver circuit of a dot sequential method applicable to the pixel configurations shown in FIGS. 1 and 4 described in Embodiment Mode 1 with reference to FIG. 41A. The signal line driver circuit includes a pulse output circuit 4101, a first switch group 4102, and a second switch group 4103. Each of the first switch group 4102 and the second switch group 4103 has a plurality of switch stages which correspond to signal lines respectively.

One terminals of switches of each stage of the first switch group 4102 are connected to a wire to which Analog Video Data corresponding to a video signal is inputted, the other terminals thereof are connected to respective corresponding signal lines. Further, one terminals of switches of each stage of the second switch group 4103 are connected to a wire to which a triangle wave potential is supplied, the other terminals thereof are connected to respective corresponding signal lines.

In a period where a signal is written to pixels, a clock signal (S-CLK), a clock inverted signal (S-CLKB), and a start pulse signal (S-SP) are inputted to the pulse output circuit 4101. In accordance with a timing of these signals, sampling pulses are outputted sequentially. Note that at this time, a control signal for controlling on/off of the second switch group 4103 is set to turn off switches of all stages.

Then, in accordance with an output of the sampling pulse, switches of the first switch group 4102 are turned by one stage.

Therefore, in the writing period, Analog Video Data is inputted to the signal lines corresponding to a stage of switches which are turned on of the first switch group 4102. Accordingly, switches of each stage of the first switch group 4102 are turned on sequentially to write Analog Video Data into pixels of a selected row.

Subsequently, pixels of the next row are selected and a signal is written to similarly. When signals are written to pixels of all rows, the signal writing period is completed.

After the signal writing period of pixels is completed, a light emitting period starts. In the light emitting period of pixels, a sampling pulse is not to be outputted from the pulse output circuit 4101. That is, an output of the pulse output circuit 4101 may not to be inputted to the first switch group 4102 or a start pulse signal (S-SP) may not to be inputted to the pulse output circuit 4101. That is, switches of the first switch group 4102 may be turned off.

A control signal is inputted so as to turn off all switches of the second switch group 4103. Then, a triangle wave potential is supplied to all signal lines. Note that in a light emitting period, pixels of all rows are selected, therefore, a triangle wave potential can be supplied to all pixels. A triangle wave potential is inputted.

In this manner, the light emitting period is completed to complete one frame period.

Next, description is made on a signal line driver circuit of a dot sequential method applicable to the pixel configurations in FIGS. 6 and 8 described in Embodiment Mode 2 with reference to FIG. 41B. The signal line driver circuit includes a pulse output circuit 4111 and a switch group 4112. Each of the switch group 4112 includes a plurality of stages of switches. The plurality of stages correspond to first signal lines respectively.

One terminals of switches of each stage of the switch group 4112 are connected to a wire to which Analog Video Data corresponding to a video signal is inputted, and the other terminals thereof are connected to first signal lines corresponding to pixel columns respectively. In addition, a wire to which a triangle wave potential is supplied is connected to second signal lines corresponding to pixel columns respectively.

In a period where a signal is written to pixels, a clock signal (S-CLK), a clock inverted signal (S-CLKB), a start pulse signal (S-SP) are inputted to the pulse output circuit 4111. In accordance with a timing of these signals, sampling pulses are outputted sequentially.

Then, in accordance with the output of the sampling pulse, switches of the switch group 4112 are turned on by one stage.

Therefore, in the period where a signal is written to pixels, Analog Video Data is inputted to the first signal lines corresponding to a stage of switches which are turned on of the switch group 4112. Accordingly, switches of each stage of the switch group 4112 are turned on sequentially to write Analog Video Data into pixels of a selected row.

Note that pixels of a row not selected are connected to the second signal lines to be in a light emitting period.

In this manner, the configuration shown in FIG. 41B can be applied to a pixel such as the pixels shown in FIGS. 6 and 8 in Embodiment Mode 2 in which a writing period is set for each pixel row and while one row is in a writing period, the other rows are in a light emitting period.

Subsequently, description is made on a scan line driver circuit and a potential supply line driver circuit.

Each scan line driver circuit and potential supply line driver circuit has a pulse output circuit. In a writing period, a sampling pulse is outputted from the pulse output circuit to a scan line and a potential supply line. In a light emitting period, the output of the sampling pulse is not to be outputted and a signal is inputted to the scan line such that all pixel rows are not to be selected. In addition, a potential for applying a forward voltage to a light emitting element is supplied to the potential supply line.

Note that when the scan line driver circuit and the potential supply line driver circuit are formed by one driver circuit, therefore, a space of the driver circuit can be reduced and a narrow bezel is achieved.

Next, description is made on a configuration applicable to the D/A converter circuit of this embodiment mode.

Figure 17:
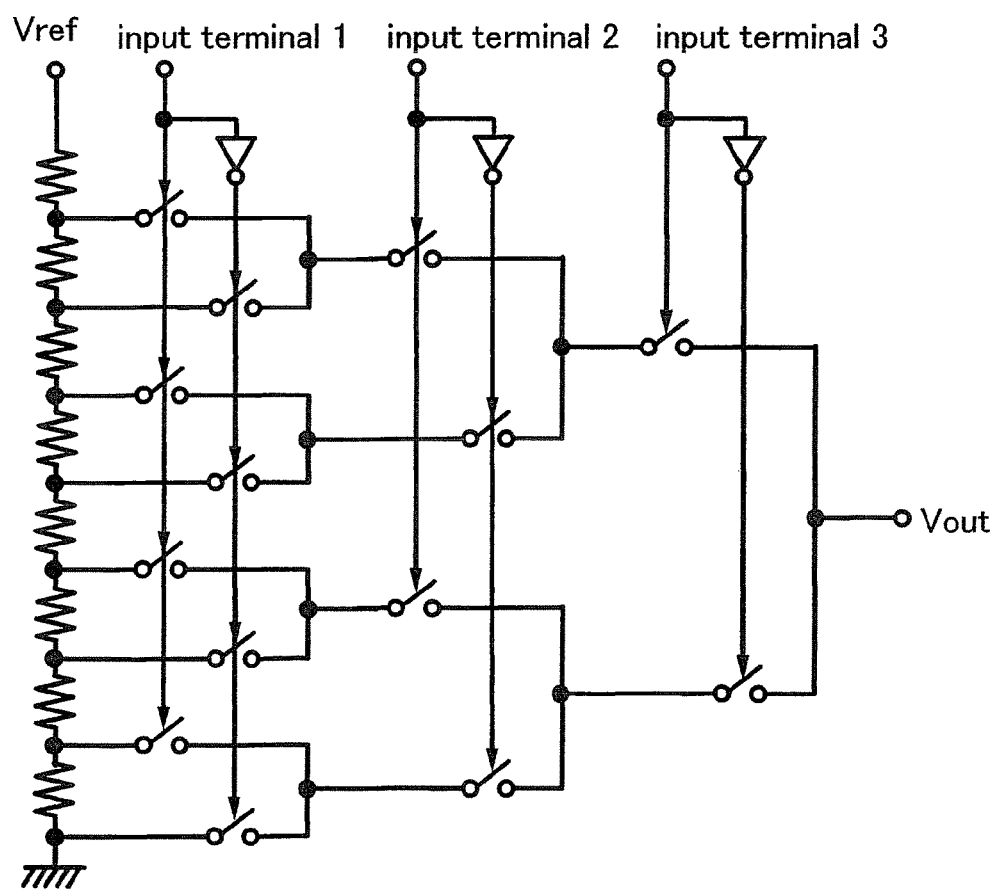
FIG. 17 shows one example of a D/A converter circuit applicable to a display device having a pixel configuration of the invention.

FIG. 17 shows a resistor string D/A converter circuit capable of converting a digital signal of three bits to an analog signal.

A plurality of resistors are connected in series, a reference power source potential Vref is supplied to one terminals of the resistor group while a low power source potential (for example, GND) is supplied to the other terminals thereof. Then, a current flows to the resistor group and both terminals of each resistor have different potentials due to voltage drop. In accordance with signals inputted to an input terminal 1, an input terminal 2, and an input terminal 3 respectively, on/off of switches are selected, therefore, eight different potentials can be obtained from an output terminal. Specifically, by a signal inputted to the input terminal 3, among the eight potentials, four higher potentials or four lower potentials are selected. Then, by a signal inputted to the input terminal 2, among the four potentials selected by the input terminal 3, two higher potentials or two lower potentials are selected. Then, by a signal inputted to the input terminal 1, among the two potentials selected by the input terminal 2, a higher potential or a lower potential is selected. In this manner, one potential is selected from the eight potentials. Therefore, digital signals inputted to the input terminal 1, the input terminal 2, and the input terminal 3 can be converted to an analog signal potential.

Figure 18:
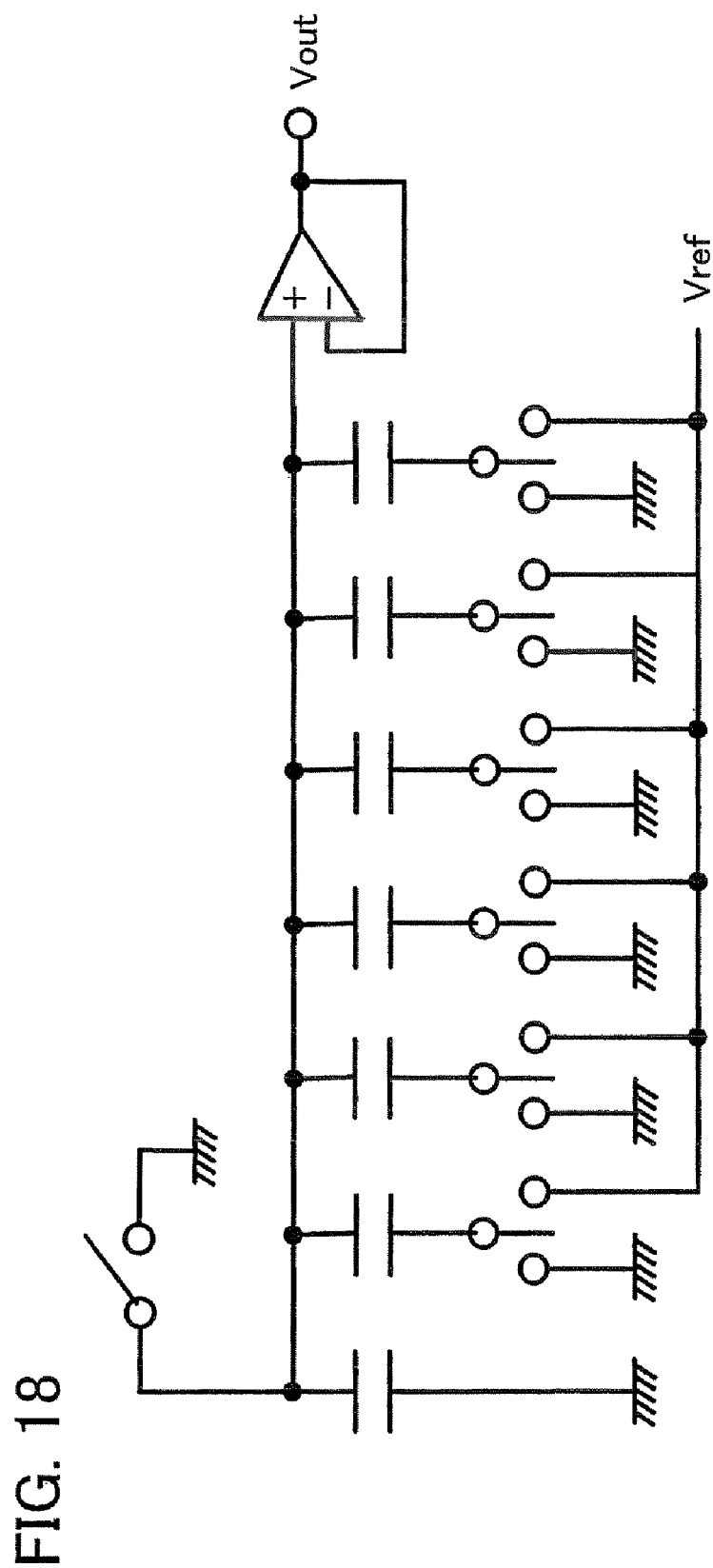
FIG. 18 is a diagram showing one example of a D/A converter circuit applicable to a display device having a pixel configuration of the invention.

In addition, a capacitor array D/A converter circuit capable of converting a digital signal of six bits into an analog signal shown in FIG. 18 is also applicable.

A plurality of capacitors which have different electrostatic capacity are electrically connected in parallel. Among these capacitors, in accordance with a digital signal, on/off of switches 1 to 6 are controlled, then a charge corresponding to a potential difference between a reference power source potential Vref and a low power source potential (for example, GND) is accumulated in an arbitrary capacitor, then the accumulated charge is distributed by the plurality of capacitors. Then, voltages of the plurality of capacitors become stable to be a certain value. From the voltage, one potential is detected by an amplifier to convert the digital signal to an analog signal potential.

Further, a D/A converter circuit combined with a resistor string type and a capacitor array type may be used as well. These D/A converter circuits are only examples, therefore, various D/A converter circuits can be appropriately used.

[Embodiment Mode 6]

Figure 19A:
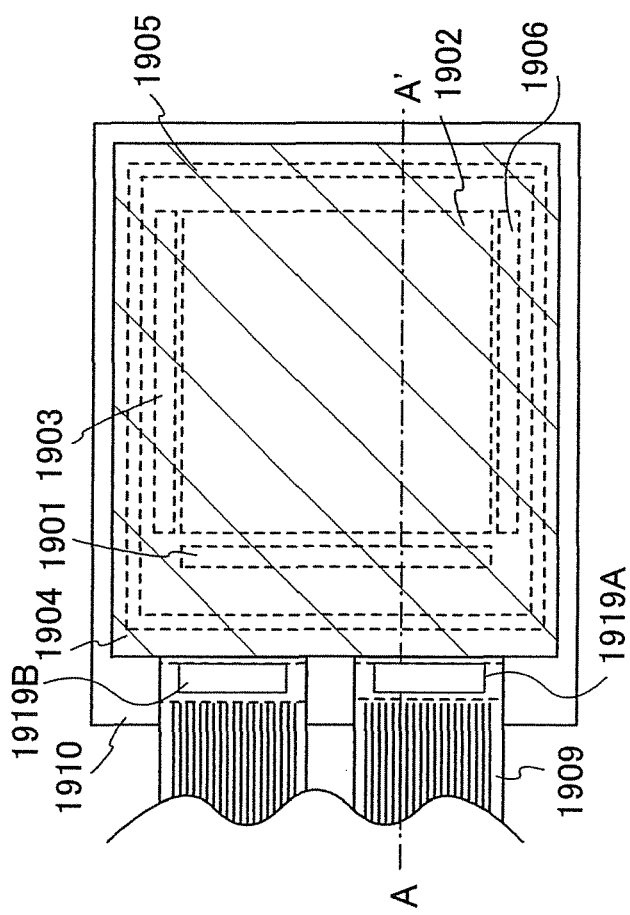
FIGS. 19A and 19B are diagrams describing a display panel having a pixel configuration of the invention.
Figure 19B:
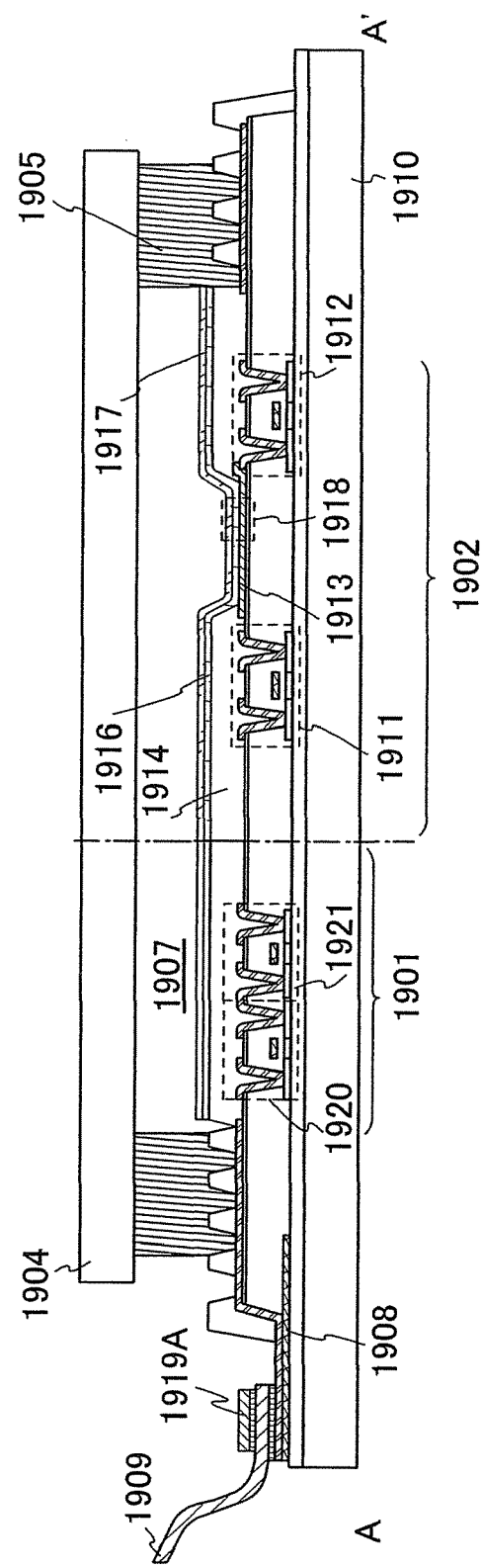

In this embodiment mode, description is made on a configuration of a display panel having the pixel configuration described in Embodiment Mode 1, Embodiment Mode 2, Embodiment Mode 3, or Embodiment Mode 4 with reference to FIGS. 19A and 19B.

In this embodiment mode, description is made on a display panel having the pixel configuration of the invention in a pixel portion with reference to FIGS. 19A and 19B. Note that FIG. 19A is a top plan view showing a display panel and FIG. 19B is a cross sectional view by cutting along a line A-A' of FIG. 19A. The display panel includes a signal line driver circuit (Data line) 1901, a pixel portion 1902, a potential supply line driver circuit (Illumination line) 1903, a scan line driver circuit (Reset line) 1906 which are shown by dotted lines, a sealing substrate 1904, and a sealing material 1905. An inside surrounded by the sealing material 1905 is a space 1907. Note that in the case of the pixel configurations in Embodiment Mode 1 and Embodiment Mode 2, the potential supply line driver circuit 1903 may not be provided.

Note that a wire 1908 transmits a signal inputted to the potential supply line driver circuit 1903, the scan line driver circuit 1906, and the signal line driver circuit 1901, and receives a video signal, a clock signal, a start signal and the like from an FPC (flexible print circuit) 1909 which is to be an external input terminal. Over a junction between the FPC 1909 and the display panel, IC chips (a semiconductor chip over which a memory circuit, a buffer circuit, or the like is formed) 1919A and 1919B are mounted by COG (Chip On Glass) and the like. Note that here, although only the FPC is illustrated, a print wiring board (PWB) may be attached to this FPC. The display device in this specification includes not only a display panel body, but also an FPC or a PWB attached. In addition, the display device includes an IC chip and the like.

Next, description is made on a cross sectional structure with reference to FIG. 19B. Although the pixel portion 1902 and a peripheral driver circuit thereof (the potential supply line driver circuit 1903, the scan line driver circuit 1906, and the signal line driver circuit 1901) are formed over a substrate 1910, here, the signal line driver circuit 1901 and the pixel portion 1902 are illustrated.

Further, in this embodiment mode, although illustrated is a display panel in which the peripheral driver circuit is integrally formed over the substrate, which is not limited thereto, all or a part of the peripheral driver circuit may be formed over an IC chip or the like and mounted by COG or the like. In that case, a driver circuit is not required to be unipolar, a P channel transistor can be combined to be used. In addition, although the buffer 1301 and the buffer 1302 which are included in the display device shown in FIG. 13 are not illustrated in the display panel described in this embodiment mode, a buffer is provided in each peripheral driver circuit.

Moreover, the pixel portion 1902 includes a plurality of circuits forming a pixel including a switching TFT 1911 and a driver TFT 1912. Note that a source electrode of the driver TFT 1912 is connected to a first electrode 1913. An insulator 1914 is formed covering an end portion of the first electrode 1913. Here, a positive type photosensitive acrylic resin film is used.

In addition, for a good coverage, a curve surface having curvature in an upper end portion or a lower end portion of the insulator 1914 is formed. For example, in the case of using a positive photosensitive acrylic as a material for the insulator 1914, a curve surface having a curvature radius (0.2 to 3 μm) is preferably provided in the upper end portion of the insulator 1914. In addition, as the insulator 1914, a negative type photosensitive organic material to be insoluble in etchant by photosensitive light or a positive type photosensitive organic material to be soluble in etchant by light can be used as well.

Overt the first electrode 1913, a layer containing an organic compound (an electroluminescent layer) 1916 and a second electrode 1917 are formed. Here, as a material used for the first electrode 1913 which functions as an anode, a material with high work function is desirably used. For example, a monolayer film such as an ITO (indium tin oxide) film, an indium zinc oxide (IZO) film, a titanium nitride film, a chrome film, a tungsten film, a Zn film, and a Pt film, a stacked layer of a film mainly containing titanium nitride and a film mainly containing aluminum, a three-layer structure of a titanium nitride film, a film mainly containing aluminum, and a titanium nitride film, and the like can be used. Note that in the case of a stacked layer structure, resistance as a wire is low and a good ohmic contact is obtained, in addition, the stacked layer structure can function as an anode.

Moreover, the layer containing an organic compound 1916 is formed by a vapor deposition method using a vapor deposition mask, or an ink-jet method. For the layer containing an organic compound 1916, a metal complex of group 4 of the periodic table of the elements is used for a part thereof, and a material which can be combined is a low molecular weight material or a high molecular weight material. In addition, for a material used for the layer containing an organic compound, there are usually many cases where an organic compound is used by a monolayer or a stacked layer. However, in this embodiment mode, a film formed of an organic compound partially includes a structure using an inorganic compound. In addition, a known triplet material can be used.

Further, as a material used for the second electrode (cathode) 1917 formed over the layer containing an organic compound 1916, a material with a low work function (Al, Ag, Li, Ca, or an alloy of these such as MgAg, MgIn, AlLi, $CaF_2$, or CaN) may be used. Note that in the case where light generated by the layer containing an organic compound (the electroluminescent layer) 1916 is transmitted through the second electrode 1917, as the second electrode (cathode) 1917, a stacked layer of a metal thin film with a thin thickness and, a transparent conductive film (ITO (an indium oxide tin oxide alloy), an indium oxide zinc oxide alloy ($In_2O_3$—ZnO), zinc oxide (ZnO), or the like) may be used.

In addition, the sealing substrate 1904 is stuck with the substrate 1910 by the sealing material 1905 to be a structure providing a light emitting element 1918 in the space 1907 surrounded by the substrate 1910, the sealing substrate 1904, and the sealing material 1905. Note that there is a structure in which an inert gas (nitrogen, argon, or the like) is filled with the space 1907, as well as a structure filled with the sealing material 1905.

Note that an epoxy resin is preferably used for the sealing material 1905. Further, these materials are desirably a material which does not transmit moisture or oxygen as much as possible. In addition, as a material used for the sealing substrate 1904, a glass substrate, a quartz substrate, as well as a plastic substrate formed of FRP (Fiberglass-Reinforced Plastics), PVF (polyvinyl fluoride), Mylar, polyester, acrylic, or the like can be used.

As set forth above, a display panel having the pixel configuration of the invention can be obtained. Note that reference numeral 1920 denotes an N channel transistor and reference numeral 1921 denotes a P channel transistor.

As shown in FIGS. 19A and 19B, the signal line driver circuit 1901, the pixel portion 1902, the potential supply line driver circuit 1903, and the scan line driver circuit 1906 are integrally formed to lower cost of the display device. Further, in this case, a transistor used for the signal line driver circuit 1901, the pixel portion 1902, the potential supply line driver circuit 1903, and the scan line driver circuit 1906 is unipolar, therefore, a manufacturing step can be simplified to lower cost further.

Note that as a configuration of a display panel, as shown in FIG. 19A, a configuration in which the signal line driver circuit 1901, the pixel portion 1902, the potential supply line driver circuit 1903, and the scan line driver circuit 1906 are integrally formed is not limited thereto, a configuration in which a signal line driver circuit 4201 shown in FIG. 42A which corresponds to the signal line driver circuit 1901 is formed over an IC chip to be mounted on the display panel by COG or the like may be used as well. Note that a substrate 4200, a pixel portion 4202, a scan line driver circuit 4203, a potential supply line driver circuit 4204, an FPC 4205, an IC chip 4206, an IC chip 4207, a sealing substrate 4208, and a sealing material 4209 in FIG. 42A correspond to the substrate 1910, the pixel portion 1902, the potential supply line driver circuit 1903, the scan line driver circuit 1906, the FPC 1909, an IC chip 1919A, an IC chip 1919B, the sealing substrate 1904, and the sealing material 1905 in FIG. 19A respectively.

That is, only the signal line driver circuit required for a high speed operation of a driver circuit is formed over an IC chip using a CMOS or the like to lower power consumption. In addition, the IC chip is a semiconductor chip of a silicon wafer or the like to perform a high speed operation and lower power consumption.

Then, the scan line driver circuit 4203 and the potential supply line driver circuit 4204 are integrally formed with the pixel portion 4202 to lower cost. Further, the scan line driver circuit 4203, the potential supply line driver circuit 4204, and the pixel portion 4202 are formed by a unipolar transistor to lower cost further. For a pixel configuration in the pixel portion 4202, the pixels described in Embodiment Modes 1, 2, 3, 4, and 5 can be applied. Therefore, a pixel with high aperture ratio can be provided.

In this manner, a display device with high definition can lower cost. In addition, at a connecting portion between the FPC 4205 and the substrate 4200, an IC chip over which a function circuit (a memory or a buffer) is formed is mounted, thereby, a substrate area can be effectively used.

Moreover, a signal line driver circuit 4211, a potential supply line driver circuit 4214, and a scan line driver circuit 4213 in FIG. 42B corresponding to the signal line driver circuit 1901, the potential supply line driver circuit 1903, and the scan line driver circuit 1906 in FIG. 19A respectively may be formed over an IC chip to be mounted on a display panel by COG or the like. In this case, a display device with high definition can lower power consumption further. Accordingly, for a display device with far less power consumption, polysilicon is desirably used for a semiconductor layer of a transistor which is used for a pixel portion. Note that a substrate 4210, a pixel portion 4212, an FPC 4215, an IC chip 4216, an IC chip 4217, a sealing substrate 4218, and a sealing material 4219 in FIG. 42B correspond to the substrate 1910, the pixel portion 1902, the FPC 1909, the IC chip 1919A, the IC chip 1919B, the sealing substrate 1904, and the sealing material 1905 in FIG. 19A respectively.

Further, when amorphous silicon is used for a semiconductor layer of a transistor of the pixel portion 4212, lower cost can be achieved. In addition, a large display panel can be made.

Figure 26A:
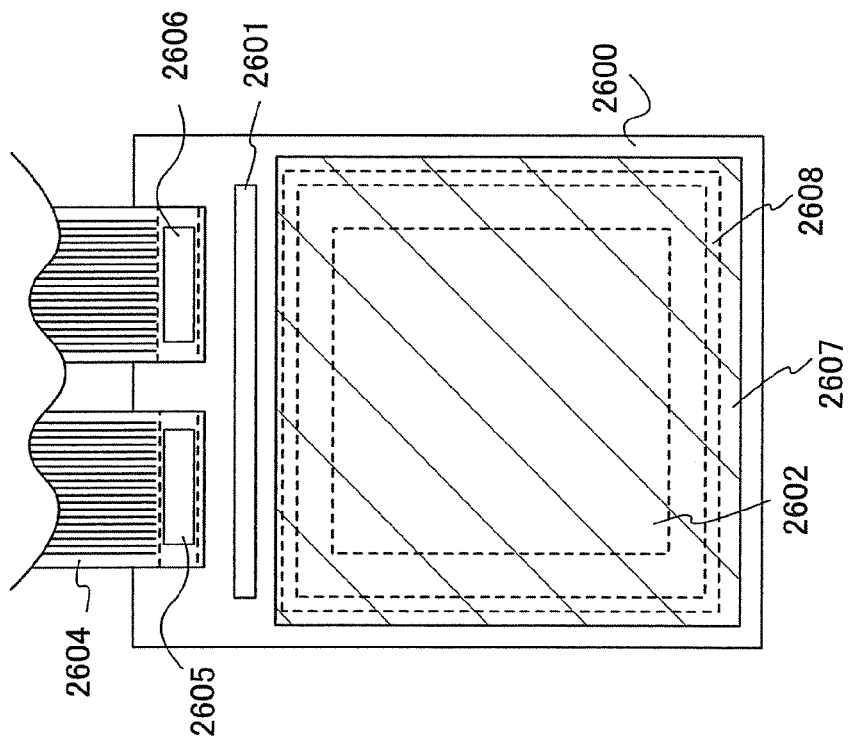
FIGS. 26A and 26B are diagrams each describing a display panel having a pixel configuration of the invention.

Moreover, a scan line driver circuit, a potential supply line driver circuit, and a signal line driver circuit may not be provided in a row direction and a column direction of a pixel. For example, a peripheral driver circuit 2601 formed over an IC chip as shown in FIG. 26A may have a function of the potential supply line driver circuit 4214, the scan line driver circuit 4213, and the signal line driver circuit 4211 shown in FIG. 42B. Note that a substrate 2600, a pixel portion 2602, an FPC 2604, an IC chip 2605, an IC chip 2606, a sealing substrate 2607, and a sealing material 2608 in FIG. 26A correspond to the substrate 1910, the pixel portion 1902, the FPC 1909, the IC chip 1919A, the IC chip 1919B, the sealing substrate 1904, and the sealing material 1905 in FIG. 19A respectively.

Figure 26B:
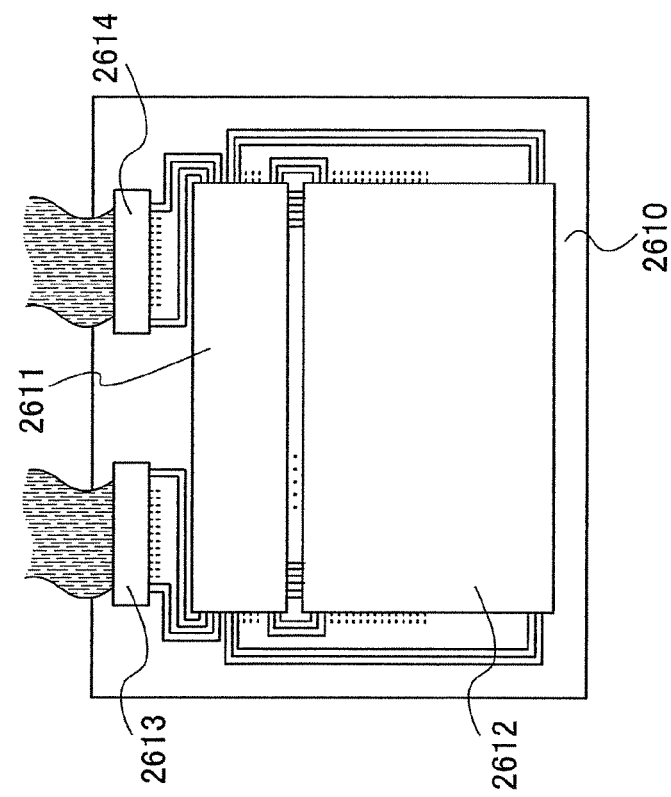

Note that a pattern diagram in which a signal line connection of the display device in FIG. 26A is described is shown in FIG. 26B. A display device has a substrate 2610, a peripheral driver circuit 2611, a pixel portion 2612, an FPC 2613, and an FPC 2614. An external signal and a power source potential are inputted from the FPC 2613 to the peripheral driver circuit 2611. Then, an output from the peripheral driver circuit 2611 is inputted to signal lines of a row direction and a column direction which are connected to pixels in the pixel portion 2612.

Figure 20A:
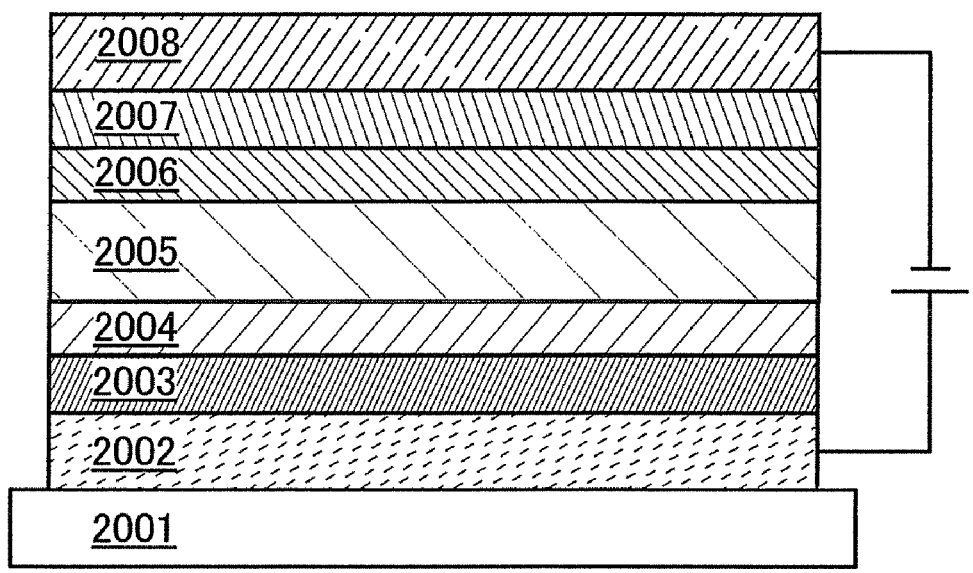
FIGS. 20A and 20 B are diagrams each showing an example of a light emitting element applicable to a display device having a pixel configuration of the invention.
Figure 20B:
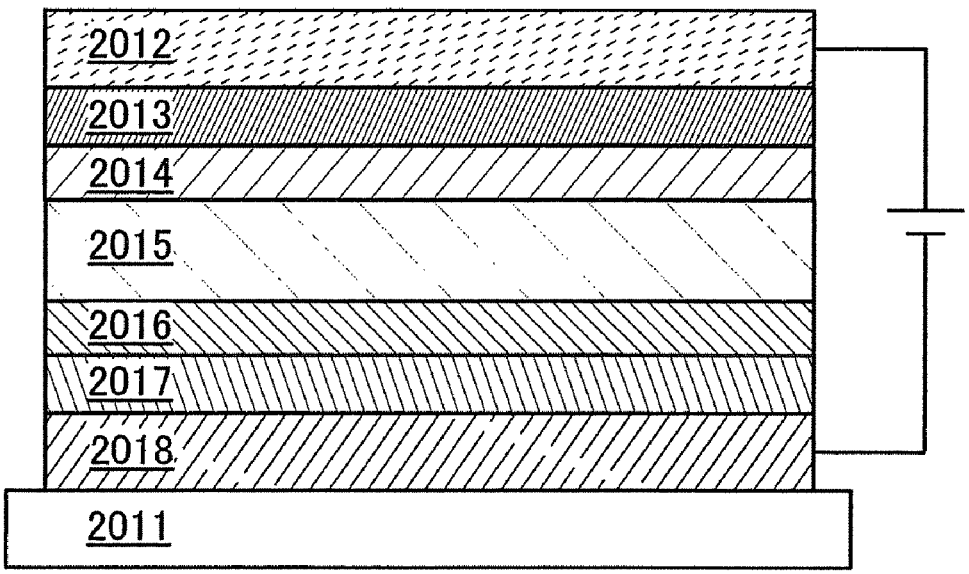

Furthermore, FIGS. 20A and 20B show examples of a light emitting element applicable to the light emitting element 1918. That is, description is made on a structure of a light emitting element applicable to the pixels shown in Embodiment Mode 1, Embodiment Mode 2, Embodiment Mode 3, Embodiment Mode 4, and Embodiment Mode 5 with reference to FIGS. 20A and 20B.

A light emitting element in FIG. 20A has an element structure in which an anode 2002, a hole injection layer 2003 formed of a hole injection material, a hole transporting layer 2004 formed thereon of a hole transporting material, a light emitting layer 2005, an electron transporting layer 2006 formed of an electron transporting material, an electron injection layer 2007 formed of an electron injection material, and a cathode 2008 are stacked on a substrate 2001. Here, although the light emitting layer 2005 may be formed of one kind of a light emitting material, the light emitting layer 2005 may be formed of two or more kinds of materials. In addition, the structure of the element of the invention is not limited to this structure.

Further, there are many variations such that a stacked layer structure in which respective function layers shown in FIG. 20A are staked, an element using a high molecular weight compound, a high-performance element using a triplet light emitting material which emits light from a triplet exited state for a light emitting layer, or the like. The element of the invention is applicable to a white-color light emitting element obtained by controlling a recombination region of carriers by a hole block layer to divide a light emitting region into two regions.

In a method of manufacturing the element of the invention shown in FIG. 20A, first, a hole injection material, a hole transportation material, and a light emitting material are deposited on the substrate 2001 having the anode 2002 (ITO) in this order. Subsequently, an electron transporting material and an electron injection material are deposited, and the cathode 2008 is formed finally by deposition.

Next, preferable materials for a hole injection material, a hole transporting material, an electron transporting material, an electron injection material, and a light emitting material respectively are described below.

As a hole injection material, among organic compounds, porphyrin compound, phthalocyanine (hereinafter referred to as "$H_2Pc$"), copper phthalocyanine (hereinafter referred to as "CuPc") and the like are effective. In addition, a material which has smaller ionization potential than the used hole transporting material and has a hole transporting function can be used as a hole injection material as well. There is a material in which chemical doping is performed to a conductive high molecular weight compound, such as polyethylene dioxy thiophene (hereinafter referred to as "PEDOT") doped with polystyrene sulfonate (hereinafter referred to as "PSS"), polyaniline, or the like. Further, an insulating high molecular weight compound is effective in that planarization of an anode, and polyimide (hereinafter referred to as "PI") is often used. Furthermore, an inorganic compound is used and there are a metal thin film of gold or platinum, as well as an ultra thin film of aluminum oxide (hereinafter referred to as "alumina") and the like.

As a hole transporting material, it is an aromatic amine-based compound (that is, a compound having a bond of benzene ring-nitrogen) that is most widely used. The materials that are widely used include 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD") or 4,4'-bis[N-(1-naphthyl)-N-phenyl-amino]-biphenyl (hereinafter referred to as "a-NPD"), and besides, star burst aromatic amine compounds such as 4,4',4"-tris(N,N-diphenyl-amino)-triphenylamine (hereinafter referred to as "TDATA") or 4,4',4"-tris[N-(3-methylphenyl)-N-phenyl-amino]-triphenylamine (hereinafter referred to as "MTDATA").

As an electron transporting material, a metal complex is often used, which includes a metal complex having a quinoline skeleton or a benzoquinoline skeleton such as the aforementioned $Alq_3$, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and besides, a metal complex having an oxazole-based or a thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, other than the metal complexes, oxadiazole derivatives such as 2-(4-biphenylyl)-5-(4-tert-butylphenyl)-1,3,4-oxadiazole (hereinafter referred to as "PBD") or OXD-7, triazole derivatives such as TAZ, 3-(4-tert-butylphenyl)-4-(4-ethylphenyl)-5-(4-biphenylyl)-1,2,4-triazole (hereinafter referred to as "p-EtTAZ"), and phenanthroline derivatives such as bathophenanthroline (hereinafter referred to as "BPhen") or BCP have an electron transporting property.

As an electron injection material, the aforementioned electron transporting materials can be used. In addition, an ultra thin film of an insulator such as metal halide such as calcium fluoride, lithium fluoride, or cesium fluoride, or alkali metal-oxide such as lithium oxide, is often used. Further, an alkali-metal complex such as lithium acetyl acetonate (hereinafter referred to as "Li(acac)") or 8-quinolinolato-lithium (hereinafter referred to as "Liq") is also efficient.

As a light emitting material, other than the aforementioned metal complexes such as $Alq_3$, Almq, BeBq, BAlq, $Zn(BOX)_2$, and $Zn(BTZ)_2$, various fluorescent dyes are efficient. The fluorescent dyes include 4,4'-bis(2,2-diphenyl-vinyl)-biphenyl which is blue, 4-(dicyanomethylene)-2-methyl-6-(p-dimethylaminostyryl)-4H-pyran which is red-orange, and the like. In addition, a triplet light emitting material is available, which is mainly a complex with platinum or iridium as a central metal. As the triplet light emitting material, tris(2-phenylpyridine) iridium, bis(2-(4'-tryl)pyridinato-$N,C^{2'}$) acetylacetonato iridium (hereinafter referred to as "$acacIr(tpy)_2$"), 2,3,7,8,12,13,17,18-octaethyl-21H, 23H porphyrin-platinum, and the like are known.

Materials having the aforementioned functions are combined with one another, then, a light emitting element with high reliability can be made.

Further, when the polarity of the transistor is inverted, and the potential of the wire to which the power source potential or the low power source potential is supplied is inverted, and the levels of the scan line and the signal line are inverted in the pixel configurations described in Embodiment Mode 1, Embodiment Mode 2, Embodiment Mode 3, and the like, a light emitting element in which layers are formed in reverse order of that of FIG. 20A as shown in FIG. 20B, can be used. That is, in an element structure, the cathode 2018, the electron injection layer 2017 formed of an electron injection material, the electron transporting layer 2016 thereon formed of an electron transporting material, the light emitting layer 2015, the hole transporting layer 2014 formed of a hole transporting material, the hole injection layer 2013 formed of a hole injection material, and the anode 2012 are stacked on the substrate 2011.

In addition, to obtain light emission, at least one of the anode or the cathode of the light emitting element may be transparent. A TFT and a light emitting element are formed over a substrate. A light emitting element may have a top emission structure in which light is emitted from the surface opposite to the substrate, a bottom emission structure in which light is emitted from the substrate side, or a dual emission structure in which light is emitted from both the substrate side and the surface opposite to the substrate. Therefore, the pixel configuration of the invention can be applied to a light emitting element having any emission structure.

Figure 21A:
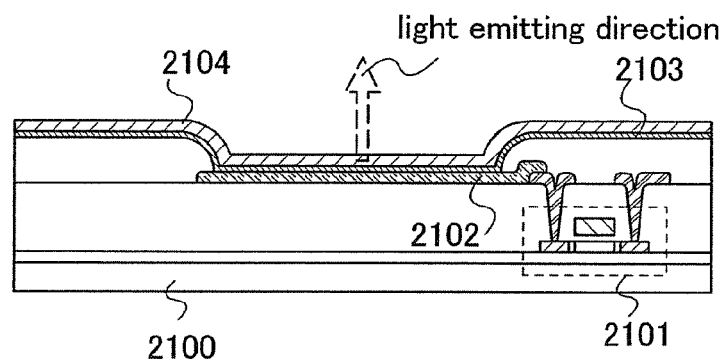
FIGS. 21A to 21C are diagrams each describing an emission structure of a light emitting element.

Description is made on a light emitting element having the top emission structure with reference to FIG. 21A.

A driver TFT 2101 is formed over a substrate 2100, and a first electrode 2102 is formed in contact with a source electrode of the driver TFT 2101. A layer containing an organic compound 2103 and a second electrode 2104 are formed thereon.

Further, the first electrode 2102 is an anode of a light emitting element and the second electrode 2104 is a cathode of the light emitting element. That is, a portion in which the layer containing an organic compound 2103 is sandwiched between the first electrode 2102 and the second electrode 2104 corresponds to a light emitting element.

Here, a material used for the first electrode 2102 which functions as the anode is desirably a material with a high work function. For example, a monolayer film such as a titanium nitride film, a chrome film, a tungsten film, a Zn film, and a Pt film, a stacked layer of a film mainly containing titanium nitride and a film mainly containing aluminum, a three-layer structure of a titanium nitride film, a film mainly containing aluminum, and a titanium nitride film, and the like can be used. Note that in the case of a stacked layer structure, resistance as a wire is low and a good ohmic contact is obtained, in addition, the stacked layer structure can function as an anode. When a metal film which reflects light is used, an anode which does not transmit light can be formed.

Further, as a material used for the second electrode 2104 which functions as the cathode, a stacked layer of a metal thin film made of a low work function material (Al, Ag, Li, Ca, or an alloy of these such as MgAg, MgIn, AlLi, $CaF_2$, or CaN) and a transparent conductive film (ITO (indium tin oxide), indium zinc oxide (IZO), zinc oxide (ZnO) or the like) may be used. Thus, when a thin metal film and a transparent conductive film having light transmitting property are used, a cathode capable of transmitting light can be formed.

Thus, as shown by an arrow in FIG. 21A, light from the light emitting element can be obtained from the top surface. That is, in the case of applying the display panel in FIGS. 19A and 19B, light is emitted to the sealing substrate 1904 side. Accordingly, in the case where a light emitting element having a top emission structure is used for a display device, a substrate having light transmitting property is used for the sealing substrate 1904.

In addition, in the case of providing an optical film, an optical film may be provided to the sealing substrate 1904.

Note that in the case of the pixel configuration in FIG. 21A, when the first electrode 2102 functions as the cathode, a metal film faulted of a low work function material such as MgAg, MgIn, and AlLi can be used as the cathode. Then, a transparent conductive film such as an ITO (indium tin oxide) film and an indium zinc oxide (IZO) film can be used for the second electrode 2104 which functions as the anode. Therefore, according to this structure, transmissivity of top emission can be improved.

Figure 21B:
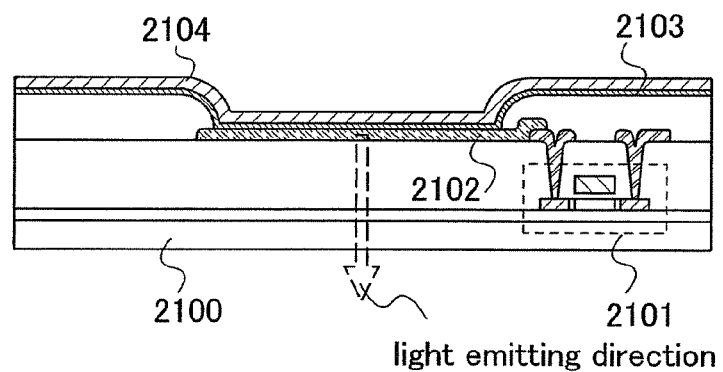

Moreover, description is made on a light emitting element having the bottom emission structure with reference to FIG. 21B. Other than a light emission structure, the light emitting element is similar to that in FIG. 21A, thereby the same reference numerals are used to make a description.

Here, as a material used for the first electrode 2102 which functions as the anode, a high work function material is desirably used. For example, a transparent conductive film such as an ITO (indium tin oxide) film and an indium zinc oxide (IZO) film can be used. An anode capable of transmitting light can be formed by using a transparent conductive film having light transmitting property.

Further, as a material used for the second electrode 2104 which functions as the cathode, a metal film made of a low work function material (Al, Ag, Li, Ca, or an alloy of these such as MgAg, MgIn, AlLi, $CaF_2$, or CaN) can be used. Thus, when a metal film which reflects light is used, an cathode which does not transmit light can be formed.

In this manner, as shown by an arrow in FIG. 21B, light from the light emitting element can be obtained from a bottom surface. That is, in the case of applying to the display panel in FIGS. 19A and 19B, light is emitted to the substrate 1910 side. Accordingly, in the case where a light emitting element having a bottom emission structure is used for a display device, a substrate having light transmitting property is used for the substrate 1910.

In addition, in the case of providing an optical film, an optical film may be provided to the substrate 1910.

Figure 21C:
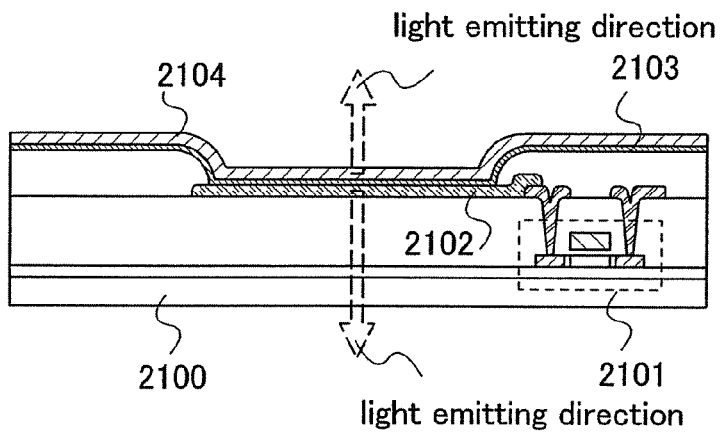

Description is made on a light emitting element having the dual emission structure with reference to FIG. 21C. Other than a light emission structure, the light emitting element is similar to that in FIG. 21A, thereby the same reference numerals are used to make a description.

Here, as a material using for the first electrode 2102 which functions as the anode, a high work function material is desirably used. For example, a transparent conductive film such as an ITO (indium tin oxide) film and an indium zinc oxide (IZO) film can be used. An anode capable of transmitting light by using a transparent conductive film having light transmitting property can be formed.

Further, as a material used for the second electrode 2104 which functions as the cathode, a stacked layer of a metal thin film made of a low work function material (Al, Ag, Li, Ca, or an alloy of these such as MgAg, MgIn, AlLi, $CaF_2$, or CaN) and a transparent conductive film (ITO (indium tin oxide), an indium oxide zinc oxide alloy ($In_2O_3$—ZnO), zinc oxide (ZnO), or the like) may be used. Thus, when a thin metal film and a transparent conductive film having transmitting property are used, a cathode capable of transmitting light can be formed.

Thus, as shown by an arrow in FIG. 21C, light from the light emitting element can be obtained from the both surfaces. That is, in the case of applying to the display panel in FIGS. 19A and 19B, light is emitted to the substrate 1910 side and the sealing substrate 1904 side. Accordingly, in the case where a light emitting element having a dual emission structure is used for a display device, a substrate having light transmitting property is used for both the substrate 1910 and the sealing substrate 1904.

In addition, in the case of providing an optical film, an optical film may be provided to both the substrate 1910 and the sealing substrate 1904.

Moreover, the invention can be applied to a display device for realizing a full color display by using a white-color light emitting element and a color filter.

As shown in FIG. 22, a base film 2202 is formed on a substrate 2200, a driver TFT 2201 is formed thereover, a first electrode 2203 is formed in contact with a source electrode of the driver TFT 2201, and a layer containing an organic compound 2204 and a second electrode 2205 are formed thereover.

Further, the first electrode 2203 is an anode of a light emitting element and the second electrode 2205 is a cathode of the light emitting element. That is, a portion in which the layer containing an organic compound 2204 is sandwiched between the first electrode 2203 and the second electrode 2205 corresponds to a light emitting element. White light is emitted in the structure in FIG. 22. Then, a red color filter 2206R, a green color filter 22060 and a blue color filter 2206B are provided over the light emitting element, therefore, a full color display can be performed. In addition, a black matrix (also called BM) 2207 to isolate these color filters is provided.

Note that the invention may be applied to a display device for realizing a full color display other than the display using the white-color light emitting element. For example, the display device having a structure, in which a red (R) light emitting element, a green (G) light emitting element and a blue (B) light emitting element are provided with the red color filter, a green color filter and a blue color filter respectively, may be used. By applying this structure, an undesirable component of a light frequency from each of the light emitting elements is removed and a color impurity can be improved, thereby a color display can be properly performed. Furthermore, a color filter for decreasing a light to be reflected prevents an outside light from being reflected without a polarizer. Accordingly, the reflected outside light is suppressed without decreasing a light transmittance due to the polarizer.

The aforementioned structures of the light emitting element can be combined to be appropriately used for a display device having the pixel configuration of the invention. In addition, the aforementioned structure of the display panel and the light emitting element are examples, and it is needless to say that the pixel configuration of the invention can be applied to a display device having another structure.

Next, described is a fragmentary cross section diagram of a pixel portion in a display panel.

First, description is made on a case where a polysilicon (p-Si: H) film is used for a semiconductor layer of a transistor with reference to FIGS. 23A to 24B.

Here, for the semiconductor layer, for example, an amorphous silicon (a-Si) film is formed over a substrate by a known deposition method. Note that it is not limited to an amorphous silicon film, a semiconductor film having an amorphous structure (including micro crystalline semiconductor film) may be used. Furthermore, a compound semiconductor film having an amorphous structure such as an amorphous silicon germanium film may be used.

Then, the amorphous silicon film is crystallized by a laser crystallization method, a thermal crystallization method using RTA or an annealing furnace, a thermal crystallization method using a metal element for promoting crystallization, or the like. It is needless to say that these may be combined.

By the aforementioned crystallization, a region which is partially crystallized is formed in an amorphous semiconductor film.

Moreover, a crystalline semiconductor film in which crystallinity is partially increased is etched in a desired shape to form an island-shape semiconductor film from the crystallized region. This semiconductor film is used for the semiconductor layer of the transistor.

As shown in FIGS. 23A and 23B, a base film 23102 is formed on a substrate 23101 and a semiconductor layer is formed thereon. The semiconductor layer includes a channel forming region 23103 to be a source region or a drain region of a driving transistor 23118, an LDD region 23104, an impurity region 23105, a channel forming region 23106 to be a bottom electrode, an LDD region 23107, and an impurity region 23108 of a capacitor 23119. Note that channel doping may be performed to the channel forming region 23103 and the channel forming region 23106.

A glass substrate, a quartz substrate, a ceramic substrate, or the like can be used for the substrate. In addition, as the base film 23102, a single layer of aluminum nitride (AlN), silicon oxide ($SiO_2$), silicon oxynitride ($SiO_xN_y$), or the like, or a stacked layer of these can be used.

Over the semiconductor layer, a gate electrode 23110 and an upper electrode 23111 of a capacitor are formed with a gate insulating film 23109 interposed therebetween.

An interlayer insulating film 23112 is formed covering the driving transistor 23118 and the capacitor 23119, and a wire 23113 is in contact with the impurity region 23105 through a contact hole over the interlayer insulating film 23112. A pixel electrode 23114 is formed in contact with the wire 23113, and an insulator 23115 is formed covering an end portion of the pixel electrode 23114 and the wire 23113. Here, a positive type photosensitive acrylic resin film is used. Then, a layer containing an organic compound 23116 and an opposite electrode 23117 are formed over the pixel electrode 23114, and in a region in which the layer containing an organic compound 23116 is sandwiched between the pixel electrode 23114 and the opposite electrode 23117, a light emitting element 23120 is formed.

In addition, as shown in FIG. 23B, a region 23202 may be provided so as to overlap an upper electrode 23111 with an LDD region forming a part of a bottom electrode of the capacitor 23119. Note that common portions with FIG. 23A are denoted by the same reference numerals and description thereof is omitted.

Figure 24A:
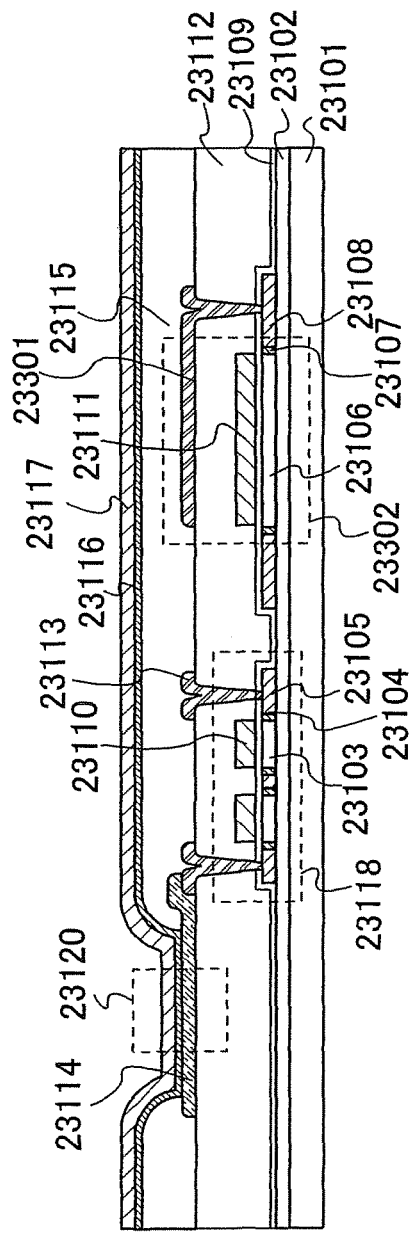
FIGS. 24A and 24B are fragmentary cross section diagrams each of a display panel.

In addition, as shown in FIG. 24A, a second upper electrode 23301 may be provided which is formed in the same layer as the wire 23113 in contact with the impurity region 23105 of the driving transistor 23118. Note that common portions with FIG. 23A are denoted by the same reference numerals and description thereof is omitted. A second capacitor is formed with the interlayer insulating film 23112 sandwiched between the second upper electrode 23301 and the upper electrode 23111. In addition, the second upper electrode 23301 is in contact with the impurity region 23108, therefore, a first capacitor formed by sandwiching the gate insulating film 23109 between the upper electrode 23111 and the channel forming region 23106, and the second capacitor formed by sandwiching the interlayer insulating film 23112 between the upper electrode 23111 and the second upper electrode 23301 are connected in parallel to constitute a capacitor 23302 formed of the first capacitor and the second capacitor. The capacitor 23302 has resultant capacitance in which capacitance of the first capacitor and capacitance of the second capacitor are added, therefore, a capacitor with large capacitance in a small area can be formed. That is, when the capacitor is used as the capacitor in the pixel configuration of the invention, an aperture ratio can be increased.

Figure 24B:
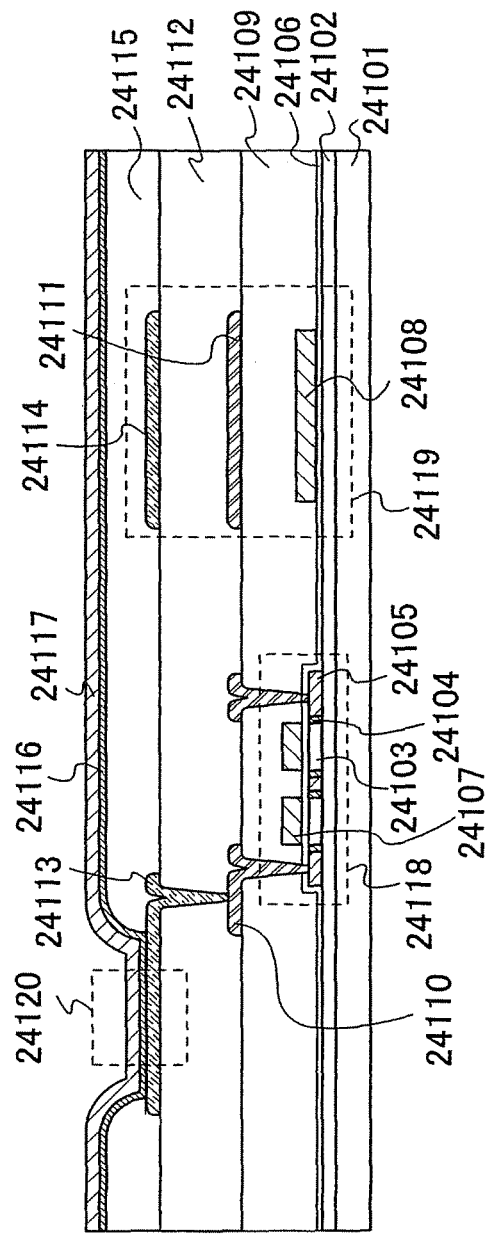

In addition, a structure of a capacitor as shown in FIG. 24B may be used as well. A base film 24102 is formed on a substrate 24101 and a semiconductor layer is formed thereon. The semiconductor layer includes a channel forming region 24103, an LDD region 24104, and an impurity region 24105 to be a source region or a drain region of a driving transistor 24118. Note that channel doping may be performed to the channel forming region 24103.

A glass substrate, a quartz substrate, a ceramic substrate, or the like can be used for the substrate. In addition, as the base film 24102, a single layer of aluminum nitride (AlN), silicon oxide ($SiO_2$), silicon oxynitride ($SiO_xN_y$), or the like, or a stacked layer of these can be used.

Over the semiconductor layer, a gate electrode 24107 and a first electrode 24108 are formed with a gate insulating film 24106 interposed therebetween.

A first interlayer insulating film 24109 is formed covering the driving transistor 24118 and the first electrode 24108, and a wire 24110 is in contact with the impurity region 24105 through a contact hole over the first interlayer insulating film 24109. In addition, a second electrode 24111 is formed in the same layer formed of the same material as that of the wire 24110.

A second interlayer insulating film 24112 is formed covering the wire 24110 and the second electrode 24111, and a pixel electrode 24113 is formed in contact with the wire 24110 through a contact hole over the second interlayer insulating film 24112. In addition, a third electrode 24114 is formed in the same layer formed of the same material as that of the pixel electrode 24113. Here, a capacitor 24119 formed of the first electrode 24108, the second electrode 24111, and third electrode 24114 is formed.

An insulator 24115 is formed covering an end portion of the pixel electrode 24113 and the third electrode 24114, a layer containing an organic compound 24116 and an opposite electrode 24117 are formed over the insulator 24115 and the third electrode 24114, and in a region in which the layer containing an organic compound 24116 is sandwiched between the pixel electrode 24113 and the opposite electrode 24117, a light emitting element 24120 is formed.

As described above, a structure of a transistor in which a crystalline semiconductor film is used for a semiconductor layer can be structures as shown in FIGS. 23A to 24B. Note that the structures of the transistor shown in FIGS. 23A to 24B are examples of a transistor having a top gate structure. That is, an LDD region may be overlapped with a gate electrode, may not be overlapped with the gate electrode, or a part of the region of the LDD region may be overlapped with the gate electrode. In addition, the gate electrode may be a tapered shape, and an LDD region may be provided in a self-aligned manner under the tapered portion of the gate electrode. In addition, the number of the gate electrodes is not limited to two, and a multi-gate structure having three or more gate electrodes may be used, or only one gate electrode may be provided as well.

When a crystalline semiconductor film is used for the semiconductor layer (a channel forming region, a source region, a drain region, or the like) of the transistor forming the pixels of the invention, for example, the scan line driver circuit 202 and the signal line driver circuit 201 in FIG. 2 are integrally formed with the pixel portion 203 easily. Moreover, in the configuration in FIG. 13, the buffer 1301 and the buffer 1302 are integrally formed easily. In addition, a part of the signal line driver circuit 201 in FIG. 2 may be integrally formed with the pixel portion 203 and the other part of the signal line driver circuit 201 may be formed over an IC chip to be mounted by COG or the like as shown in the display panel in FIGS. 19A and 19B. In this manner, manufacturing cost can be reduced.

Further, FIGS. 27A and 27B show fragmentary cross section diagrams of a display panel to which, as a structure of a transistor using polysilicon (p-Si: H) for a semiconductor layer, a structure in which a gate electrode is sandwiched between a substrate and a semiconductor layer, that is, a bottom gate transistor in which the gate electrode is arranged under the semiconductor layer is applied.

A base film 2702 is formed on a substrate 2701 and a gate electrode 2703 is formed on the base film 2702. In addition, a first electrode 2704 is formed in the same layer formed of the same material as that of the gate electrode 2703. For a material of the gate electrode 2703, polycrystalline silicon to which phosphorus is added can be used. Other than polycrystalline silicon, silicide which is a compound of metal and silicon may be used as well.

Moreover, a gate insulating film 2705 is formed covering the gate electrode 2703 and the first electrode 2704. As the gate insulating film 2705, a silicon oxide film, a silicon nitride film, or the like is used.

In addition, over the gate insulating film 2705, a semiconductor layer is formed. The semiconductor layer includes a channel forming region 2706, an LDD region 2707, an impurity region 2708 to be a source region or a drain region of a driving transistor 2722, a channel forming region 2709 to be a second electrode of a capacitor 2723, an LDD region 2710, and an impurity region 2711 Note that channel doping may be performed to the channel forming region 2706 and the channel forming region 2709.

A glass substrate, a quartz substrate, a ceramic substrate, and the like can be used for the substrate. In addition, as the base film 2702, a single layer of aluminum nitride (AlN), silicon oxide ($SiO_2$), silicon oxynitride ($SiO_xN_y$), or the like, or a stacked layer of these can be used.

A first interlayer insulating film 2712 is formed covering the semiconductor layer, and a wire 2713 is in contact with the impurity region 2708 through a contact hole over the first interlayer insulating film 2712. In addition, a third electrode 2714 is formed in the same layer formed of the same material as that of the wire 2413. The capacitor 2723 is formed of the first electrode 2704, the channel forming region 2709, and the third electrode 2714.

Further, an opening 2715 is formed in the first interlayer insulating film 2712. A second interlayer insulating film 2716 is formed covering the driving transistor 2722, the capacitor 2723, and the opening 2715. A pixel electrode 2717 is formed through a contact hole over the second interlayer insulating film 2716. An insulator 2718 is formed covering an end portion of the pixel electrode 2717. For example, a positive type photosensitive acrylic resin film is used. Then, a layer containing an organic compound 2719 and an opposite electrode 2720 are formed over the pixel electrode 2717, and in a region in which the layer containing an organic compound 2719 is sandwiched between the pixel electrode 2717 and the opposite electrode 2720, a light emitting element 2721 is formed. In addition, the opening 2715 is arranged under the light emitting element 2721. That is, when light emission from the light emitting element 2721 is obtained from a substrate side, transmissivity can be improved by providing the opening 2715.

In addition, a fourth electrode 2724 may be formed in the same layer formed of the same material as that of the pixel electrode 2717 in FIG. 27A to be a structure as shown in FIG. 27B. Then, a capacitor 2725 formed of the first electrode 2704, the second electrode, the third electrode 2714, and the fourth electrode 2724 can be formed.

Next, description is made on a case where an amorphous silicon (a-Si: H) film is used for a semiconductor layer of a transistor. FIGS. 28A and 28B show a case of a top gate transistor while FIGS. 29A to 30B show a case of a bottom gate transistor.

FIG. 28A shows a cross section of a transistor having a top gate structure using amorphous silicon for a semiconductor layer. A base film 2802 is formed on a substrate 2801 and a pixel electrode 2803 is formed on the base film 2802. In addition, a first electrode 2804 is formed in the same layer formed of the same material as that of the pixel electrode 2803.

A glass substrate, a quartz substrate, a ceramic substrate, and the like can be used for the substrate. In addition, as the base film 2802, a single layer of aluminum nitride (AlN), silicon oxide ($SiO_2$), silicon oxynitride ($SiO_xN_y$), or the like, or a stacked layer of these can be used.

Moreover, a wire 2805 and a wire 2806 are formed on the base film 2802, and an end portion of the pixel electrode 2803 is covered with the wire 2805. On the wire 2805 and the wire 2806, an N type semiconductor layer 2807 and an N type semiconductor layer 2808 each of which has N type conductivity are formed. In addition, between the wire 2805 and the wire 2806, a semiconductor layer 2809 is formed on the base film 2802. Then, a part of the semiconductor layer 2809 is extended over the N type semiconductor layer 2807 and the N type semiconductor layer 2808. Note that, this semiconductor layer is formed by a semiconductor film having non-crystallinity such as amorphous silicon (a-Si: H) and microcrystalline semiconductor (μ-Si: H). In addition, a gate insulating film 2810 is formed on the semiconductor layer 2809, and an insulating film 2811 which is formed in the same layer formed of the same material as that of the gate insulating film 2810 is formed on the first electrode 2804. Note that for the gate insulating film 2810, a silicon oxide film, a silicon nitride film, or the like is used.

Moreover, on the gate insulating film 2810, a gate electrode 2812 is formed. A second electrode 2813 which is formed in the same layer formed of the same material as that of the gate electrode 2812 is formed over the first electrode 2804 with the insulating film 2811 interposed therebetween. A capacitor 2819 in which the insulating film 2811 is sandwiched between the first electrode 2804 and the second electrode 2813 is formed. Further, an interlayer insulating film 2814 is formed covering an end portion of the pixel electrode 2803, a driving transistor 2818, and the capacitor 2819.

A layer containing an organic compound 2815 and an opposite electrode 2816 are formed on the interlayer insulating film 2814 and the pixel electrode 2803 arranged an opening potion thereof, and in a region in which the layer containing an organic compound 2815 is sandwiched between the pixel electrode 2803 and the opposite electrode 2816, a light emitting element 2817 is formed.

In addition, the first electrode 2804 shown in FIG. 28A may be formed by a first electrode 2820 as shown in FIG. 28B. The first electrode 2820 is formed in the same layer formed of the same material as that of the wires 2805 and 2806.

Further, FIGS. 29A and 29B show fragmentary cross sections of a display panel using a transistor having a bottom gate structure in which amorphous silicon is used for a semiconductor layer.

A base film 2902 is formed on a substrate 2901 and a gate electrode 2903 is formed on the base film 2902. In addition, a first electrode 2904 is formed in the same layer formed of the same material as that of the gate electrode 2903. For a material of the gate electrode 2903, polycrystalline silicon to which phosphorus is added can be used. Other than polycrystalline silicon, silicide which is a compound of metal and silicon may be used as well.

Moreover, a gate insulating film 2905 is formed covering the gate electrode 2903 and the first electrode 2904. As the gate insulating film 2905, a silicon oxide film, a silicon nitride film, or the like is used.

In addition, on the gate insulating film 2905, a semiconductor layer 2906 is formed. A semiconductor layer 2907 is formed in the same layer formed of the same material as that of the semiconductor layer 2906.

A glass substrate, a quartz substrate, a ceramic substrate, and the like can be used for the substrate. In addition, as the base film 2902, a single layer of aluminum nitride (AlN), silicon oxide ($SiO_2$), silicon oxynitride ($SiO_xN_y$), or the like, or a stacked layer of these can be used.

On the semiconductor layer 2906, N type semiconductor layers 2908 and 2909 each of which has N type conductivity are formed while an N type semiconductor layer 2910 is formed on the semiconductor layer 2907.

On the N type semiconductor layers 2908 and 2909, wires 2911 and 2912 are formed respectively while on the N type semiconductor layer 2910, a conductive layer 2913 formed in the same layer formed of the same material as that of the wires 2911 and 2912 is formed.

A second electrode formed by the semiconductor layer 2907, the N type semiconductor layer 2910, and the conductive layer 2913 is formed. Note that a capacitor 2920 having a structure in which the gate insulating film 2905 is sandwiched between this second electrode and the first electrode 2904 is formed.

Moreover, one end portion of the wire 2911 is extended, and a pixel electrode 2914 is formed in contact with the upper portion of the extended wire 2911.

Moreover, an insulator 2915 is formed covering an end portion of the pixel electrode 2914, a driving transistor 2919, and the capacitor 2920.

A layer containing an organic compound 2916 and an opposite electrode 2917 are formed over the pixel electrode 2914 and the insulator 2915, and in a region in which the layer containing an organic compound 2916 is sandwiched between the pixel electrode 2914 and the opposite electrode 2917, a light emitting element 2918 is formed.

The semiconductor layer 2907 and the N type semiconductor layer 2910 to be a part of the second electrode of the capacitor may not be provided. That is, a second electrode may be the conductive layer 2913, and a capacitor may have a structure in which a gate insulating film is sandwiched between the first electrode 2904 and the conductive layer 2913.

Note that in FIG. 29A, the pixel electrode 2914 is formed before forming the wire 2911, a capacitor 2922 having a structure in which the gate insulating film 2905 is sandwiched between the first electrode 2904 and a second electrode 2921 formed by the pixel electrode 2914 can be formed as shown in FIG. 29B.

Note that in FIGS. 29A and 29B, although description is made on an inversely staggered channel etch type transistor, it is needless to say that a channel protection type transistor may be used as well. Description is made on a case of a channel protection type transistor with reference to FIGS. 30A and 30B.

A channel protection type transistor shown in FIG. 30A is different from the channel etch type driving transistor 2919 shown in FIG. 29A in that over a region formed with a channel of the semiconductor layer 2906 an insulator 3001 to be an etching mask is provided. However, common reference numerals are used for other common portions.

Similarly, a channel protection type transistor shown in FIG. 30B is different from the channel etch type driving transistor 2919 shown in FIG. 29B in that over a region formed with a channel of the semiconductor layer 2906 an insulator 3001 to be an etching mask is provided. However, common reference numerals are used for other common portions.

When an amorphous semiconductor film is used for a semiconductor layer (a channel forming region, a source region, a drain region, or the like) of the transistor forming the pixels of the invention, manufacturing cost can be reduced.

Note that it is not limited to the aforementioned structure of a transistor structure and a capacitor structure to which the pixel configuration of the invention can be applied, and various structures of a transistor structure and a capacitor structure can be used.

[Embodiment Mode 7]

The invention can be applied to various electronic apparatuses, and specifically can be applied to a display portion of an electronic apparatus. As such an electronic apparatus, there are a video camera, a digital camera, a goggle type display, a navigation system, a sound reproducing device (a car audio, an audio component system, and the like), a computer, a game machine, a portable data terminal (a mobile computer, a mobile phone, a portable game machine, an electronic book, or the like), an image reproducing device providing a recording media (specifically, a device providing a display device which reproduces a recording media such as a Digital Versatile Disc (DVD) and displays the image), and the like.

Figure 44A:
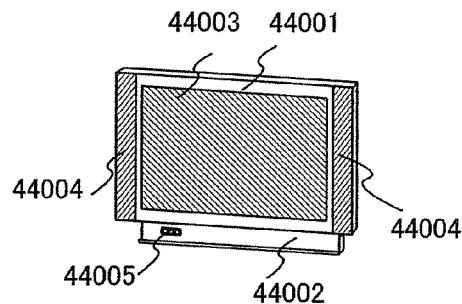
FIGS. 44A to 44H are views each showing an example of an electronic apparatus applicable to a pixel portion of a display device having a pixel configuration of the invention.

FIG. 44A shows a display device including a housing 44001, a support 44002, a display portion 44003, speaker portions 44004, a video input terminal 44005, and the like. A display device having the pixel configuration of the invention can be used for the display portion 44003. Note that the display includes all display devices for information display such as for a personal computer, for a television receiver, for advertisement display. The display device using the invention for the display portion 44003 can express clear gradation, increase an aperture ratio of the pixel and display images with high definition without reducing luminance.

Figure 44B:
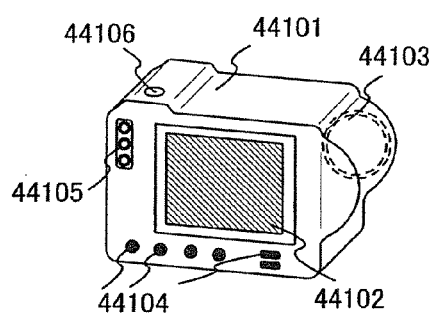

FIG. 44B shows a camera including a main body 44101, a display portion 44102, an image receiving portion 44103, operation keys 44104, an external connecting port 44105, a shutter 44106, and the like.

In recent years, with high performance of a digital camera and the like, production competition has heated up. Thus, it is important to produce high performance devices at low cost. The digital camera using the invention for the display portion 44102 can express clear gradation, increase an aperture ratio of the pixel and display images with high definition without reducing luminance.

Figure 44C:
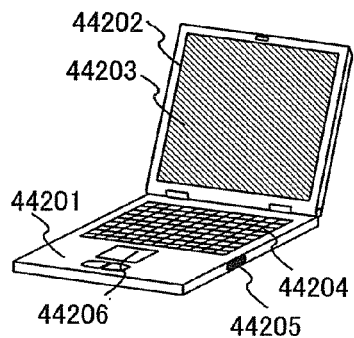

FIG. 44C shows a computer including a main body 44201, a housing 44202, a display portion 44203, a keyboard 44204, an external connecting port 44205, a pointing mouse 44206, and the like. The computer using the invention for the display portion 44203 can express clear gradation, increase an aperture ratio of the pixel and display images with high definition without reducing luminance.

Figure 44D:
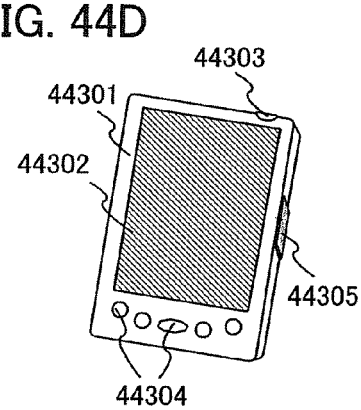

FIG. 44D shows a mobile computer including a main body 44301, a display portion 44302, a switch 44303, operation keys 44304, an infrared port 44305, and the like. The mobile computer using the invention for the display portion 44302 can express clear gradation, increase an aperture ratio of the pixel and display images with high definition without reducing luminance.

Figure 44E:
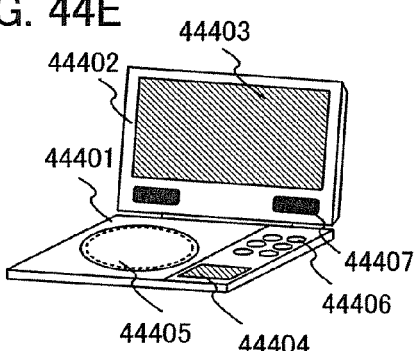

FIG. 44E shows a portable image reproducing device providing a recording media (specifically, a DVD reproducing device) including a main body 44401, a housing 44402, a display portion A 44403, a display portion B 44404, a recording media (DVD and the like) reading portion 44405, an operation key 44406, a speaker portion 44407, and the like. The display portion A 44403 can mainly display image data while the display portion B 44404 can mainly display text data. The image reproducing device using the invention for the display portion A 44403 and the display portion B 44404 can express clear gradation, increase an aperture ratio of the pixel and display images with high definition without reducing luminance.

Figure 44F:
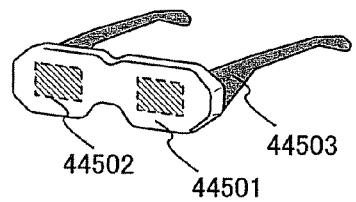

FIG. 44F shows a goggle type display including a main body 44501, a display portion 44502, an arm portion 44503, and the like. The goggle type display using the invention for the display portion 44502 can express clear gradation, increase an aperture ratio of the pixel and display images with high definition without reducing luminance.

Figure 44G:
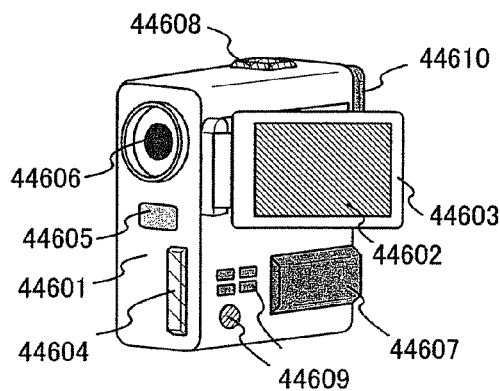

FIG. 44G shows a video camera including a main body 44601, a display portion 44602, a housing 44603, an external connecting port 44604, a remote control receiving portion 44605, an image receiving portion 44606, a battery 44607, a sound input portion 44608, operation keys 44609, an eyepiece portion 44610, and the like. The video camera using the invention for the display portion 44602 can express clear gradation, increase an aperture ratio of the pixel and display images with high definition without reducing luminance.

Figure 44H:
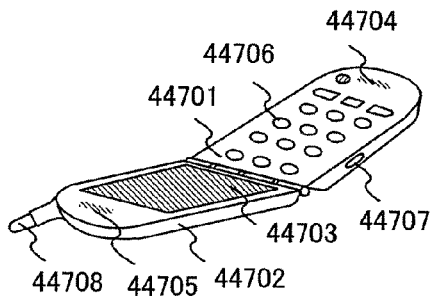

FIG. 44H shows a mobile phone device including a main body 44701, a housing 44702, a display portion 44703, a sound input portion 44704, a sound output portion 44705, an operation key 44706, an external connecting port 44707, an antenna 44708, and the like.

In recent years, mobile phone devices have been mounted with game function, camera function, electronic money function, and the like to increase the needs of mobile phone devices with high added value. Furthermore, displays are also required to have high definition. The mobile phone device using the invention for the display portion 44703 can express clear gradation, increase an aperture ratio of the pixel and display images with high definition without reducing luminance.

In addition, when a display portion has the display device having the dual emission structure as shown in FIG. 21C, a mobile phone having a display portion with high added value and high definition can be provided.

In this manner, mobile phone devices are multi-functionalized and frequency of use is increased. On the other hand, longer hours of use available by once of charging is demanded.

For example, when a peripheral driver circuit is formed over an IC chip and a CMOS or the like is used as shown in FIG. 42B, low power consumption can be achieved.

In this manner, the invention can be applied to various electronic apparatuses.

[Embodiment 1]

Figure 47:
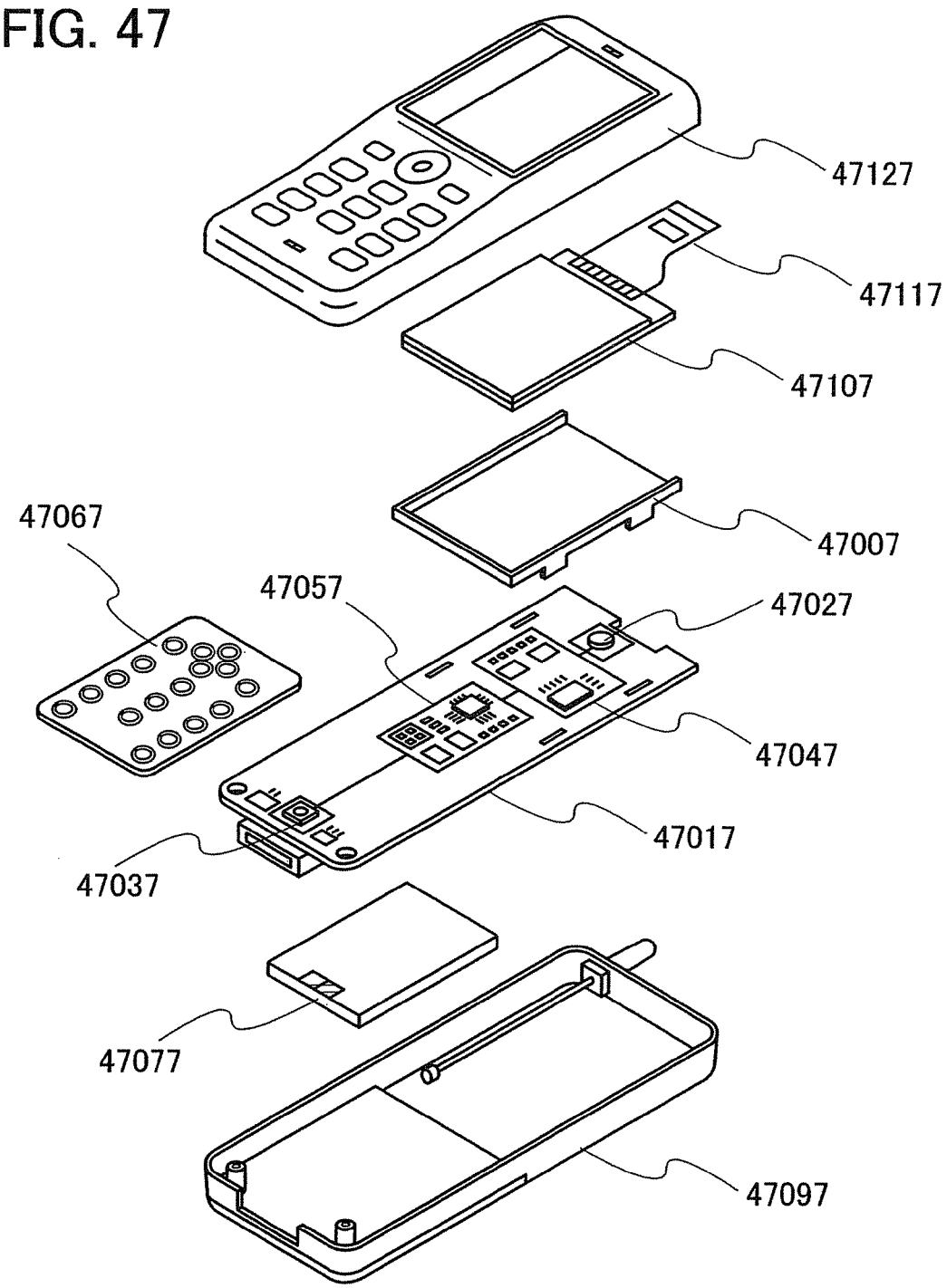
FIG. 47 is an example of a mobile phone device to which the invention is applicable.

In this embodiment, description is made on an example of a mobile phone structure having a display device using the pixel configuration of the invention for a display portion with reference to FIG. 47.

A display panel 4710 is detachably incorporated in a housing 4700. The housing 4700 can be appropriately changed its shape and size in accordance with the size of the display panel 4710. The housing 4700 which fixes the display panel 4710 is incorporated in a print circuit board 4701 as a module.

The display panel 4710 is connected to the print circuit board 4701 through an FPC 4711. On the print circuit board 4701, a speaker 4702, a microphone 4703, a transmit/receive circuit 4704, a signal processing circuit 4705 including a CPU, a controller and the like are formed. Such a module, an input means 4706, and a battery 4707 are combined to be incorporated in a housing 4709. A pixel portion of the display panel 4710 is arranged to be visible from a window formed in the housing 4709.

For the display panel 4710, a pixel portion and a part of a peripheral driver circuit (among a plurality of driver circuits, a driver circuit with lower operating frequency) may be integrally formed over a substrate by using a TFT, the other part of the peripheral driver circuit (among the plurality of driver circuits, a driver circuit with higher operating frequency) may be formed over an IC chip, and the IC chip may be mounted on the display panel 4710 by COG (Chip On Glass). Alternatively, the IC chip may be connected to a glass substrate by using TAB (Tape Auto Bonding) or a print circuit board. Note that FIG. 42A shows an example of a structure of a display panel in which a part of a peripheral driver circuit and a pixel portion are integrally formed over a substrate, and an IC chip forming the other peripheral driver circuit is mounted by COG or the like. Such a structure can achieve low power consumption of a display device and increase hours of use available by once of charging of a mobile phone device. Moreover, lower cost of a mobile phone device can be achieved.

In addition, for the pixel portion, the pixel configurations described in Embodiment Modes 1 to 3 can be appropriately applied.

Further, when the pixel configurations shown in FIGS. 6 and 8 in Embodiment Mode 2 are applied to increase a lighting period, instantaneous luminance of a light emitting element can be decreased to improve the reliability of the light emitting element.

Moreover, when signals supplied to a scan line or a signal line are impedance-converted by a buffer to increase current supply capacity, signal delay can be prevented to shorten writing time into pixels in each one row. Accordingly, a display device with high gradation can be provided.

For reducing power consumption further, as shown in FIG. 42B, a pixel portion using a TFT may be formed over a substrate, all peripheral driver circuits may be formed over an IC chip, and the IC chip may be mounted on a display panel by COG (Chip On Glass) or the like.

Moreover, the structure described in this embodiment is an example of mobile phone devices, therefore, the pixel configuration of the invention is not limited to the mobile phone device having such structure, and can be applied to mobile phone devices having various structures.

[Embodiment 2]

Figure 45:
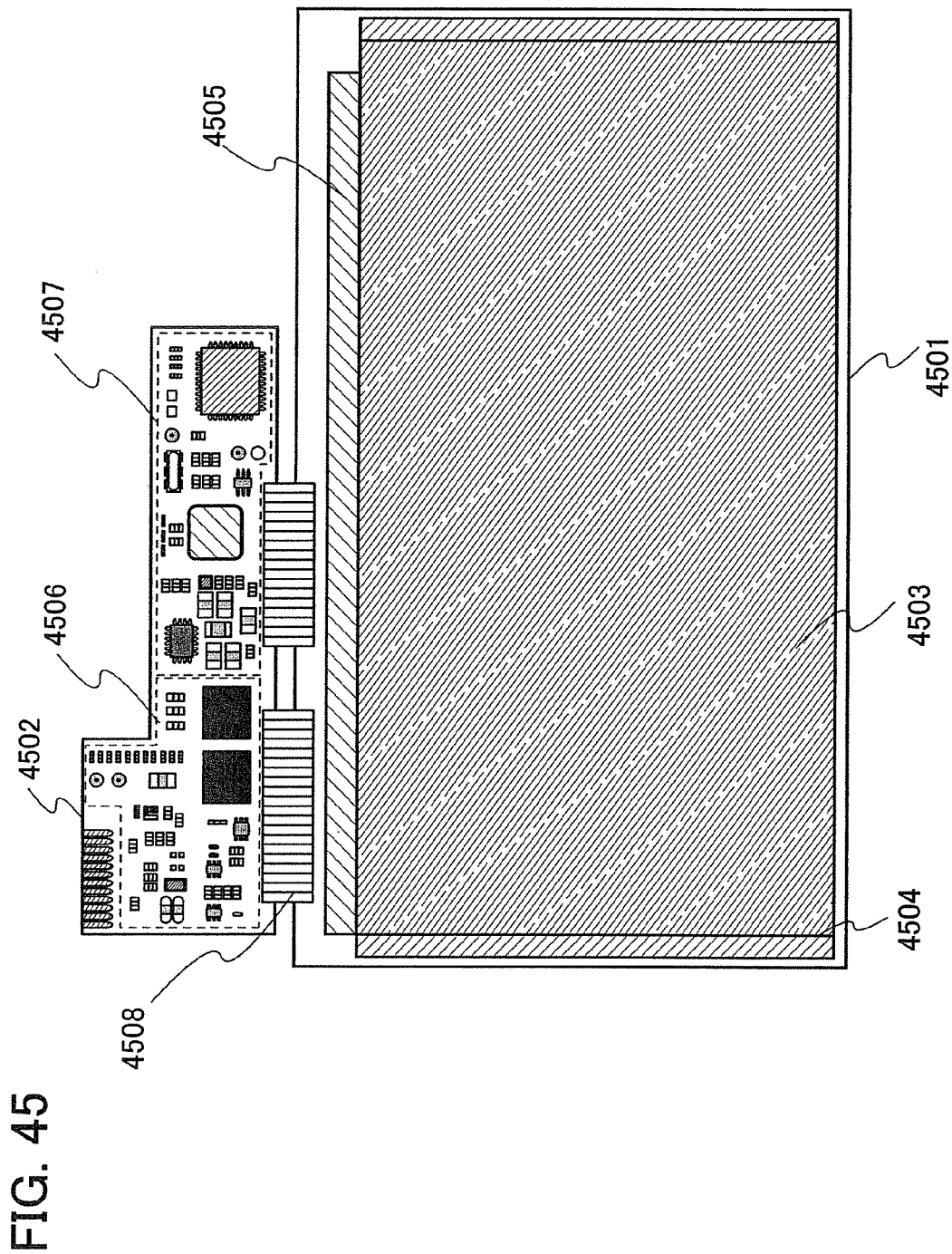
FIG. 45 is an example of an EL module.

FIG. 45 shows an EL module in which a display panel 4501 and a circuit board 4502 are combined. The display panel 4501 has a pixel portion 4503, a scan line driver circuit 4504, and a signal line driver circuit 4505. For example, a control circuit 4506, a signal dividing circuit 4507, and the like are formed on the circuit board 4502. The display panel 4501 is connected to the circuit board 4502 through a connecting wire 4508. An FPC and the like can be used for the connecting wire 4508.

For the display panel 4501, a pixel portion and a part of a peripheral driver circuit (among a plurality of driver circuits, a driver circuit with lower operating frequency) may be integrally formed over a substrate by using a TFT, the other part of the peripheral driver circuit (among the plurality of driver circuits, a driver circuit with higher operating frequency) may be formed over an IC chip, and the IC chip may be mounted on the display panel 4501 by COG (Chip On Glass) or the like. Alternatively, the IC chip may be mounted on the display panel 4501 by using TAB (Tape Auto Bonding) or a print circuit board. Note that FIG. 42B shows an example of a structure in which a part of a peripheral driver circuit and a pixel portion are integrally formed over a substrate, and an IC chip forming the other peripheral driver circuit is mounted by COG or the like.

In addition, for the pixel portion, the pixel configurations described in Embodiment Modes 1 to 3 can be appropriately applied.

Further, when the pixel configurations shown in FIGS. 6 and 8 in Embodiment Mode 2 are applied to increase a lighting period, instantaneous luminance of a light emitting element can be decreased to improve the reliability of the light emitting element.

Moreover, when signals supplied to a scan line or a signal line are impedance-converted by a buffer to increase current supply capacity, signal delay can be prevented to shorten writing time into pixels in each one row. Accordingly, a display device with high gradation can be provided.

For reducing power consumption further, a pixel portion may be formed over a glass substrate using a TFT, all peripheral driver circuits may be formed over an IC chip, and the IC chip may be mounted on a display panel by COG (Chip On Glass).

Note that in the case where an amorphous semiconductor film is applied to a semiconductor layer of a transistor forming a pixel, a pixel portion may be formed over a substrate using a TFT, all peripheral driver circuits may be formed over an IC chip, and the IC chip may be mounted on a display panel by COG (Chip On Glass). Note that FIG. 42B shows an example of a structure in which a pixel portion is formed over a substrate, and an IC chip forming a peripheral driver circuit over the substrate is mounted by COG or the like.

Figure 46:
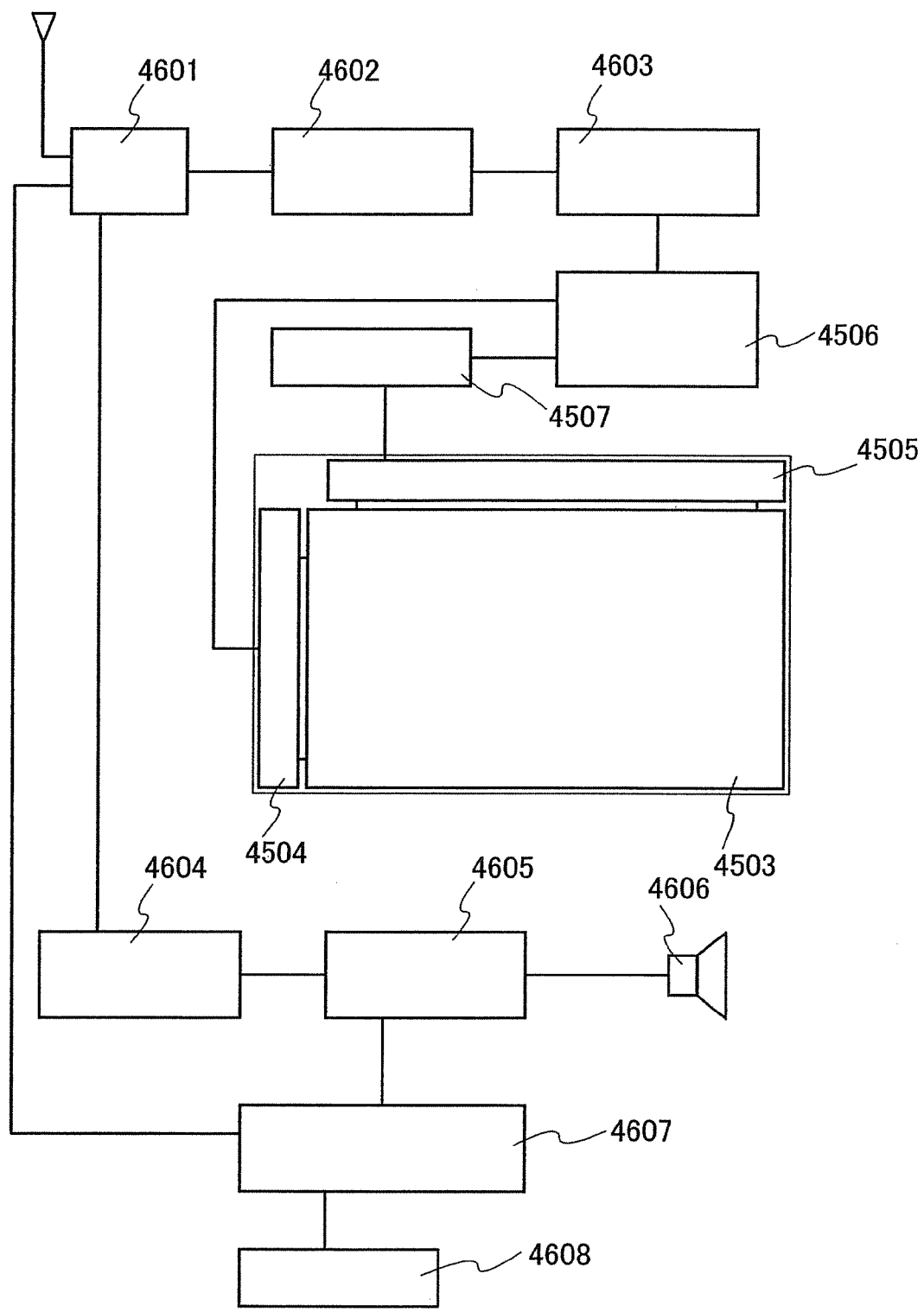
FIG. 46 is a block diagram showing a main structure of an EL television receiver.

This EL module can complete an EL television receiver. FIG. 46 is a block diagram showing a main structure of an EL television receiver. A tuner 4601 receives a video signal and an audio signal. The video signal is processed by a video signal amplifier circuit 4602, a video signal processing circuit 4603 in which signals outputted from the video signal amplifier circuit 4602 are converted to color signals corresponding to each color of red, green, and blue, and a control circuit 4506 for converting the video signals to the input specification of a driver circuit. The control circuit 4506 outputs signals each to a scan line side and a signal line side. In the case of driving in a digital manner, the signal dividing circuit 4507 may be provided on the signal line side and an input digital signal may be divided into m signals to be supplied.

Among the signals received in the tuner 4601, the audio signals are transmitted to an audio signal amplifier circuit 4604, and the output is supplied to a speaker 4606 through an audio signal processing circuit 4605. A control circuit 4607 receives receiving station (receive frequency) and sound volume control data from an input portion 4608, and sends signals to the tuner 4601 and the audio signal processing circuit 4605.

As shown in FIG. 44A, the EL module in FIG. 45 is incorporated in the housing 44001 so that a television receiver can be completed. The display portion 44003 is formed by the EL module. Moreover, the speaker portions 44004, the video input terminal 44005, and the like are appropriately provided.

It is needless to say that the invention is not limited to the television receiver and can be applied to various applications particularly as a large area display medium such as a monitor of a personal computer, an information display board at a train station, airport and the like, and an advertisement display board on the streets.

This application is based on Japanese Patent Application No. 2005-014890 filed in Japan Patent Office on 21, Jan., 2005, the entire contents of which are hereby incorporated by reference.

What is claimed is:

1. A semiconductor device comprising:
   a first transistor including a gate terminal, a source terminal and a drain terminal;
   a second transistor including a gate terminal, a source terminal and a drain terminal;
   a third transistor including a gate terminal, a source terminal and a drain terminal; and
   a capacitor including a first electrode and a second electrode,
   wherein the gate terminal of the first transistor is connected to a first scan line,
   wherein one of the source terminal or the drain terminal of the second transistor is connected to a power supply line,
   wherein one of the source terminal or the drain terminal of the third transistor is connected to a second scan line,
   wherein the first electrode of the capacitor is connected to the gate terminal of the second transistor and the gate terminal of the third transistor,
   wherein the second electrode of the capacitor is connectable to a first signal line through a first switch,
   wherein the second electrode of the capacitor is connectable to a second signal line through a second switch,
   wherein the other of the source terminal or the drain terminal of the second transistor and the other of the source terminal or the drain terminal of the third transistor are connected to a pixel electrode,
   wherein one of the source terminal or the drain terminal of the first transistor is connected to the other of the source terminal or the drain terminal of the second transistor and the other of the source terminal or the drain terminal of the third transistor, and
   wherein the other of the source terminal or the drain terminal of the first transistor is connected to the gate terminal of the second transistor and the gate terminal of the third transistor.

2. The semiconductor device according to claim 1,
   wherein the first transistor and the third transistor are N channel transistors and the second transistor is a P channel transistor.

3. The semiconductor device according to claim 1,
wherein the first switch comprises a fourth transistor and the second switch comprises a fifth transistor, and
wherein a thickness of a gate insulating film of the fourth transistor and a gate insulating film of the fifth transistor is thinner than a thickness of a gate insulating film of the second transistor.

4. The semiconductor device according to claim 1,
wherein the first switch comprises a fourth transistor and the second switch comprises a fifth transistor, and
wherein each of the fourth transistor and the fifth transistor comprises a multi-gate transistor.

5. The semiconductor device according to claim 1,
wherein the first switch is an N channel transistor and the second switch is a P channel transistor.

6. The semiconductor device according to claim 1,
wherein the semiconductor device is incorporated into at least one selected from the group consisting of a display, a camera, a computer, a mobile computer, a portable image reproducing device, a goggle type display, a video camera, and a mobile phone.

7. A display device comprising:
a first transistor including a gate terminal, a source terminal and a drain terminal;
a second transistor including a gate terminal, a source terminal and a drain terminal;
a third transistor including a gate terminal, a source terminal and a drain terminal;
a capacitor including a first electrode and a second electrode; and
a light emitting element comprising a pixel electrode,
wherein the gate terminal of the first transistor is connected to a first scan line,
wherein one of the source terminal or the drain terminal of the second transistor is connected to a power supply line,
wherein one of the source terminal or the drain terminal of the third transistor is connected to a second scan line,
wherein the first electrode of the capacitor is connected to the gate terminal of the second transistor and the gate terminal of the third transistor,
wherein the second electrode of the capacitor is connectable to a first signal line through a first switch,
wherein the second electrode of the capacitor is connectable to a second signal line through a second switch,
wherein the pixel electrode of the light emitting element is connected to the other of the source terminal or the drain terminal of the second transistor and the other of the source terminal or the drain terminal of the third transistor,
wherein one of the source terminal or the drain terminal of the first transistor is connected to the other of the source terminal or the drain terminal of the second transistor and the other of the source terminal or the drain terminal of the third transistor, and
wherein the other of the source terminal or the drain terminal of the first transistor is connected to the gate terminal of the second transistor and the gate terminal of the third transistor.

8. The display device according to claim 7,
wherein the first transistor and the third transistor are N channel transistors and the second transistor is a P channel transistor.

9. The display device according to claim 7,
wherein the first switch comprises a fourth transistor and the second switch comprises a fifth transistor, and
wherein a thickness of a gate insulating film of the fourth transistor and a gate insulating film of the fifth transistor is thinner than a thickness of a gate insulating film of the second transistor.

10. The display device according to claim 7,
wherein the first switch comprises a fourth transistor and the second switch comprises a fifth transistor, and
wherein each of the fourth transistor and the fifth transistor comprises a multi-gate transistor.

11. The display device according to claim 7,
wherein the first switch is an N channel transistor and the second switch is a P channel transistor.

12. The display device according to claim 7,
wherein the display device is incorporated into at least one selected from the group consisting of a display, a camera, a computer, a mobile computer, a portable image reproducing device, a goggle type display, a video camera, and a mobile phone.

* * * * *